United States Patent [19]

Hara et al.

[11] Patent Number: 5,581,094

[45] Date of Patent: Dec. 3, 1996

[54] PHOTODETECTOR, A PHOTODECTOR ARRAY COMPRISING PHOTODETECTORS, AN OBJECT DETECTOR COMPRISING THE PHOTODETECTER ARRAY AND AN OBJECT DETECTING PROCEDURE

[75] Inventors: Kunihiko Hara; Eiichi Funatsu; Masaya Oita; Takashi Toyoda; Yoshikazu Nitta; Shuichi Tai; Kazuo Kyuma, all of Hyogo, Japan

[73] Assignee: Mitsubishi Denki Kabushiki Kaisha, Tokyo, Japan

[21] Appl. No.: 300,693

[22] Filed: Sep. 1, 1994

[30] Foreign Application Priority Data

Nov. 18, 1993  [JP]  Japan .................... 5-314101

[51] Int. Cl.$^6$ .................... H01L 27/15; H01L 31/12; H01L 33/00

[52] U.S. Cl. .................... 257/80; 257/82; 257/84; 257/440; 257/443; 257/233; 257/432; 250/206.1; 250/208.1; 250/370.1; 250/559.38

[58] Field of Search .................... 257/82, 84, 85, 257/81, 80, 440, 443, 233, 432; 250/559.38, 370.1, 208.1, 206.1, 206.2

[56] References Cited

U.S. PATENT DOCUMENTS

| | | | |
|---|---|---|---|
| 4,791,396 | 12/1988 | Nishizawa et al. | 257/440 X |
| 4,847,489 | 7/1989 | Dietrich | 257/440 X |
| 5,008,557 | 4/1991 | Noji et al. | 250/559.38 |
| 5,068,540 | 11/1991 | Tsuji | 250/559.38 |
| 5,216,259 | 6/1993 | Stern et al. | 250/559.38 |

FOREIGN PATENT DOCUMENTS 0585673  3/1994  European Pat. Off. ............. 257/443

OTHER PUBLICATIONS

Kyuma, et al "Optical Neurodevices Based on A 2-D VSPD Array" Fourth Optoelectronics Conference, Jul. 1992.

Funatsu, et al, "An Artificial Retina Made of a Variable Sensitivity Photodetector Array", Fourth Optoelectronics Conf., Jul. 1992.

Kyuma, et al, "Optical Neuro-Devices", Optoelectronics, Mar. 1993.

Primary Examiner—William Mintel
Attorney, Agent, or Firm—Wolf, Greenfield & Sacks, P.C.

[57] ABSTRACT

A photodetector has a semiconductor substrate which produces light-induced charge upon the absorption of incident light. A first electrode and a second electrode are attached to the surface of the semiconductor substrate so as to form metal-semiconductor junctions. When control voltage $V_B$, which is variable in a positive range through a negative range, is applied to the first electrode, a photocurrent flows through the second electrode and depletion layers are formed in the surface of the semiconductor substrate. The control voltage $V_B$ applied to the first electrode increases the expanse of one of the depletion layers relative to that of the other to cause the light-induced charge to drift toward one of the depletion layers or the other. Consequently, a positive or negative current is delivered through the second electrode. Thus, the photosensitivity of the photodetector can be controlled by the control voltage $V_B$.

57 Claims, 94 Drawing Sheets

FIG. 42
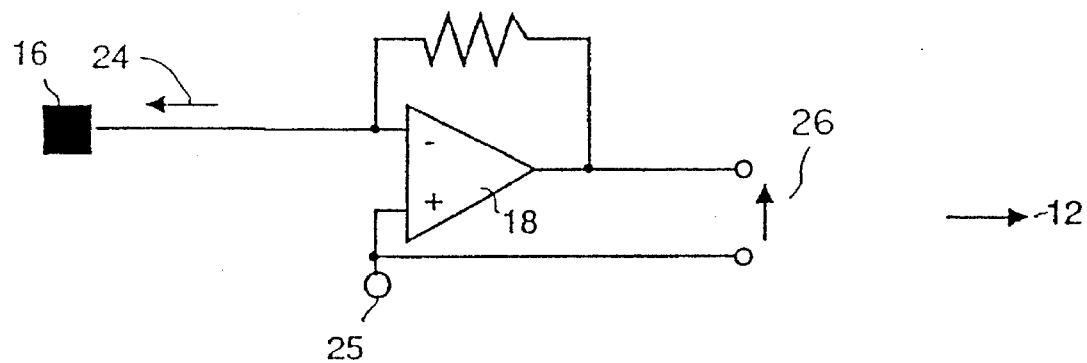
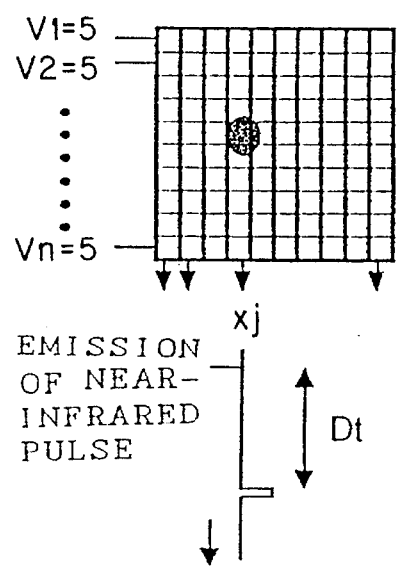
FIG. 44(a)
PARTIAL IMAGE INFORMATION
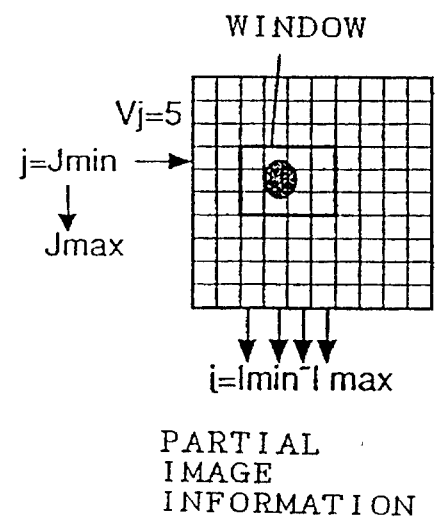
FIG.44(b)

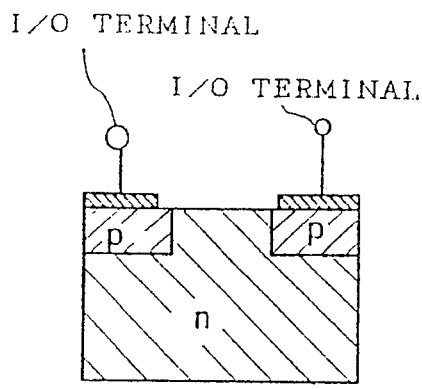
FIG. 45(a)
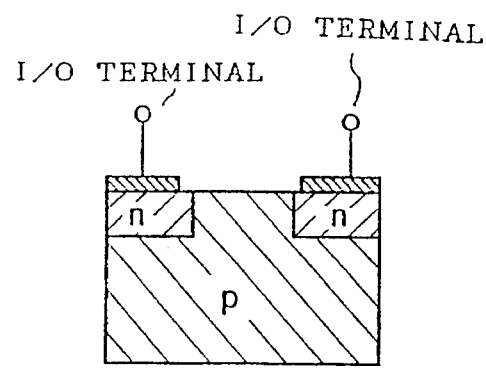
FIG. 45(b)
FIG. 46
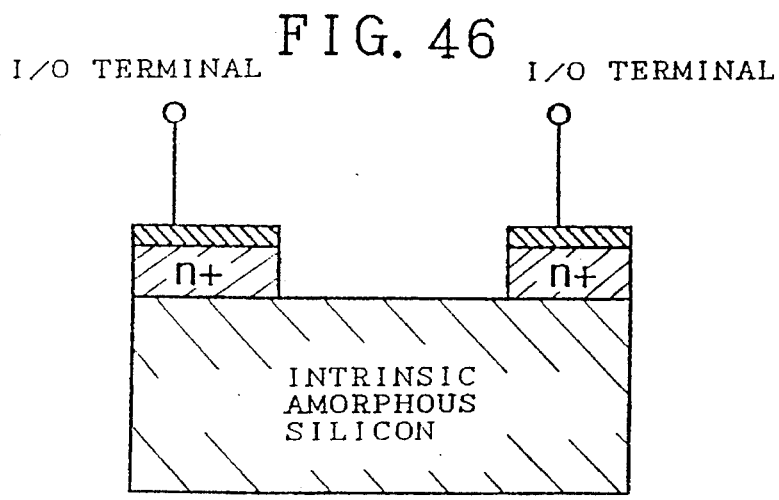
FIG. 47
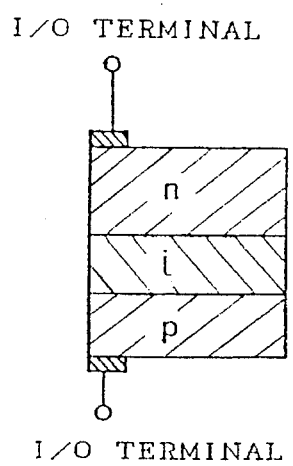
FIG. 48
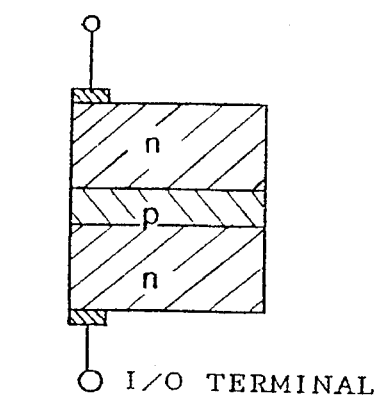

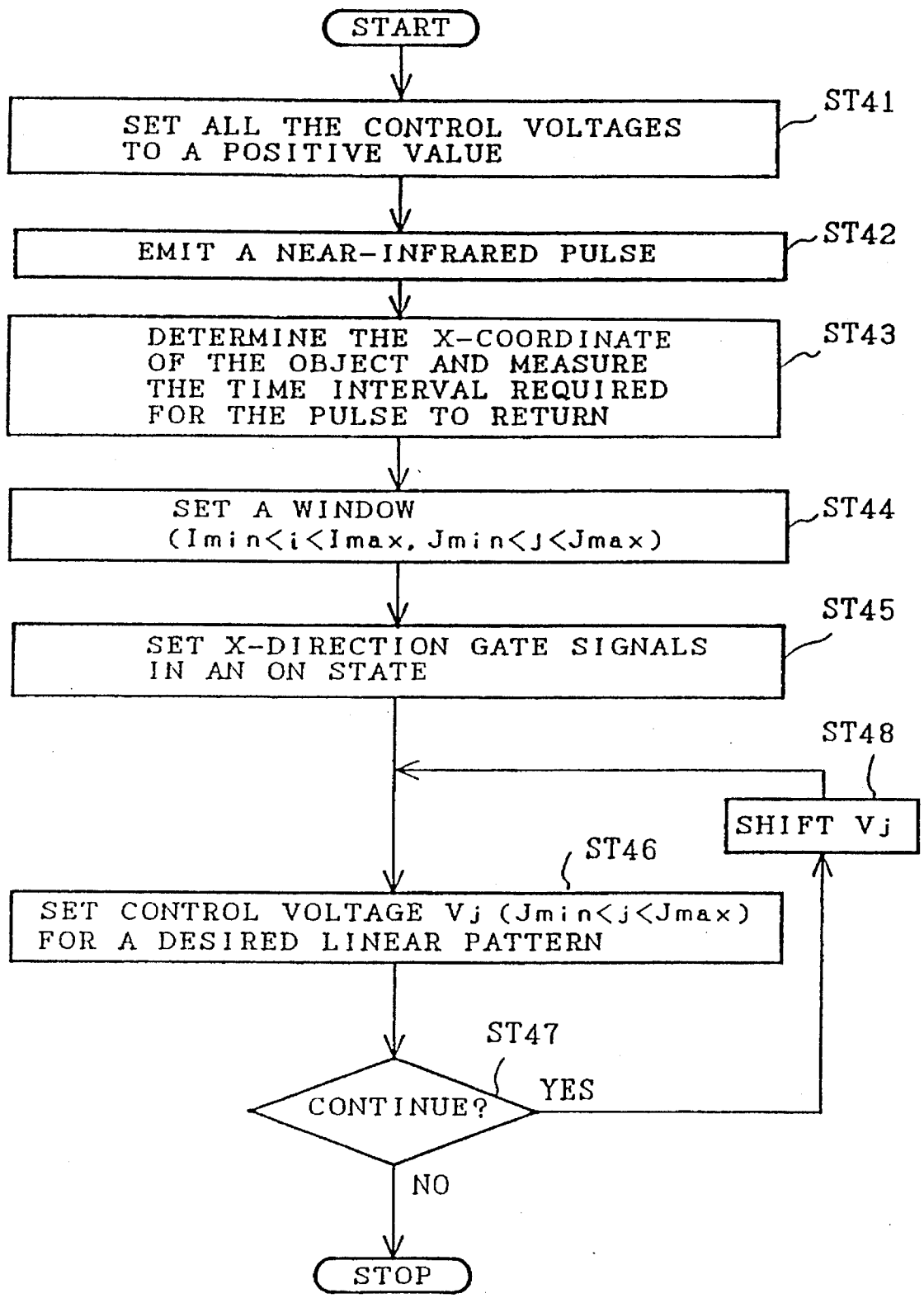

FIG. 57(a)
FIG. 57(b)
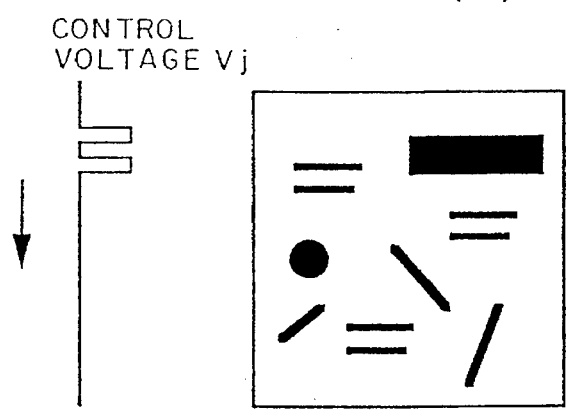
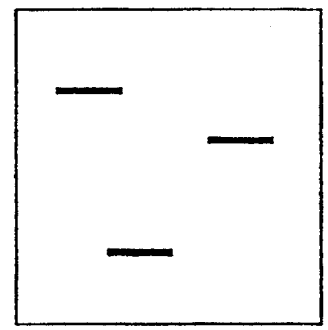
FIG. 59
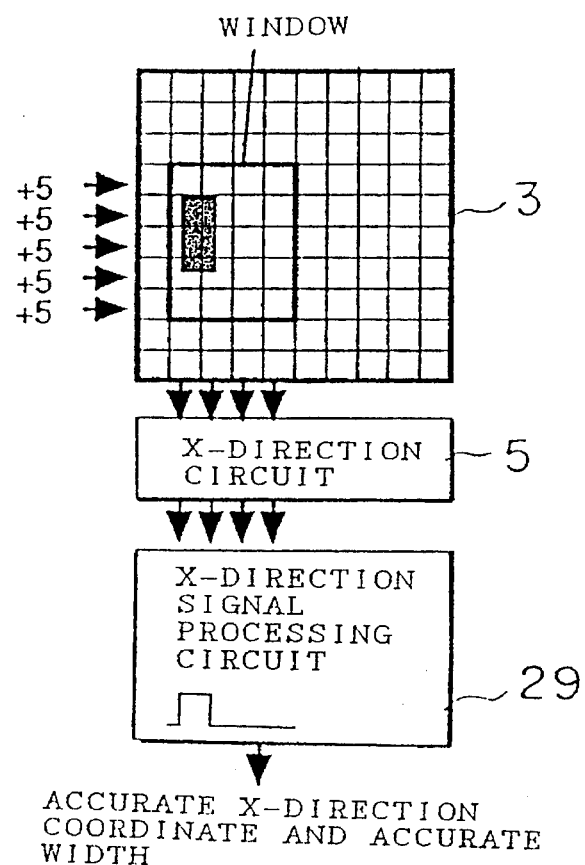

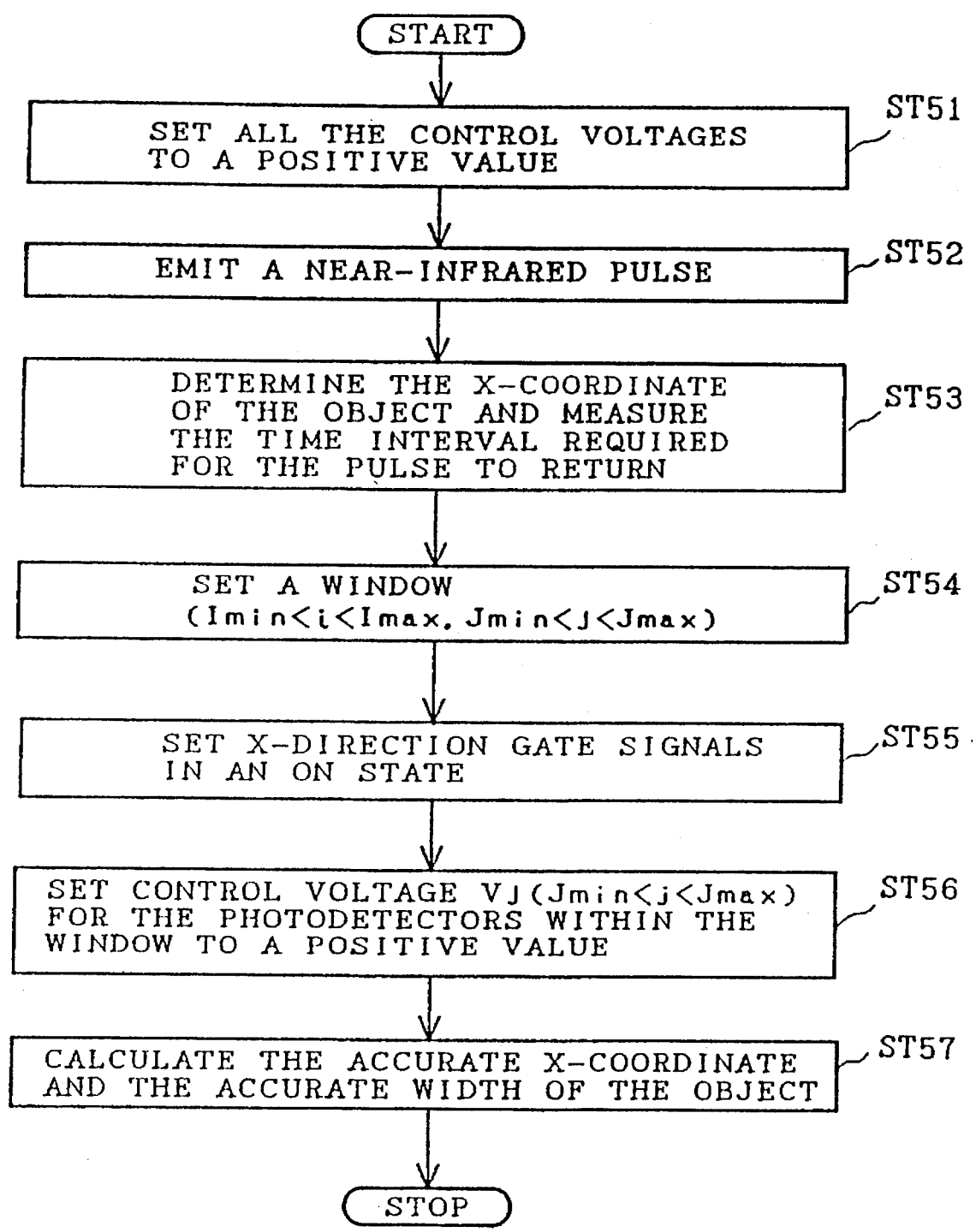

FIG. 62
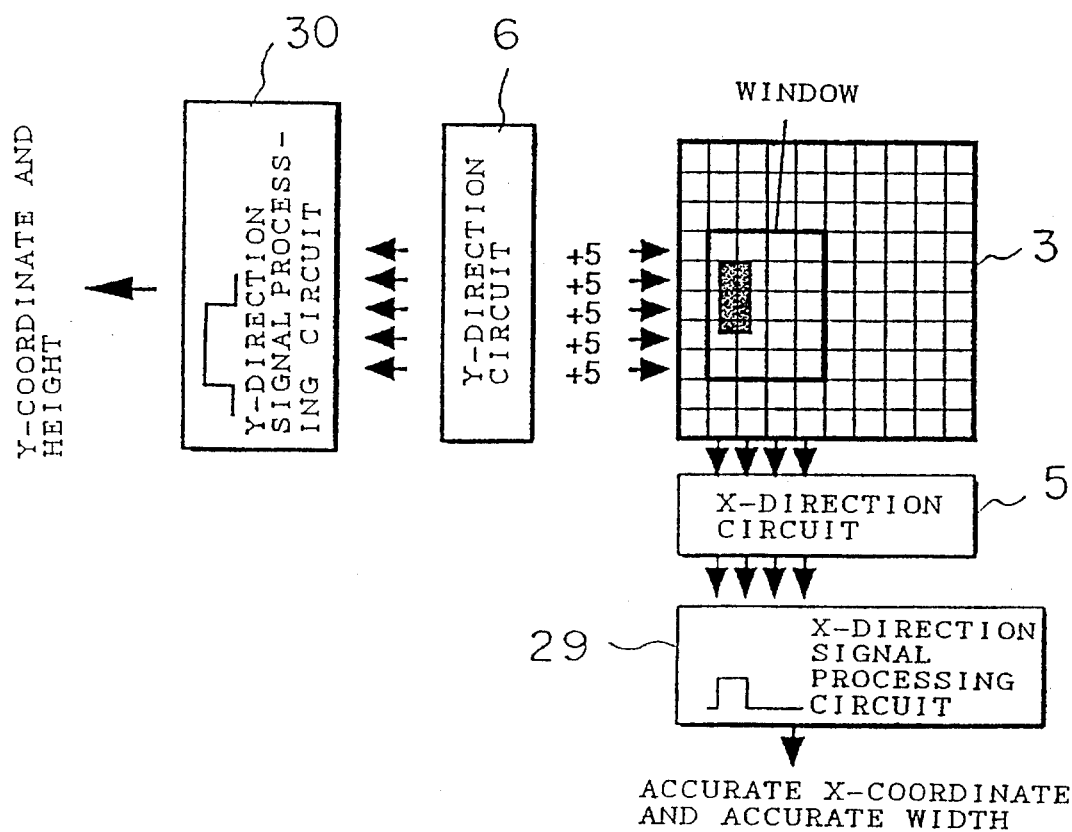
FIG. 63(a)  FIG. 63(b)  FIG. 63(c)
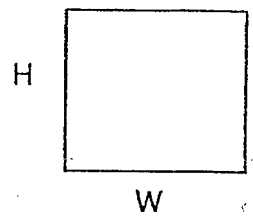 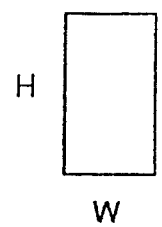 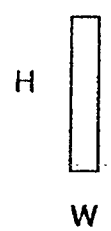
H/W < 1   1 < H/W < 5   5 < H/W

PHOTODETECTOR, A PHOTODECTOR ARRAY COMPRISING PHOTODETECTORS, AN OBJECT DETECTOR COMPRISING THE PHOTODETECTER ARRAY AND AN OBJECT DETECTING PROCEDURE

BACKGROUND OF THE INVENTION

1. Field of the Invention

The present invention relates to a photodetector, a photodetector array comprising photodetectors similar to the aforesaid photodetector, an object detector comprising the photodetector array, and an object detecting procedure. More particularly, the invention relates to a photodetector and a photodetector array suitable for detecting obstacles in proximity of a traveling vehicle or the like, an object detector comprising the photodetector array and an object detecting procedure.

2. Description of the Related Art

FIG. 1 shows a known photodetector described, for example, in C. C. Sun et al., "Quantum Electronics" Vol. 25, No. 5, pp.896–903 (1989). Shown in FIG. 1 are a light-absorptive n-type silicon substrate 211, a p$^+$-type silicon layer 212 formed in part of the surface of the n-type silicon substrate 211, a transparent polycrystalline silicon electrode 213, to which a bias voltage $V_c$ for setting the sensitivity of the photodetector, formed on the surface of the n-type silicon substrate 211 contiguously with the p$^+$-type silicon layer 212, a transparent silicon dioxide insulating film 214 insulating the polycrystalline silicon electrode 213 from the n-type silicon substrate 211, an output electrode 215, i.e. an opaque metal electrode, covering the p$^+$-type silicon layer 212, and a depletion layer 216. The depletion layer 216 is formed in the vicinity of the interface between the n-type silicon substrate 211 and the silicon dioxide insulating film 214, and also in the vicinity of the interface between the n-type silicon substrate 211 and the p$^+$-type silicon layer 212. The photodetector is a variable-sensitivity photodetector, in which the depth of the depletion layer 216 is changed by changing the bias voltage $V_c$ applied to the polycrystalline silicon electrode 213.

In operation, the bias voltage $V_c$ is applied to the polycrystalline silicon layer 213 to set the sensitivity of the photodetector. Since the photodetector has a MIS (metal-insulator semiconductor) construction formed by stacking the polycrystalline silicon electrode 213 and the silicon dioxide insulating film 214 on the silicon substrate 211, the depletion layer 216 is formed when the bias voltage $V_c$ applied to the polycrystalline silicon electrode 213 is a negative voltage. Accordingly, the depth of the depletion layer 216 varies with the variation of the negative bias voltage $V_c$, and an appropriate negative voltage is applied to the polycrystalline silicon electrode 213 to set the photodetector for a photosensitivity. When light hv is projected on the photodetector along a direction perpendicular to the surface of the photodetector, the light hv travels through the silicon dioxide insulating film 214, the polycrystalline silicon electrode 213 and the silicon dioxide insulating film 214 in that order and falls on the depletion layer 216. When the wavelength of the incident light is shorter than the absorption edge of the semiconductor forming the n-type silicon substrate 211, a photocurrent $I_{ph}$ is produced, i.e., electron-hole pairs are created, in the depletion layer 216. The electrons gather in the pn junction of the p-type semiconductor, i.e., the p$^+$-type silicon layer 212, and the n-type semiconductor, i.e., the n-type silicon substrate 211, and the electrons appear on the output electrode 215.

The intensity of the photocurrent $I_{ph}$ produced by the photodetector is proportional to the thickness of the depletion layer 216; the intensity increases with the increase of the thickness of the depletion layer 216. The thickness of the depletion layer 216 is proportional to the magnitude of the bias voltage $V_c$ applied to the polycrystalline silicon electrode 211. Therefore, the intensity of the photocurrent $I_{ph}$ that flows through the photodetector, which corresponds to the sensitivity to incident light, can be changed by adjusting the bias voltage $V_c$ applied to the polycrystalline silicon electrode 211.

FIG. 2 shows a photodetector array, for example, a MOS image sensor, described in "Sensor Interfacing No. 2", Toranzista Gijutsu (Bessatsu), Apr. 1, 1983. Shown in FIG. 2 are photodiodes 206 serving as the pixels of the image sensor, MOS transistors 207 serving as vertical switches for reading pixel signals stored in the photodiodes 206, MOS transistors 208 serving as horizontal switches to read pixel signals along a horizontal direction from a bus connected to the vertical-switching MOS transistors 207, a vertical shift register 209 that supplies clock pulses for vertical reading to the vertical-switching MOS transistors 207, and a horizontal shift register 210 that applies clock pulses for horizontal reading to the horizontal-switching MOS transistors 208.

In operation, when light from an object falls on the photodiodes 206 arranged in a matrix, light-induced carriers are accumulated in each photodiode 206. Then, the vertical shift register 209 applies clock pulses sequentially to the horizontal lines of the vertical-switching MOS transistors 207 to turn on the MOS transistors 207 sequentially to make the photodiodes 206 deliver pixel signals onto the common bus. Then, the horizontal shift register 210 applies clock pulses to the horizontal-switching MOS transistors 208 to turn on the MOS transistors 208 sequentially to read the pixel signals on the vertical lines horizontally sequentially. Thus, two-dimensional image signals represented by the photocurrents produced by the two-dimensionally arranged photodiodes 206 are obtained.

Passive object detectors employing the foregoing image sensor are disclosed, for example, in Japanese Patent Publication Nos. 63-38085 and 63-46363, and Japanese Patent Laid-open No. 63-52300. Each of these known object detectors is provided, for example, with two sets each of the image sensor and an input optical system to sense the scenery spreading before the object detector to acquire image data. The object detector processes the image data to detect an object and obtains three-dimensional data including the distance to the object.

FIG. 3 is a block diagram of a known object detector, such as an optical radar, described in, for example, "Laser Handbook", Asakura Shoten, pp.644–676 (1973) or Japanese Patent Publication No. 60-4011. Referring to FIG. 3, there is shown a pulse generator 201 that generates clock pulses, i.e., a reference pulse signal, a light-emitting unit 202 comprising a light-emitting device, such as a semiconductor laser, that generates light pulses, in response to the clock pulses generated by the pulse generator 201, a driving circuit for driving the light-emitting device, and a lens system. The object detector also includes a photodetector unit 203 for receiving light pulses reflected from the object, comprising the lens system through which light signals, i.e., the reflected light pulses, are received, light sensing devices, such as photodiodes, for converting received light signals into electrical signals, a bias voltage generator that generates a bias voltage for biasing the light sensing devices, an amplifier 204, such as a wide-band amplifier, for amplifying the output electric signals of the photodetector unit 203, and a rangefinder 205 that counts propagation delay times on the basis of the clock pulses generated by the pulse generator 201 to calculate the distance to the object.

In operation, the pulse generator 201 is driven and generates clock pulses at intervals far longer than a time interval corresponding to a maximum measurable distance. The clock pulses are applied as driving pulses to the light-emitting unit 202, and then the light emitting unit emits light pulses $L_t$ using the light-emitting device, such as a semiconductor laser, according to the driving pulses. The light pulses $L_t$ are projected through a lens or the like on a reflecting object. The photodetector unit 203 receives reflected light pulses $L_r$ reflected from the reflecting object, and converts the reflected light pulses $L_r$ into electric signals by photoelectric conversion by light-sensitive devices, such as photodiodes. The amplifier 204 amplifies the output electric signals of the photodetector unit 203 to electric signals on a predetermined level and gives the amplified electric signals to the rangefinder 205. The rangefinder 205 determines the distance to the reflecting object by measuring the time interval between transmission of the pulse and reception of the reflected pulse. The optical radar is an active object detector that transmits a microwave or an infrared laser light into a three-dimensional space, receives the reflected signal reflected from an object in the three-dimensional space by the lightsensing unit 204, determines the distance to the object, and detects the object and the relative speed between the object and the optical radar.

In the conventional variable-sensitivity photodetector thus constructed, the photocurrent $I_{ph}$ flows always in the fixed direction, and the sensitivity can be varied only in the positive direction corresponding to the direction of flow of the photocurrent $I_{ph}$; that is, since the sensitivity of the variable-sensitivity photodetector cannot be varied in the negative direction or negatively weighted, the object detector employing this variable-sensitivity photodetector is incapable of carrying out effective processing, such as calculation of the difference between the pixels of an image. Although the conventional variable-sensitivity photodetector is illuminated entirely by the incident light, the variable-sensitivity photodetector is able to use the energy of only part of the incident light falling on the depletion layer and is unable to use the energy of all the incident light effectively. Since the variable-sensitivity photodetector receives all the incident radiations having wavelengths shorter than the absorption edge of the semiconductor, the variable-sensitivity photodetector is incapable of effectively using the respective characteristics of the component radiations having different wavelengths of the incident light, and, since the variable-sensitivity photodetector has no threshold action with the intensity of the incident light, the variable-sensitivity photodetector is unable to discriminate between the useful signal components and noise components of the incident light.

Still further, since the conventional photodetector array has a complicated construction, it is difficult to increase the number of pixels to process two-dimensional image data, and the photodetector array needs a light source, such as a light-emitting device, to process three-dimensional image data including distance data. The object detector for processing three-dimensional image data including distance data, comprises, in combination, the conventional photodetector array and a light-emitting device needing a complicated optical system which is difficult to align.

The conventional object detector employing an active optical radar is incapable of obtaining information about an object other than the distance to the object, such as the width and the height of the object. When applied, for example, to an automobile, this conventional object detector could not achieve highly reliable obstacle detection. Since a passive object detector employing an image sensor collects a large number of pieces of image information successively, the passive object detector cannot be applied to function where real-time image detection is required.

SUMMARY OF THE INVENTION

The present invention has been made to solve the foregoing problems and it is therefore a first object of the present invention to provide a photodetector highly sensitive to light and having photosensitivity which can be varied between a negative sensitivity and a positive sensitivity.

A second object of the present invention is to provide a photodetector array capable of effectively utilizing the incident light, suitable for image information processing, having a compact construction and capable of operating at a high processing speed.

A third object of the present invention is to provide an object detector capable of quickly and satisfactorily detecting three-dimensional information about an object including the distance to the object.

A fourth object of the present invention is to provide an object detecting procedure capable of quickly and satisfactorily detecting three-dimensional information about an object including the distance to the object.

To achieve the first object, the present invention provides a photodetector comprising a light-absorptive semiconductor substrate, two depletion layers formed substantially symmetrically in the semiconductor substrate, a first electrode electrically connected to the semiconductor substrate for receiving a control voltage variable in a positive range through a negative range to the first electrode to vary the depth of the depletion layers, and a second electrode disposed opposite to the first electrode and electrically connected to the semiconductor substrate.

When either a positive control voltage or a negative voltage is applied to the first electrode of the photodetector, one of the depletion layers substantially symmetrically formed in the light-absorptive semiconductor substrate expands relative to the other and, consequently, charge induced by light falling on the depletion layers moves into one of the depletion layers according to the expansion ratio and a positive or negative photocurrent appears on the second electrode. When no control voltage is applied to the first electrode, namely, when the control voltage is zero, any photocurrent does not appear on the second electrode because the depletion layers are symmetrical and hence the photosensitivity of the photodetector is zero; that is, the photosensitivity of the photodetector can be varied in a positive range through a negative range by varying the control voltage to be applied to the first electrode in a positive voltage range through a negative voltage range.

Preferably, the first electrode and the second electrode of the photodetector are formed on the semiconductor substrate so as to form metal-semiconductor junctions to enable the variation of the photosensitivity in the positive range through the negative range by using the depletion layers when the control voltage to be applied to the first electrode is varied in the positive range through the negative range.

More preferably, the first electrode and the second electrode of the photodetector are formed on the surface of the semiconductor substrate in a symmetrical arrangement so as to form metal-semiconductor junctions to enable the variation of the photosensitivity in the positive range through the negative range by using the depletion layers formed in the surface of the semiconductor substrate.

More preferably, the first electrode and the second electrode of the photodetector are semitransparent electrodes to enable part of the incident light to fall effectively on the depletion layers formed in the surface of the semiconductor substrate.

Preferably, the first electrode and the second electrode of the photodetector are transparent electrodes to enable more of the incident light to fall effectively on the depletion layers formed in the surface of the semiconductor substrate.

Preferably, the first electrode and the second electrode of the photodetector are embedded in the semiconductor substrate in a symmetrical arrangement so as to form metal-semiconductor junctions to enable the variation of the photosensitivity in the positive range through the negative range by using the depletion layers formed in the surface of the semiconductor substrate.

More preferably, the first electrode and the second electrode of the photodetector are semitransparent metal electrodes capable of transmitting part of the incident light to the semiconductor substrate, and capable of forming depletion layers between the first and second electrodes and the semiconductor substrate and around them according to the control voltage applied to the first electrode to enable the incident light to illuminate effectively the entire areas of the depletion layers formed in the surface of the semiconductor substrate, opposite the surface on which the incident light falls.

Preferably, the first electrode and the second electrode of the photodetector are transparent metal electrodes capable of transmitting the incident light to the semiconductor substrate, and capable of forming depletion layers between the first and second electrodes and the semiconductor substrate and around them according to the control voltage applied to the first electrode to enable the incident light to illuminate effectively the entire areas of the depletion layers formed in the surface of the semiconductor substrate, opposite the surface on which the incident light falls.

More preferably, the first electrode and the second electrode of the photodetector are formed on the side surfaces of a mesa of the semiconductor substrate having a mesa configuration to enable the variation of the photosensitivity in the positive range through the negative range by using the deep depletion layers.

Preferably, the semiconductor substrate of the photodetector is provided internally with a dispersive Bragg reflecting mirror to reflect the incident light penetrated through the depletion layers into the semiconductor substrate effectively toward the depletion layers.

Preferably, the incident light falls on the surface of the semiconductor substrate of the photodetector, opposite the surface on which the first electrode and the second electrodes are formed to illuminate the depletion layers effectively.

Preferably, a control voltage that will cause electron avalanche in the semiconductor substrate when the photodetector is illuminated is applied to the first electrode of the photodetector, and the charge induced by the incident light is enhanced by electron avalanche so that an enhanced charge appears on the second electrode.

More preferably, the semiconductor substrate of the photodetector is a transparent, insulating substrate that enables the formation of the photodetector having photosensitivity variable in the positive range through the negative range.

Preferably, the photodetector is formed on a semiconductor substrate having a band gap wider than that of the semiconductor substrate on which the cell is formed to prevent light absorption by the latter semiconductor substrate.

To achieve the second object, the present invention provides a photodetector array comprising a plurality of photodetectors arranged in a two-dimensional arrangement each having a depletion layer to produce a photocurrent according to the energy of light absorbed by the depletion layer, and a cooling unit for cooling the plurality of photodetectors. Each photodetector comprises a light-absorptive semiconductor substrate, two depletion layers formed substantially symmetrically in the surface of the semiconductor substrate, a first electrode electrically connected to the semiconductor substrate and to a voltage source capable of applying a control voltage variable in a positive range and a negative range to the first electrode to vary the depth of the depletion layers, and a second electrode disposed opposite to the first electrode and electrically connected to the semiconductor substrate to provide a photocurrent produced in the depletion layers therethrough. The photosensitivity of the photodetectors can be varied in a positive range through a negative range, and the heat generated by the photodetectors during operation can be removed to ensure stable operation of the photodetector array.

Preferably, the cooling unit is a heatsink capable of absorbing heat from the semiconductor substrates of the photodetectors and dissipating the absorbed heat.

Preferably, the photodetector array comprises the plurality of photodetectors arranged in a two-dimensional arrangement, and each capable of producing a photocurrent according to the energy of light absorbed by its depletion layers, and insulating parts formed between the photodetectors to electrically insulate the photodetectors from each other. Each photodetector comprises a light-absorptive semiconductor substrate, two depletion layers substantially symmetrically formed in the surface of the semiconductor substrate, a first electrode electrically connected to the semiconductor substrate and to a voltage source that applies a control voltage variable in a positive range through a negative range to the first electrode to vary the depth of the depletion layers, and a second electrode disposed opposite to the first electrode and electrically connected to the semiconductor substrate to provide a photocurrent induced in the depletion layers therethrough. The plurality of photodetectors having photosensitivity variable in a positive range through a negative range are electrically insulated from each other to ensure the stable operation of the photodetectors.

In a preferable photodetector array, a plurality of photodetectors having photosensitivity variable in a positive range through a negative range are arranged in an array at fixed intervals on an insulating substrate, and the photodetectors are electrically insulated from each other.

In another preferred embodiment, the photodetector array comprises, a plurality of photodetectors having photosensitivity variable in a positive range through a negative range and differing from each other in size or shape are arranged in an array, and the photodetectors are accessed individually to obtain a desired image efficiently.

In another preferred embodiment, the photodetector array comprises, a plurality of photodetectors having photosensitivity variable in a positive range through a negative range are arranged at irregular intervals so that the photodetectors are arranged in a specified region, and the photodetectors are accessed individually to obtain a desired image efficiently.

Another preferred photodetector array is provided with a gradient index lens on the light-receiving side of a plurality of photodetectors having photosensitivity variable in a positive range through a negative range to make light fall through the gradient index lens on the photodetectors.

Another preferred photodetector array is provided with a plurality of gradient index lenses respectively for a plurality of photodetectors to concentrate light traveling toward the photodetectors on the photodetectors.

Another preferred photodetector array is provided with linear gradient index lenses respectively for the lines or rows of the photodetectors. to concentrate light traveling toward the lines or rows of photodetectors on the photodetectors.

Another preferred photodetector array is provided with a diffraction lens on the light-receiving side of a plurality of photodetectors having photosensitivity variable in a positive range through a negative range to make light to fall through the diffraction lens on the photodetectors.

Another preferred photodetector array is provided with a plurality of diffraction lenses respectively for a plurality of photodetectors, and the diffraction lenses concentrate light on the corresponding photodetectors, respectively.

Another preferred photodetector array is provided with linear diffraction lenses for lines or rows of a plurality of photodetectors to concentrate light on the photodetectors on the corresponding lines or rows, respectively.

Another preferred photodetector array is provided with a refraction or diffraction lens coated with an antireflection film to make light fall through the refraction or diffraction lens on photodetectors having photosensitivity variable in the in a positive range through a negative range.

Another preferred photodetector array comprises a plurality of photodetectors arranged in a two-dimensional arrangement and capable of producing a photocurrent according to the energy of light absorbed by their depletion layers, and a filter disposed on the light-receiving side of the plurality of photodetectors to select a wavelength of the incident light having a transmittance corresponding to the wavelength of the incident light falling on the photodetectors. Each photodetector comprises a light-absorptive semiconductor substrate, two depletion layers formed substantially symmetrically in the surface of the semiconductor substrate, a first electrode electrically connected to the semiconductor substrate for receiving a control voltage variable in a positive range through a negative range to the first electrode to vary the depth of the depletion layers, and a second electrode disposed opposite to the first electrode and electrically connected to the semiconductor substrate to provide a photocurrent induced in the depletion layers therethrough. Light having a predetermined wavelength filtered through the wavelength-selective filter having selective transmittance with respect to wavelength falls on the photodetectors having photosensitivity variable in a positive range through a negative range.

Another preferred photodetector array is provided with a light modulator having light transmittance with respect to wavelength, which can be set by an external selection signal to make light having a predetermined wavelength fall on the photodetectors having photosensitivity variable in a positive range through a negative range.

Another preferred photodetector array is provided with nonlinear optical devices having light transmittance that can be determined according to the intensity of light that falls thereon to make light having a predetermined wavelength fall on the photodetectors having photosensitivity variable in a positive range through a negative range.

Another preferred photodetector array is provided with an optical switching device to make light having a predetermined wavelength fall on the photodetectors having photosensitivity variable in a positive range through a negative range.

Another preferred photodetector array is provided with a control voltage applying unit that applies a control voltage variable in a positive range through a negative range through a parallel circuit of diodes respectively having opposite forward directions, respectively to the photoconductors. This arrangement surely prevents the flow of a leakage current into the photodetectors when the control voltage is zero.

Another preferred photodetector array comprises a plurality of photodetectors each having a first electrode and a second electrode connected to a semiconductor substrate so as to form metal-semiconductor junctions, which enables the variation of photosensitivity in a positive range through a negative range by using depletion layers.

Another preferred photodetector array comprises a plurality of photodetectors each having a first electrode and a second electrode formed on the surface of a semiconductor substrate in a symmetrical arrangement so as to form metal-semiconductor junctions, so that light can be effectively applied to depletion layers.

Another preferred photodetector array comprises a plurality of photodetectors each having a first electrode and a second electrode formed on the surface of a semiconductor substrate in a symmetrical arrangement so as to form metal-semiconductor junctions, so that photosensitivity can be varied in a positive range through a negative range by using depletion layers.

Another preferred photodetector array comprises a plurality of photodetectors each having a transparent first electrode and a transparent second electrode formed near the surface of a semiconductor substrate, so that light can be effectively transmitted to depletion layers.

Another preferred photodetector array comprises a plurality of photodetectors each having a first electrode and a second electrode each having a first electrode and a second electrode embedded in a semiconductor substrate in a symmetrical arrangement, so that photosensitivity can be varied in a positive range through a negative range.

Another preferred photodetector array comprises a plurality of photodetectors each having a semitransparent first electrode and a semitransparent second electrode in a semiconductor substrate, so that light falling on one surface of the semiconductor substrate can be transmitted to depletion layers formed in the other surface of the semiconductor substrate to make the light fall effectively on the entire areas of depletion layers.

Another preferred photodetector array comprises a plurality of photodetectors each having a transparent first electrode and a transparent second electrode formed in a semiconductor substrate, so that light falling on one surface of the semiconductor substrate can be transmitted to the entire areas of depletion layers formed in the other surface of the semiconductor substrate.

Another preferred photodetector array comprises a plurality of photodetectors formed on a semiconductor substrate having a mesa construction and each having a first electrode and a second electrode formed on the side surfaces of a mesa in metal-semiconductor junctions, so that photosensitivity can be varied in a positive range through a negative range by using deep depletion layers.

To achieve the third object, the present invention provides an object detector comprising a light-emitting unit that emits pulses of light having a predetermined wavelength, a photodetector unit that receives reflected light reflected from an object and including the pulse of light, comprising a two-dimensional photodetector array formed by arranging a plurality of photodetectors each having photosensitivity variable in a positive range through a negative range in a two-dimensional arrangement, a control signal supply unit that supplies a control signal for controlling the photosensitivity of each photodetector of the photodetector unit, a signal detecting unit that detects the output signals of the photodetectors on each line or each row of photodetectors, and a control unit that times either the light emitting operation of the light emitting unit and the operation of the control signal supply unit for supplying control signals to the photodetectors, or the operation of the signal detecting unit for detecting the output signals of the photodetectors on each line or each row of photodetectors.

The light-emitting unit emits pulses of light having a predetermined wavelength. The photodetector unit comprising a two-dimensional photodetector array of the photodetectors arranged in a two-dimensional arrangement detects the reflected light reflected from an object and including natural light and the pulse of light. The control signal supply unit supplies a control signal to the photodetector unit to adjust the photosensitivity of each photodetector to a predetermined value. The signal detecting unit detects the output signals of the photodetectors each having a set photosensitivity on each of the lines or rows of photodetectors to detect a desired image. The control unit controls either the light emitting operation of the light-emitting unit and the control signal supply operation of the control signal supply unit for supplying control signals to the photodetectors, or the signal detecting operation of the signal detecting unit for detecting the output signals of the photodetectors on each line or each row of photodetectors to determine the distance to the object and its projection accurately.

Preferably, the object detector further comprises a set information feedback unit that receives the output signal of the signal detecting unit and feeds back set information to the control unit. The control unit decides on the basis of the set information whether or not a setting operation has been correctly executed for the next setting and detecting operations.

Preferably, the object detector further comprises an optical system having a selective transmission unit that transmits only near-infrared radiation. The pulses of light emitted by the light-emitting unit is sent out through the selective transmission unit, and the selective transmission unit transmits only near-infrared radiation included in the incoming external light to the photodetector unit.

Preferably, the object detector detects visible radiation and near-infrared radiation selectively by the photodetectors of the photodetector unit to obtain output signals suitable respectively for processing operations.

Preferably, the object detector further comprises a signal converting unit that converts the parallel output signal of a signal detecting unit connected in parallel to the lines or rows of the two-dimensional array of photodetectors of the photodetector unit into a serial output signal.

Preferably, the object detector further comprises a switching unit that converts the parallel output signal of the signal detecting unit connected in parallel to the lines or the rows of the two-dimensional photodetector array of the photodetector unit into a serial signal by selective switching and gives the serial signal to a subsequent circuit.

Preferably, the object detector further comprises an integrating unit that integrates the output signals of the two-dimensional array of photodetectors of the photodetector unit to remove noise from the signals.

Preferably, the object detector further comprises an optical system having a visible radiation absorbing unit that absorbs visible radiation from reflected light reflected from an object toward the photodetector unit. Pulses of light having a predetermined wavelength are emitted toward the light-emitting unit, visible radiation included in the reflected light reflected from the object and including at least the pulse of light emitted by the light-emitting unit is absorbed to transmit only near-infrared radiation to the light-receiving unit, and the photodetector unit having the two-dimensional array of photodetectors arranged in a two-dimensional arrangement detects the near-infrared radiation. The control signal supply unit supplies a control signal to the photodetector unit to adjust the photosensitivity of each photodetector to a predetermined photosensitivity. The signal detecting unit detects the output signals of the photodetectors having a predetermined photosensitivity arranged on each line or each row to detect a desired image. The control unit times the light emitting operation of the light emitting unit and the control signal supply operation of the control signal supply unit for supplying control signals to the photodetectors, or the signal detecting operation of the signal detecting unit for detecting the output signals of the photodetectors on each line or each row to determine the distance to the object and its projection accurately.

Preferably, the object detector further comprises a set information feedback unit that receives the output signal of the signal detecting unit and feeds back set information to the control unit. The control unit decides whether or not a setting operation has been correctly carried out for the next setting and detecting operations.

Preferably, the object detector comprises a signal converting unit that converts the parallel output signal of the signal detecting unit, which is connected to the lines or the rows of the two-dimensional array of photodetectors to detect only near-infrared radiation, into a serial signal.

More preferably, the object detector that converts the parallel output signal of the signal detecting unit, which is connected in parallel to the lines or the rows of the two-dimensional photodetector array of the photodetector unit to detect only near-infrared radiation, into a serial signal by selective switching and sends the serial signal to a subsequent circuit.

Another preferred object detector comprises a light-emitting unit that emits pulses of light having a predetermined wavelength, a photodetector unit comprising a two-dimensional photodetector array formed by arranging a plurality of photodetectors having photosensitivity variable in a positive range through a negative range in a two-dimensional arrangement to detect reflected light reflected from an object and including at least a reflected pulse of light, an optical system that absorbs visible radiation from reflected light reflected from an object toward the photodetector unit, a control signal supply unit that supplies a control signal for controlling the photosensitivity of each photodetector of the photodetector unit, provided with a time window setting unit for a specified line or a specified row of photodetectors, a signal detecting unit that detects the output signals of the photodetectors of each line or each row of the photodetector unit and detects selectively the output signals of the photodetectors on each line or each row in the set time window, and a control unit that times the light emitting operation of the light-emitting unit. The control signal supply operation of the control signal supply unit is for supplying control signals to the photodetectors and the signal detecting operation of the signal detecting unit is for detecting the output signals of the photodetectors on each line or each row.

The light-emitting unit emits pulses of light having a predetermined wavelength, and the photodetector unit is having the two-dimensional photodetector array formed by arranging the photodetectors having photosensitivity variable in a positive range through a negative range in a two-dimensional arrangement receives reflected light including at least the pulse of light emitted by the light-emitting unit. The control signal supply unit supplies a control signal for specifying a line or a row and setting a time window to the photodetector unit to adjust the photosensitivity of each photodetector to a predetermined value so as to form a time window. The signal detecting unit detects the output signals of the photodetectors each having the predetermined photosensitivity on each line or each row to detect a desired image. In the meantime, the control unit times the light emitting operation of the light-emitting unit and the control signal supply operation of the control signal supply unit for supplying control signals to the photodetectors, or the signal detecting operation of the signal detecting unit for detecting the output signals of the photodetectors on each line or each row to determine the distance to the object and its projection accurately.

Another preferred object detector comprises a light-emitting unit that emits pulses of light having a predetermined wavelength, a photodetector unit that receives reflected light reflected from an object and including at least the pulse of light emitted by the light-emitting unit, comprising a two-dimensional photodetector array formed by arranging a plurality of photodetectors having photosensitivity variable in a positive range through a negative range in a two-dimensional arrangement, an optical system having a visible radiation absorbing unit that absorbs visible radiation from reflected light reflected from an object toward the photodetector unit, a control signal supply unit that supplies a control signal for controlling the photosensitivity of each photodetector of the photodetector unit, a signal detecting unit that detects the output signals of the photodetectors on each line or each row of the photodetector unit, a storage unit that stores the output detection signal of the signal detecting unit for parallel access, and a control unit that times the light emitting operation of the light-emitting unit, the control signal supply operation of the control signal supply unit for supplying control signals to the photodetectors and the signal detecting operation of the signal detecting unit for detecting the output signals of the photodetectors on each line or each row.

The light-emitting unit emits pulses of light having a predetermined wavelength, and the photodetector unit comprising the two-dimensional photodetector array formed by arranging photodetectors having photosensitivity variable in a positive range through a negative range in a two-dimensional arrangement detects the reflected light including at least the pulse of light emitted by the light-emitting unit. The control signal supply unit supplies a control signal for specifying a line or a row to form a time window to the photodetector unit to adjust the photosensitivity of each photodetector to a predetermined value so as to form a time window. The output signals of the photodetectors each having a predetermined photosensitivity on each line or each row are detected to form a desired image. In the meantime, the control unit times the light emitting operation of the light-emitting unit and the control signal supply operation of the control signal supply unit for supplying control signals to the photodetectors, or the signal detecting operation of the signal detecting unit for detecting the output signals of the photodetectors on each line or each row to determine the distance to the object and its projection accurately. A set information feedback unit receives the output signal of the signal detecting unit and feeds back set information to the control unit, and the control unit decides whether or not the window has been accurately set for the next setting and detecting operations.

Preferably, the object detector is provided with a signal converting unit that converts a parallel signal obtained by detecting only near-infrared radiation in the time window by the signal detecting unit connected in parallel to the lines or the rows of the two-dimensional photodetector array of the photodetector unit into a serial signal.

Another preferred object detector comprises a light-emitting unit that emits pulses of light having a predetermined wavelength, a photodetector unit that receives reflected light reflected from an object and including at least the pulse of light emitted by the light-emitting unit, comprising a two-dimensional photodetector array formed by arranging photodetectors having photosensitivity variable in a positive range through a negative range in a two-dimensional arrangement, and a linear photodetector array formed by arranging a plurality of photodetectors capable of operating at a fixed efficiency, an optical system having a visible radiation absorbing unit or a visible radiation separating unit that absorbs or separates visible radiation from the reflected light reflected from an object toward the photodetector unit to make light other than visible radiation fall on the photodetector unit, a control signal supply unit that supplies a control signal for controlling the photosensitivity of each photodetectors of the two-dimensional photodetector array of the photodetector unit, a first signal detecting unit that detects the output signals of the photodetectors on each line or each row of the two-dimensional photodetector array of the photodetector unit, a second signal detecting unit that detects the output signals of the photodetectors of the linear photodetector array, and a control unit that times the light emitting operation of the light-emitting unit, the control signal supply operation of the control signal supply unit for supplying control signals to the photodetectors, the signal detecting operation of the first signal detecting unit for detecting the output signals of the photodetectors on each line or each row of the two-dimensional photodetector array and the signal detecting operation of the second signal detecting unit for detecting the output signals of the photodetectors of the linear photodetector array.

The light-emitting unit emits pulses of light having a predetermined wavelength, the visible radiation separating unit separates visible radiation from the reflected light reflected from an object and including at least the pulse of light emitted by the light emitting unit, and the linear photodetector array comprising the photodetectors capable of operating at a fixed conversion efficiency detects only near-infrared radiation included in the reflected light. Thus, the distance to the object is determined and the position of the object is estimated. Then, the control signal supply unit supplies a control signal to each of the photodetectors of the two-dimensional photodetector array formed by arranging the photodetector having photosensitivity variable in a positive range through a negative range to adjust the photosensitivity of each photodetector to a predetermined value. Each photodetector having the predetermined photosensitivity of the two-dimensional photodetector array detects the reflected light reflected from the object, the signal detecting unit detects the output signals of the photodetectors on each line or each row to form a desired image. In the meantime, the control unit times the light emitting operation of the light-emitting unit and the control signal supply operation of the control signal supply unit for supplying control signals to the photodetectors, or the signal detecting operation of the signal detecting unit for detecting output signals of the photodetectors on each line or each row to determine the distance to the object and its projection accurately.

Another preferred object detector comprises a light emitting unit that emits pulses of light having a predetermined wavelength, a photodetector unit that receives reflected light reflected from an object and including at least the pulse of light emitted by the light-emitting unit, comprising a two-dimensional photodetector array formed by arranging photodetectors having photosensitivity variable in a positive range through a negative range in a two-dimensional arrangement and a linear photodetector array formed by linearly arranging a plurality of photodetectors capable of operating at a fixed conversion efficiency, an optical system provided with a visible radiation absorbing unit or a visible radiation separating unit that separates light other than visible radiation from the reflected light reflected from the object toward the photodetector unit to make the light other than visible radiation fall on the photodetector unit, a control signal supply unit that supplies a control signal for controlling the photosensitivity of each of the photodetectors of the two-dimensional photodetector array, a first signal detecting unit that detects the output signals of the photodetectors on each line or each row of the two-dimensional photodetector array, a second signal detecting unit that detects the output signal of the linear photodetector array, a control unit that times the light emitting operation of the light-emitting unit, the control signal supply operation of the control signal supply unit for supplying control signals to the photodetectors, the signal detecting operation of the first signal detecting unit for detecting the output signals of the photodetectors on each line or each row of the two-dimensional photodetector array and the signal detecting operation of the second signal detecting unit for detecting the output signals of the photodetectors of the linear photodetector array, and a set information feedback unit that receives the output signals of the signal detecting units and feeds back set information to the control unit.

The light-emitting unit emits pulses of light having a predetermined wavelength, the visible radiation separating unit separates only near-infrared radiation from the reflected light reflected from an object and including at least the pulse of light emitted by the light-emitting unit, and the linear photodetector array of the photodetector unit, formed by linearly arranging photodetectors capable of operating at a fixed conversion efficiency receives only the near-infrared radiation separated from the reflected light.

Thus, the distance to the object is determined and the position of the object is estimated. Then, the control signal supply unit supplies a control signal to each of the photodetectors having photosensitivity variable in a positive range through a negative range of the two-dimensional photodetector array to adjust the photosensitivity of each photodetector to a predetermined value. Then, each of the photodetectors having photosensitivity adjusted to the predetermined value of the two-dimensional array of photodetectors receives the reflected light from the object, the signal detecting unit detects the output signals of the photodetectors on each line or each row of the two-dimensional photodetector array to form a desired image of the object. In the meantime, the control unit times the light emitting operation of the light-emitting unit and the control signal supply operation of the control signal supply unit for supplying control signals to the photodetectors, or the signal detecting operation of the signal detecting unit for detecting the output signals of the photodetectors on each line or each row of the two-dimensional photodetector array to determine the distance to the object and its projection accurately. A set information feedback unit receives the output signal of the signal detecting unit and feeds back set information to the control unit, and the control unit decides whether or not setting operation has been correctly carried out for the next setting and detecting operations. Preferably, the object detector is provided with a signal converting unit that converts the parallel output signal of the signal detecting unit connected in parallel to the lines or the rows of photodetectors of the two-dimensional array of the photodetector unit into a serial signal.

Preferably, the object detector is provided with a switching unit that converts the parallel output signal of the signal detecting unit connected in parallel to the lines or the rows of the two-dimensional photodetector array of the photodetector unit into a serial signal by selective switching and gives the serial signal to a subsequent circuit.

More preferably, the control unit of the object detector sends an optical timing signal to other circuit in synchronism with the light emitting operation of the light-emitting unit.

Preferably, the two-dimensional photodetector array of the photodetector unit and the light-emitting element of the light-emitting unit of the object detector are formed on a single substrate to form the object detector in a compact construction and to enable the projection of pulses of light on an object and the reception of reflected light reflected from the object.

More preferably, the two-dimensional photodetector array of the photodetector unit, the light-emitting element of the light-emitting unit and a vertical resonator are formed on a single substrate to form the object detector in a compact construction and to enable efficient projection of pulses of light on an object and reception of reflected light from the object.

More preferably, the two-dimensional photodetector array of the photodetector unit, the light emitting element of the light-emitting unit, a horizontal resonator and a 45 reflecting mirror are formed on a single substrate to form the object detector in a compact construction and to enable the projection of pulses of light on an object and reception of reflected light from the object.

More preferably, the two-dimensional photodetector array of the photodetector unit, the light-emitting element of the light-emitting unit, a horizontal resonator and a diffraction grating are formed on a single substrate to form the object detector in a compact construction and to enable the projection of pulses of light on an object and the reception of reflected light from the object.

In another preferred object detector, the two-dimensional photodetector array of the photodetector unit and the light-emitting element of the light-emitting unit are fabricated integrally on a single substrate by continuous processes to form the object detector in a compact construction and to enable the projection of pulses of light on an object and the reception of reflected light from the object.

In another preferred object detector, the two-dimensional photodetector array of the photodetector unit and the light-emitting element of the light-emitting unit are formed respectively on the opposite major surface of a single substrate to form the object detector in a compact construction and to enable the projection of pulses of light on an object and the reception of reflected light from the object.

In another preferred object detector, the two-dimensional photodetector array of the photodetector unit and the light-emitting element of the light-emitting unit differing from each other in material system are formed integrally on a single substrate to form the object detector in a compact construction and to enable the projection of pulses of light on an object and the reception of reflected light from the object.

In another preferred object detector, the two-dimensional photodetector array of the photodetector unit, and the light-emitting element of the light-emitting unit are formed respectively on separate substrates, and then the separate substrates are put and bonded together in a single substrate for integration to form the object detector in a compact construction and to enable the projection of pulses of light on an object and the reception of reflected light from the object.

In another preferred object detector, the two-dimensional photodetector array of the photodetector unit, the light-emitting element of the light-emitting unit and a driving integrated circuit are fabricated on a single substrate to form the object detector in a compact construction and to enable the projection of pulses of light on an object and the reception of reflected light from the object.

In another preferred object detector, the two-dimensional photodetector array of the photodetector unit, the light-emitting element of the light emitting unit and a driving power supply capable of amplitude modulation are formed on a single substrate to form the object detector in a compact construction and to enable the efficient projection of pulses of amplitude-modulated light on an object and the efficient reception of reflected light from the object.

In another preferred object detector, the two-dimensional photodetector array of the photodetector unit, the light-emitting element of the light-emitting unit and an optical spatial modulator capable of amplitude modulation are fabricated on a single substrate to form the object detector in a compact construction and to enable the efficient projection of pulses of amplitude-modulated light on an object and the efficient reception of reflected light from the object.

In another preferred object detector the two-dimensional photodetector array of the photodetector unit, the light-emitting element of the light-emitting unit, and a diffraction lens or a gradient index lens are fabricated on a single substrate to form the object detector in a compact construction and to enable the projection of pulses of light on an object and the reception of reflected light from the object.

In another preferred object detector, the two-dimensional photodetector array, a wavelength-selective filter and the light-emitting element of the light-emitting unit are fabricated on a single substrate to form the object detector in a compact construction and to enable the projection of pulses of light on an object and the reception of reflected light from the object.

In another preferred object detector, the light-emitting element of the light-emitting unit is formed on the two-dimensional photodetector array of the photodetector unit to form the object detector in a compact construction and to enable the projection of pulses of light on an object and the reception of reflected light from the object.

Another preferred object detector comprises a photodetector unit having a two-dimensional photodetector array formed by arranging a plurality of photodetectors having photosensitivity variable in a positive range through a negative range in a two-dimensional arrangement and provided with a lens, a control voltage applying circuit that applies a control voltage to the photodetectors on each line of the two-dimensional photodetector array of the photodetector unit, a signal detecting unit that detects the output signals of the photodetectors on each line of the two-dimensional photodetector array of the photodetector unit, a light emitting unit that emits light of a predetermined wavelength to be projected on an object, and an optical scanning unit that projects the light emitted by the light-emitting unit in a scanning light beam.

The light-emitting unit emits light having a predetermined wavelength, the optical scanning unit projects the light emitted by the light-emitting unit on an object in a scanning light beam, the photodetectors having photosensitivity variable in a positive range through a negative range of the two-dimensional photodetector array receive the reflected light through the lens, and the output signals of the photodetectors on each line of the two-dimensional photodetector array are detected.

In another preferred object detector, one of the depletion layers formed substantially symmetrically in a light-absorptive semiconductor substrate expands relative to the other when a positive or negative control voltage is applied to the first electrode of each photodetector of the two-dimensional photodetector array and, consequently, light-induced charges induced by the light fallen on the depletion layers drift toward either of the depletion layers according to the expansion ratio and a positive or negative photocurrent appears on the second electrode. When any control voltage is not applied to the first electrode, namely, when the control voltage is zero, no photocurrent flows through the second electrode because the depletion layers are symmetrical and, therefore, the photosensitivity of the photodetector is zero. Thus, the photosensitivity of the photodetector can be varied in a positive range through a negative range by varying the control voltage in a positive voltage through a negative voltage range.

To achieve the fourth object, the present invention provides an object detecting procedure comprising determining the photosensitivity of each of the photodetectors of a photodetector unit, receiving reflected light by the photodetectors each having a set photosensitivity of the photodetector unit, and obtaining image data by processing the output signals of the photodetector unit provided upon the reception of the reflected light.

Another preferred object detecting procedure comprises determining the photosensitivity of each photodetector of the photodetector unit, forming a spatial window in the photodetector unit having the photodetectors each having the set photosensitivity so as to contain an image of a desired object, receiving reflected light reflected from the object by the photodetector unit, detecting the output signals of the photodetector unit in a range corresponding to the spatial window to obtain image data of the object.

Another preferred object detecting procedure comprises emitting near-infrared pulses by a light-emitting unit, receiving the reflected pulse of near-infrared light reflected from an object by a photodetector unit, and determining the coordinates of the object and the time difference between the emission of a pulse of the near-infrared light and the reception of the same reflected from the object on the basis of the output signals of the photodetector unit.

Another preferred object detecting procedure comprises emitting near-infrared pulses by a light-emitting unit, receiving the reflected pulse of near-infrared light emitted by the light-emitting unit and reflected from an object, determining the coordinates of the object and the time difference between the emission of a pulse of near-infrared light and the reception of the reflected pulse of near-infrared light reflected from an object, setting a spatial window in the photodetector unit on the basis of the coordinates of the object so as to contain an image of the object in an image of the field to obtain optical image data on the basis of the output signals of the photodetector unit corresponding to the set spatial window.

Another preferred object detecting procedure comprises emitting near-infrared pulses by a light-emitting unit, receiving the reflected pulse of near-infrared light reflected from an object by a photodetector unit, determining the coordinates of the object and the time difference between the emission of a pulse of near-infrared light and the reception of the reflected pulse of near-infrared light from the object on the basis of the output signals of the light-receiving unit, setting a spatial window in the photodetector unit on the basis of the coordinates of the object so as to contain an image of the object in an image of the field, obtaining optical image data on the basis of the output signals of the photodetector unit in the set spatial window, and processing the optical image data.

Another preferred object detecting procedure comprises emitting near-infrared pulses by a light-emitting unit, receiving the reflected pulse of near-infrared light reflected from an object by a photodetector unit, determining the coordinates of the object and the time difference between the emission of a pulse of near-infrared light and the reception of the reflected pulse of near-infrared light on the basis of the output signals of the photodetector unit, setting a spatial window in the photodetector unit on the basis of the coordinates of the object so as to contain an image of the object in an image of the field, obtaining optical image data on the basis of the output signals of the photodetector unit in the set spatial window, and detecting a projection of the desired object on the basis of the optical image data.

Preferably, the photodetector unit provides output signals in a step of the object detecting procedure, and then the object detecting procedure returns to an earlier step to set a spatial window again on the basis of the output signals of the photodetector unit to form an accurate image.

Another preferred object detecting procedure comprises emitting near-infrared pulses by a light-emitting unit, setting a spatial window in a photodetector unit so as to contain an image of an object in a image of the field, and obtaining optical image data by processing the output signals of the photodetector unit corresponding to the reflected pulse of near-infrared light reflected from the object and falling on part of the photodetector unit corresponding to the spatial window.

Another preferred object detecting procedure comprises emitting near-infrared pulses by a light-emitting unit, receiving the reflected pulse of near-infrared light reflected from an object by a photodetector unit, determining the coordinates of the object and the time difference between the emission of a pulse of near-infrared light and the reception of the reflected pulse of near-infrared light on the basis of the output signals of the photodetector unit, setting a spatial window for the light receiving unit on the basis of the coordinates of the object so as to contain an image of the object in an image of the field, and obtaining optical image data on the basis of the output signals of the photodetector unit corresponding to the reflected pulse of near-infrared light reflected from the object and falling on part of the light receiving unit corresponding to the spatial window.

Another preferred object detecting procedure comprises emitting near-infrared pulses by a light-emitting unit, receiving the reflected pulse of near-infrared light reflected from an object by a photodetector unit, determining the coordinates of the object and the time difference between the emission of a pulse of near-infrared light and the reception of the reflected pulse of near-infrared light on the basis of the output signals of the photodetector unit, setting a spatial window in the photodetector unit on the basis of the coordinates of the object so as to contain an image of the object in an image of the field, obtaining optical image data on the basis of the output signals of the photodetector unit corresponding to the reflected pulse of near-infrared light reflected from the object and falling on part of the photodetector unit corresponding to the spatial window, and processing the optical image data.

Another preferred object detecting procedure comprises emitting near-infrared pulses by a light-emitting unit, receiving the reflected pulse of near-infrared light reflected from an object by a photodetector unit, determining the coordinates of the object and the time interval between the emission of a pulse of near-infrared light and the reception of the reflected pulse of near-infrared light on the basis of the output signals of the photodetector unit, setting a spatial window in the photodetector unit on the basis of the coordinates of the object so as to contain an image of the object in an image of the field, obtaining optical image data on the basis of the output signals of the photodetector unit corresponding to the reflected pulse of near-infrared light reflected from the object and falling on part of the photodetector unit corresponding to the spatial window, and detecting a projection of the desired object on the basis of the optical image data.

Preferably, the photodetector unit receives the reflected pulse of near-infrared light in a step of the object detecting procedure, and the object detecting procedure returns to an earlier step to set a spatial window again on the basis of the output signals of the photodetector unit to obtain accurate image data.

Preferably, the object detecting procedure measures coordinates with respect to two directions by the photodetector unit to detect the coordinates of the object and the distance to the object.

Another preferred object detecting procedure comprises emitting near-infrared pulses by a light-emitting unit, receiving the reflected pulse of near-infrared light emitted by the light-emitting unit and reflected from an object by a linear photodetector array included in a photodetector unit, determining the coordinates of the object and the time interval between the emission of a pulse of near-infrared light and the reception of the reflected pulse of near-infrared light reflected from the object on the basis of the output signal of the linear photodetector array, setting a spatial window for a two-dimensional photodetector array included in the photodetector unit on the basis of the coordinates of the object so as to contain an image of the object in an image of the field, receiving reflected light reflected from the object by the two-dimensional photodetector array, and obtaining optical image data on the basis of the output signal of the two-dimensional photodetector array corresponding to reflected light falling in part of the two-dimensional photodetector array corresponding to the spatial window.

Another preferred object detecting procedure comprises emitting near-infrared pulses by a light-emitting unit, receiving the reflected pulse of near-infrared light emitted by the light-emitting unit and reflected from an object by a linear photodetector array included in a photodetector unit, determining the coordinates of the object and the time interval between the emission of a pulse of near-infrared light and the reception of the reflected pulse of near-infrared light on the basis of the output signal of the linear photodetector array, setting a spatial window in a two-dimensional photodetector array included in the light-receiving unit on the basis of the coordinates of the object so as to contain an image of the object in an image of the field, receiving reflected light by the two-dimensional photodetector array, obtaining optical image data on the basis of the output signals of the two-dimensional photodetector array corresponding to reflected light falling on part of the two-dimensional photodetector array corresponding to the spatial window, and processing the optical image data.

Another preferred object detecting procedure comprises emitting near-infrared pulses, receiving the reflected pulse of near-infrared light emitted by the light-emitting unit and reflected from an object by a linear photodetector array included in a photodetector unit, determining the coordinates of the object and the time interval between the emission of a pulse of near-infrared light and the reception of the reflected pulse of near-infrared light on the basis of the output signals of the linear photodetector array, setting a spatial window in a two-dimensional photodetector array included in the photodetector unit on the basis of the coordinates of the object so as to contain an image of the object in an object of the field, receiving reflected light by the two-dimensional photodetector array, obtaining optical image data on the basis of the output signals of the two-dimensional photodetector array corresponding reflected light falling on part of the two-dimensional photodetector array corresponding to the spatial window, and detecting a projection of the desired object on the basis of the optical image data.

Preferably, the photodetector unit receives reflected light in a step of the object detecting procedure, and then the object detecting procedure returns to an earlier step to set a spatial window again on the basis of the output signal of the photodetector unit to obtain accurate image data.

Preferably, the combination of the lines or the rows of the two-dimensional photodetector array to make access to the two-dimensional photodetector array for detecting image data provided by the two-dimensional photodetector array is variable to enable optimum access to the two-dimensional photodetector array according to the desired object.

Preferably, windows are formed for coordinates with respect to an x-axis of a plurality of objects detected by processing reflected near-infrared pulses in the increasing order or decreasing order of the coordinates.

Preferably, windows are formed for a plurality of objects detected by processing reflected near-infrared pulses in order according to a prescribed rule.

The above and other objects of the present invention will become more apparent from the following description taken in connection with the accompanying drawings and the novelty of the present invention stated in the scope of appended claims.

BRIEF DESCRIPTION OF THE DRAWINGS

FIG. 42 is a circuit diagram of a y-direction circuit included in the object detector of FIG. 39;

FIGS. 44(a) and 44(b) are diagrammatic views of assistance in explaining a window setting method to be carried out by the object detector of FIG. 39;

FIGS. 45(a) and 45(b) are schematic sectional views of photodetectors applicable to the object detector of FIG. 39

FIG. 46 is a schematic sectional view of a photodetector applicable to the object detector of FIG. 39;

FIG. 47 is a schematic sectional view of a photodetector applicable to the object detector of FIG. 39;

FIG. 48 is a schematic sectional view of a photodetector applicable to the object detector of FIG. 39;

FIG. 56 is a flow chart of an object detecting procedure in a preferred embodiment according to the present invention;

FIGS. 57(a) and 57(b) are pictorial views of assistance in explaining a pattern matching procedure included in the object detecting procedure explained with reference to FIG. 56;

FIG. 59 is a diagrammatic view of assistance in explaining a procedure for setting a window and a control voltage to be carried out by the object detector of FIG. 58;

FIG. 60 is a flow chart of an object detecting procedure in a preferred embodiment according to the present invention;

FIG. 62 is a diagrammatic view of assistance in explaining a procedure for projecting the interior of a window, included in the object detecting procedure of FIG. 61;

FIGS. 63(a), 63(b) and 63(c) are diagrammatic views of assistance in explaining a procedure for classifying objects by shape, included in the object detecting procedure of FIG. 61;

FIG. 120 is a flow chart of an object detecting procedure in a preferred embodiment according to the present invention;

FIG. 121 is a block diagram of an essential part of an object detector in a preferred embodiment according to the present invention;

FIG. 122 is a perspective view of an essential part of an object detector in a preferred embodiment according to the present invention;

FIG. 123 is a block diagram of the object detector of FIG. 122;

FIG. 124 is a side view of an essential part of the object detector of FIG. 122;

FIG. 125 is a perspective view of an essential part of an object detector in a preferred embodiment according to the present invention;

FIG. 126 is a perspective view of an essential part of an object detector in a preferred embodiment according to the present invention;

FIG. 127 is a perspective view of an essential part of an object detector in a preferred embodiment according to the present invention;

FIG. 128 is a perspective view of an essential part of an object detector in a preferred embodiment according to the present invention;

FIG. 129 is a perspective view of an essential part of an object detector in a preferred embodiment according to the present invention;

FIG. 130 is a perspective view of an essential part of an object detector in a preferred embodiment according to the present invention;

FIG. 131 is a diagrammatic view of assistance in explaining an object detector in a preferred embodiment according to the present invention;

Figure 131:
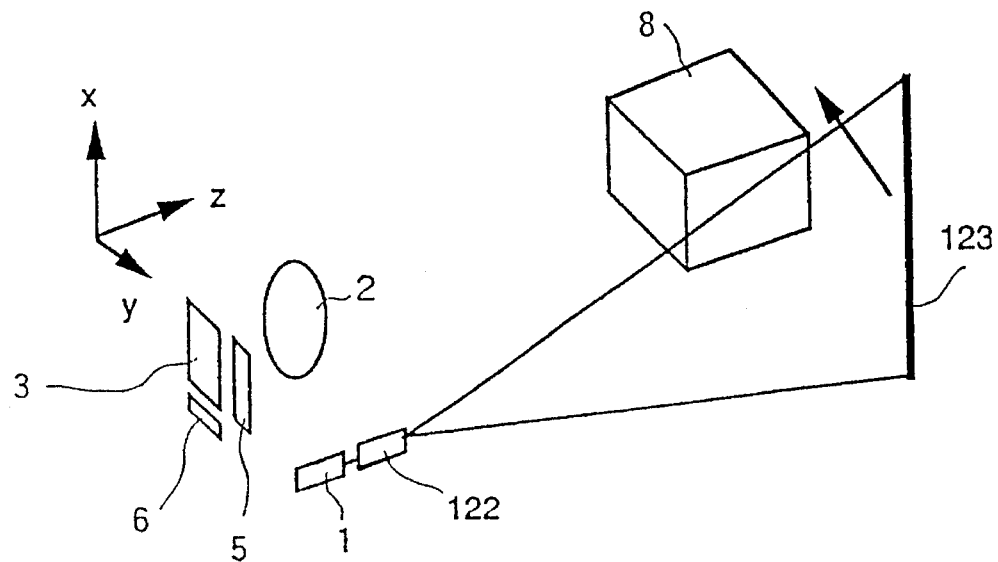
Figure 132:
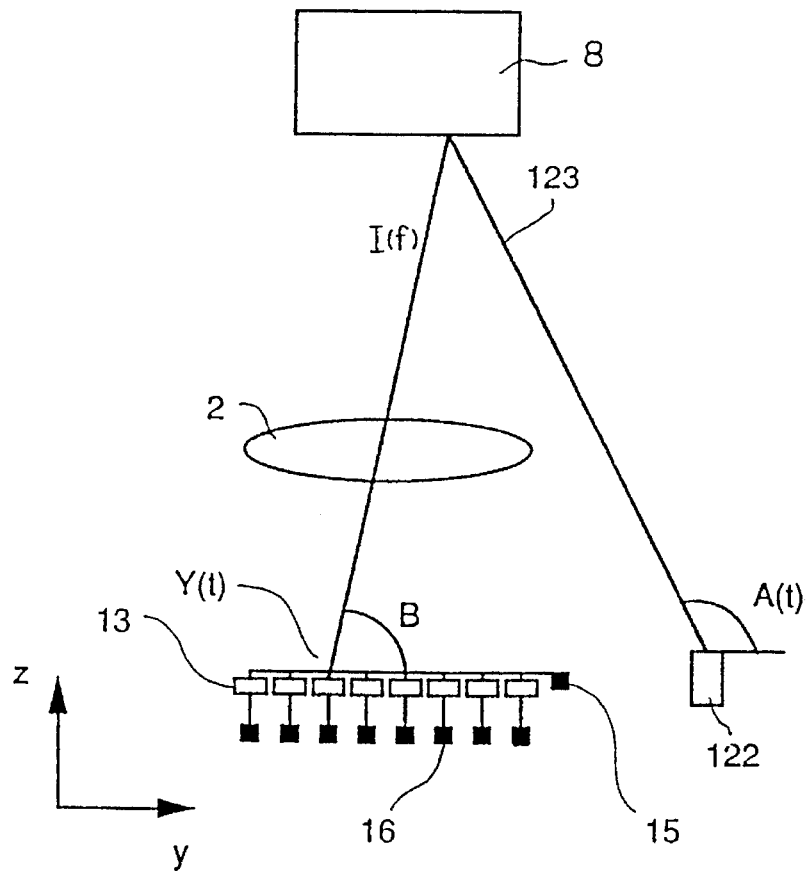
Figure 133:
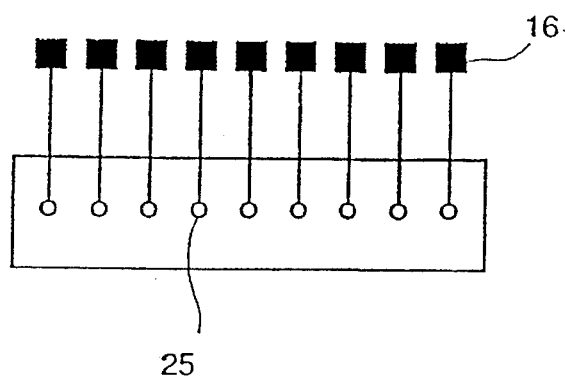
Figure 134:
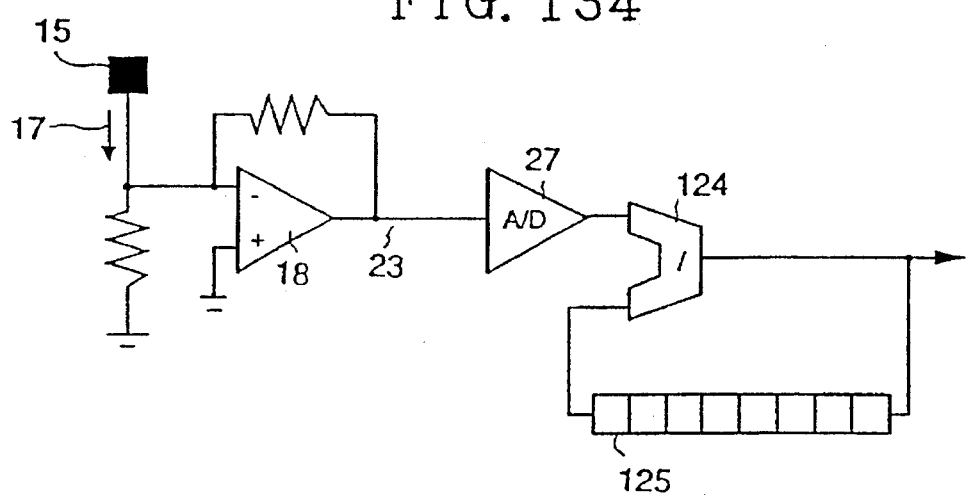
Figure 135A:
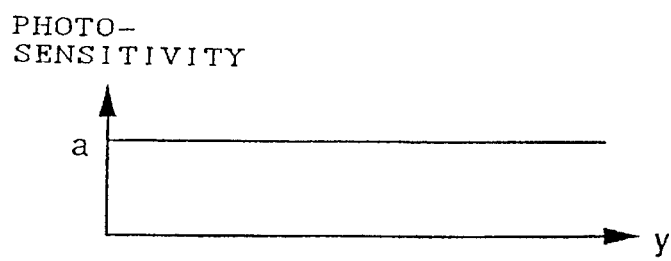
Figure 135B:
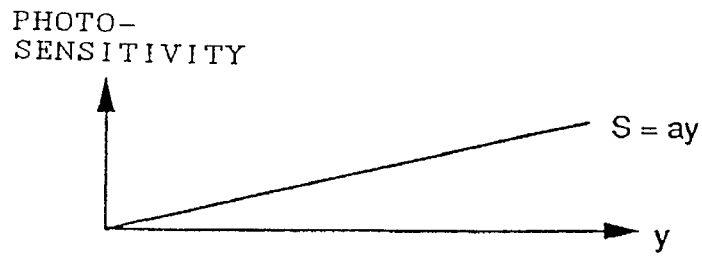

FIG. 132 is a schematic plan view of assistance in explaining an object detecting procedure to be carried out by the object detector of FIG. 131;

FIG. 133 is a diagrammatic view of a y-direction circuit included in the object detector of FIG. 131;

FIG. 134 is a circuit diagram of one channel of an x-direction circuit included in the object detector of FIG. 131; and FIGS. 135(a) and 135(b) are diagrams showing a sensitivity vector dealt with by the object detector of FIG. 131.

DETAILED DESCRIPTION OF THE PREFERRED EMBODIMENTS

Figure 4:
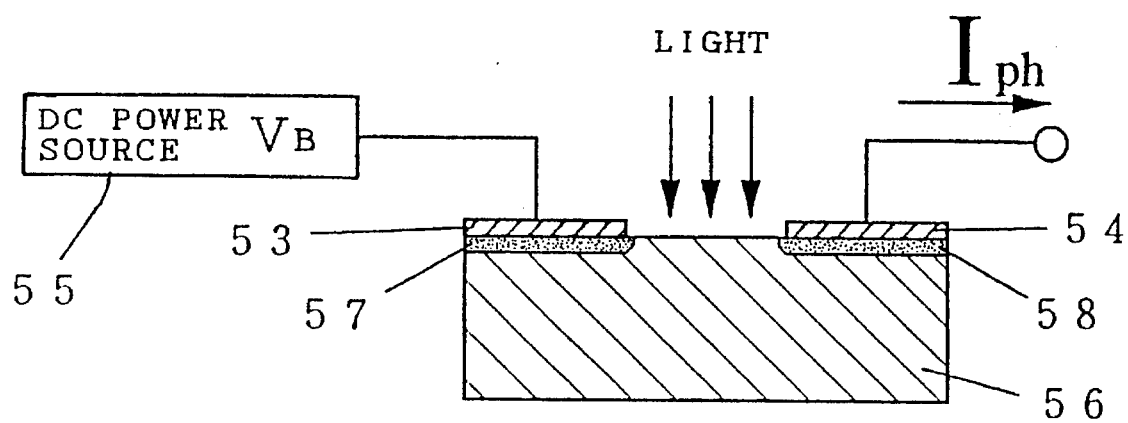
FIG. 4 is a sectional view of a photodetector in a preferred embodiment according to the present invention.
Figure 5:
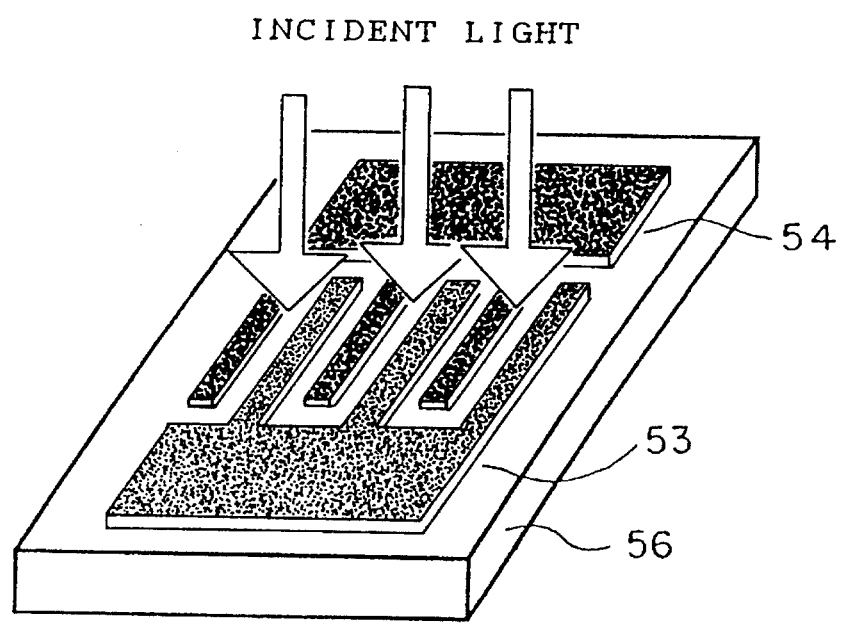
FIG. 5 is a perspective view of a photodetector of FIG. 4.

Referring to FIG. 4 showing a photodetector in a preferred embodiment according to the present invention, a semiconductor substrate 56 is formed of a semiconductor that absorbs light and induces photoelectrons, such as GaAs (gallium-arsenic), AlGaAs (aluminum-gallium-arsenic), InGaAs (indium-gallium-Arsenic), Si (silicon), a-Si (amorphous silicon) or the like. A first electrode 53 and a second electrode 54 of aluminum or the like are formed symmetrically on the surface of the semiconductor substrate 56 in a metal-semiconductor junction to form depletion layers 57 and 58 symmetrically in the surface of the semiconductor substrate 56. The first electrode 53 serves as a control electrode to which is applied a control voltage $V_B$ for adjusting the depth of the depletion layers 57 and 58, and the second electrode 54 serves as an output electrode through which a photocurrent $I_{ph}$ induced in the depletion layers 57 and 58 formed on the semiconductor substrate 56 according to the control voltage $V_B$ is provided. For example, the electrodes 53 and 54 are formed in the shape of a comb on the surface of the semiconductor substrate 56 so that portions thereof corresponding to the teeth of the comb extend alternately at fixed intervals as shown in FIG. 5. In some cases, the electrodes 53 and 54 are formed in a thickness that allows part of light falling on the electrodes 53 and 54 is able to penetrate through the electrodes 53 and 54 and reach the depletion layers 57 and 58 underlying the electrodes 53 and 54. A dc power source applies the control voltage $V_B$ variable in a positive voltage range through a negative voltage range to the control electrode 53.

In operation, the dc power source 55 is adjusted to set the control voltage $V_B$, whereby the depth of the depletion layers 57 and 58 is adjusted to determine the sensitivity of the photodetector. For example, when the control voltage $V_B$ is zero volts, the depletion layers 57 and 58 having the same depth are formed in regions of the surface of the semiconductor substrate underlying the first electrode 53 and the second electrode 54 as shown in FIG. 4. When light fall on the photodetector along a direction perpendicular to the surface of the photodetector with the control voltage $V_B$ applied to the first electrode 53, charges induced near the depletion layers 57 and 58 are unable to drift beyond potential barriers at the metal-semiconductor junctions, and charges induced in other regions are cancelled because the photodetector has a symmetrical configuration and, consequently, the output photocurrent $I_{ph}$ at the second electrode 54 is zero.

When a positive control voltage $V_B$ is applied to the control electrode 53, the energy gap between the control electrode 53 and the semiconductor substrate 56 is reduced and the energy gap between the output electrode 54 and the semiconductor substrate 56 is increased. Consequently, the depth of the depletion layer 58 underlying the output electrode 54 becomes greater than the depth of the depletion layer 57 underlying the control electrode 53. When light falls on the photodetector in this state, charges induced near the depletion layer 58 is caused to drift by the potential difference between the electrodes 53 and 54, and a positive output photocurrent $I_{ph}$ appears on the second electrode 54. In this case, charges produced within the depletion layer 58 and in regions within the diffusion length of the depletion layer 58 contributes to producing the photocurrent $I_{ph}$. Since the depth of the depletion layer 58 is dependent on the control voltage $V_B$, the intensity of the output photocurrent $I_{ph}$ is dependent on the control voltage $V_B$.

When a negative control voltage $V_B$ is applied to the control electrode 53, the depth of the depletion layer 57 underlying the control electrode 53 is greater than the depth of the depletion layer 58 underlying the output electrode 54 and, similarly, a negative output photocurrent $I_{ph}$, the intensity of which is dependent on the control voltage $V_B$ is produced. Thus, the output photocurrent $I_{ph}$ of the variable-sensitivity photodetector shown in FIG. 4 is variable in a positive range through a negative range according to the control voltage $V_B$; that is, the sensitivity of the photodetector is continuously variable in a positive range through a negative range. When the electrodes 53 and 54 are comparatively thin, the incident light is able to reach the depletion layers 57 and 58 covered respectively with the electrodes 53 and 54, so that the photodetector has an increased light utilization factor and an enhanced sensitivity.

Figure 6:
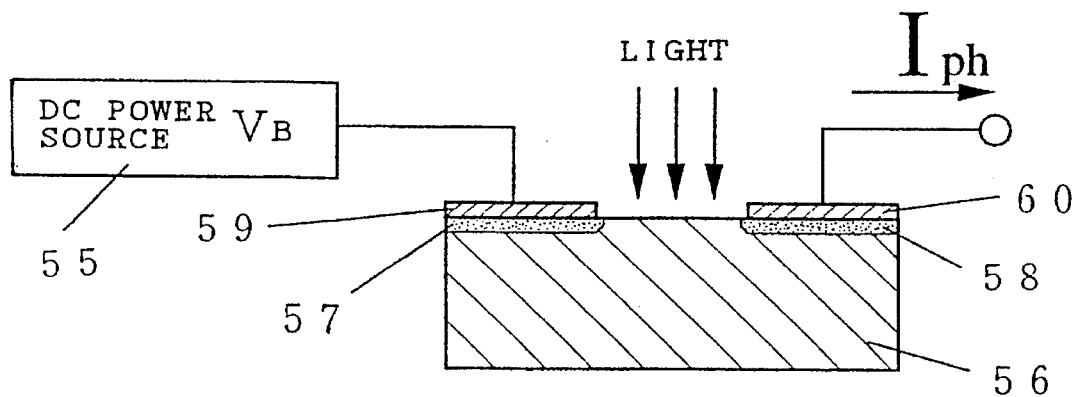
FIG. 6 is a sectional view of a photodetector in a preferred embodiment according to the present invention.

Referring to FIG. 6 showing a photodetector in another preferred embodiment according to the present invention, in which parts like or corresponding to those of the photodetector shown in FIG. 4 are denoted by the same reference characters, a first electrode 59 and a second electrode 60 are formed symmetrically on the surface of a semiconductor substrate 56 in metal-semiconductor junctions. The first electrode 59 is a transparent electrode formed of polycrystalline silicon or the like and serving as a control electrode, and the second electrode 60 is a transparent electrode formed of polycrystalline silicon and serving as an output electrode. The transparent electrodes may be formed of $SnO_2$ (stannic oxide) or ITO (indium tin oxide).

The operation of the photodetector will be described hereinafter. The dc power source 55 is adjusted to set the control voltage $V_B$ to adjust the sensitivity of the photodetector. When the control voltage $V_B$ is zero volts, depletion layers 57 and 58 having the same depth are formed symmetrically and hence no output photocurrent appears on the second electrode 60. When the control voltage $V_B$ is a negative voltage, the depletion layer 58 expands according to the positive voltage, and a positive photocurrent corresponding to the intensity of the incident light appears on the second electrode 60. When the control voltage $V_B$ is a negative voltage, the depletion layer 57 expands according to the negative voltage and a negative photocurrent of an intensity corresponding to the intensity of the incident light appears on the second electrode 60. Since the first electrode 59 and the second electrode 60 are transparent, the intensity of incident light that reaches the depletion layers 57 and 58 is greater than that of incident light that reaches the depletion layers 57 and 58 of the photodetector shown in FIG. 4, so that the photodetector has an increased light utilization factor and an enhanced sensitivity.

Figure 7:
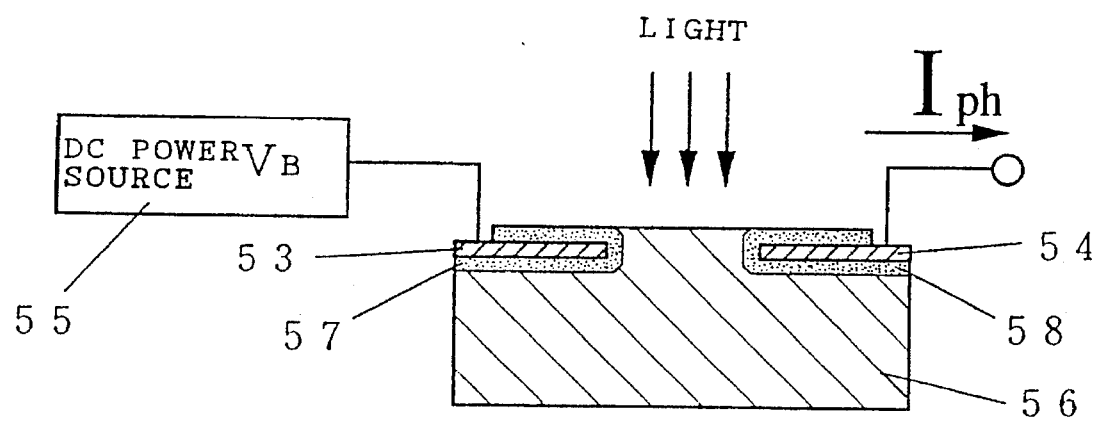
FIG. 7 is a sectional view of a photodetector in a preferred embodiment according to the present invention.

FIG. 7 shows a photodetector in a preferred embodiment according to the present invention, in which parts like or corresponding to those of the photodetector shown in FIG. 4 are denoted by the same reference characters. The photodetector shown in FIG. 7 differs from that shown in FIG. 4 in that electrodes 53 and 54 thereof are embedded in a symmetrical arrangement in a semiconductor substrate 56 so as to form metal-semiconductor junctions. When fabricating this photodetector, the metal electrodes 53 and 54 are formed on the surface of the semiconductor substrate 56, and then a layer of the semiconductor material forming the semiconductor substrate 56 is deposited so as to coat the electrodes 53 and 54. Thus, depletion layers 57 and 58 surround the electrodes 53 and 54, respectively, as shown in FIG. 7. The electrodes 53 and 54 of this photodetector, similarly to those of the photodetector shown in FIG. 4, are semitransparent.

The depletion layers 57 and 58 surround the electrodes 53 and 54, respectively, namely, the depletion layers 57 and 58 overlie and underlie the electrodes 53 and 54, so that the depletion layers 57 and 58 are illuminated efficiently with the incident light. Accordingly, the photodetector has an increased light utilization factor and an enhanced sensitivity.

The electrodes 53 and 54 embedded in the semiconductor substrate 56 may be transparent similarly to those of the photodetector shown in FIG. 6 or may be opaque.

Figure 8:
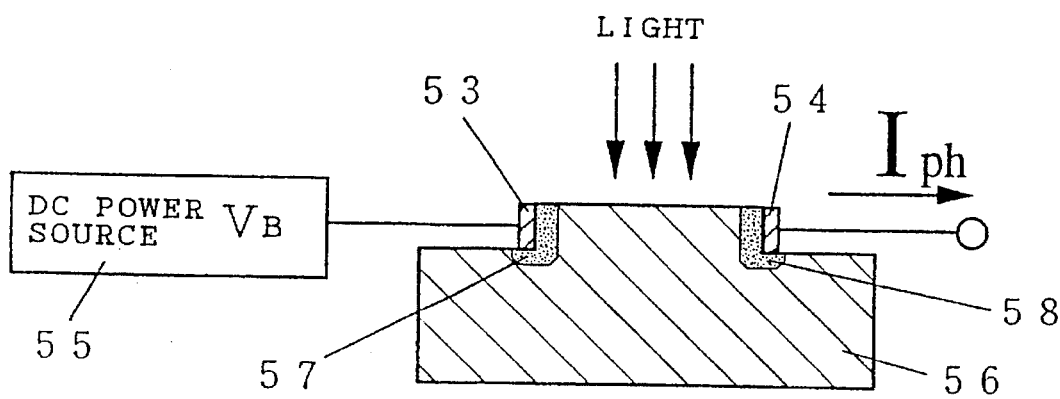
FIG. 8 is a sectional view of a photodetector in a preferred embodiment according to the present invention.

FIG. 8 shows a photodetector in a preferred embodiment according to the present invention. This photodetector is formed in a mesa construction, which is different from the planar constructions of the photodetectors shown in FIGS. 4 to 7, and employs a semiconductor substrate 56 having a central mesa. Electrodes 53 and 54 are formed over the opposite side surfaces of the mesa of the semiconductor substrate 56 so as to form metal-semiconductor junctions.

Since the electrodes 53 and 54 are formed over the side surfaces of the mesa of the semiconductor substrate 56, uniform, deep depletion layers 57 and 58 are formed in the side surfaces of the mesa and the depletion layers 57 and 58 are illuminated efficiently. Accordingly, the photodetector has an increased light utilization factor and an enhanced sensitivity.

Figure 9:
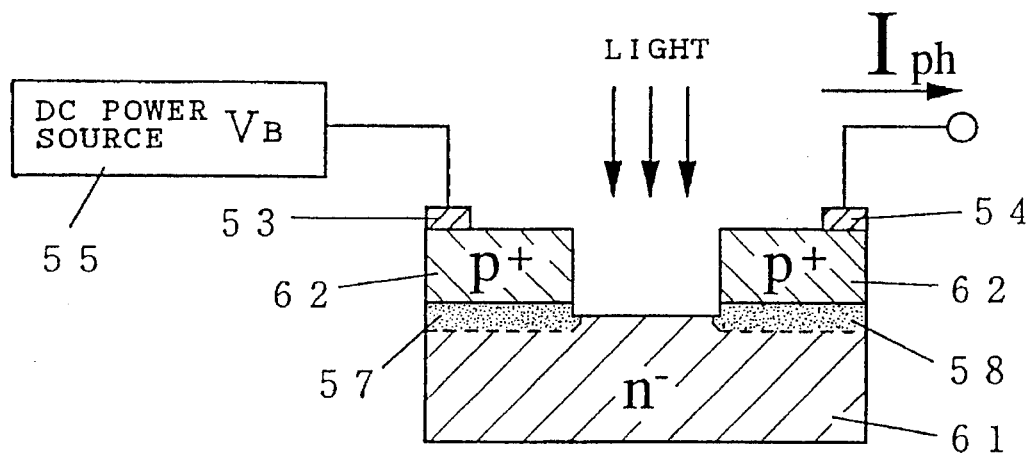
FIG. 9 is a sectional view of a photodetector in a preferred embodiment according to the present invention.

FIG. 9 shows a photodetector in a preferred embodiment according to the present invention employing a semiconductor substrate 56 consisting of an $n^-$-type semiconductor layer (hereinafter referred to simply as "$n^-$-type layer") 61 and two $p^+$-type semiconductor layers (hereinafter referred to simply as "$p^+$-type layers") 62. A first electrode 53 and a second electrode 54 are formed in ohmic contact on the surfaces of the $p^+$-type layers 62, respectively. The layers 61 and 62 are formed of the same light-absorptive semiconductor, such as GaAs (gallium-arsenic), AlGaAs (aluminum-gallium-arsenic), InGaAs (indium-gallium-arsenic), Si (silicon) or a-Si (amorphous silicon). The two $p^+$-type layers 62 are formed a predetermined distance apart from each other on the $n^-$-type layer 61 by an epitaxial growth process or the like. Depletion layers 57 and 58 are formed in the pn junctions. The area of the electrodes 53 and 54 is smaller than the area of the surfaces of the $p^+$-type layers 62.

The control voltage $V_B$ to be applied to the first electrode 53 is adjusted to adjust the sensitivity of the photodetector. When the control voltage $V_B$ is zero volts, the depletion layers 57 and 58 are formed symmetrically between the $n^-$-type layer 61 and the $p^+$-type layers 62 in the same depth and hence no photocurrent appears on the second electrode 54. When the control voltage $V_B$ applied to the first electrode 53 is a positive voltage, the depletion layer 58 expands according to the control voltage $V_B$ and a positive photocurrent corresponding to the intensity of the incident light appears at the second electrode 54. When the control voltage $V_B$ applied to the first electrode 53 is a negative voltage, the depletion layer 57 expands according to the control voltage $V_B$ and a negative photocurrent corresponding to the intensity of the incident light appears at the second electrode 54. Since the conductivity of the $p^+$-type layers 62 is higher than that of the $n^-$-type layer 61, the $p^+$-type layers 62 need not be covered entirely with the electrodes 53 and 54, respectively, for the output photocurrent $I_{ph}$. Since the area of the electrodes 53 and 54 are smaller than that of the surfaces of the $p^+$-type layers 62, the incident light penetrates the $p^+$-type layers 62 through the exposed areas of the surfaces of the $p^+$-type layers 62 and falls on the depletion layers 57 and 58. Accordingly, the photodetector has an increased light utilization factor and an enhanced sensitivity.

The $n^-$-type layer 61 and the $p^+$-type layers 62 may be replaced with a $p^+$-type layer and $n^-$-type layers, respectively.

Figure 10:
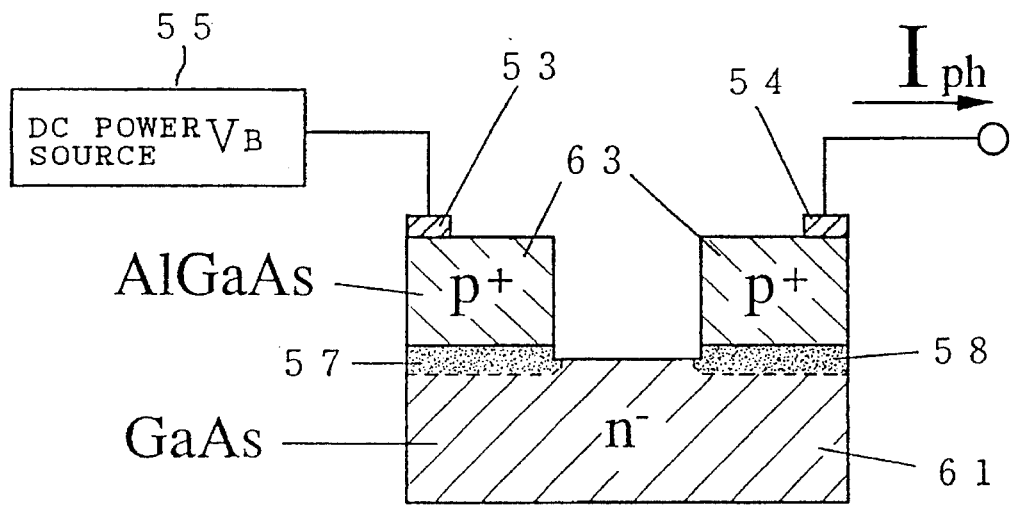
FIG. 10 is a sectional view of a photodetector in a preferred embodiment according to the present invention.

FIG. 10 shows a photodetector in a preferred embodiment according to the present invention employing a semiconductor substrate 56 consisting of an $n^-$-type layer 61 and two $p^+$-type layers 63 formed of a semiconductor having a band gap wider than that of a semiconductor forming the $n^-$-type layer 61. That is, the $n^-$-type layer 61 and the $p^+$-type layers 63 differ from each other in absorption band. In this embodiment, the $p^+$-type layers 63 are formed of, for example, AlGaAs, and the $n^-$-type layer 61 is formed of, for example, GaAs.

When light having a wavelength that is not absorbed by the $p^+$-type layers 63 and absorbed only by the $n^-$-type layer 61 fall perpendicularly on the surface of the photodetector thus formed, the incident light reaches the depletion layers 57 and 58 without being attenuated. Accordingly, the photodetector has an enhanced sensitivity.

Figure 11:
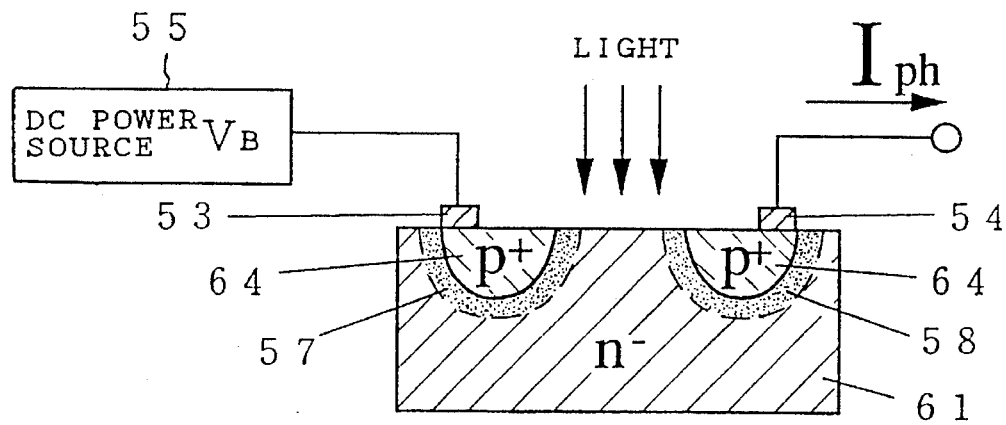
FIG. 11 is a sectional view of a photodetector in a preferred embodiment according to the present invention.

Referring now to FIG. 11 showing a photodetector in a preferred embodiment according to the present invention having a planar construction, two $p^+$-type layers 64 are formed symmetrically in the surface of an $n^-$-type layer 61 by introducing a p-type impurity into the surface of the $n^-$-type layer 61 by ion implantation or diffusion. The surfaces of the $p^+$-type layers 64 are flush with the surface of the $n^-$-type layer 61. Electrodes 53 and 54 are formed on the surfaces of the $p^+$-type layers 64 in ohmic contact.

Since the exposed surfaces of the $p^+$-type layers 64 are flush with the surface of the $n^-$-type layer 61, and depletion layers 57 and 58 are formed near the surface of the $n^-$-type layer 61, the incident light can easily fall on the depletion layers 57 and 58. Accordingly, the photodetector has an enhanced sensitivity. The photodetector having a planar construction is suitable for mass production.

Figure 12:
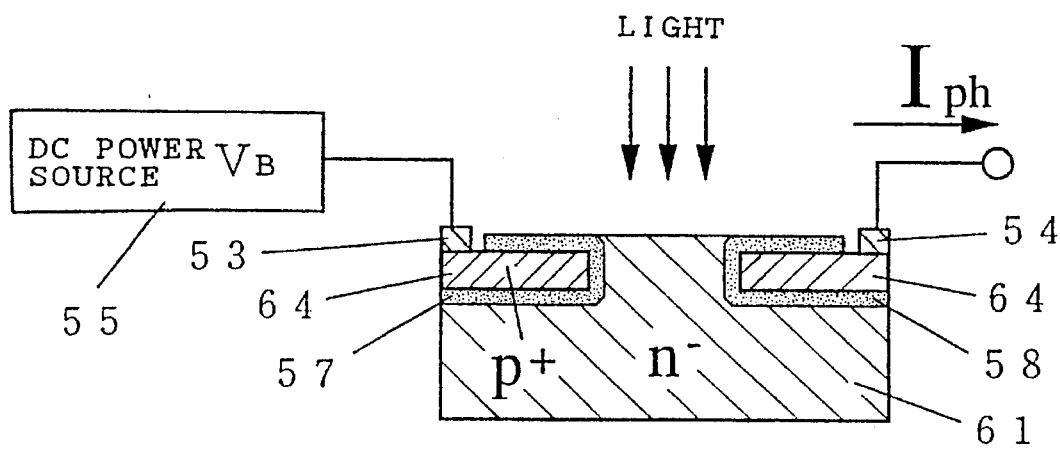
FIG. 12 is a sectional view of a photodetector in a preferred embodiment according to the present invention.

FIG. 12 shows a photodetector in a preferred embodiment according to the present invention having two $p^+$-type layers (second semiconductor layers) 64 embedded in a $n^-$-type layer 61. When fabricating this photodetector, the $p^+$-type layers 64 are formed in the surface of the $n^-$-type layer 61 by ion implantation or diffusion, and then a layer of the same material as that forming the $n^-$-type layer 61 is deposited so as to cover the $p^+$-type layers 64 leaving areas in the surfaces of the $p^+$-type layers 64 for electrodes 53 and 54.

Since depletion layers 57 and 58 are formed so as to surround the $p^+$-type layers 64, the depletion layers 57 and 58 are illuminated efficiently. Accordingly, the photodetector has an increased light utilizing factor and an enhanced sensitivity.

The $n^-$-type layer 61 and the two $p^+$-type layers 64 of each of the photodetectors shown in FIGS. 11 and 12 may be replaced with a $p^+$-type layer and two $n^-$-type layers, respectively.

Figure 13:
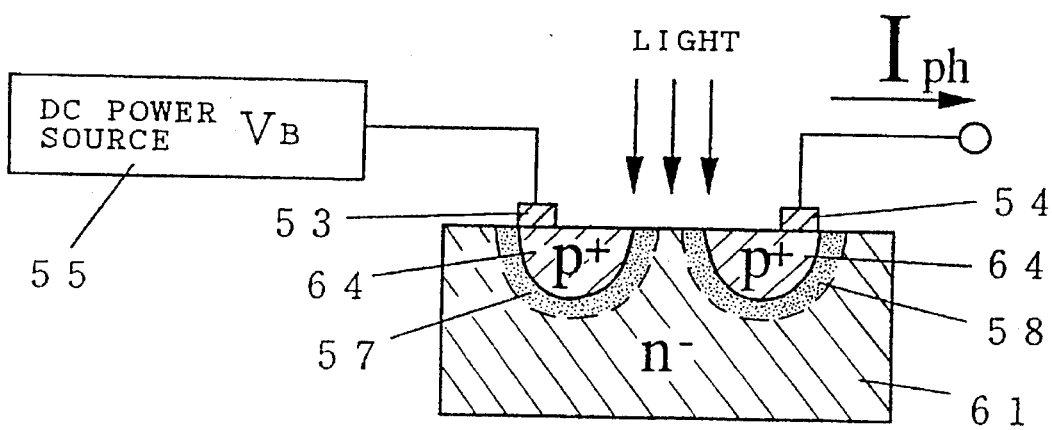
FIG. 13 is a sectional view of a photodetector in a preferred embodiment according to the present invention.

Referring to FIG. 13 showing a photodetector in a preferred embodiment according to the present invention, the photodetector differs from the photodetector shown in FIG. 11 in that the distance between a pair of $p^+$-type layers 64 formed in the surface of a $n^-$-type layer 61 is as small as transistor effect is produced. This photodetector operates like a transistor to provide photocurrent amplifying effect and has an enhanced sensitivity. This special arrangement of the $p^+$-type layers 64 is applicable to any one of the photodetectors shown in FIGS. 9 to 12.

Figure 14:
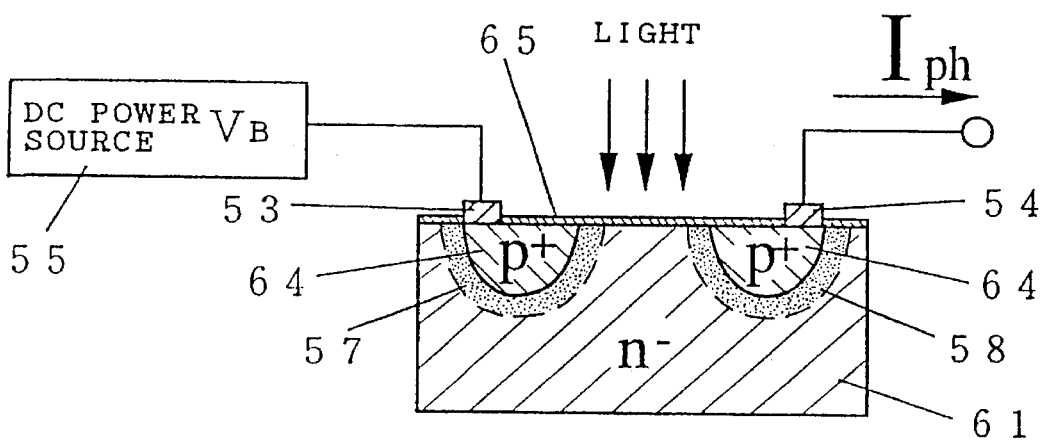
FIG. 14 is a sectional view of a photodetector in a preferred embodiment according to the present invention.

FIG. 14 shows a photodetector in a preferred embodiment according to the present invention, in which parts like or corresponding to those shown in FIG. 11 are denoted by the same reference numerals. This photodetector differs from the photodetector shown in FIG. 11 in that the surfaces of the semiconductor layers 61 and 64 are coated with an antireflection film 65 which reduces light loss attributable to reflection by the surface of the semiconductor layers 61 and 64. Accordingly, this photodetector has an enhanced sensitivity.

The photodetectors in the previously described embodiments may be provided with an antireflection film.

Figure 15:
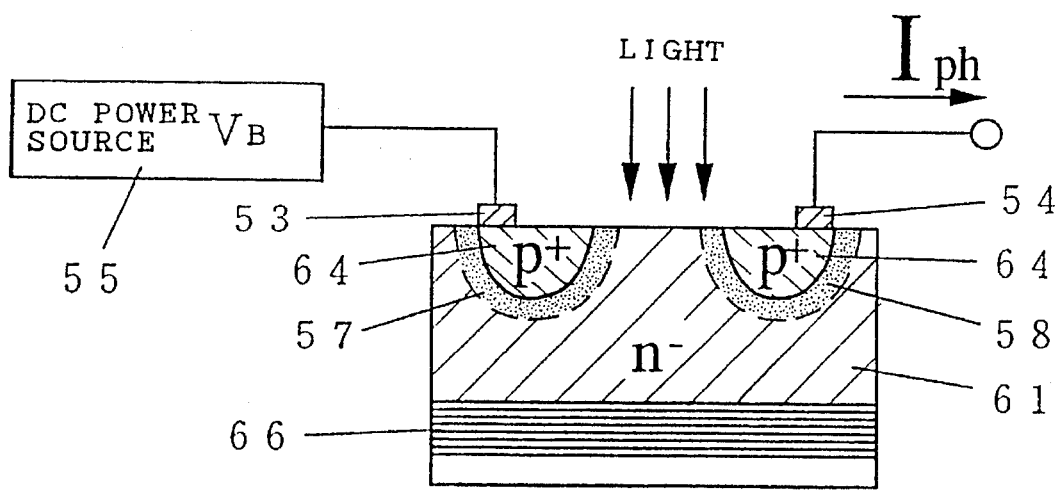
FIG. 15 is a sectional view of a photodetector in a preferred embodiment according to the present invention.

FIG. 15 shows a photodetector in a preferred embodiment according to the present invention, in which parts like or corresponding to those shown in FIG. 11 are denoted by the same reference characters. This photodetector is provided with a dispersive Bragg reflecting mirror 66 at a distance in which the incident light will not be completely attenuated from the surface of an n⁻-type layer 61. The reflecting mirror 66 reflects the light that was not absorbed by and reached the depth of the n⁻-type layer 61 to enhance the intensity of an electric field created in the vicinity of the surface of the n⁻-type layer 61 to enhance the sensitivity of the photodetector. Any one of the photodetectors shown in FIGS. 4 to 14 may be provided with a dispersive Bragg reflecting mirror similar to the dispersive Bragg reflecting mirror 66.

Figure 16:
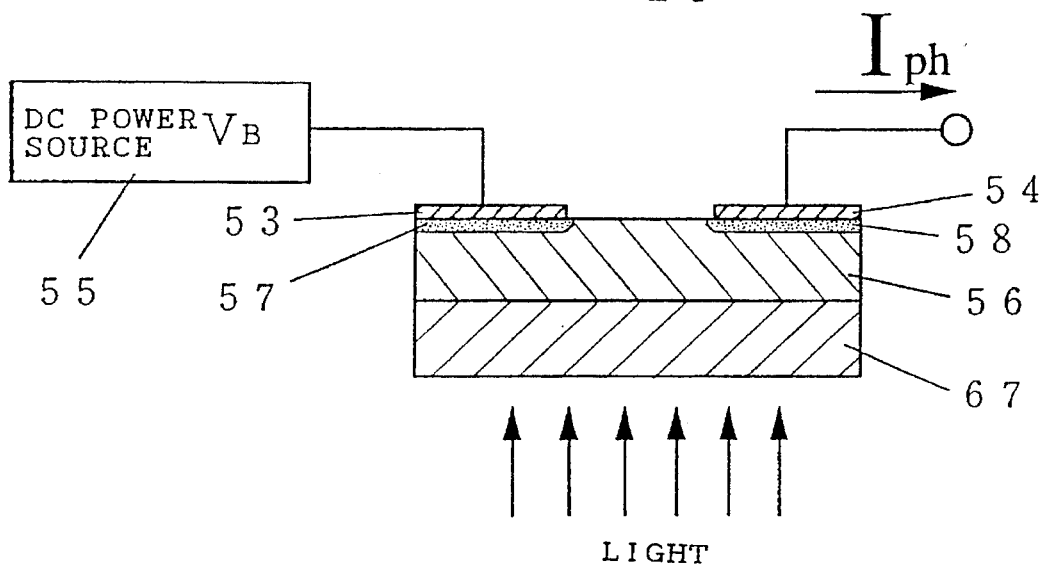
FIG. 16 is a sectional view of a photodetector in a preferred embodiment according to the present invention.

Referring to FIG. 16 showing a photodetector in a preferred embodiment according to the present invention, electrodes 53 and 54 are connected to one major surface of a semiconductor substrate 56, and a semiconductor substrate 67 is attached to the other major surface of the semiconductor substrate 56. The semiconductor substrate 67 is a transparent insulating semiconductor substrate or a semiconductor substrate having a band gap wider than that of the semiconductor substrate 56 and incapable of absorbing light. The back surface of the semiconductor substrate 67 is exposed to the incident light. Since the incident light is able to reach depletion layers 57 and 58 respectively underlying the electrodes 53 and 54, this photodetector has an increased light utilization factor and an enhanced sensitivity. Any one of the photodetectors shown in FIGS. 6 to 15 may be provided with a semiconductor substrate similar to the semiconductor substrate 67.

Figure 17:
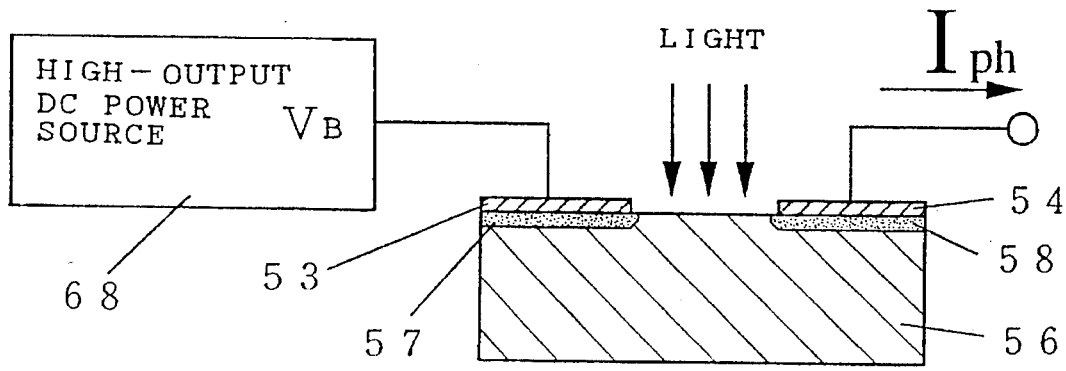
FIG. 17 is a sectional view of a photodetector in a preferred embodiment according to the present invention.

FIG. 17 shows a photodetector in a preferred embodiment according to the present invention, which is similar in construction to that shown in FIG. 4, in which parts like or corresponding to those shown in FIG. 4 are denoted by the same reference characters. In this embodiment, a first electrode 53 is connected to a high-output variable-voltage dc power source 68 capable of applying a high control voltage $V_B$ that will cause electron avalanche to the first electrode 53. Thus, depletion layers 57 and 58 produce photocurrent amplifying effect. Accordingly, the photodetector has an enhanced sensitivity. The first electrode 53 of any one of the photodetectors shown in FIGS. 6 to 16 may be connected to a high-output variable-voltage dc power source similar to the high-output variable-voltage dc power source 68.

Figure 18:
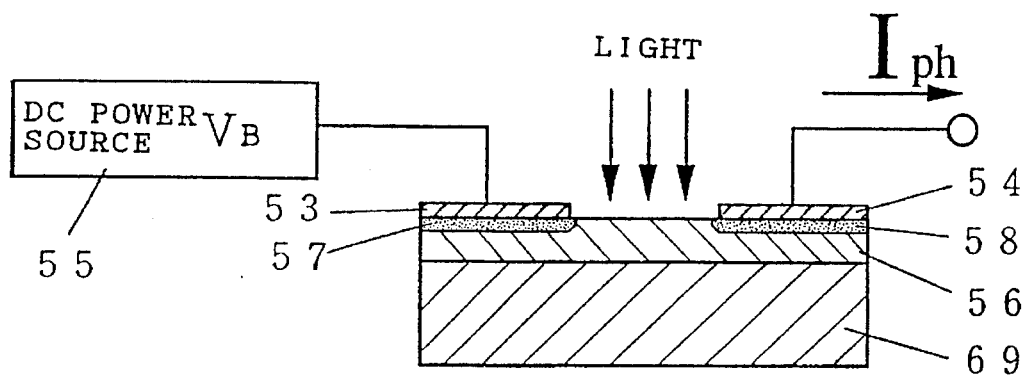
FIG. 18 is a sectional view of a photodetector in a preferred embodiment according to the present invention.

FIG. 18 shows a photodetector in a preferred embodiment according to the present invention, which is similar to that shown in FIG. 4 in construction, in which parts like or corresponding to those shown in FIG. 4 are denoted by the same reference characters. This photodetector is provided with a comparatively thin light-absorptive semiconductor substrate 56, and a semiconductor substrate 69 attached to the back surface of the semiconductor substrate 56. The semiconductor substrate 69 is a transparent semiconductor substrate or a semiconductor substrate having a band gap wider than that of the semiconductor substrate 56 and incapable of absorbing the incident light. Since the semiconductor substrate 56 is comparatively thin, charges are induced in a comparatively thin region and hence the charges are able to diffuse to electrodes 53 and 54 in a comparatively short time, so that the photodetector is able to respond to the incident light in a comparatively high response speed. The construction of this photodetector is applicable to any one of the photodetectors shown in FIGS. 6 to 17.

Figure 19:
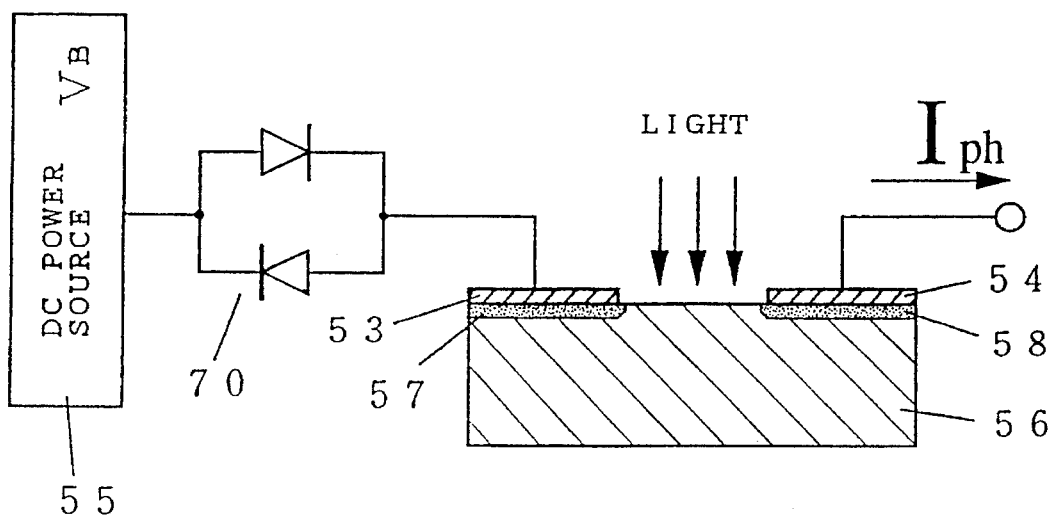
FIG. 19 is a sectional view of a photodetector array in a preferred embodiment according to the present invention.

FIG. 19 shows a photodetector, which is similar to the photodetector shown in FIG. 4, for a photodetector array in a preferred embodiment according to the present invention, in which parts like or corresponding to those shown in FIG. 4 are denoted by the same reference characters. Referring to FIG. 19, a parallel diode circuit of two diodes 70 disposed with their easy directions of flow of current reverse to each other (control voltage supply control means) is inserted in a line interconnecting a variable-voltage power source 55 and a control electrode 53. Even if the output voltage of the variable-voltage source 55 is not zero volts due to errors in the control operation of the variable-voltage source 55 when the control voltage $V_B$ is set at zero volts, the output voltage of the parallel diode circuit of the diodes 70 to be applied to the first electrode 53 is exactly zero volts. Accordingly, this photodetector is highly resistant to noise.

Figure 20:
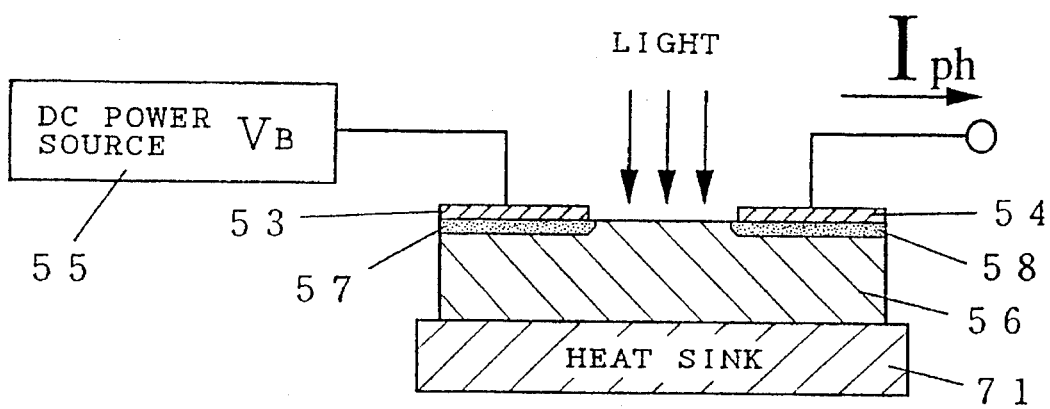
FIG. 20 is a sectional view of a photodetector array in a preferred embodiment according to the present invention.

FIG. 20 shows a photodetector, which is similar in construction to the photodetector of FIG. 4, in a preferred embodiment according to the present invention, in which parts like or corresponding to those shown in FIG. 4 are denoted by the same reference characters. Referring to FIG. 20, a heatsink 71 (cooling means) is attached to the back surface of a semiconductor substrate 56 to absorb heat from the semiconductor substrate 56. The heatsink 71 absorbs and dissipates the heat generated by the control voltage $V_B$ applied to a first electrode 53 formed on the semiconductor substrate 56 or the operation of the photodetector to reduce thermal noise so that noise in the photodetector will be reduced.

Figure 21:
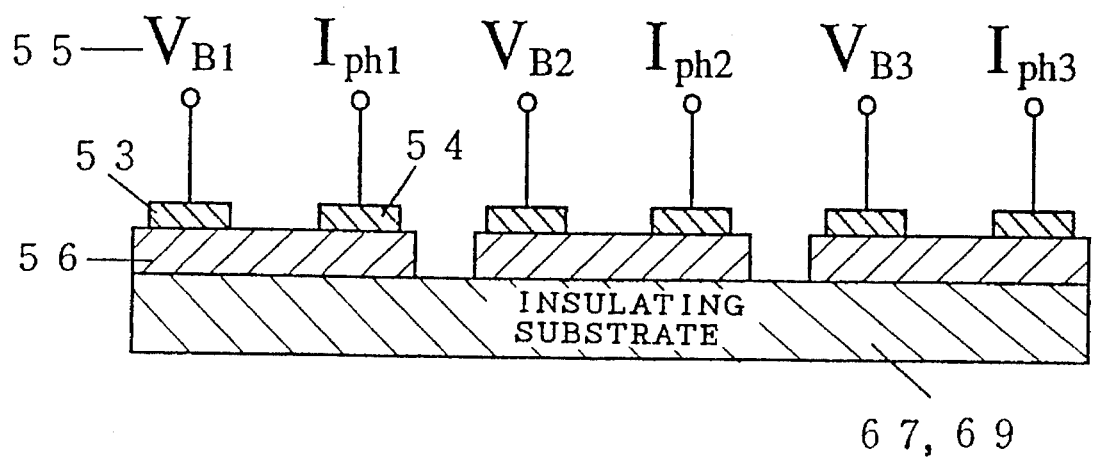
FIG. 21 is a sectional view of a photodetector array in a preferred embodiment according to the present invention.

FIG. 21 shows a photodetector array in a preferred embodiment according to the present invention comprising an insulating substrate 69 similar to the insulating substrate 69 of the photodetectors shown in FIG. 18, and a plurality of variable-sensitivity photodetectors having photosensitivity variable in a positive range through a negative range, similar in construction as the photodetector shown in FIG. 4, arranged at predetermined intervals on the insulating substrate 69 in a two-dimensional array and electrically insulated from each other. Each of the photodetectors of this photodetector array comprises a semiconductor substrate 56, electrodes 53 and 54 connected in ohmic contact to the semiconductor substrate 56.

Since the photodetectors of this photodetector array are electrically insulated from each other, noise in the photodetectors attributable to leakage current from the adjacent photodetectors can be perfectly obviated. Since the distance through which charges drift is comparatively short, the photodetectors operate at a comparatively high response speed.

The insulating substrate 69 may be the insulating substrate 67 of the photodetector of FIG. 16, such as a transparent insulating substrate or a semiconductor substrate having a band gap wider than that of the semiconductor substrate 56 of the photodetectors. When an insulating substrate similar to the insulating substrate 67 is employed, the photodetector array may receive the incident light on the back surface of the insulating substrate. The photodetector array may be formed by arranging a plurality of photodetectors similar to any one of the photodetectors shown in FIGS. 6 to 20 on an insulating substrate similar to the insulating substrate 69 or 67.

Figure 22:
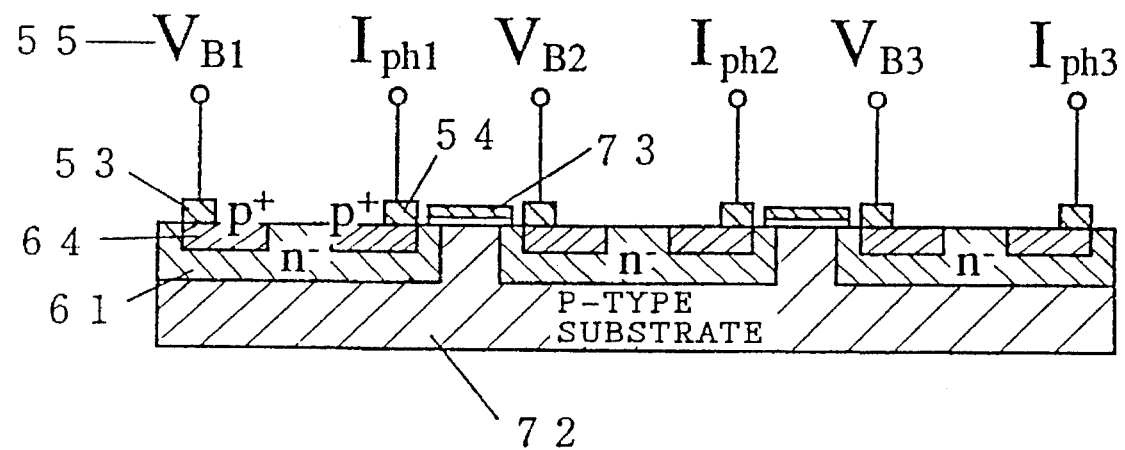
FIG. 22 is a sectional view of a photodetector array in a preferred embodiment according to the present invention.

FIG. 22 shows a photodetector array in a preferred embodiment according to the present invention. As shown in FIG. 22, the photodetector array comprises a p-type semiconductor substrate 72 having a high resistance, and a plurality of photodetectors, which are similar to the photodetector shown in FIG. 11, having photosensitivity variable in a positive range through a negative range formed in the surface of the p-type semiconductor substrate 72 at predetermined intervals in a two-dimensional arrangement. Each of the photodetectors is formed by forming an $n^-$-type layer 61 in the surface of the p-type semiconductor substrate 72, forming two $p^+$-type layers 64 formed in the surface of the $n^-$-type layer 61, and connecting electrodes 53 and 54 respectively to the $p^+$-type layers 64 in ohmic contact. The photodetectors are insulated from each other by pn junctions. The exposed areas of the surface of the p-type semiconductor substrate 72 are coated with a light absorbing film 73 to intercept light traveling toward the surface of the p-type semiconductor substrate 72.

Since the photodetectors of this photodetector array are electrically isolated from each other by the pn junctions of the p-type semiconductor substrate 72 separating the photodetectors from each other and the respective $n^-$-type layers 61 of the photodetectors, noise attributable to leakage current from the adjacent photodetectors is scarcely generated in the photodetectors. Since charges drift through a comparatively short distance in each photodetector, the photodetectors are able to operate at a high response speed. The p-type semiconductor substrate 72 may be a transparent insulating substrate or a semiconductor substrate having a band gap wider than that of the semiconductor substrate 56 and incapable of absorbing the incident light, such as the semiconductor substrate 67 of the foregoing embodiment. When the p-type semiconductor substrate 72 is such a substrate, the photodetector array may receive the incident light on the back surface of the p-type semiconductor substrate 72. The photodetector array in this embodiment may be provided with photodetectors similar to any one of the photodetectors shown in FIGS. 6 to 20, in which the semiconductor substrate 72 having a polarity different from that of the semiconductor substrate 56 or the semiconductor layer 61 is used to form the pn junctions.

Figure 23:
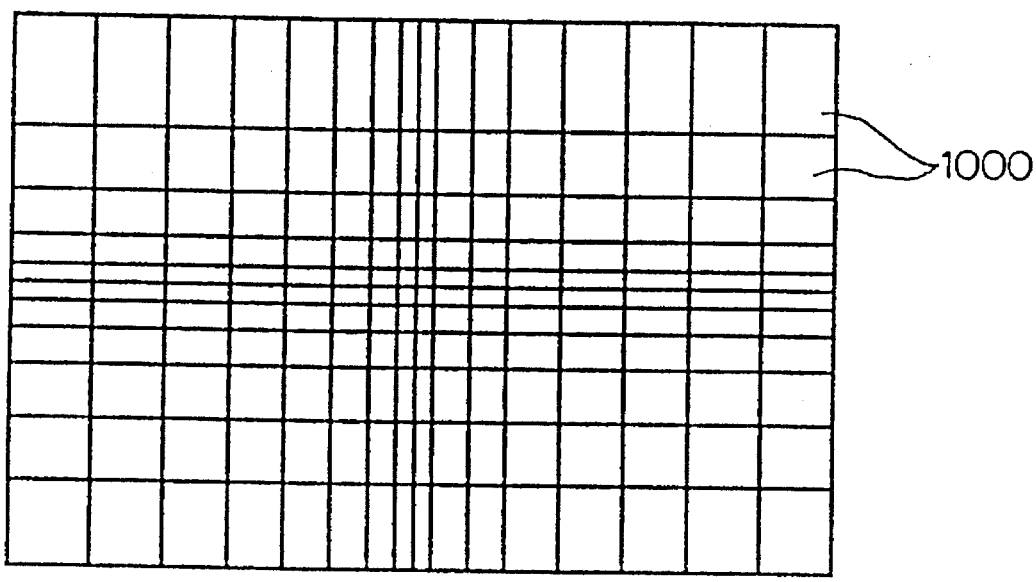
FIG. 23 is a plan view of a photodetector array in a preferred embodiment according to the present invention.

FIG. 23 shows a photodetector array in a preferred embodiment according to the present invention provided with a plurality of photodetectors 1000 similar in construction to any one of the photodetectors shown in FIGS. 4 to 20, respectively having different surface areas and arranged in a two-dimensional arrangement. The photodetectors are insulated from each other in a manner as shown in FIG. 21 or 22.

Part of the photodetector array in which the photodetectors are arranged in a comparatively high density enables forming an image in a comparatively high resolution. Thus, the photodetector array enables forming an important part of an image in a comparatively high resolution and a less important part of the same in a comparatively low resolution to achieve object detection effectively and quickly.

The photodetector array may be provided with a two-dimensional arrangement of photodetectors respectively having different surface shapes instead of the two-dimensional arrangement of the photodetectors respectively having different surface areas.

Figure 24:
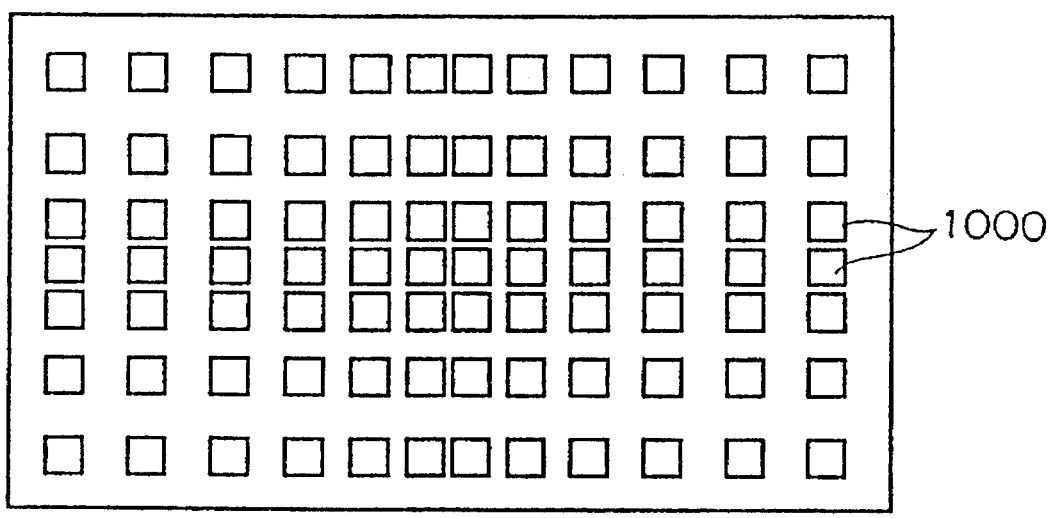
FIG. 24 is a plan view of a photodetector array in a preferred embodiment according to the present invention.

FIG. 24 shows a photodetector array in a preferred embodiment according to the present invention provided with a plurality of photodetectors 1000 similar in construction to any one of the photodetectors shown in FIGS. 4 to 20, and arranged in a two-dimensional arrangement at irregular intervals so that the photodetectors are arranged in a comparatively high density in part of the photodetector array. The photodetectors are insulated from each other in a manner as shown in FIG. 21 or 22.

Part of the photodetector array in which the photodetectors are arranged in a comparatively high density enables forming an image in a comparatively high resolution. Thus, the photodetector array enables forming an important part of an image in a comparatively high resolution and a less important part of the same in a comparatively low resolution.

Figure 25:
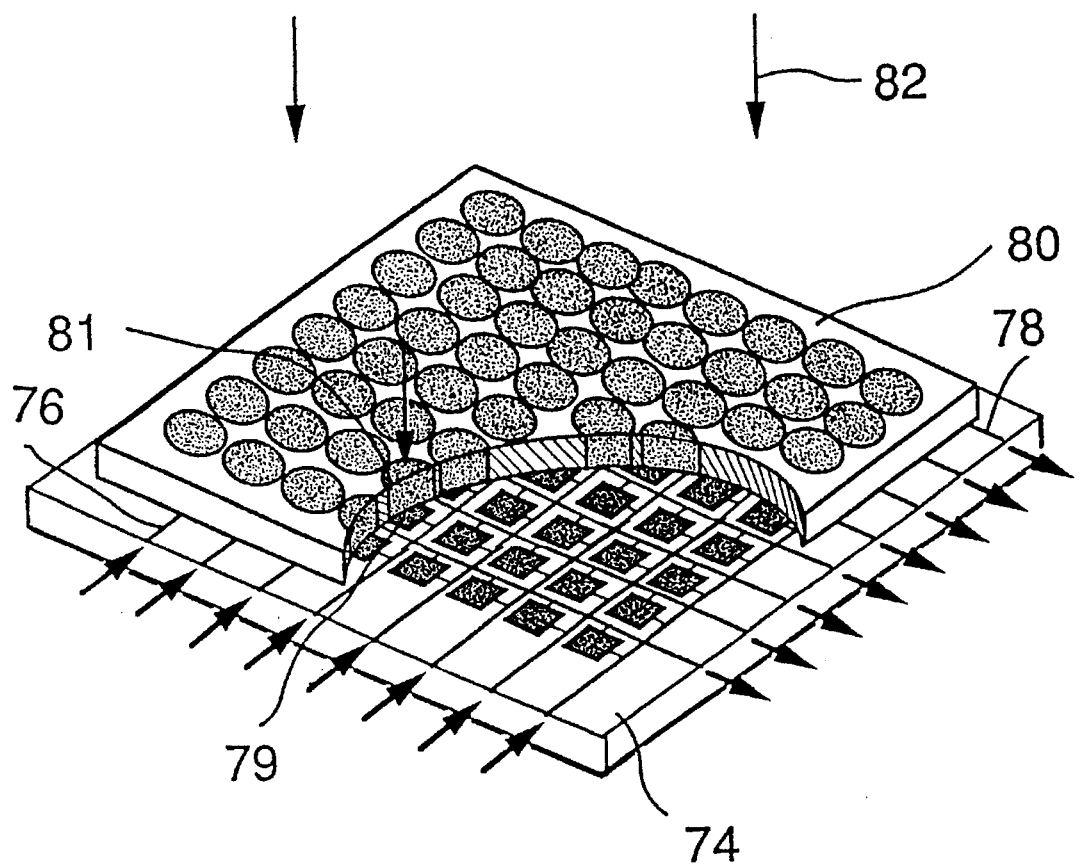
FIG. 25 is a partly cutaway perspective view of a photodetector array in a preferred embodiment according to the present invention.
Figure 26:
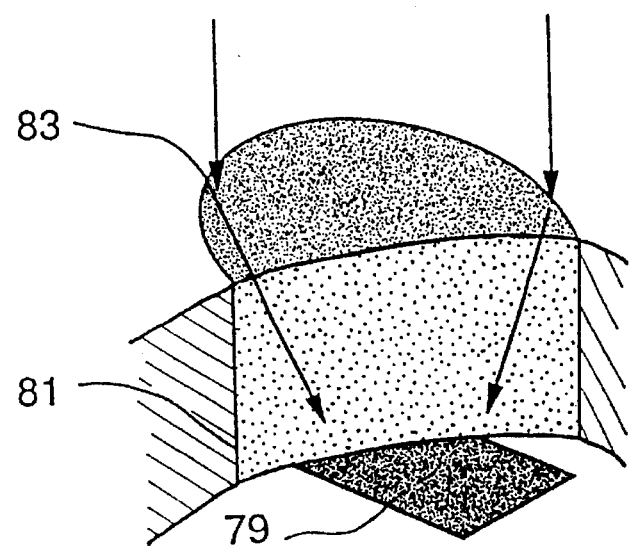
FIG. 26 is a fragmentary, partly cutaway perspective view of the photodetector array of FIG. 25.

FIG. 25 shows a photodetector unit in a preferred embodiment according to the present invention in a perspective view. Referring to FIG. 25, there are shown a photodetector array 74 formed by arranging a plurality of photodetectors 79 similar to any one of the photodetectors shown in FIGS. 4 to 20 in a two-dimensional arrangement, signal lines 76 connected respectively to the control electrodes of the photodetectors to apply control signals to the control electrodes, output signal lines 78 connected respectively to the output electrodes of the photodetectors 79 to take out the output photocurrents of the photodetectors, and a lens unit 80 formed by arranging gradient index lenses 80 in a two-dimensional arrangement. The incident light falls through the gradient index lenses 80 on the corresponding photodetectors 79. As shown in FIG. 26, each gradient index lens 80 has gradient refractive index decreasing from the peripheral toward the central part, and has the effect of a condenser lens.

In this photodetector unit, each gradient index lens 81 gathers the incident light so that the incident light 82 will fall accurately on the light-receiving surface of the corresponding photodetector 79 and will not fall on areas of the surface of the substrate between the adjacent photodetectors 79, the control signal lines 76 and the output signal lines 78. Thus, part of the incident light 82 which will otherwise fall on areas of the surface of the substrate between the photodetectors 79, the control signal lines 76 and the output signal lines 78 is gathered by the gradient index lenses 81 on the photodetectors 79. Accordingly, the photodetector unit has an increased light utilization factor and an enhanced sensitivity.

Figure 27:
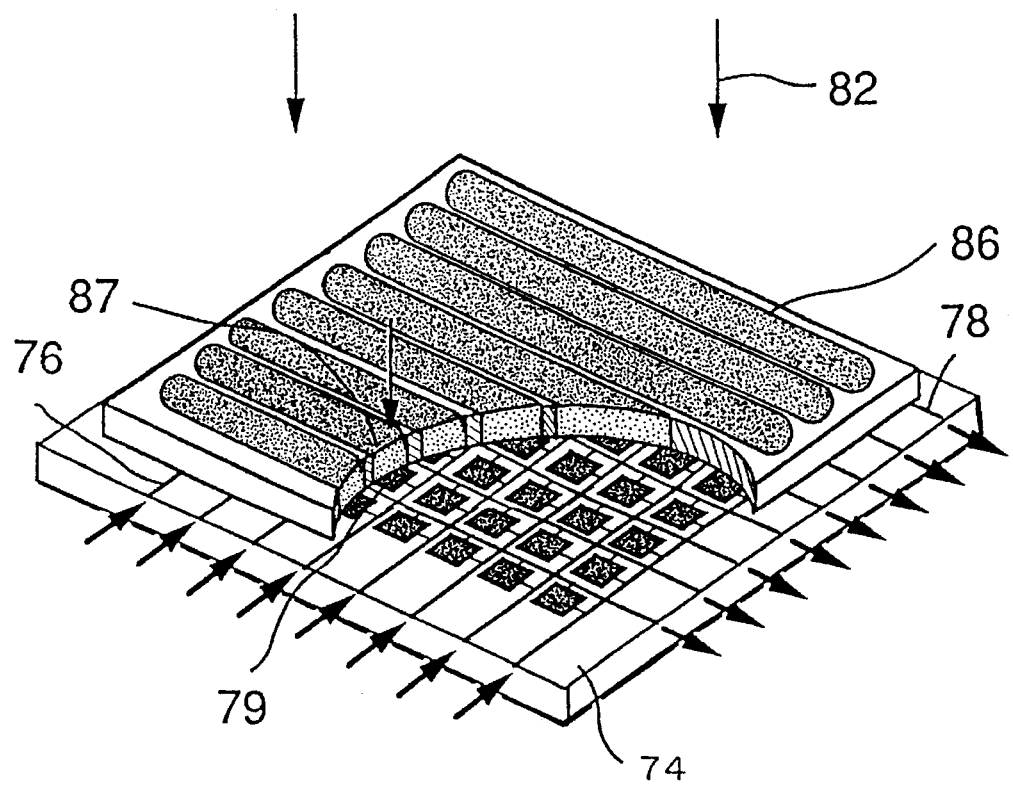
FIG. 27 is a partly cutaway perspective view of a photodetector array in a preferred embodiment according to the present invention.

FIG. 27 shows a photodetector unit in a preferred embodiment according to the present invention in a partly cutaway perspective view, in which parts like or corresponding to those of the photodetector array shown in FIG. 25 are denoted by the same reference characters. Referring to FIG. 27, the photodetector unit comprises a photodetector array 74 comprising photodetectors 79 arranged in lines (or rows), and a lens unit 86 comprising linear gradient index lenses 87 extending respectively along the lines (or rows) of the photodetectors 79. Each linear gradient index lens 87 has gradient refractive index varying along the direction of the width, and the effect of a condenser lens.

Since the lens unit 86 consists of the linear gradient index lenses 87, the linear gradient index lenses 87 can be easily aligned respectively with the lines (or rows) of the photodetectors 79 of the photodetector array 74. Accordingly, the photodetector unit having an enhanced sensitivity can be readily fabricated.

The linear gradient index lenses 84 may be arranged either with their axes in parallel to output signal lines 78 as shown in FIG. 27 or with their axes in parallel to control signal lines 76.

Figure 28:
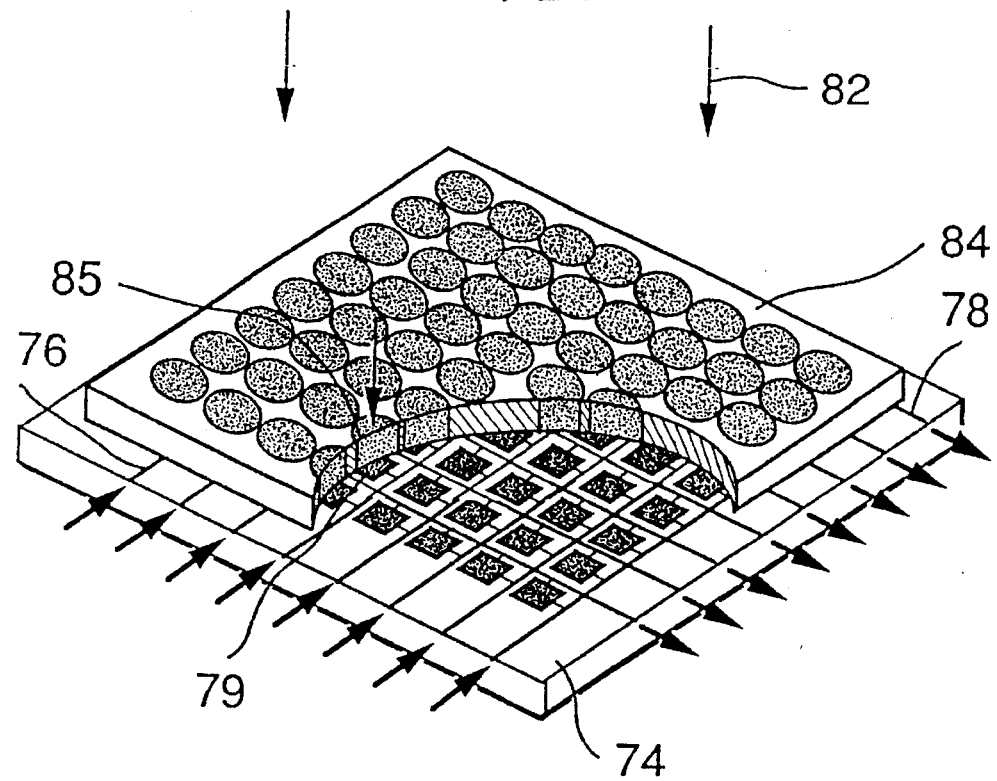
FIG. 28 is a partly cutaway perspective view of a photodetector array in a preferred embodiment according to the present invention.

FIG. 28 shows a photodetector unit in a preferred embodiment according to the present invention in a partly cutaway perspective view, in which parts like or corresponding to those of the photodetector array shown in FIG. 25 are denoted by the same reference characters. This photodetector array has a photodetector array 74 provided with a plurality of photodetectors 79 arranged in a two-dimensional arrangement, and a lens unit 84 comprising a plurality of diffraction lenses 85, and put on the photodetector array 74 with the diffraction lenses 85 in coincidence respectively with the photodetectors 79.

The diffraction lenses 85 gather the incident light 82 respectively on the corresponding photodetectors 79. Accordingly, the photodetector unit has an increased light utilization factor and an enhanced sensitivity.

Figure 29:
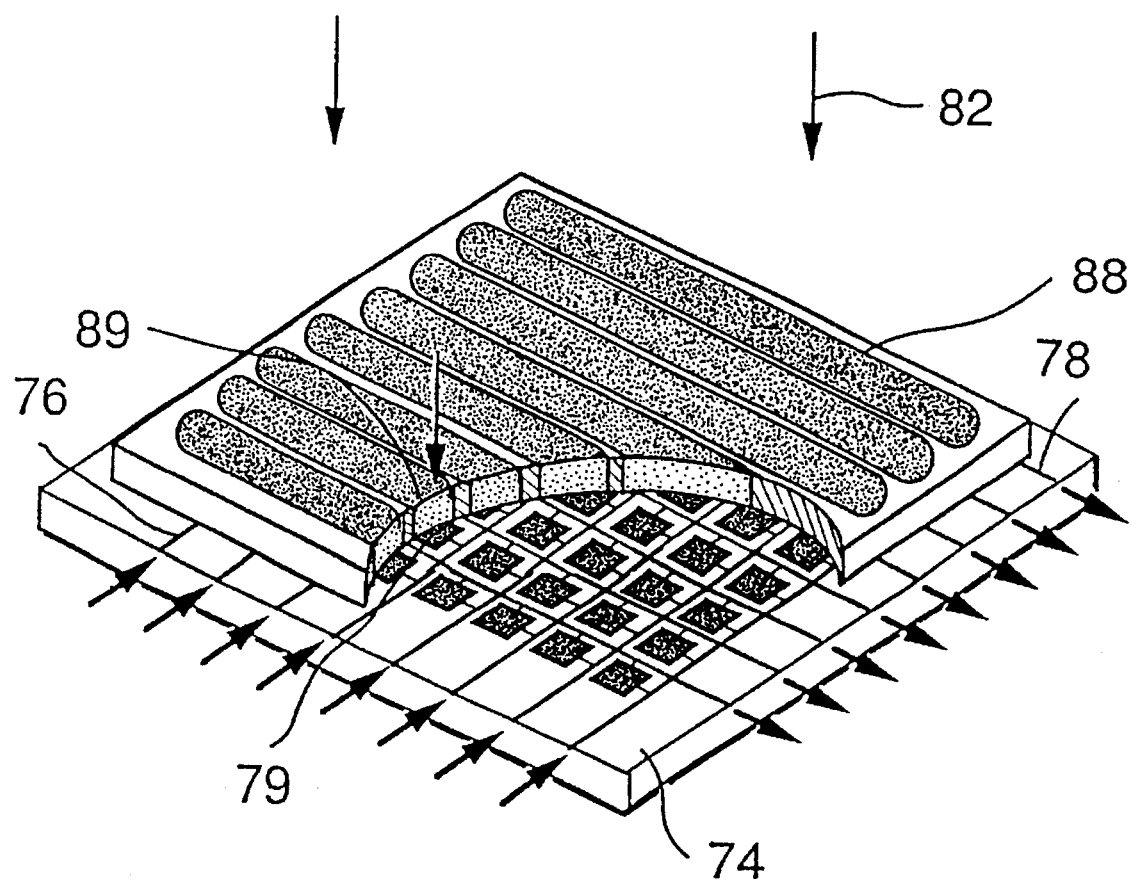
FIG. 29 is a partly cutaway perspective view of a photodetector array in a preferred embodiment according to the present invention.

FIG. 29 shows a photodetector unit in a preferred embodiment according to the present invention in a partly cutaway perspective view, in which parts like or corresponding to those of the photodetector unit shown in FIG. 25 are denoted by the same reference characters. As shown in FIG. 29, the photodetector unit comprises a photodetector array 74 comprising photodetectors 79 arranged in a two-dimensional arrangement, i.e., in lines and rows, and a lens unit 88 comprising linear diffraction lenses 89 and put on the photodetector array 74 with the linear diffraction lenses 89 extended respectively along the lines (or rows) of the photodetectors 79. Since the lens unit 88 comprises the parallel linear diffraction lenses 89, the linear diffraction lenses 89 of the lens unit 88 can be easily aligned respectively with the lines (or rows) of the photodetectors 79 of the photodetector array 74. The linear diffraction lenses 89 may be arranged either with their axes in parallel to output signal lines 78 as shown in FIG. 29 or with their axes in parallel to control signal lines 76.

Figure 30:
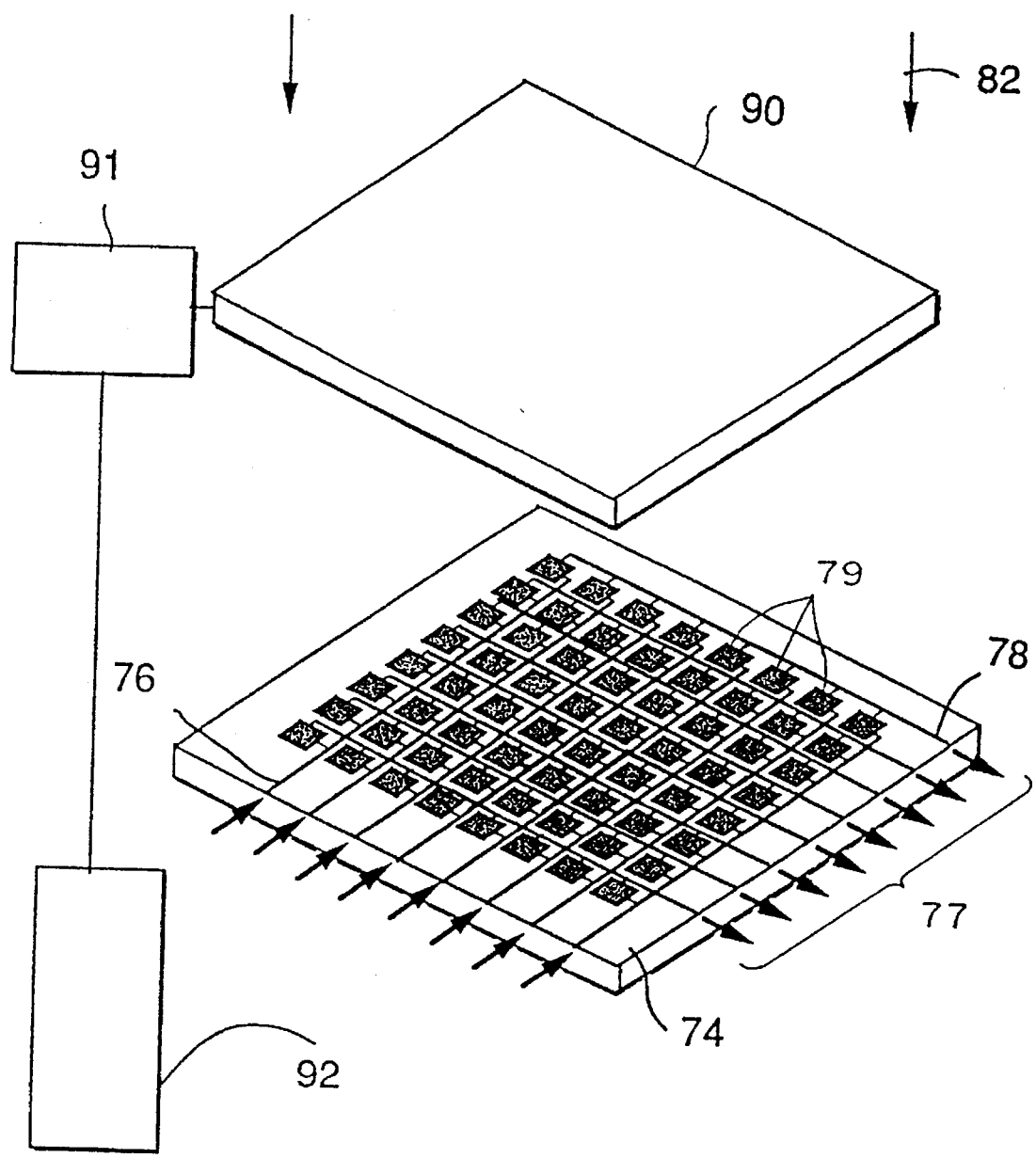
FIG. 30 is a partly cutaway perspective view of a photodetector array in a preferred embodiment according to the present invention.

FIG. 30 shows a photodetector unit in a preferred embodiment according to the present invention in a perspective view. This photodetector unit comprises a photodetector array 74 comprising photodetectors 79 arranged in a two-dimensional arrangement, control signal lines 76 and output signal lines 78, a wavelength-selective filter 90 that filters the incident light 82 and transmits only infrared light, a shutter mechanism 91 for advancing the wavelength-selective filter 90 into and retracting the same from a light path along which the incident light travels toward the photodetector array 74, and a synchronizing circuit 92 for synchronizing the operation of the shutter mechanism 91 for driving the wavelength-selective filter 90 and control signal supply operation for supplying control signals to the control signal lines 76 of the photodetector array 74.

In operation, first the synchronizing circuit 92 gives a driving signal to the shutter mechanism 91 to advance the wavelength-selective filter 90 into the light path along which the incident light 82 travels toward the photodetector unit 74, whereby only infrared light is allowed to travel through the wavelength-selective filter 90 and to fall on the photodetector unit 74. At the same time, the synchronizing circuit 92 applies control signals, namely, control voltages $V_B$ for setting the respective sensitivities of the photodetectors 79, to the control signal lines 76 of the photodetector array 74. The photodetectors 79 of the photodetector array 74 receive the incident light 82 passed through the wavelength-selective filter 90, i.e., infrared light, in the set sensitivities, and provides photocurrents proportional to the intensities of the incident light 82 on the photodetectors 79 on the output signal lines 78. Thus, this photodetector unit provides output signals 77 respectively corresponding to the intensities of the infrared light included in the incident light 82 on the corresponding photodetectors 79 to use only the characteristics of the infrared light included in the incident light 82 effectively and to eliminate the adverse effect of the superposition of different wavelengths of the incident light 82. The wavelength-selective filter 90 that transmits only infrared light may be replaced with a wavelength-selective filter that transmits only visible radiation or with a band-pass filter that transmits only light of wavelengths in a specific wavelength range to use effectively the characteristics of the incident light of wavelengths in a wavelength range defined by the wavelength-selective filter. The photodetector unit may be provided with a plurality of wavelength-selective filters having different light filtering characteristics and the wavelength-selective filters may be placed one at a time at a working position by the shutter mechanism 91.

Figure 31:
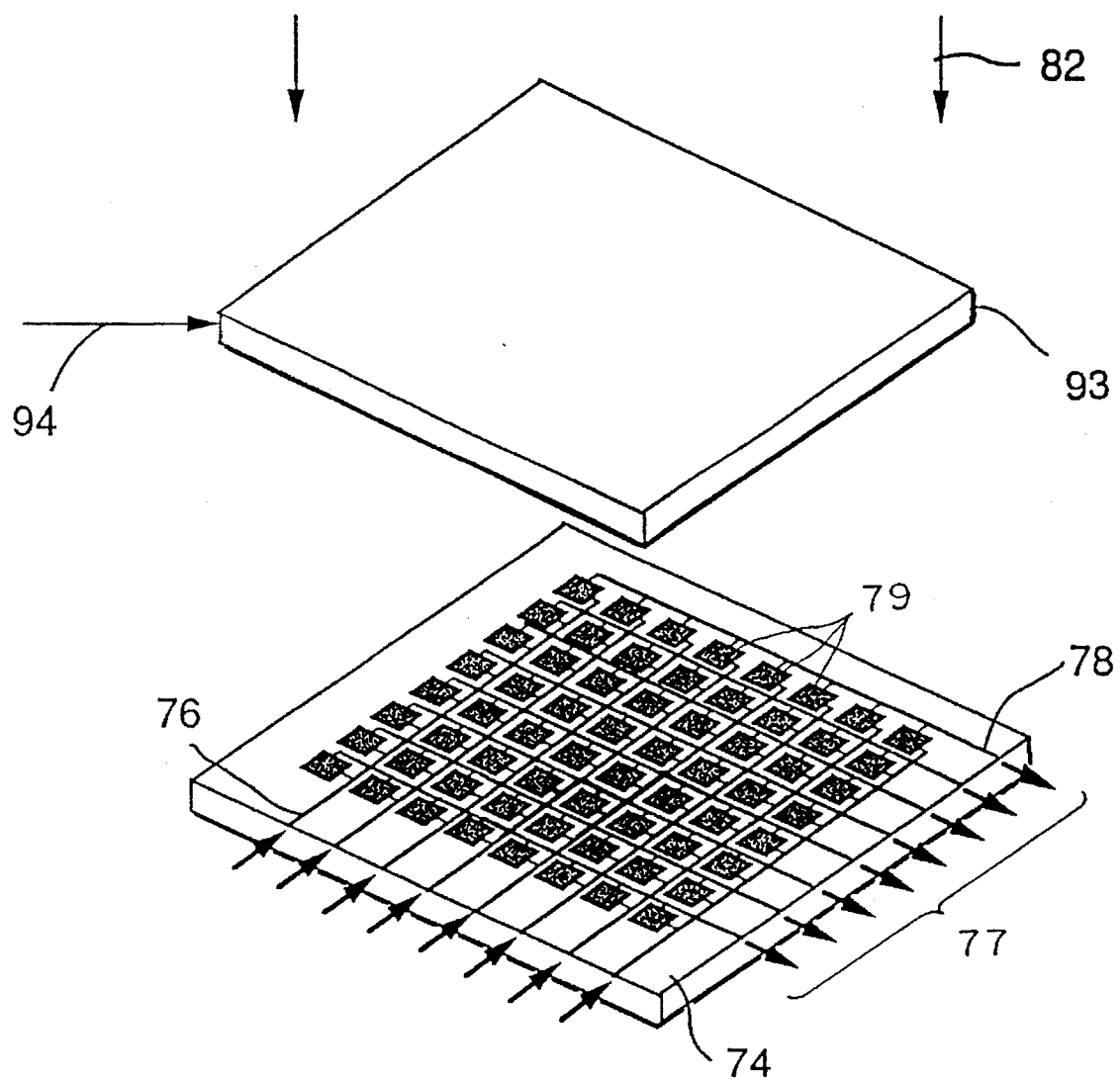
FIG. 31 is a perspective view of a photodetector array in a preferred embodiment according to the present invention.

FIG. 31 shows a photodetector unit in a preferred embodiment according to the present invention in a perspective view. This photodetector unit comprises a photodetector array 74 comprising photodetectors 79, and an optical modulator 93 which modulates the incident light 82 in accordance with a predetermined scheme before the incident light 82 falls on the photodetector unit 74. The transmittance of the optical modulator 94 with respect to wavelength can be determined in accordance with a selection signal 94.

In operation, first a selection signal 94 is given to the optical modulator 93 to make the optical modulator 93 transmit only infrared light among the incident light 82 and, consequently, only infrared light passed through the optical modulator 93 falls on the photodetector array 74. In the meantime, control signals are applied to the control signal lines 76 of the photodetector array 74 to set each photodetector 79 for a desired sensitivity, and then the photodetectors 79 receive the incident light 82, i.e., infrared light, in the desired sensitivities and provide output signals 77 on output signal lines 78, respectively. The output signals 77 have characteristics corresponding to only those of the infrared light. Therefore, the photodetector unit is able to use effectively only the characteristics of infrared light included in the incident light 82 and to eliminate the adverse effect of the superposition of different wavelengths of the incident light 82. Although the selection signal 94 employed in this embodiment sets the optical modulator 93 for a specific transmittance to pass only infrared light, it is also possible to use a selection signal that makes the optical modulator transmit only visible radiation or only light having wavelengths in a specific wavelength range to utilize effectively the characteristics the incident light of specific wavelengths.

Figure 1:
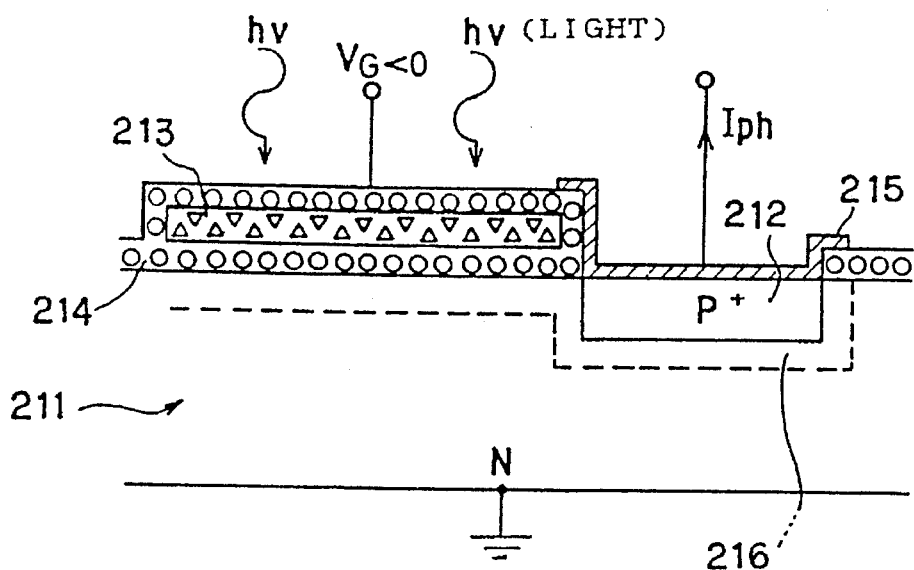
FIG. 1 is a sectional view of a conventional photodetector.
Figure 2:
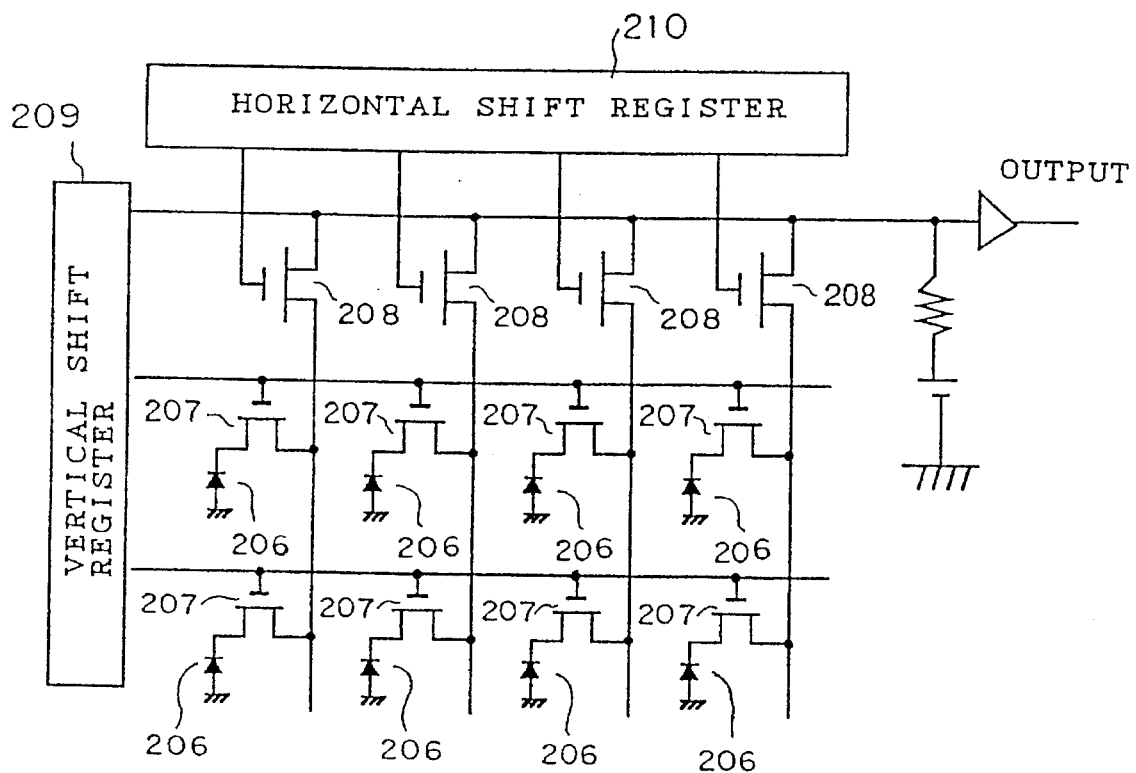
FIG. 2 is a circuit diagram of a conventional photodetector array.
Figure 3:
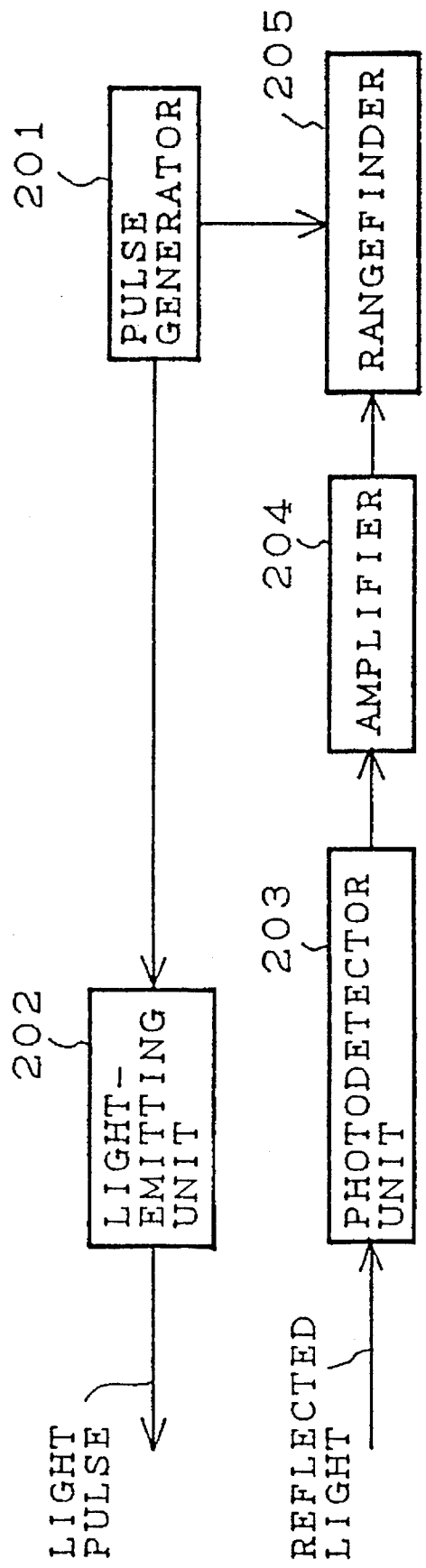
FIG. 3 is a block diagram of a conventional object detector.
Figure 32:
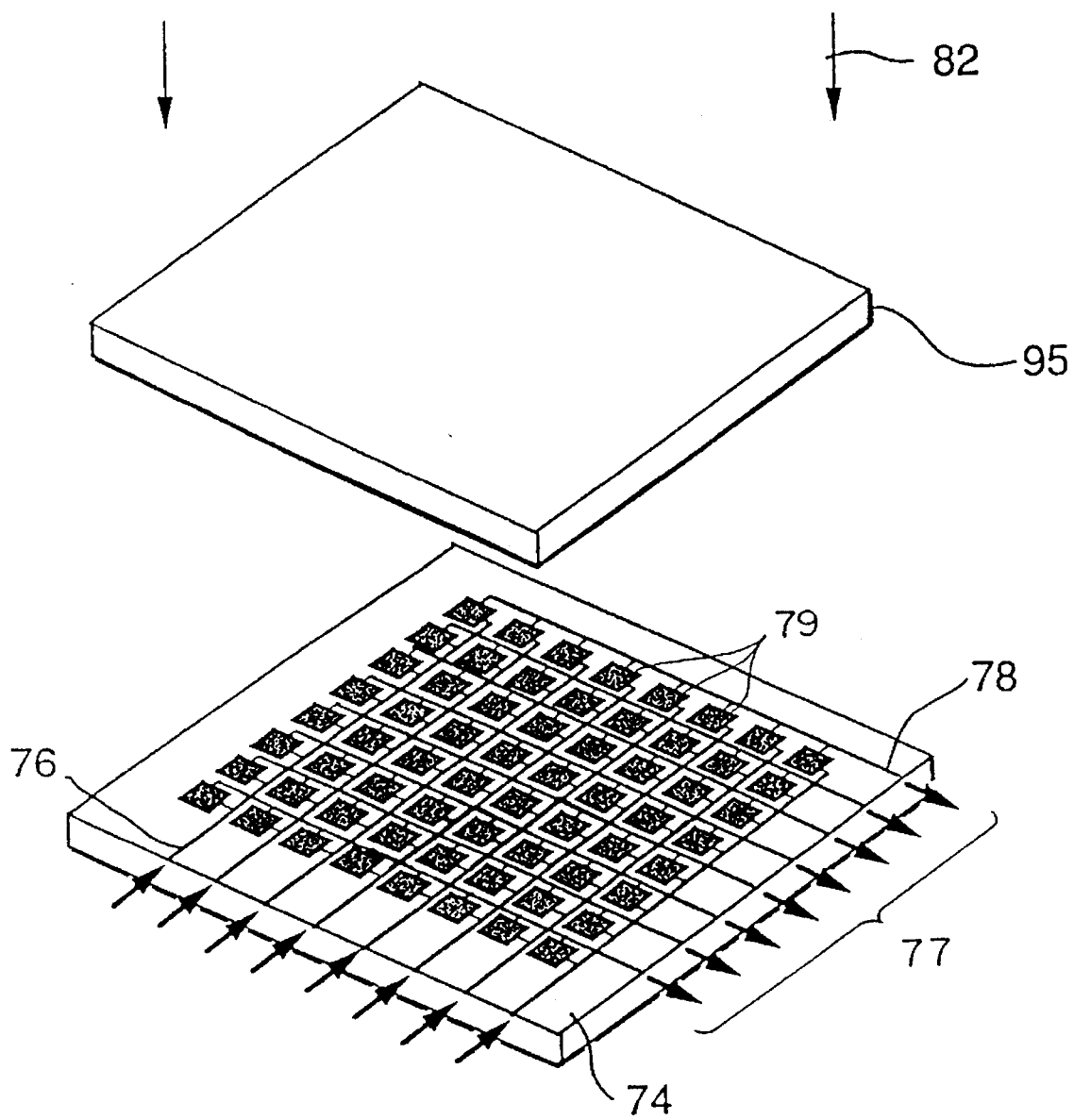
FIG. 32 is a perspective view of a photodetector array in a preferred embodiment according to the present invention.
Figure 33:
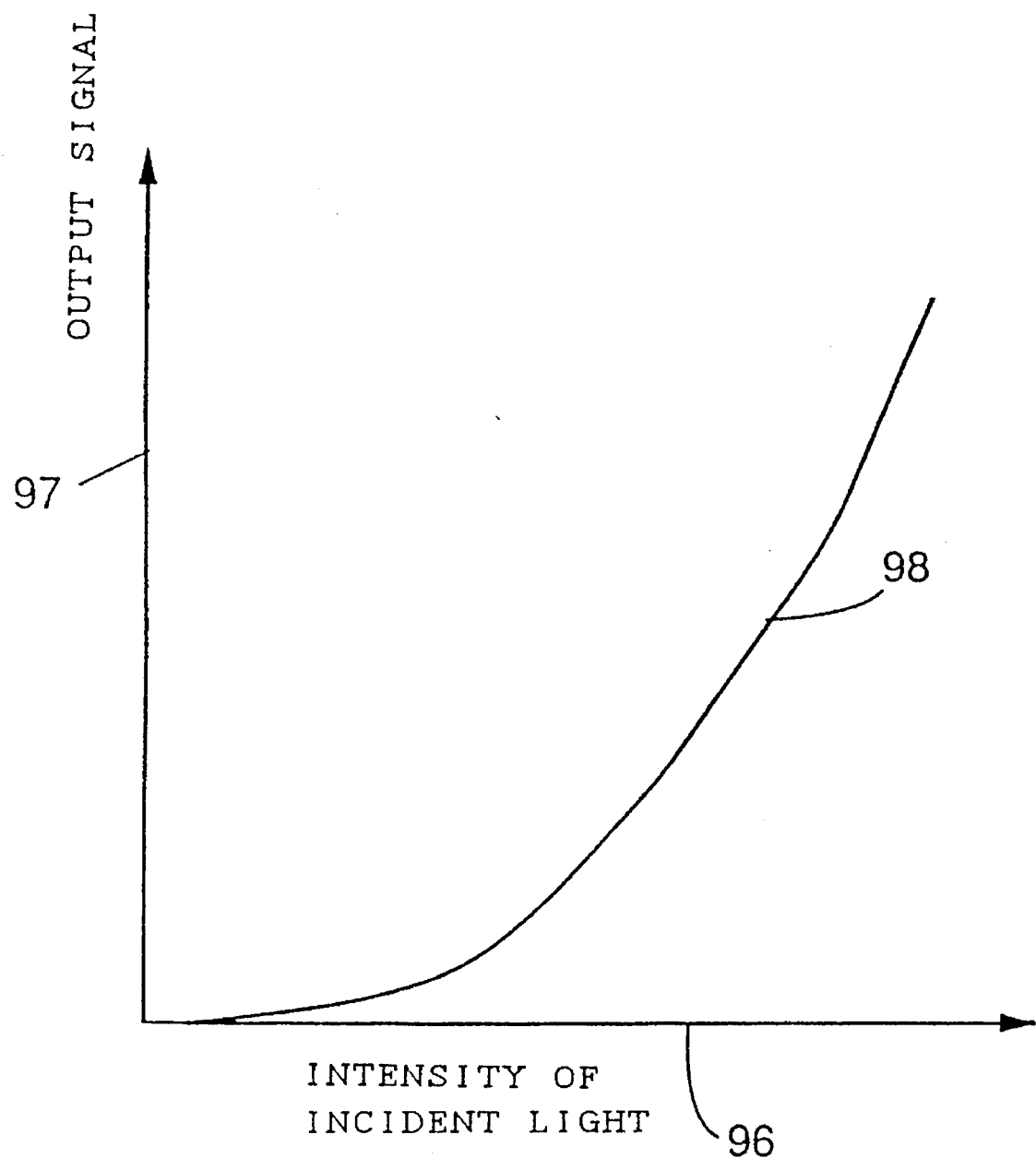
FIG. 33 is a graph showing the input-output characteristic of the photodetector array of FIG. 32.

FIG. 32 shows a photodetector unit in a preferred embodiment according to the present invention in a perspective view. This photodetector unit comprises a photodetector unit 74 comprising photodetectors 79, control signal lines 76 and output signal lines 78, and a nonlinear optical element 95 having a nonlinear input-output characteristic with respect to incident light 82 traveling toward the photodetector unit 74. The nonlinear optical element 95 has nonlinear input-output characteristic as shown by way of example in FIG. 33, in which the intensity 96 of incoming light is measured on the horizontal axis, the intensity 97 of outgoing light is measured on the vertical axis, and a curve 98 indicates the input-output characteristic of the nonlinear optical element 95. As is evident from FIG. 3, the light transmittance of the nonlinear optical element 95 varies nonlinearly relative to the intensity 96 of the incoming light and, therefore, the variation of the intensity 97 of the outgoing light relative to the intensity 96 of the incoming light is nonlinear. When the intensity 96 of the incoming light is lower than a threshold intensity, the intensity 97 of the outgoing light is substantially zero, namely, the incoming light passes the nonlinear optical element 95 scarcely, and the intensity 97 of the outgoing light increases progressively when the intensity 96 of the incoming light increases beyond the threshold intensity.

The nonlinear optical element 95 having the threshold intensity attenuates noise light of comparatively low intensities included in the incident light 82 and allows only useful light of comparatively high intensities to fall on the photodetector unit 74. The photodetector unit may be provided, instead of the nonlinear optical element 95, a nonlinear optical element unit comprising a plurality of nonlinear optical elements respectively corresponding to the photodetectors of the photodetector unit 74.

Figure 34:
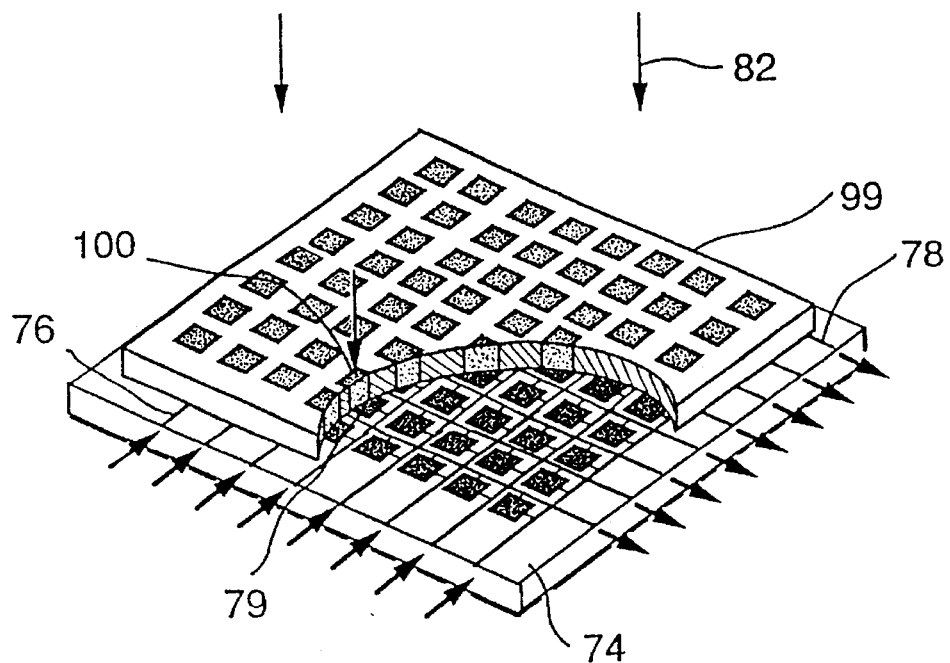
FIG. 34 is a partly cutaway perspective view of a photodetector array in a preferred embodiment according to the present invention.
Figure 35:
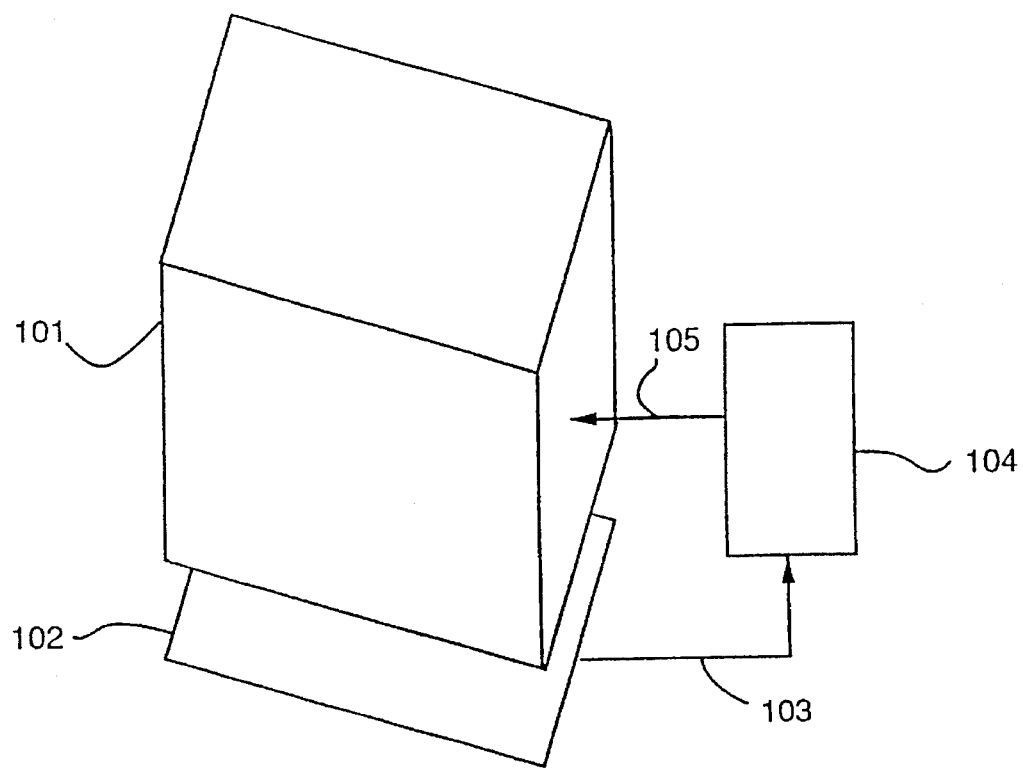
FIG. 35 is a diagrammatic view of assistance in explaining the constitution of an essential part of the photodetector array of FIG. 34.
Figure 36:
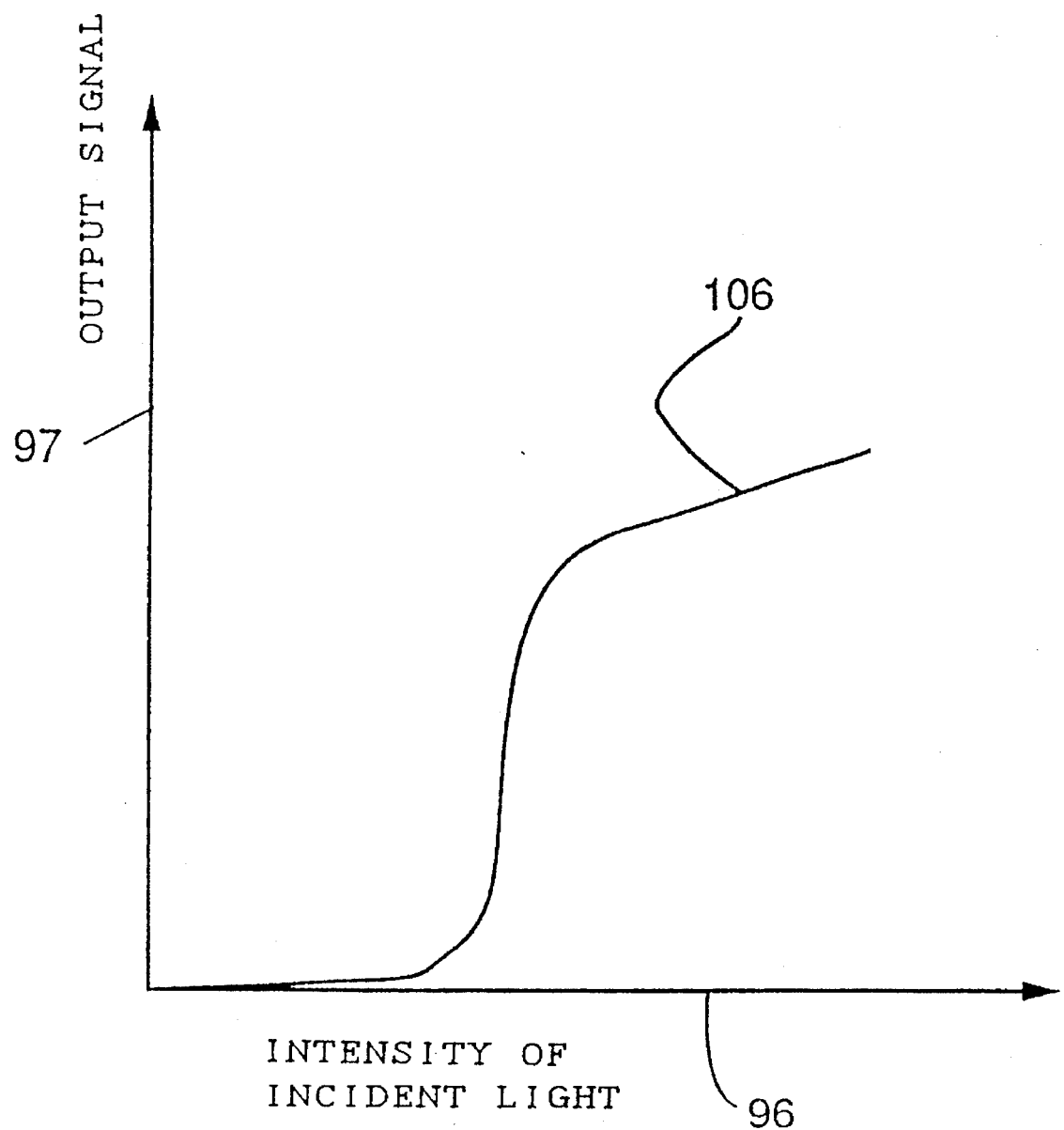
FIG. 36 is a graph showing the input-output characteristic of the photodetector array of FIG. 34.

FIG. 34 shows a photodetector unit in a preferred embodiment according to the present invention in a perspective view. This photodetector unit comprises a photodetector unit 74 comprising photodetectors 79, control signal lines 76 and output signal lines 78, and an optical switching unit 99 comprising optical switching devices 100 respectively corresponding to the photodetectors 79. As shown in FIG. 35, each optical switching device 100 comprises an optical modulator 101 having variable transmittance, a photodetector 102 transmissive to the incident light, and a feedback circuit 104 which receives the output signal 103 of the photodetector 102 and gives a feedback signal 105 to the optical modulator 101. FIG. 36 shows the input-output characteristic of the optical switching device 100 by way of example. The light transmittance of the optical switching device 100, i.e., the intensity 97 of the outgoing light, varies nonlinearly relative to the intensity 96 of the incoming light. When the intensity 96 of the incoming light coming into the optical switching device 100 is lower than a threshold intensity, the intensity 97 of the outgoing light leaving the optical switching device 100 is substantially zero. The intensity 97 of outgoing light increases as the intensity 96 of incoming light increases beyond the threshold intensity. When the incident light 82 including useful signal components having comparatively high intensities and noise signal components having comparatively low intensities passes through each optical switching device 100, the noise signal components are attenuated by the optical switching device 100 and only the useful signal components having comparatively high intensities are allowed to fall on the corresponding photodetector 79 of the photodetector unit 74. Part of the output signal of the photodetector 79, instead of the output signal of the photodetector 102 of the optical switching device 100, may be given to the feedback circuit 104 and the photodetector 102 may be omitted.

The photodetector arrays 74 of the photodetector units of FIGS. 25 to 34 may be any one of the photodetector arrays of FIGS. 21 to 24, and the photodetectors 79 of the photodetector arrays 74 of the photodetector units of FIGS. 25 to 34 may be any one of the photodetectors of FIGS. 4 to 20.

Figure 37:
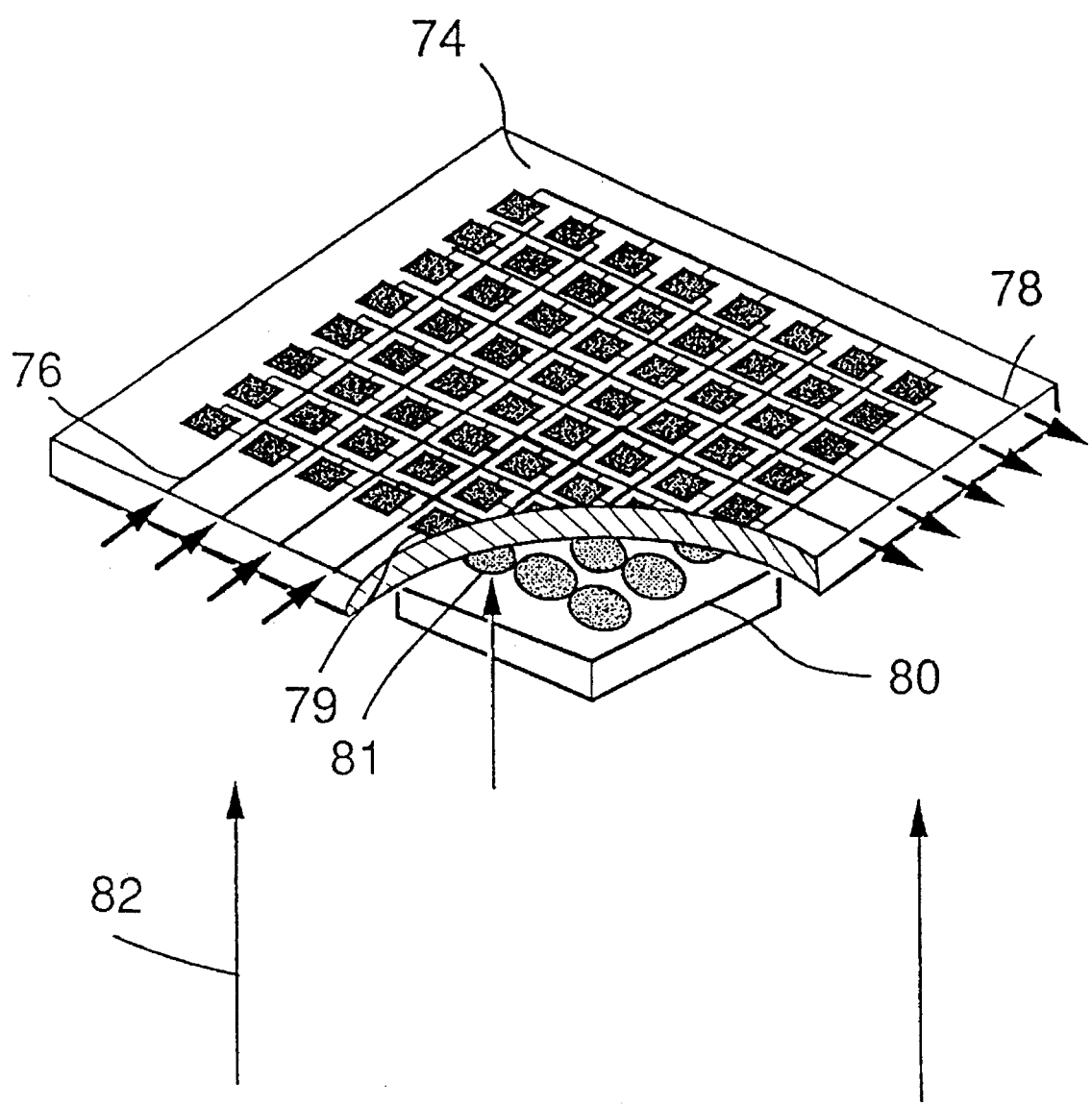
FIG. 37 is a partly cutaway perspective view of a photodetector array in a preferred embodiment according to the present invention.

FIG. 37 shows a photodetector unit in a preferred embodiment according to the present invention in a perspective view. This photodetector unit comprises photodetectors in accordance with the present invention. Referring to FIG. 37, the photodetectors 79 of the photodetector array 74 of the photodetector unit are similar to the photodetector of FIG. 16 that receives the incident light on its back surface. A gradient index lens unit 80, which is similar to the gradient index lens unit of FIG. 25, comprising gradient index lenses 81 is attached to the back surface of the photodetector array 74.

Since the photodetector unit receives the incident light on the back surface of the photodetector unit 74, an integrated electronic circuit can be formed on the front surface of the photodetector unit 74. Since the back surface of the photodetector unit 74 is flat, the lens unit 80 can be easily attached to the photodetector array 74. Thus, a photodetector unit suitable for information processing can be fabricated. The optical system attached to the back surface of the photodetector unit 74 may be any one of the optical systems of FIGS. 27 to 34.

Figure 38:
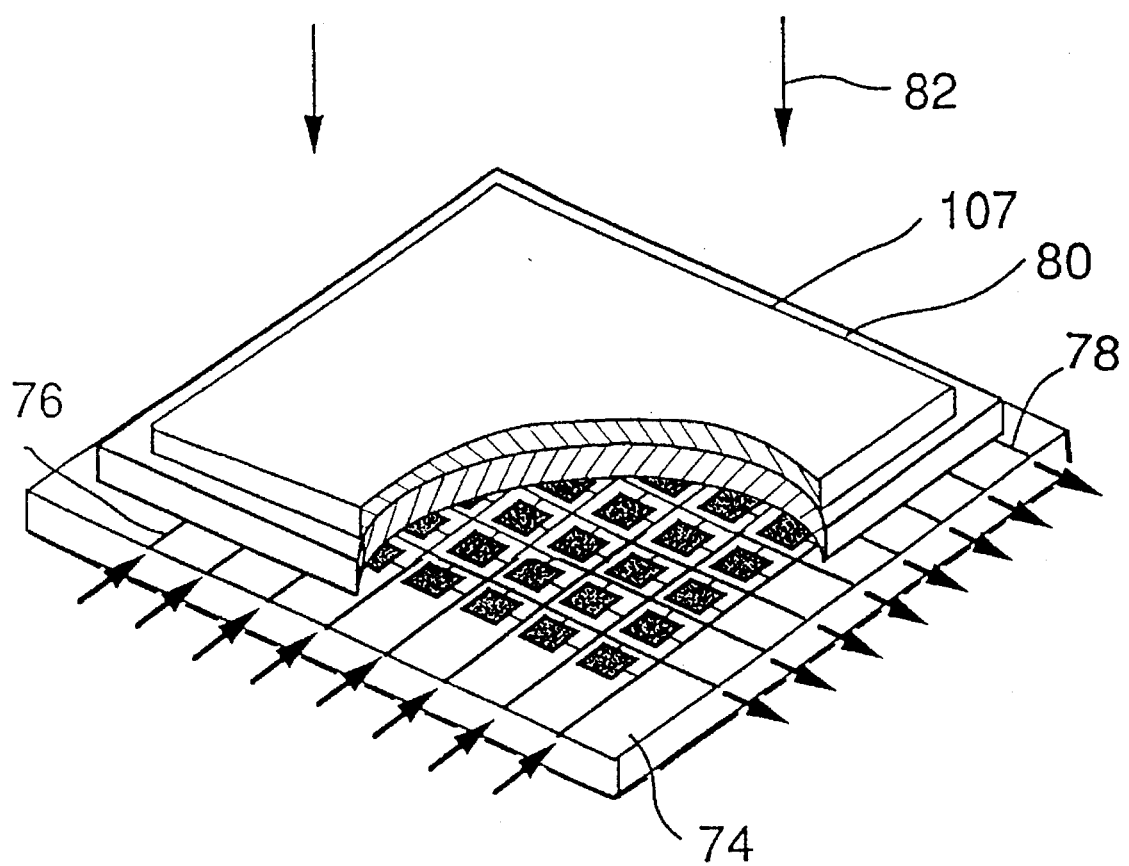
FIG. 38 is a partly cutaway perspective view of a photodetector array in a preferred embodiment according to the present invention.

FIG. 38 shows a photodetector unit in a preferred embodiment according to the present invention comprising photodetectors in accordance with the present invention. As shown in FIG. 38, the photodetector unit comprises a photodetector array 74 comprising photodetectors 79 similar to, for example, the photodetector of FIG. 4, a lens unit 80 comprising a plurality of gradient index lenses 81 similar to those of FIG. 25 and attached to the front surface of the photodetector array 74, and an antireflection film 107, which is similar to the antireflection film of the photodetector of FIG. 14, coating the surface of the lens unit 80.

Since the antireflection film 107 suppresses the reflection of the incident light 82 by the lens unit 80 of the gradient index lenses 81, the photodetector array 74 is able to receive the incident light 82 efficiently. Accordingly, the photodetectors 79 operates in high sensitivities. The optical system attached to the front surface of the photodetector array 74 may be any one of the optical system shown in FIGS. 27 to 34.

Although the foregoing photodetector units embodying the present invention are some examples of modifications of the photodetector arrays embodying the present invention, any other combinations of the photodetectors of FIGS. 4 to 20 and the photodetector units of FIGS. 21 to 38 are possible without departing from the scope of the present invention as stated in the appended claims.

Figure 39:
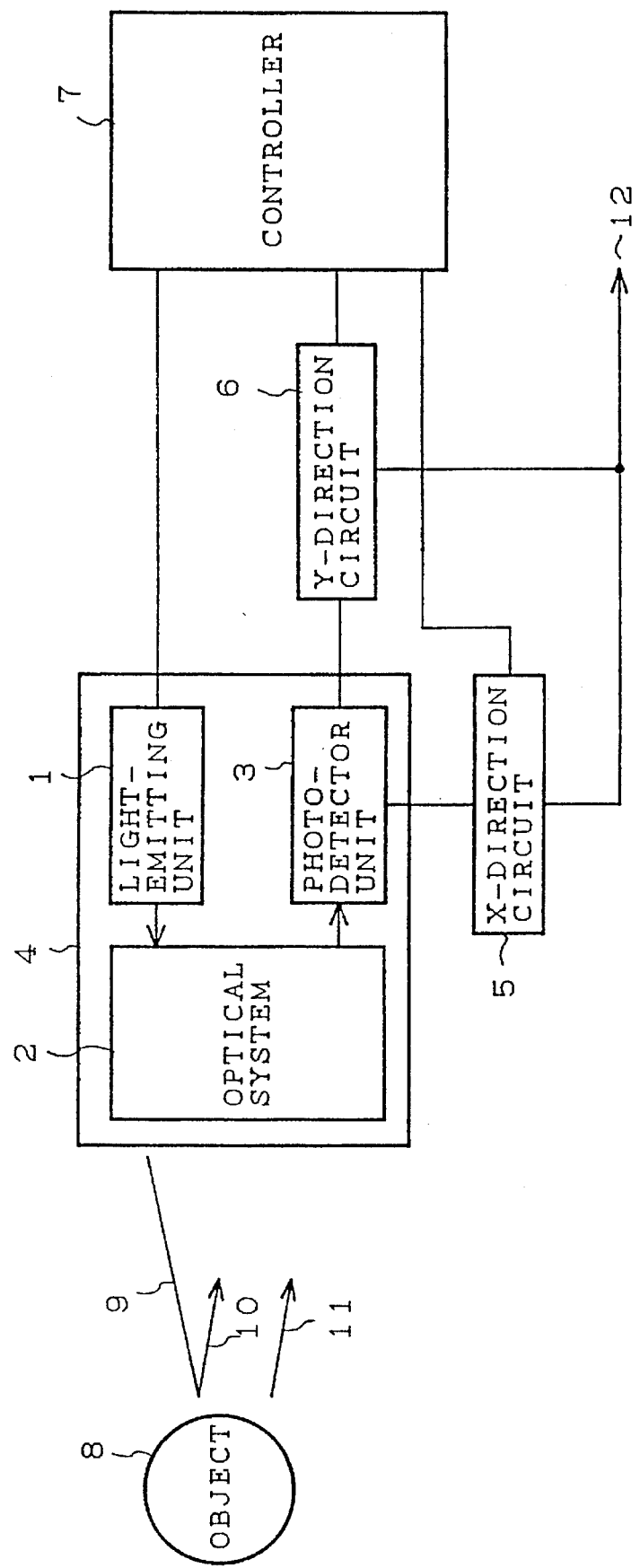
FIG. 39 is a block diagram of an object detector in a preferred embodiment according to the present invention.

Referring to FIG. 39 showing an object detector in a preferred embodiment according to the present invention, there are shown a light-emitting unit 1 that emits near-infrared pulses, an optical system 2 that sends out the near-infrared pulses generated by the light-emitting unit 1 in a predetermined range and receives reflected near-infrared radiation reflected from an object and visible radiation, a photodetector unit 3 comprising any one of the two-dimensional arrays of photodetectors shown in FIGS. 4 to 38, an x-direction signal processing circuit 5 for processing the x-direction output signals of the photodetector unit 3, a y-direction signal processing circuit 6 for processing the the y-direction output signals of the photodetector unit, an object 8 to be detected, near-infrared radiation 9 emitted by the light-emitting unit 1, reflected near-infrared radiation 10 reflected from the object 8, scattered visible radiation 11 of solar radiation, and the output signal 12 of the object detector.

Figure 40:
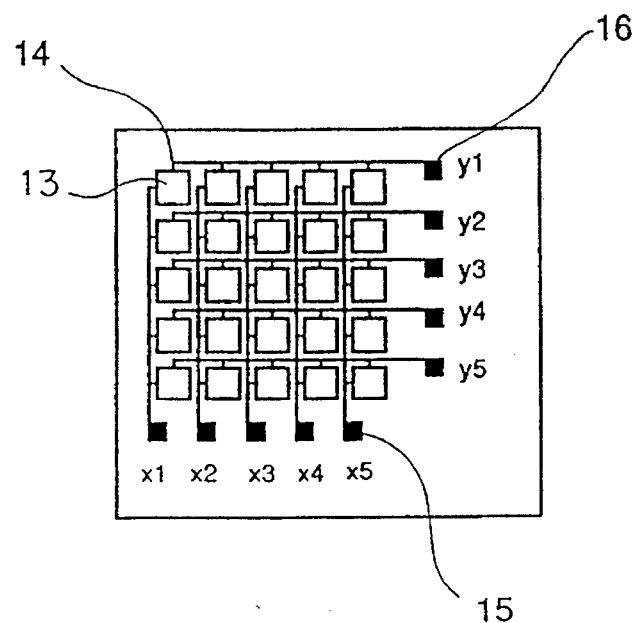
FIG. 40 is a plan view of a photodetector unit included in the object detector of FIG. 39.
Figure 41:
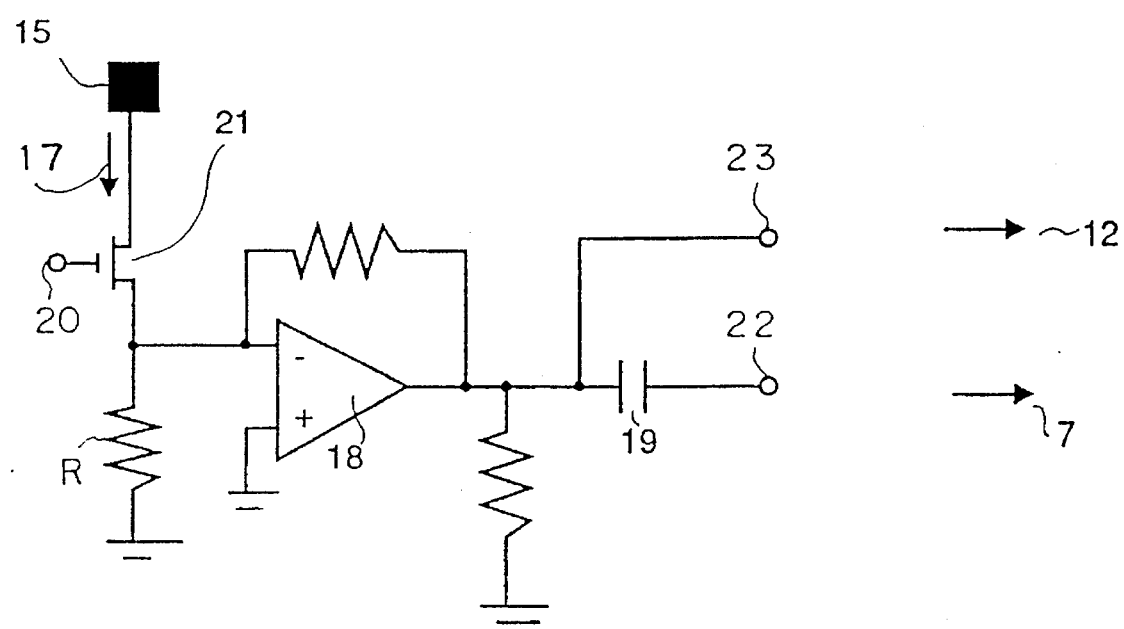
FIG. 41 is a circuit diagram of an x-direction circuit included in the the object detector of FIG. 39.

Referring to FIG. 40 showing the photodetector unit 3, the photodetector unit 3 comprises photodetectors 13 similar to the photodetector of FIG. 4, input/output terminals 14 each connected to the first or the second electrode of each photodetectors 13, x-direction terminals 15 and y-direction terminals 16. The photodetectors 13 may be any one of the photodetectors of FIGS. 4 to 20. FIG. 41 is a circuit diagram of one of the channels of the x-direction signal processing circuit 5. Shown in FIG. 41 are x-direction current 17, i.e., $IX_i$, an operational amplifier 18, a capacitor 19, an x-direction gate signal 20, an x-direction gate switch 21, an x-direction ac output signal, an x-direction dc output signal and a conversion resistor R. FIG. 42 is a circuit diagram of one of the channels of the y-direction signal processing circuit 6. Shown in FIG. 42 are y-direction current 24, i.e., $IY_j$, control voltage $V_j$, and y-direction dc output signal 26.

In operation, the optical system 2 receives near-infrared pulses from the light-emitting unit 1, sends out the near-infrared pulses into a predetermined range, receives the reflected near-infrared radiation 10 reflected from the object 8 and visible radiation 11, and transmits the reflected near-infrared radiation 10 and the visible radiation 11 to the photodetector unit 3. Then, the photodetectors 13 of the photodetector unit 3 converts the incident light signals $W_{ij}$ into corresponding photocurrents. The photoelectric conversion efficiency is proportional to the voltage across the two input/output terminals 14, and the intensity of the photocurrent is proportional to the photoelectric conversion efficiency $S_{ij}$. When the polarity of the voltage is inverted, the direction of flow of the photocurrent is inverted. Therefore, the change of the polarity of the voltage corresponds to setting positive sensitivity and negative sensitivity. As shown in FIG. 40, one of the input/output terminals 14 of each photodetector 13 on each line of the photodetectors 13 is connected to the y-direction terminal 16, and the other input/output terminal of each photodetector 13 on each row of the photodetectors 13 is connected to the x-direction terminal 15. As shown in FIG. 42, control voltages $V_j$ are applied to the y-direction terminals $y_{ij}$. As shown in FIG. 41, the voltage at the x-direction terminal is substantially zero when an x-direction gate signal is HIGH. The sensitivity $S_{ij}$ of the photodetector array of j lines and i rows is expressed by:

$$S_{ij}=k \cdot V_{ij} \quad (1)$$

where k is a constant. An x-direction current $IX_i$ that flows through the x-direction terminal $X_i$ is expressed by:

$$IX_i = \Sigma W_{ij} \cdot S_{ij} = \Sigma Wij \cdot k \cdot V_j \quad (2)$$

This expresses the execution of the one-dimensional sum of products of vectors determined by an image and the control voltage by the photodetector array. In the x-direction circuit 5, the conversion resistor R converts an x-direction current into a voltage signal and the operational amplifier 18 amplifies the voltage signal. The harmonic components included in the output signal of the operational amplifier 18 appear through the capacitor 19 on an ac output terminal as an x-direction ac output signal 22. The dc output signal (which contains ac components, though, the operation of the object detector is not affected by the ac components) included in the output signal of the operational amplifier 18 appears on a dc output terminal as an x-direction dc output signal 23. The y-direction circuit 6 applies a control voltage $V_j$ applied to the photodetectors 13 on each line, and converts a y-direction current $IY_j$ into an output voltage signal. The y-direction current $IY_j$ is the sum of the photocurrents generated by the photodetectors 13 on the j-th line.

Figure 43:
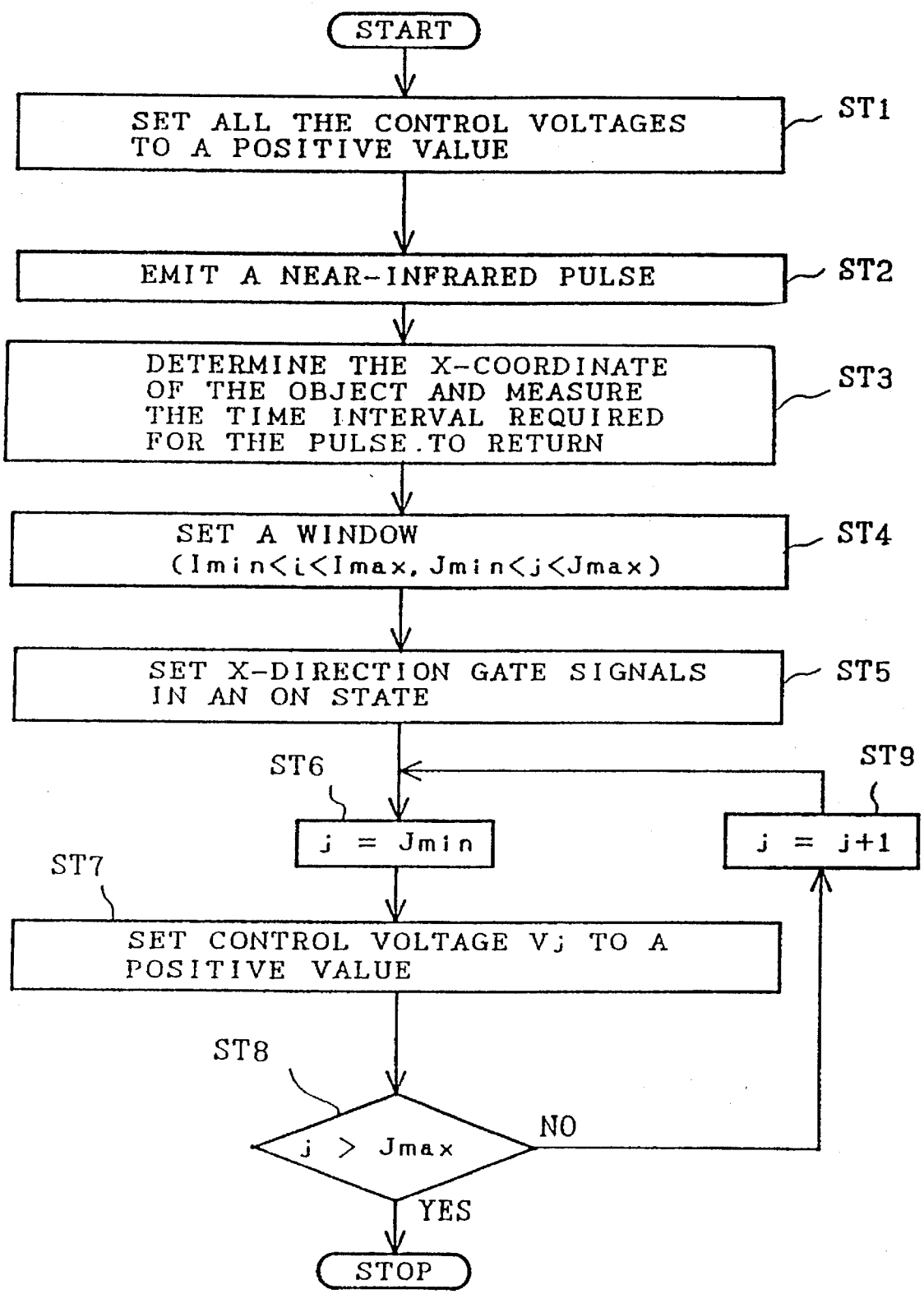
FIG. 43 is a flow chart of an object detecting procedure to be carried out by the object detector of FIG. 39.

FIG. 43 is a flow chart of an object detecting procedure in a preferred embodiment according to the present invention to be carried out by the object detector of FIG. 40.

In step ST1, control voltages $V_j$ to be applied to the photodetectors 13 by the y-direction circuit 6 are set to a positive value, for example, +5. The control voltage $V_j$ is variable, for example, in ten steps in the range of +5 to −5. In this state, the sensitivities of all the photodetectors 13 are "5" (in this state, all the x-direction gates are in an ON state). In step ST2, the light-emitting unit 1 is driven, and the light-emitting unit 1 generates a near-infrared pulse, and then the optical system 2 sends out the near-infrared pulse.

Then in step ST3, the optical system 2 receives the reflected light reflected from the object 8 and the photodetector unit 3 detects the reflected light. The x-coordinate of the object 8 can be roughly estimated through the detection of the x-direction terminals 15 through which photocurrents flow as shown in FIG. 44(a). The distance L between the object 8 and the object detector can be determined by calculation on the basis of the time interval Dt between the emission of a pulse and the reception of the reflected pulse by using the following expression.

$$L=Dt/2C \quad (3)$$

where C is light velocity. Since the reflection signal is a pulse signal, the x-direction ac output signal 22 of the x-direction circuit 5 is measured.

In step ST4, a window is set in a image formed by the photodetector unit 3 so as to contain an image of the object 8 ($I_{min}<i<I_{max}$, $J_{min}<j<J_{max}$) on the basis of the x-coordinate, the distance and the position of the object detector. Then in step ST5, x-direction gate signals 20 corresponding to the set window are set in an ON state for $I_{min}$ to $I_{max}$ and the rest of the x-direction gate signals 20 are kept in an OFF state. Then in step ST6, j for the j-th line corresponding to the first line of the set window is set to $J_{min}$. In step ST7, control voltage $V_j$ is set to +5 V and the rest are set to zero. In this state, the photodetectors 13 on the j-th line are sensitive. An image on the j-th line in the window can be obtained by observing the x-direction dc output signals 22 corresponding to photocurrents generated by visible radiation, i.e., the image data of the object, of the x-direction circuit 5.

In step ST8, a query is made to see if the value of the j-th line is outside a range defined by the window, namely, if $j>J_{max}$. If the response in step ST8 is negative, j is incremented by one in step ST9. This operation is performed while step ST7 is executed to obtain image data including the object for each line is obtained.

Thus, the object detector determines the distance to the object 8 and the x-coordinate of the object, and obtains a partial image of the object. The y-coordinate and the shape of the object can be determined by processing the partial image by a subsequent image processing circuit.

Figure 49:
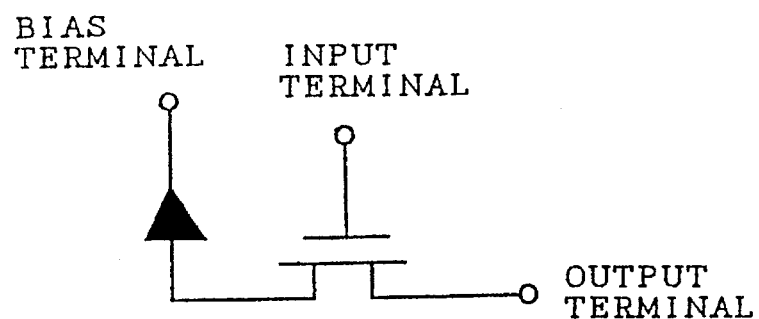
FIG. 49 is a circuit diagram of a photodetector applicable to the object detector of FIG. 39.
Figure 50:
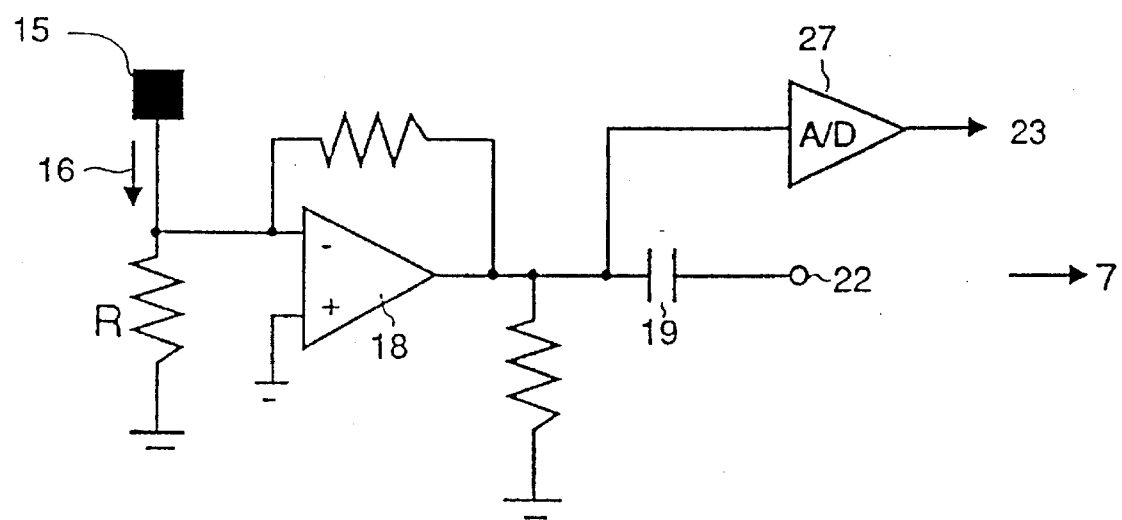
FIG. 50 is a circuit diagram of an x-direction circuit applicable to the object detector of FIG. 39.

The photodetectors 13 employed in this object detector may be replaced with photodetectors in the foregoing embodiments or photodetectors having the following construction provided that the photodetectors have the same functions. For example, a photodetector having two pn junctions, and two p-type layers connected to input/output terminals as shown in FIG. 45(a) or a photodetector having two pn junctions, and two n-type layers connected to input/output terminals as shown in FIG. 45(b) may be used. In these photodetector, the photocurrent is proportional to the voltage across the terminals, and no current flows due to the rectifying function of the pn junctions when the photodetectors are not illuminated. FIG. 46 shows a photodetector employing a photoconductive layer, such as an amorphous silicon layer, having resistance variable with the incident light power. FIG. 47 shows a photodetector formed by stacking an n-type semiconductor layer, a semi-insulating semiconductor layer and a p-type semiconductor layer. When the photodetector shown in FIG. 47 is used, a positive voltage must be applied to the n-type semiconductor layer. FIG. 48 shows a photodetector having a transistor configuration. This photodetector has an amplifying function and is capable of providing an output signal on a high level. A photodetector formed of semiconductors having different band gaps in a heterojunction configuration may be used. FIG. 49 shows a variable-sensitivity photodetector formed by combining a photoelectric converter and a switch. A bias voltage is applied to the photoelectric converter so that the photoelectric converter has a photosensitivity, and the intensity of the photocurrent is controlled by the resistance of the switch. FIG. 50 shows another x-direction circuit 5 applicable to the object detector in this embodiment. This x-direction circuit 5 is provided with an A/D converter 27. The A/D converter 27 converts an analog current signal provided by the photodetector into a corresponding digital signal.

Figure 51:
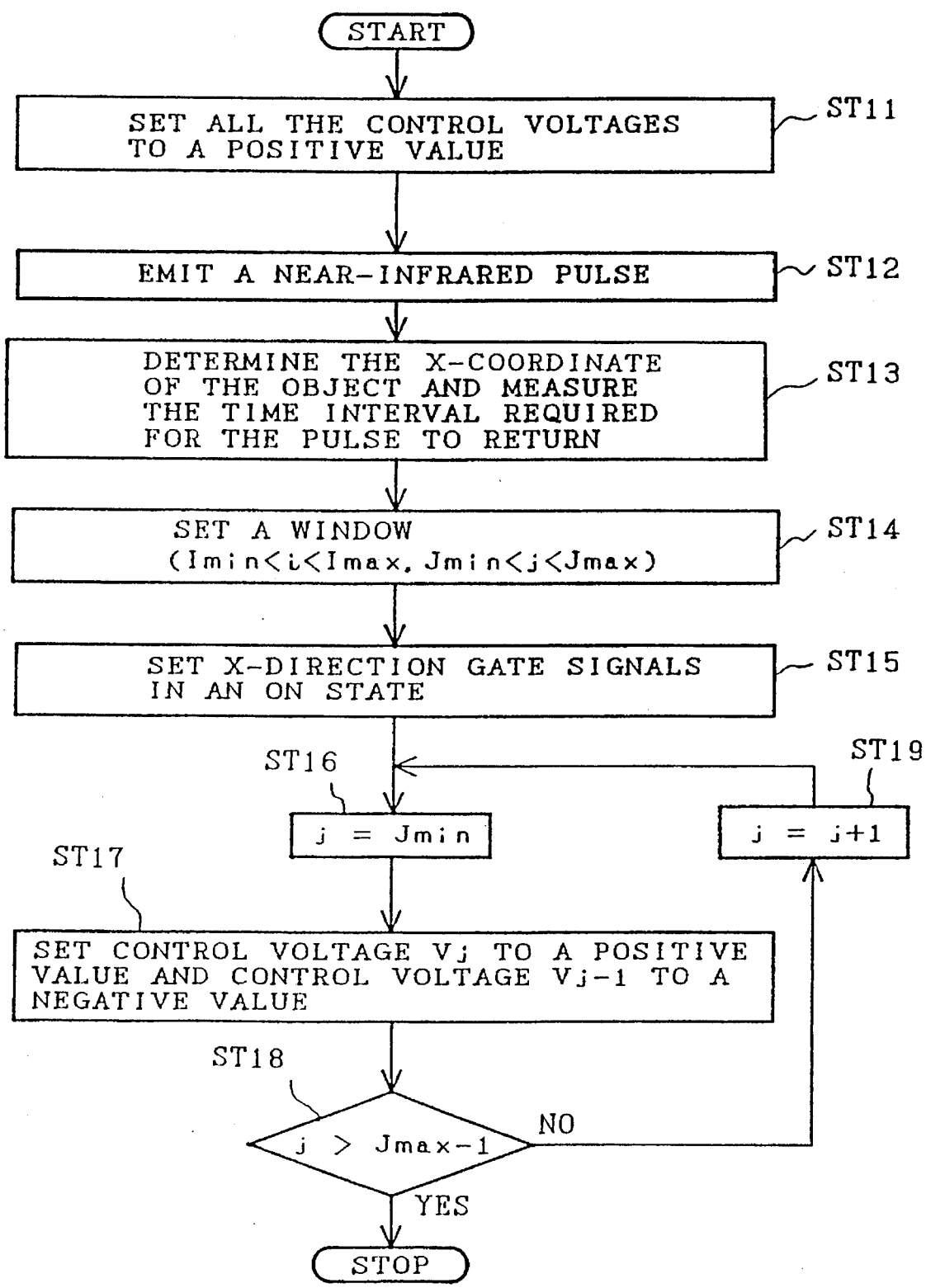
FIG. 51 is a flow chart of another object detecting procedure to be carried out by the object detector of FIG. 39.

FIG. 51 shows another object detecting procedure to be carried out by the object detector shown in FIG. 39. In step ST11, control voltages Vj to be applied to the photodetectors 13 are set to a positive value of, for example, +5 to adjust the photosensitivities of all the photodetectors to "5" (all the x-direction gates are set in an ON state).

In step ST12, the light-emitting unit 1 emits a near-infrared pulse and the optical system 2 sends out the near-infrared pulse. In step ST13, the optical system 2 transmits the reflected light 10 from the object 8 to the photodetector unit 3 and the photodetector unit 3 detects the reflected light 10. The x-coordinate of the object 8 can be roughly estimated through the detection of the x-direction terminals 15 through which photocurrents flow. The distance L between the object 8 and the object detector can be determined by calculation on the basis of the time interval Dt between the emission of a pulse and the reception of the reflected pulse by using expression (3). Since the reflection signal is a pulse signal, x-direction ac output signals 22 of the x-direction circuit 5 may be observed.

Figure 52:
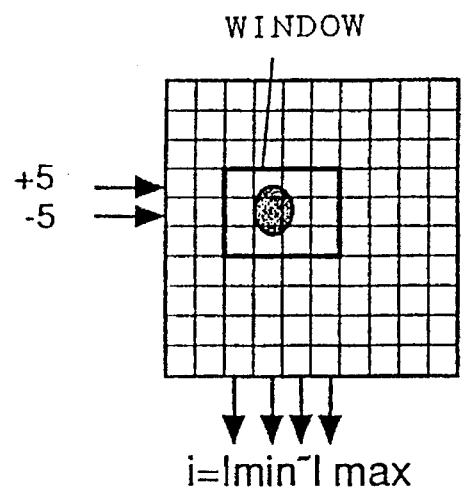
FIG. 52 is a diagrammatic view of assistance in explaining a procedure for setting a window and a control voltage, included in the object detecting procedure explained with reference to FIG. 51.

Then in step ST14, a window is set in an image formed by the photodetector unit 3 so as to contain an image of the object 8 on the basis of the x-coordinate, the distance and the position of the object detector ($I_{min}<i<I_{max}$, $J_{min}<j<J_{max}$). Then in step ST15, the x-direction gate signals 20 of the x-direction circuit 5 for $I_{min}$ to $I_{max}$ are set in an ON state and the rest of the x-direction gate signals 20 are kept in an OFF state. In step ST16, the value j of the j-th line is set to Jmin. In step ST17, control voltages $V_j$ are set to a positive value of, for example, +5, control voltages $V_{j+1}$ are set to a negative value of, for example, −5 and the rest are set to zero (FIG. 52). The x-direction output signal represents the difference in the illuminance of the incident light on the plane of incidence between the j-th line and the j+1-th line. The outputs of the photodetectors corresponding to a vertical outline of the pattern are high and the outputs of the rest are low.

Then in step ST18, a query is made to see if j is greater than Jmax−1. If the response in step ST18 is negative, j is incremented by one in step ST19 and steps ST16 and ST17 are repeated for different values of j to determine the vertical outline in a partial image including the image of the object 8 for each line.

The partial image obtained by the object detecting procedure indicates the distance to the object 8, and the x-coordinate and the vertical outline of the object. Since the characteristics of the partial image are detected, the y-coordinate and the shape of the object 8 can be readily detected by a subsequent circuit.

Figure 53:
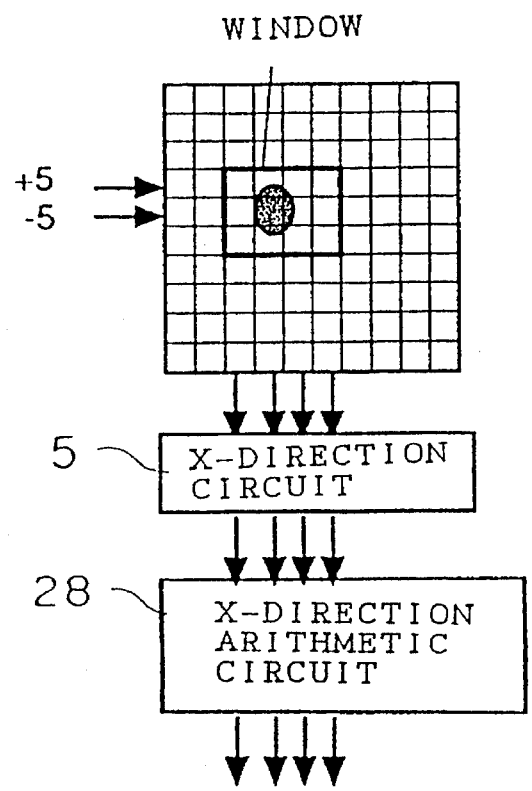
FIG. 53 is a diagrammatic view of assistance in explaining essential procedures to be executed by an object detector in a preferred embodiment according to the present invention.

FIG. 53 shows an essential part of an object detector in a preferred embodiment according to the present invention. This object detector is provided with an x-direction arithmetic circuit 28 in addition to the x-direction circuit 5 included in the object detector of FIG. 51. The x-direction arithmetic circuit 28 processes the plurality of output signals of the x-direction circuit 5, for example, for addition and subtraction.

Figure 54:
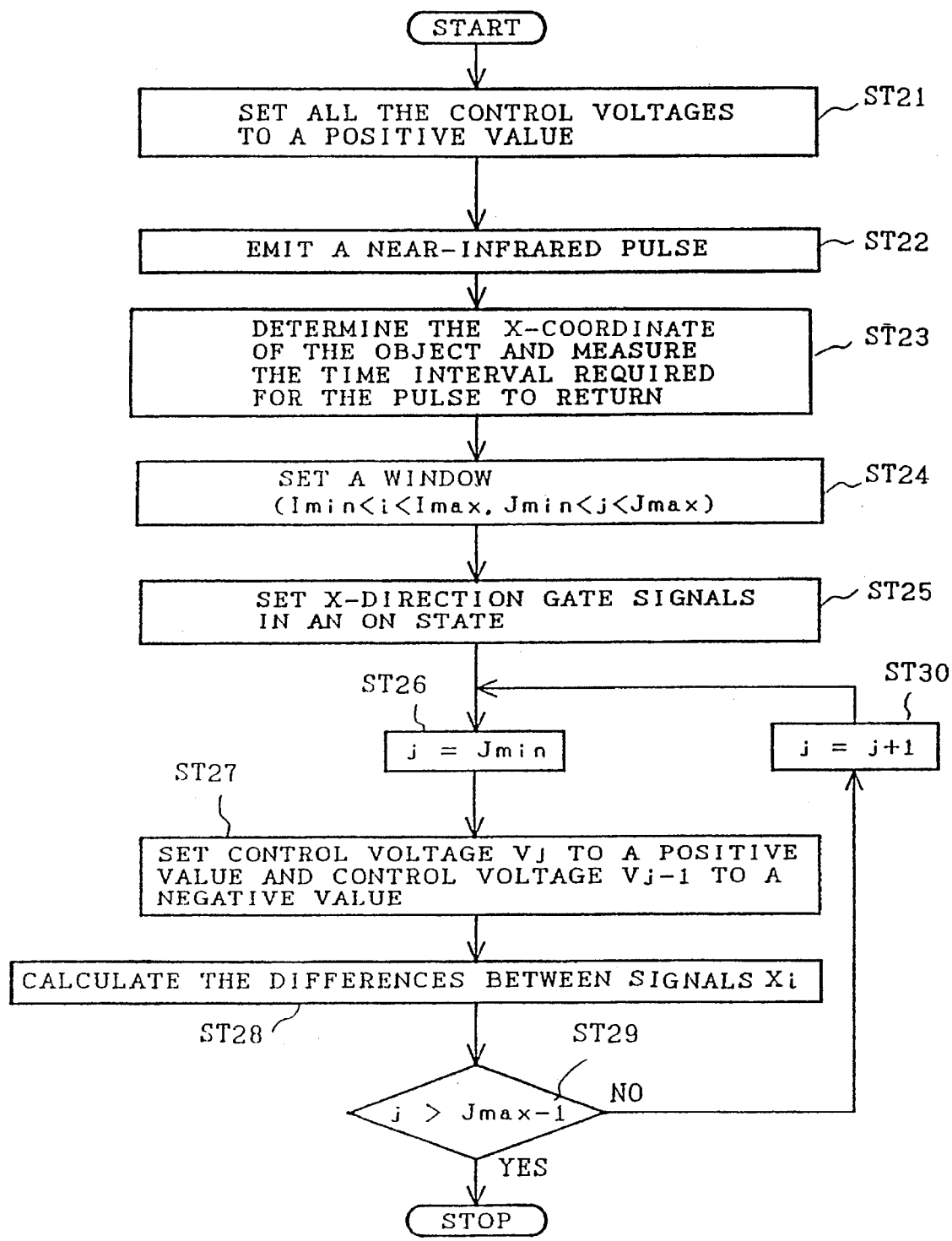
FIG. 54 is a flow chart of an object detecting procedure in a preferred embodiment according to the present invention.

FIG. 54 is a flow chart of an object detecting procedure in a preferred embodiment according to the present invention. Referring to FIG. 54, in step ST21, control voltages Vj to be applied to the photodetectors are set to a positive value of, for example, +5 to adjust the photosensitivities of the photodetectors to "5" (all the x-direction gates are set in an ON state). In step ST22, the light-emitting unit 1 emits a near-infrared pulse, and the optical system sends out the near-infrared pulse.

In step ST23, the optical system 2 transmits the reflected light reflected from the object 8 to the photodetector unit 3. The x-coordinate of the object 8 can be roughly estimated from the detection of the x-direction terminals 15 through which photocurrents flow. The distance between the object and the object detector can be determined by calculation on the basis of the time interval Dt between the emission of a pulse of near-infrared radiation and the reception of the reflected pulse. Since the reflection signal is a pulse signal, the x-direction ac output signals 22 of the x-direction circuit 5 may be observed.

Then in step ST24, a window is set in an image formed by the photodetector unit 3 so as to contain an image of the object 8 ($I_{min}<i<I_{max}$, $J_{min}<j<J_{max}$) on the basis of the x-coordinate, the distance and the position of the object detector. Then in step ST25, x-direction gate signals 20 are set in an ON state for imin to Imax and the rest of the x-direction gate signals 20 are kept in an OFF state. Then in step ST26, j for the j-th line of the window is set to Jmin.

Then in step ST27, control voltages Vj are set to a positive value of, for example, +5, control voltages $V_{j+1}$ are set to a negative value of, for example −5 and the rest are set to zero. The x-direction output signal represents the difference in the illuminance of the incident light on the plane of incidence between the j-th line and the j+1-th line. In step ST28, the differences between the adjacent signals are calculated by the x-direction arithmetic circuit 28.

Then in step ST29, a query is made to see if j is greater than Jmax−1. If the response in step ST28 is negative, j is incremented by one in step ST29 and steps ST26 through ST28 are repeated for different values of j to determine the diagonal outlines in a partial image including the image of the object 8 for each line. A partial image having a detected horizontal outline can be obtained by calculating the horizontal differences by the x-direction arithmetic circuit 28.

Figure 55:
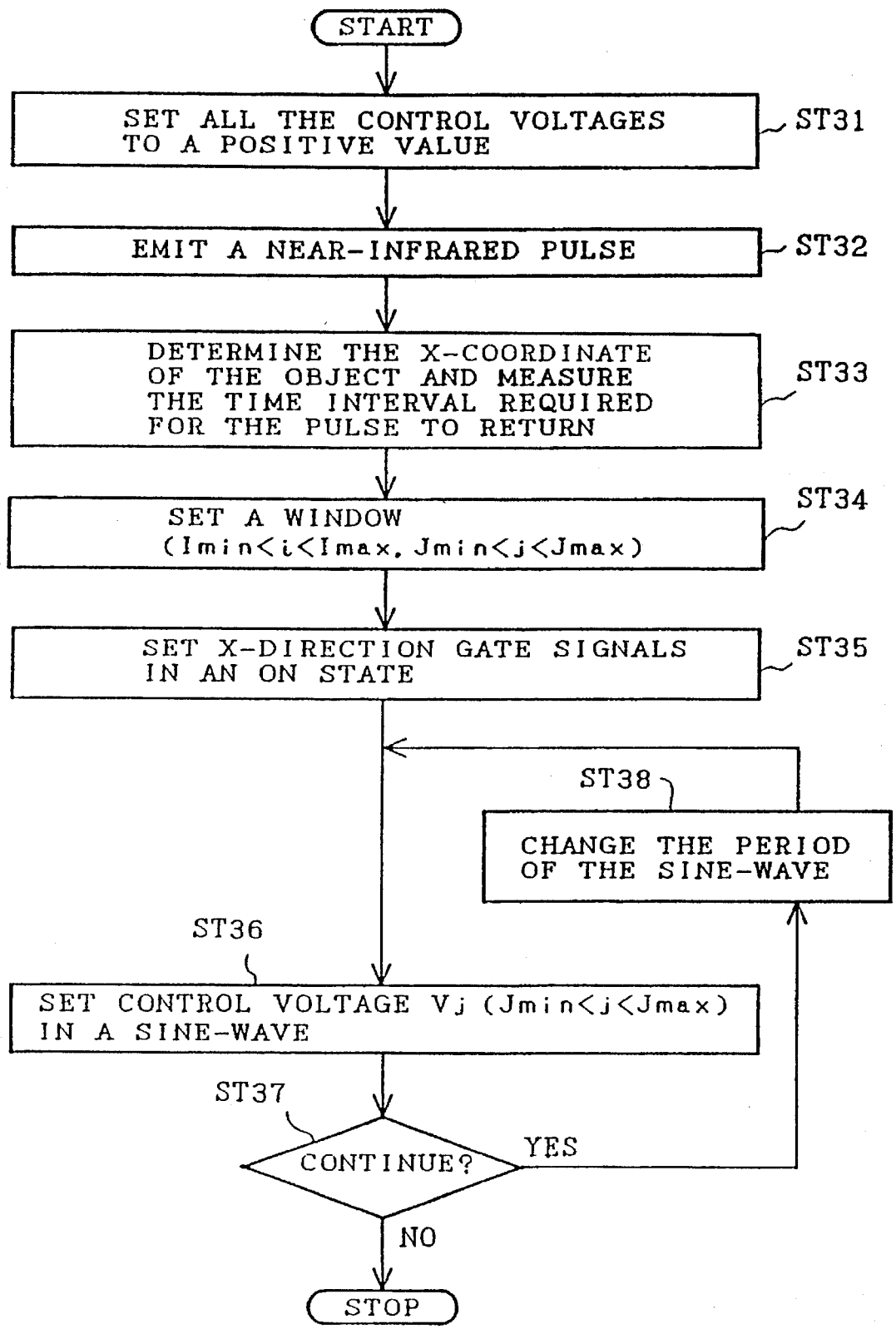
FIG. 55 is a flow chart of an object detecting procedure in a preferred embodiment according to the present invention.

FIG. 55 is a flow chart of an object detecting procedure in a preferred embodiment according to the present invention. Although the object detecting procedures shown in FIGS. 51 and 53 detect the outlines, various image processing method can be carried out by changing the combination of control voltages $V_j$. The object detecting procedure shown in FIG. 55 employs spatial Fourier transformation.

In step ST31, all control voltages $V_j$ to be applied to the photodetectors 13 are set to a positive value of, for example +5 to adjust the photosensitivities of all the photodetectors 13 to "5" (all the x-direction gates are set in an ON state). Then in step ST32, the light emitting unit 1 emits a near-infrared pulse and the optical system sends out the near-infrared pulse.

Then in step ST33, the optical system 2 receives the reflected light reflected from the object 8 and the photodetector unit 3 detects the reflected light. The x-coordinate of the object 8 can be roughly estimated through the detection of the x-direction terminals 15 through which photocurrents flow. The distance between the object 8 and the object detector can be determined by calculation on the basis of the time interval Dt between the emission of a pulse and the reception of the reflected pulse. Since the reflection signal is a pulse signal, the x-direction ac output signals 22 of the x-direction circuit may be observed.

Then in step ST34, a window is set in an image formed by the photodetector unit 3 so as to contain an image of the object 8 ($I_{min}<i<I_{max}$, $J_{min}<j<J_{max}$) on the basis of the x-coordinate, the distance and the position of the object detector. then, in step ST35, x-direction gate signals 20 corresponding to the set window are set in an ON state for $I_{min}$ to $I_{max}$ and the rest of the x-direction gate signals 20 are kept in an OFF state. Then in step ST36, the control voltages $V_j$ ($J_{min}<j<J_{max}$) are set to a sine-wave voltage. In this state, the x-direction output is equal to the magnitude of a set spatial frequency component.

Then in step ST37, a query is made to see if the procedure is to be continued. If the response in step ST37 is affirmative, the period of the control voltages $V_j$ is changed for a different period in step ST38, and then the step ST36 is executed to obtain the longitudinal Fourier transformation of the partial image for each line. Another orthogonal transformation, such as Walsh transformation, may be used instead of Fourier transformation.

FIG. 56 is a flow chart of an object detecting procedure in a preferred embodiment according to the present invention. The object detector of FIG. 39 executes the calculation of the sum of products of an image and control voltage vectors. The object detecting procedure shown in FIG. 56 executes the calculation of the sum of products of an image and control voltage vectors to search a window for a specified pattern by pattern matching.

In step ST41, all control voltages $V_j$ to be applied to the photodetectors are set to a value of, for example, +5. In this state, the photosensitivities of all the photodetectors are adjusted to "5" (all the x-directions gates are set in an ON state). Then in step ST42, the light-emitting unit 1 emits a near-infrared pulse and the optical system 2 sends out the near-infrared pulse.

Then in step ST43, the optical system 2 receives the reflected light from the object 8 and transmits the reflected light to the photodetector unit 3. The x-coordinate of the object 8 can be roughly estimated through the detection of the x-direction terminals 15 through which photocurrents flow. The distance between the object 8 and the object detector can be determined by calculation on the basis of a timer interval Dt between the emission of a pulse of near-infrared radiation and the reception of the reflected pulse. Since the reflection signal is a pulse signal, the x-direction ac output signals 22 of the x-direction circuit 5 may be observed.

Then in step ST44, a window is set in an image formed by the photodetectors so as to contain an image of the object 8 on the basis of the x-coordinate, the distance and the position of the object detector ($I_{min}<i<I_{max}$, $J_{min}<j<J_{max}$). Then in step ST45, x-direction gate signals 20 for $I_{min}$ to $I_{max}$ are set in an ON state and the rest of the x-direction gate signals 20 are kept in an OFF state.

Then in step ST46, control voltages $V_j$ ($J_{min}<j<J_{max}$) are set for a desired pattern. In this state, the x-direction output signal is a correlation signal representing the correlation between the set pattern and the image. Then in step ST47, a query is made to see if the procedure is to be continued. If the response in step ST47 is affirmative, the control voltages $V_j$ are shifted in step ST48. Thus, step ST46 is repeated while the components of the control voltage vectors are shifted to achieve pattern matching with the partial image for each line. For example, double lines among various patterns are detected by setting the control voltages $V_j$ as shown in FIG. 57(a), and the respective positions of the double lines are indicated in an output image as shown in FIG. 57(b).

Figure 58:
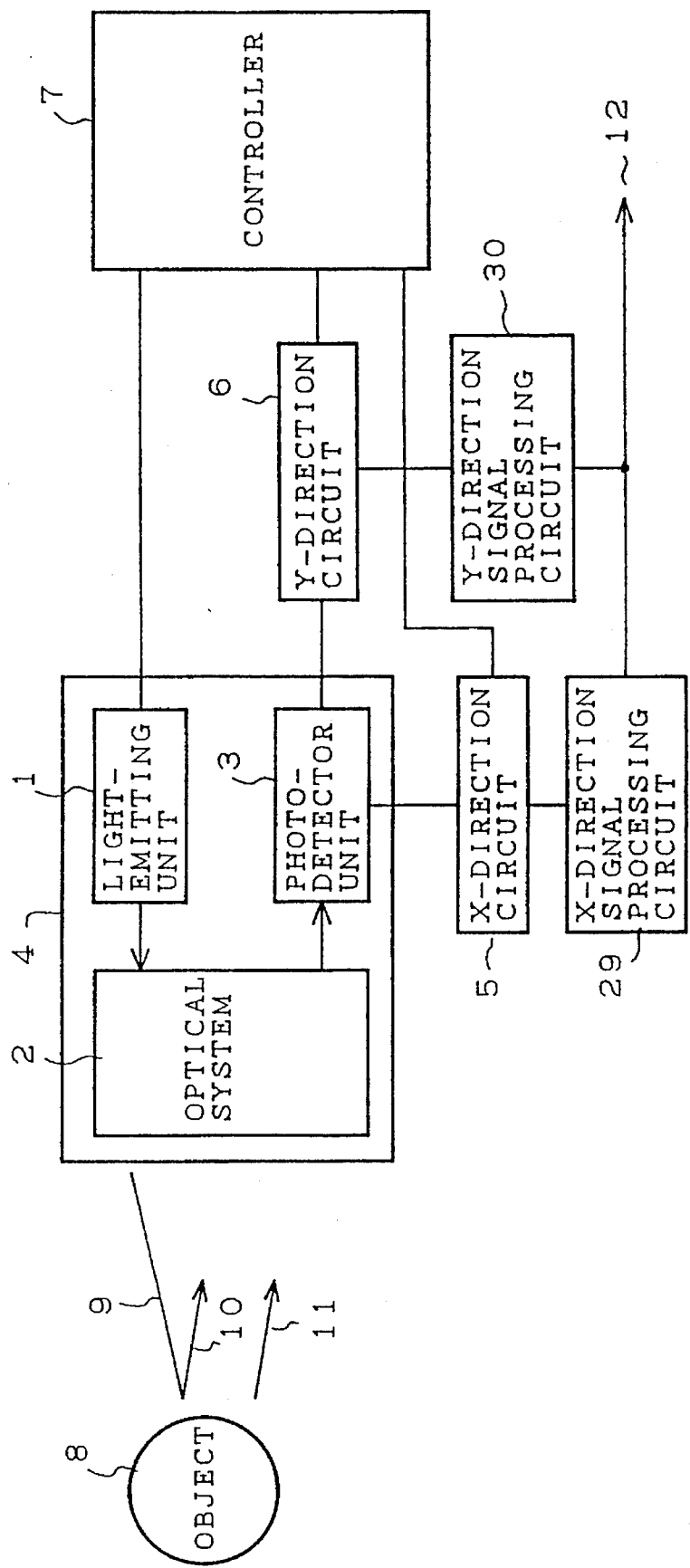
FIG. 58 is a block diagram of an object detector in a preferred embodiment according to the present invention.

FIG. 58 shows an object detector in a preferred embodiment according to the present invention, in which parts like or corresponding to those of the object detector shown in FIG. 39 are denoted by the same reference characters, and FIG. 59 shows an essential part of the object detector of FIG. 59. Referring to FIGS. 58 and 59, an x-direction signal processing circuit 29 receives a plurality of signals from an x-direction circuit 5 and processes the input signals by analog operations, digital operations or analog and digital operations, and a y-direction signal processing circuit 30 receives signals from a y-direction circuit 6 and processes the input signals in an analog signal processing mode, a digital signal processing mode or an analog-and-digital signal processing mode.

FIG. 60 is a flow chart of an image processing procedure to be carried out by the object detector of FIG. 58. Referring to FIG. 60, all control voltages $V_j$ to be applied to the photodetectors are set to a value of, for example, +5 in step ST51. In this state, the photosensitivity of all the photodetectors are "5" (all the x-direction gates are set in an ON state). In step ST52, alight-emitting unit 1 emits a near-infrared pulse and an optical system 2 sends out the near-infrared pulse.

Then in step ST53, the optical system 2 receives the reflected light from an object 8 and transmits the reflected light to a photodetector unit 3. The x-coordinate of the object 8 can be roughly estimated through the detection of x-direction terminals 15 through which photocurrents flow. The distance between the object 8 and the object detector can be determined by calculation on the basis of the time interval Dt between the emission of a pulse and the reception of the reflected pulse. Since the reflection signal is a pulse signal, the x-direction ac output signals 22 of the x-direction circuit 5 may be observed.

Then in step ST54, a window is set in an image formed by the photodetector unit 3 so as to contain an image of the object 8 ($I_{min}<i<I_{max}$, $J_{min}<j<J_{max}$) on the basis of the x-coordinate, the distance and the position of the object detector. Then in step ST55, x-direction gate signals 20 for $I_{min}$ to $I_{max}$ are set in an ON state and the rest of the x-direction gate signals 20 are kept in an OFF state. Then in step ST56, the control voltages $V_j$ ($J_{min}<j<J_{max}$) are set to a value of, for example 5. In this state, the x-direction output signals represent a vertical projection of an image within the window. If only few patterns other than that of the object is contained in the window, the projection is that of the object (FIG. 59).

Then in step ST57, the x-direction signal processing circuit 29 processes x-direction projection signals to calculate the x-coordinate and the width of the object accurately.

Thus, the object detector in this embodiment does not need to drive the photodetector array repeatedly, so that the distance to the object, and the accurate x-coordinate and the accurate width of the object can be determined very quickly.

Figure 61:
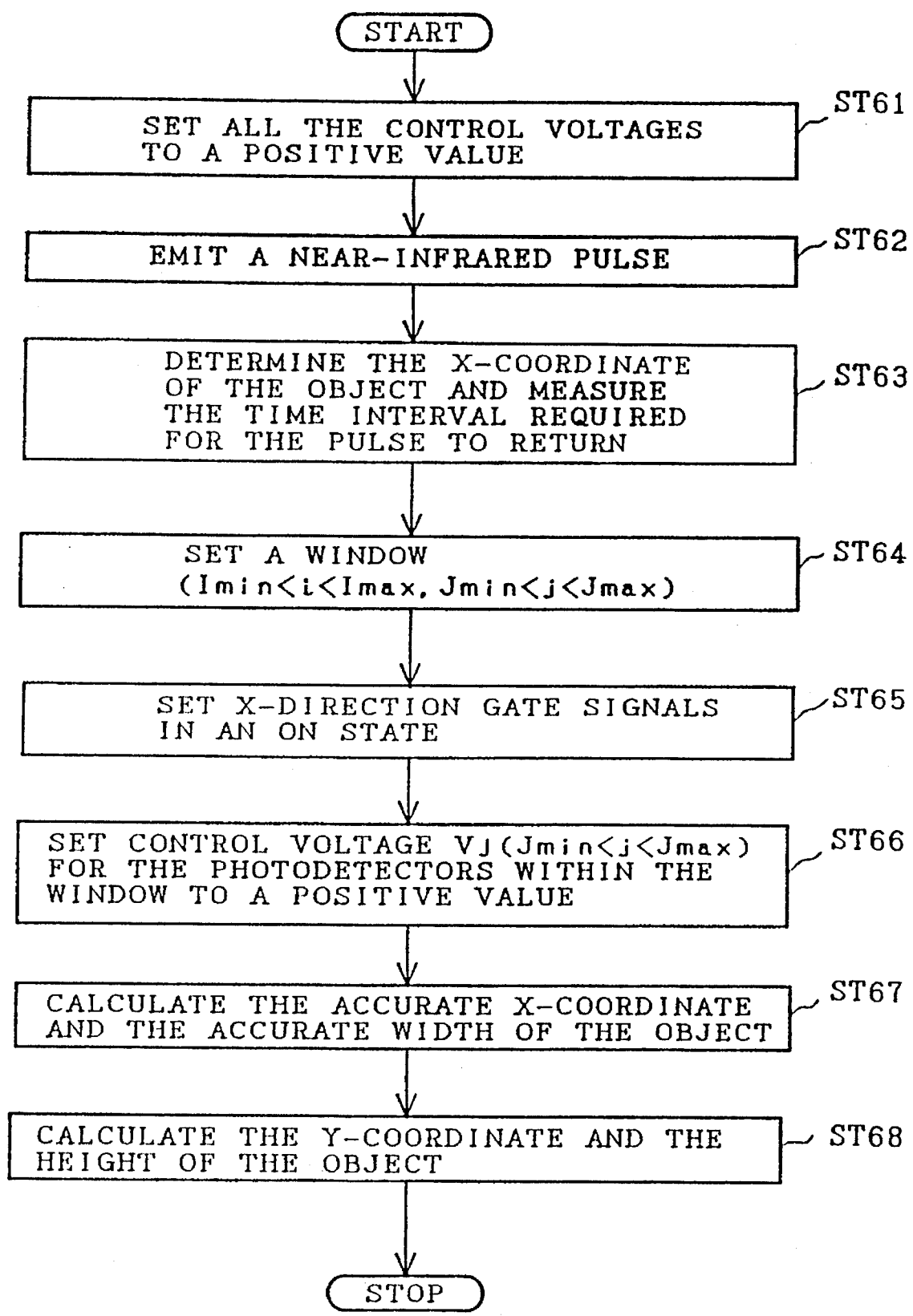
FIG. 61 is a flow chart of an object detecting procedure to be carried out by the object detector of FIG. 58.

FIG. 61 is a flow chart of an object detecting procedure in a preferred embodiment according to the present invention to be carried out by the object detector of FIG. 58. This object detecting procedure uses both an x-direction projection and a y-direction projection.

First, control voltages $V_j$ to be applied to all the photodetectors are set to 5 in step ST61 to adjust the photosensitivities of all the photodetectors to "5" (all the x-direction gates are set in an ON state). Then in step ST62, the light-emitting unit 1 emits a near-infrared pulse and the optical system 2 sends out the near-infrared pulse. Then in step ST63, the optical system 2 receives the reflected light from the object 8 and transmits the reflected light to the photodetector unit 3 to from an image of the object 8. The x-coordinate of the object 8 can be roughly determined through the detection of the x-direction terminals 15 through which photocurrents flow. The distance between the object 8 and the object detector can be determined by calculation on the basis of the time interval Dt between the emission of a pulse and the reception of the reflected pulse. Since the reflection signal is a pulse signal, the x-direction ac output signals of the x-direction circuit 5 may be observed.

Then in step ST64, a window is set for the detected image so as to contain the image of the object 8 ($I_{min}<i<I_{max}$, $J_{min}<j<J_{max}$) on the basis of the x-coordinate, the distance and the position of the object detector. Then in step ST65, x-direction gate signals 20 for Imin to Imax are set in an ON state and the rest of the x-direction gate signals 20 are kept in an OFF state. Then in step ST66, control voltages $V_j$ ($J_{min}<j<J_{max}$) are set to +5. In this state, x-direction output signals represent a vertical projection of the image within the window, and y-direction output signals represent a horizontal projection of the image within the window. If only few patterns other than that of the object is contained in the window, the projections are those of the object (FIG. 62).

Then in step ST67, the x-direction signal processing circuit 29 processes the x-direction projection signals to calculate the accurate x-coordinate and the accurate width of the object 8. Then in step ST68, the y-direction signal processing circuit 30 processes the y-direction projection signals to calculate the y-coordinate and the height of the object 8.

Thus, this object detecting procedure does not need to drive the photodetector array repeatedly, so that the distance to the object, and the accurate x- and the y-coordinate, the accurate width and the accurate height of the object 8 can be quickly determined. It is possible to infer roughly what the object 8 is from the width and the height of the object. Suppose that the object detector is used on an automobile. Objects can be detected in three images as shown in FIGS. 63(*a*), 63(*b*) and 63(*c*). An image having a comparatively large with as shown in FIG. 63(*a*) is considered to be an image of an automobile, an image having a comparatively small width as shown in FIG. 63(*b*) is expected to be an image of a motorcycle, and an image having a very small width as shown in FIG. 63(*c*) is expected in a high probability to be an image of a man. Although the classification is very rough, quick detection of the object is a significant advantage.

Figure 64:
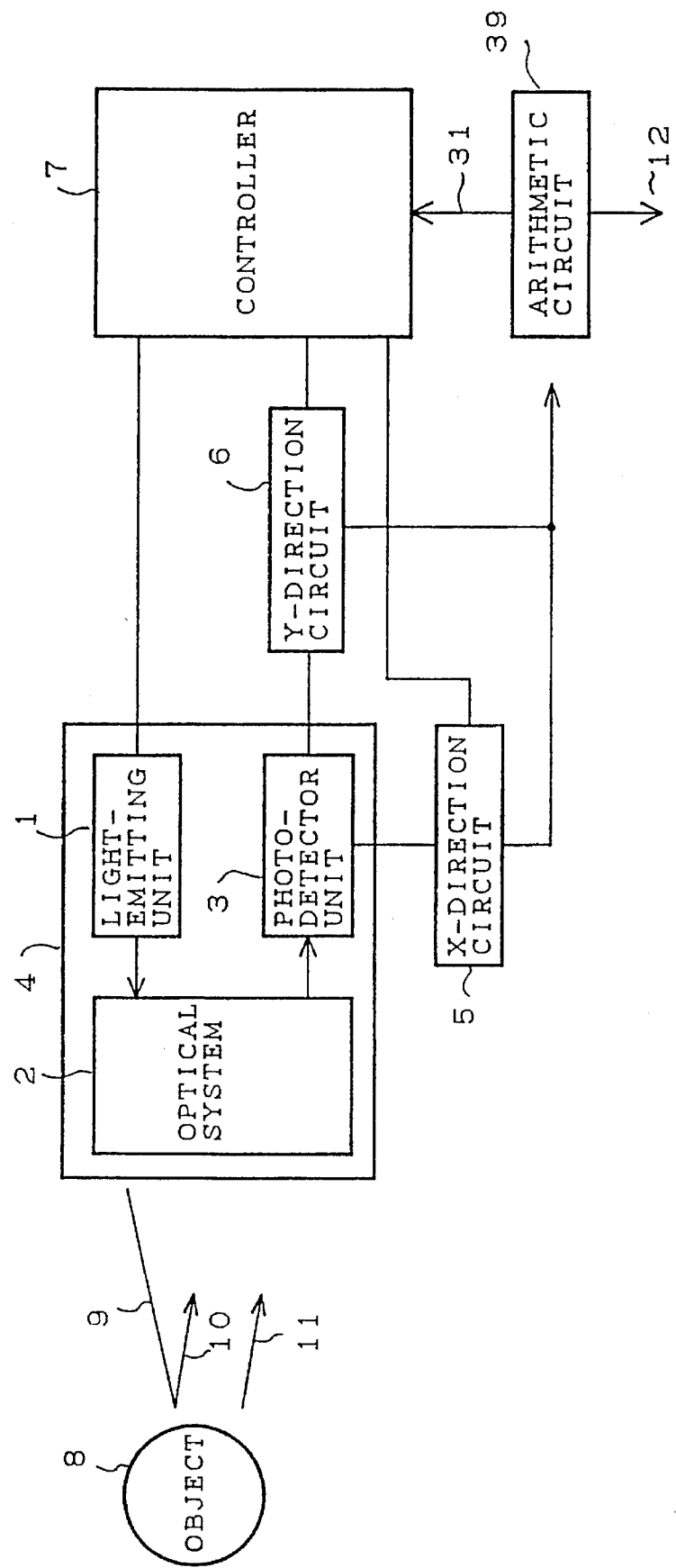
FIG. 64 is a block diagram of an object detector in a preferred embodiment according to the present invention.

FIG. 64 shows an object detector in a preferred embodiment according to the present invention, in which parts like or corresponding to those of the object detector of FIG. 39 are denoted by the same reference characters. In FIG. 64 indicated at 39 is an arithmetic circuit, i.e., a set data feedback means, and at 31 is a feedback signal. The arithmetic circuit 39 processes the output signals of an x-direction circuit 5 and a y-direction circuit 6. Concretely, the arithmetic circuit 39 is, for example, an analog circuit, a chip microprocessor, a signal processor or a computer.

Each of the three-dimensional object detecting procedures in the foregoing embodiments sets a window on the basis of the reflected near-infrared radiation, and detects an object and processes the partial image of the object. However, it is probable in some cases that an inappropriate window, such as a window too small for the object, is set. On the other hand, the object detector in this embodiment processes the data by the arithmetic circuit 39 to decide whether or not a window is set properly, feeds back the decision to a control circuit 7, and then, if necessary, the window setting operation is repeated to set a proper window, so that the object can be accurately detected.

Although the object detector of FIG. 58 tries the window setting operation again, the object detector of FIG. 64 does not change the window and changes the method of processing the partial image by the arithmetic circuit 39 optionally. For example, the window is searched for square patterns in the initial stage of a pattern matching operation and, if any square pattern is not found in the window, the window may be searched for triangular patterns.

Figure 65:
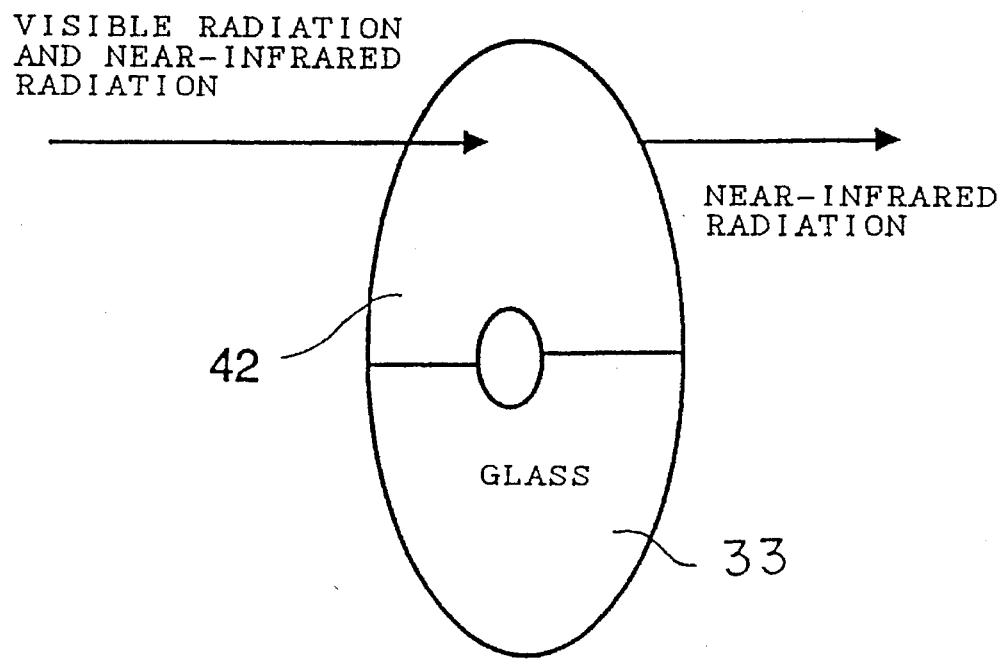
FIG. 65 is a pictorial view of an essential component of an object detector in a preferred embodiment according to the present invention.

FIG. 65 shows an optical system included in an object detector in a preferred embodiment according to the present invention. Whereas the object detector in the foregoing embodiments detect the reflected pulse by the pulse detecting circuit to determine the distance to the object, the object detector in this embodiment removes visible radiation optically from the reflected radiation to determine the distance to the object by using the reflected pulse of near-infrared radiation. Referring to FIG. 65, a glass plate 33 (transmissive means) transmits both visible radiation and near-infrared radiation included in the reflected light. A visible radiation absorbing filter 42 (visible radiation absorbing means) transmits only near-infrared radiation, so that a photodetector unit 3 receives only near-infrared radiation. The elimination of visible radiation from the incident light simplifies subsequent optical signal processing circuits. The visible radiation absorbing filter 42 may be any suitable optical element.

Figure 66:
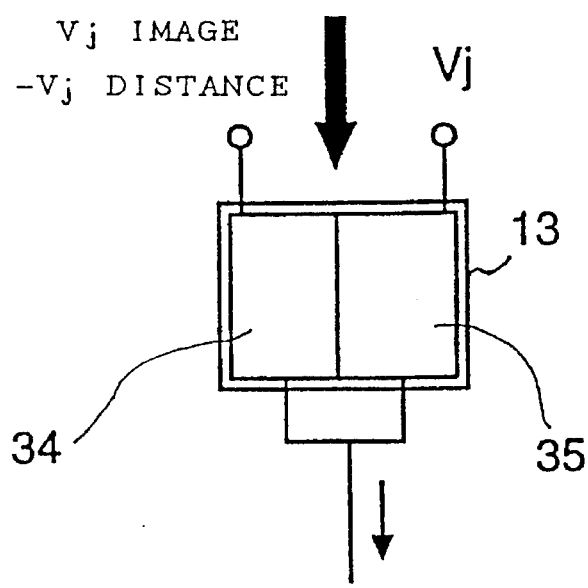
FIG. 66 is a diagrammatic view of an essential component of an object detector in a preferred embodiment according to the present invention.

FIG. 66 shows one of photodetectors employed in an object detector in a preferred embodiment according to the present invention. In FIG. 66, indicated at 34 is a first photoelectric conversion part sensitive to only visible radiation and at 35 is a second photoelectric conversion part sensitive to both visible radiation and near-infrared radiation. When the first photoelectric conversion part 34 is set for a negative photosensitivity and the second photoelectric conversion part 34 is set for a positive photosensitivity, the output signal of the photodetector, i.e., the sum of the respective output photocurrents of the first photoelectric conversion part 34 and the second photoelectric conversion part 35, represents the near-infrared component. When the photosensitivity of the photodetector is thus variable for a wavelength range, a photocurrent representing only near-infrared radiation can be used for distance measurement.

Figure 67:
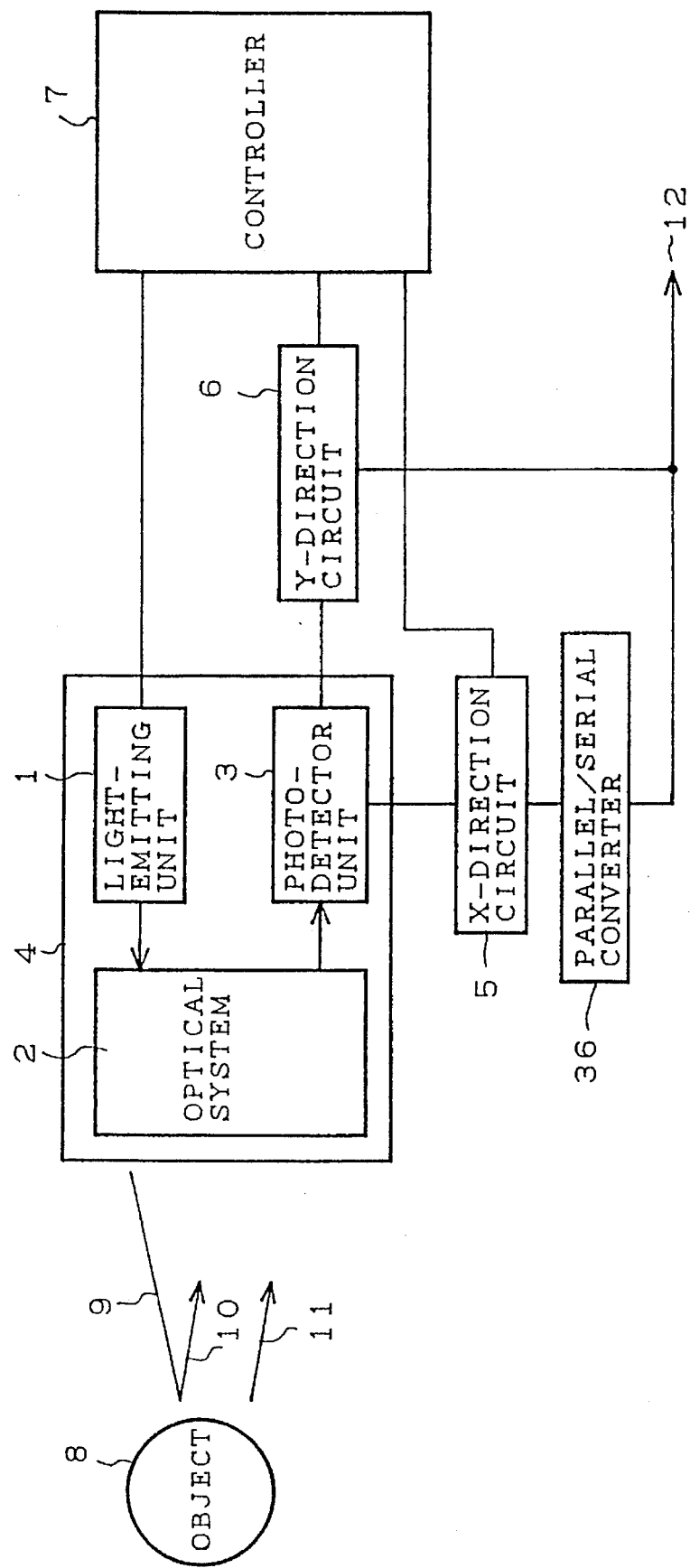
FIG. 67 is a block diagram of an object detector in a preferred embodiment according to the present invention.

FIG. 67 shows an object detector in a preferred embodiment according to the present invention, in which parts like or corresponding to those of the object detector of FIG. 39 are denoted by the same reference characters. Referring to FIG. 67, a parallel/serial converter 36 (signal converting means) converts the parallel output signal of an x-direction circuit 5 into a serial signal. The parallel/serial converter 36 may be formed so as to hold analog signals temporarily with a capacitor or the like and to send out the analog signals sequentially by switching or so as to convert analog signals into corresponding digital signals with an A/D converter and to convert the digital signals into serial signals with a shift register.

Figure 68:
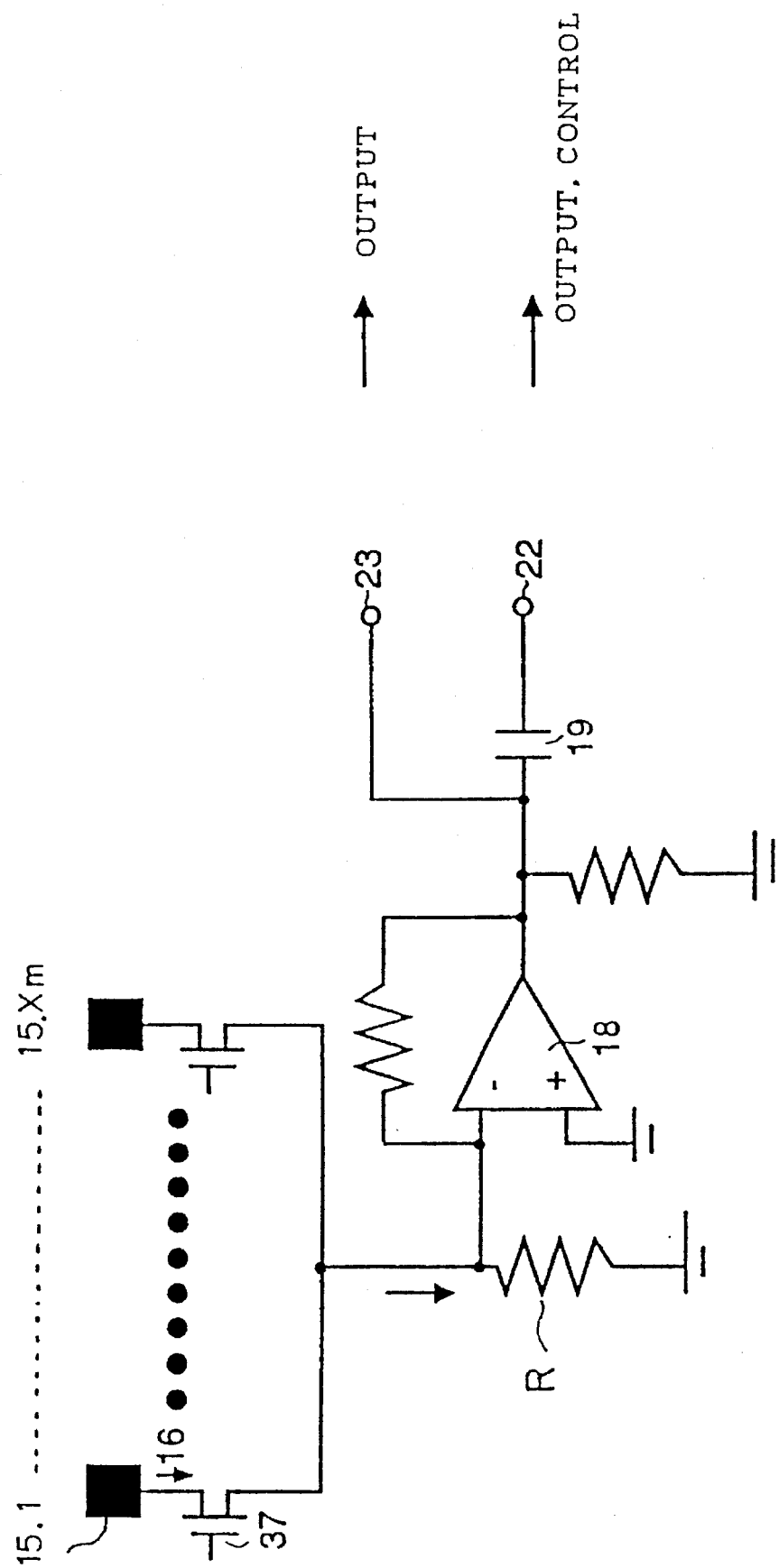
FIG. 68 is a circuit diagram of an essential circuit of an object detector in a preferred embodiment according to the present invention.

FIG. 68 shows an x-direction circuit included in an object detector in a preferred embodiment according to the present invention. In FIG. 68, indicated at 37 are parallel/serial conversion switches (switching means). This circuit need not be provided with any x-direction gate switch. A plurality of x-direction terminals 15.1, 15.2, . . . and 15.xm are connected respectively through the parallel/serial conversion switches 37 to the negative terminal of an operational amplifier 18. The switches 37 are turned on sequentially to apply a plurality of output signals of a photodetector array serially to the operational amplifier 18. Since the plurality of signals are received serially by only a single x-direction circuit, the circuit of the object detector can be formed in a compact configuration.

Figure 69:
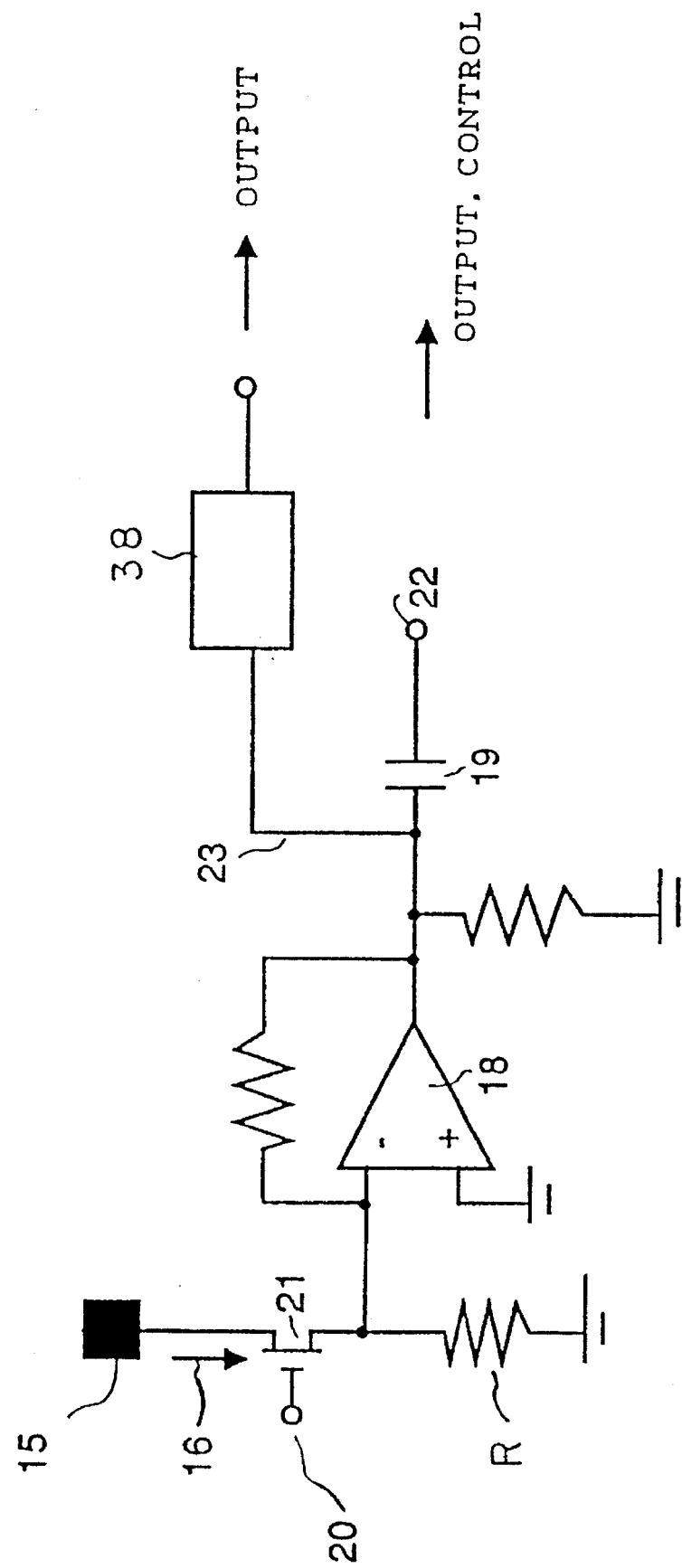
FIG. 69 is a circuit diagram of an essential circuit of an object detector in a preferred embodiment according to the present invention.
Figure 70:
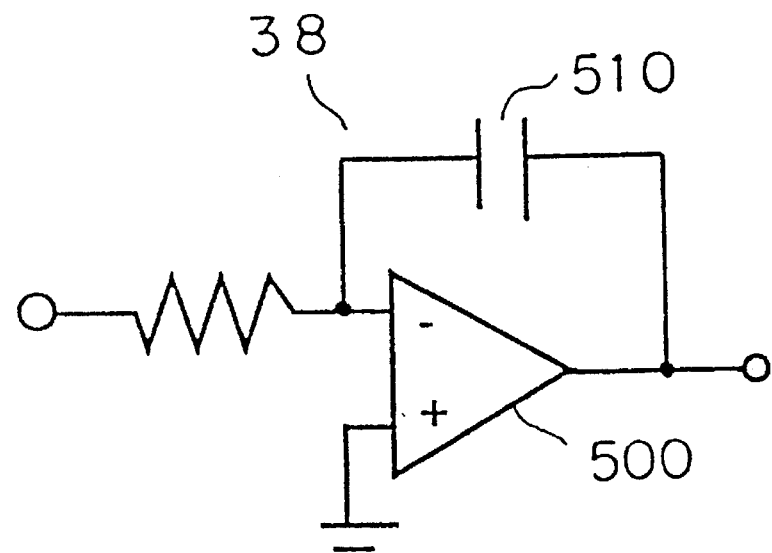
FIG. 70 is a circuit diagram of an integrating circuit included in the object detector of FIG. 69.

FIG. 69 shows an x-direction circuit included in an object detector in a preferred embodiment according to the present invention. In FIG. 69, indicated at 38 is an integrator (integrating means) comprising an operational amplifier 500 and a capacitor 510 as shown in FIG. 70. Since the integrator 38 integrates the output signal of the photodetector to raise the level of the output signal, the object detector is able to function in an environment where only signals on a comparatively low level are available. The integrator 38 cancels random noise to improve the S/N ratio of the x-direction circuit.

Figure 71:
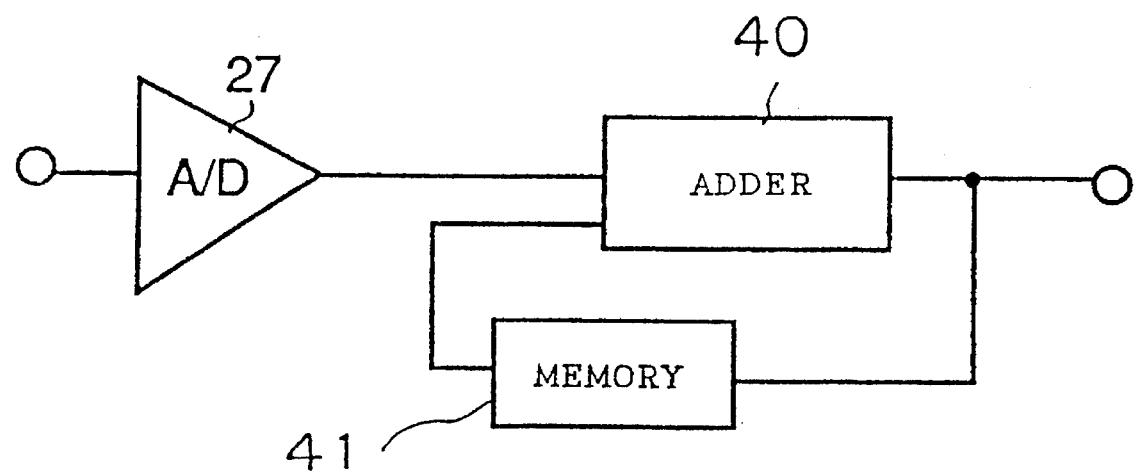
FIG. 71 is a block diagram of another integrating circuit applicable to the object detector of FIG. 69.

Although the integrator 38 employed in this embodiment is an analog integrator, the integrator 38 may be a digital integrator comprising an A/D converter 27, an adder 40 and a memory 41 as shown in FIG. 71.

Figure 72:
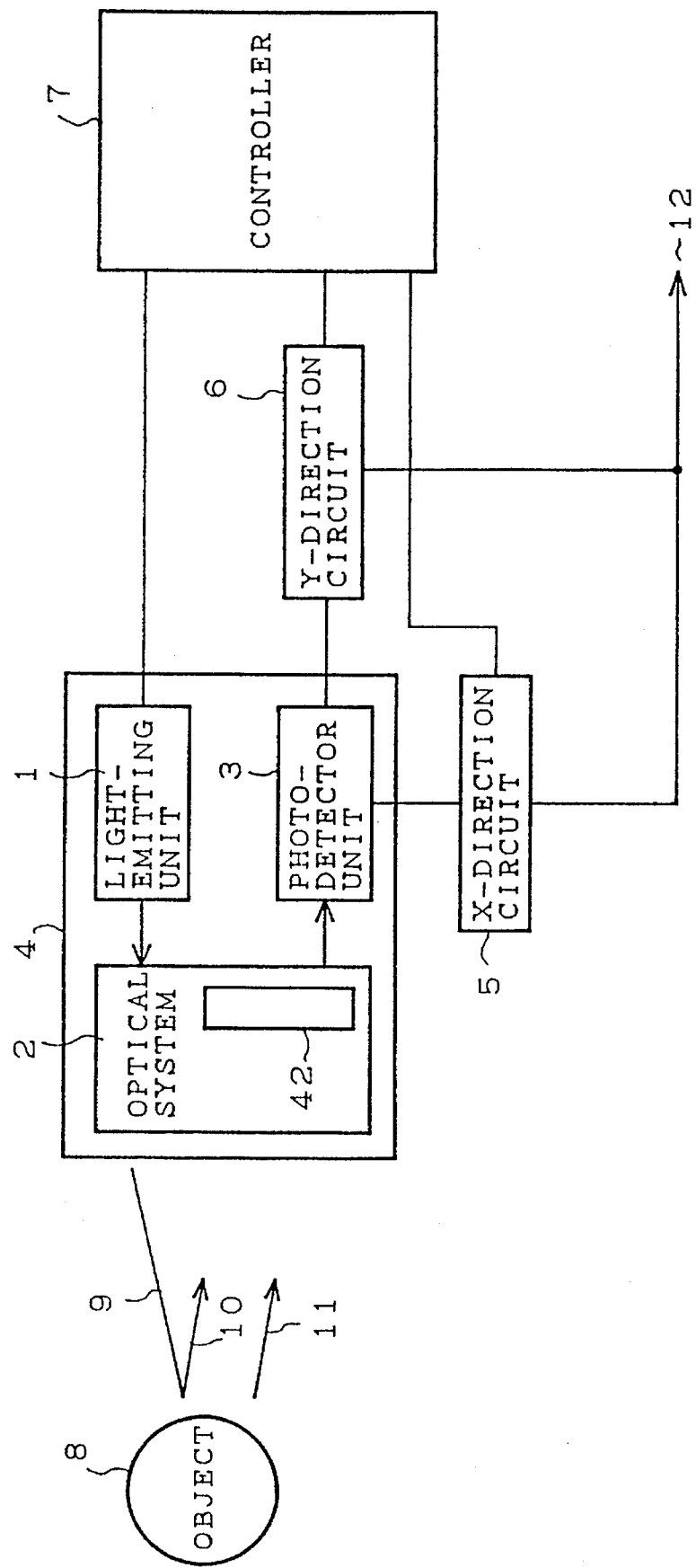
FIG. 72 is a block diagram of an object detector in a preferred embodiment according to the present invention.

FIG. 72 shows an object detector in a preferred embodiment according to the present invention, in which parts like or corresponding to those of the object detector of FIG. 39 are denoted by the same reference characters. An optical system 2 included in this object detector is provided with a visible radiation absorbing filter (visible radiation absorbing means), which is similar to the visible radiation absorbing filter of FIG. 65, capable of absorbing visible radiation included in the reflected light reflected from an object 8.

Figure 73:
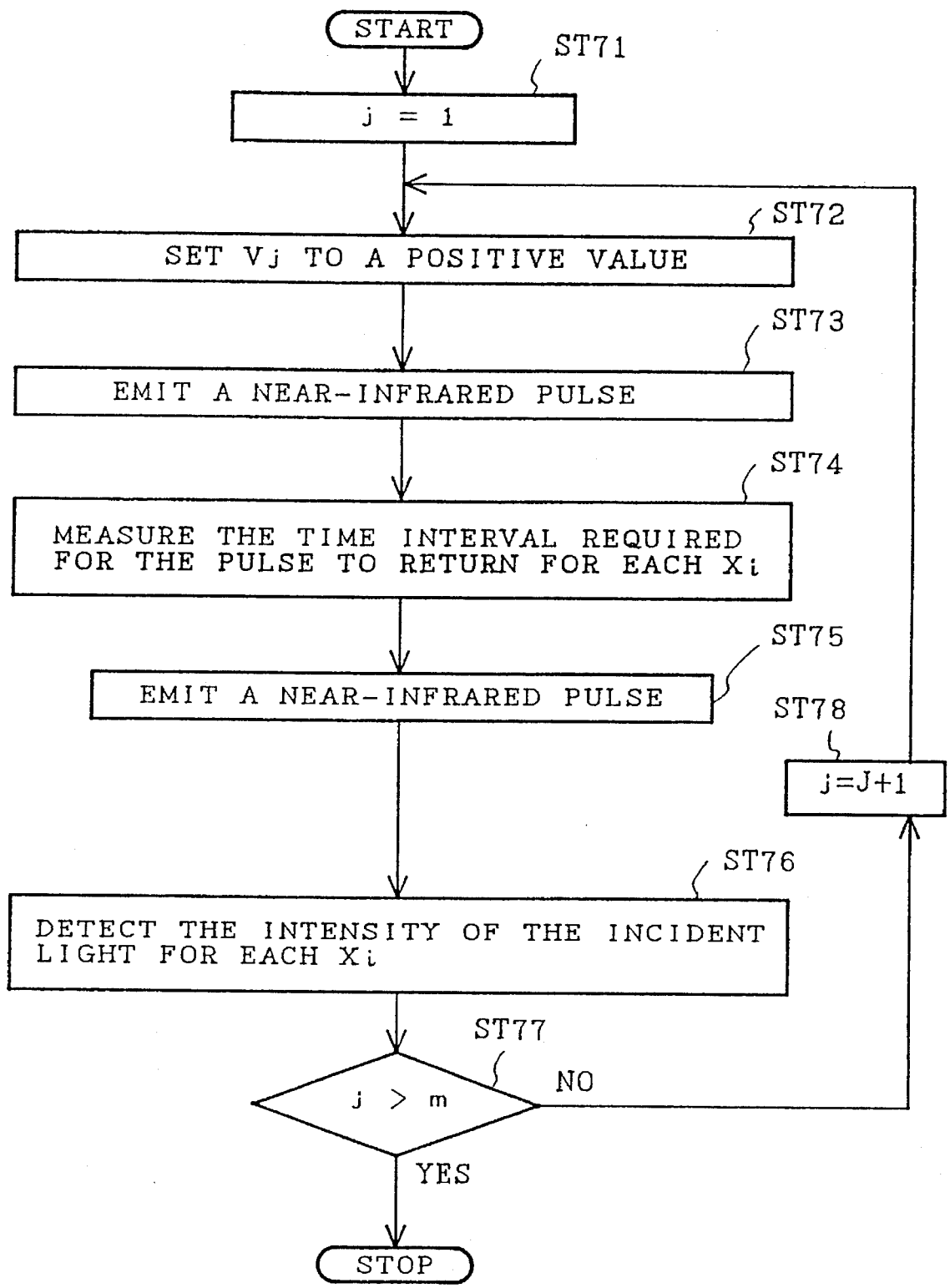
FIG. 73 is a flow chart of an object detecting procedure to be carried out by the object detector of FIG. 72.

The operation of the object detector will be described hereinafter with reference to FIG. 73 showing an object detecting procedure. In step ST71, the line number j is set to "1" to select the first line of the two-dimensional photodetector array. In step ST72, control voltages Vj to be applied to the photodetectors 13 on the first line are set to +5. Consequently, the photosensitivities of only the photodetectors 13 on the first line are adjusted to "5" (all the x-direction gates are set in an ON state). Then in step ST73, the light-emitting unit 1 emits a near-infrared pulse and the optical system 2 sends out the near-infrared pulse.

Then in step ST74, the optical system 2 receives the reflected light from an object 8, absorbs visible radiation included in the reflected light and transmits only reflected near-infrared radiation to the photodetector unit 3. The time interval Dt between the emission of the pulse and the reception of the reflected pulse is determined on the basis of the x-direction ac output signal 22 of the x-direction circuit 5, and then the distance between the object 8 and the object detector can be determined by calculation on the basis of the time interval Dt.

Then in step ST75, the light-emitting unit 1 emits near-infrared radiation, and the optical system 2 sends out the near-infrared radiation. In step ST76, the optical system 2 receives the reflected light reflected from the object, absorbs visible radiation and transmits only reflected near-infrared radiation to the photodetector unit 3. The intensity of the reflected light is determined on the basis of the x-direction ac output signal 22 of the x-direction circuit 5.

Then in step ST77, a query is made to see if the j-th line is the last line. If the response in step ST77 is negative, j is incremented by one in step ST78, and then steps ST72 to ST76 are repeated for the j+1-th line. Thus, j is incremented successively by one at a time and steps ST72 to ST76 are repeated for all the lines. Thus, complete image data can be obtained from the two-dimensional image data and the distance data obtained on the basis of the intensity of the reflected light.

Figure 74:
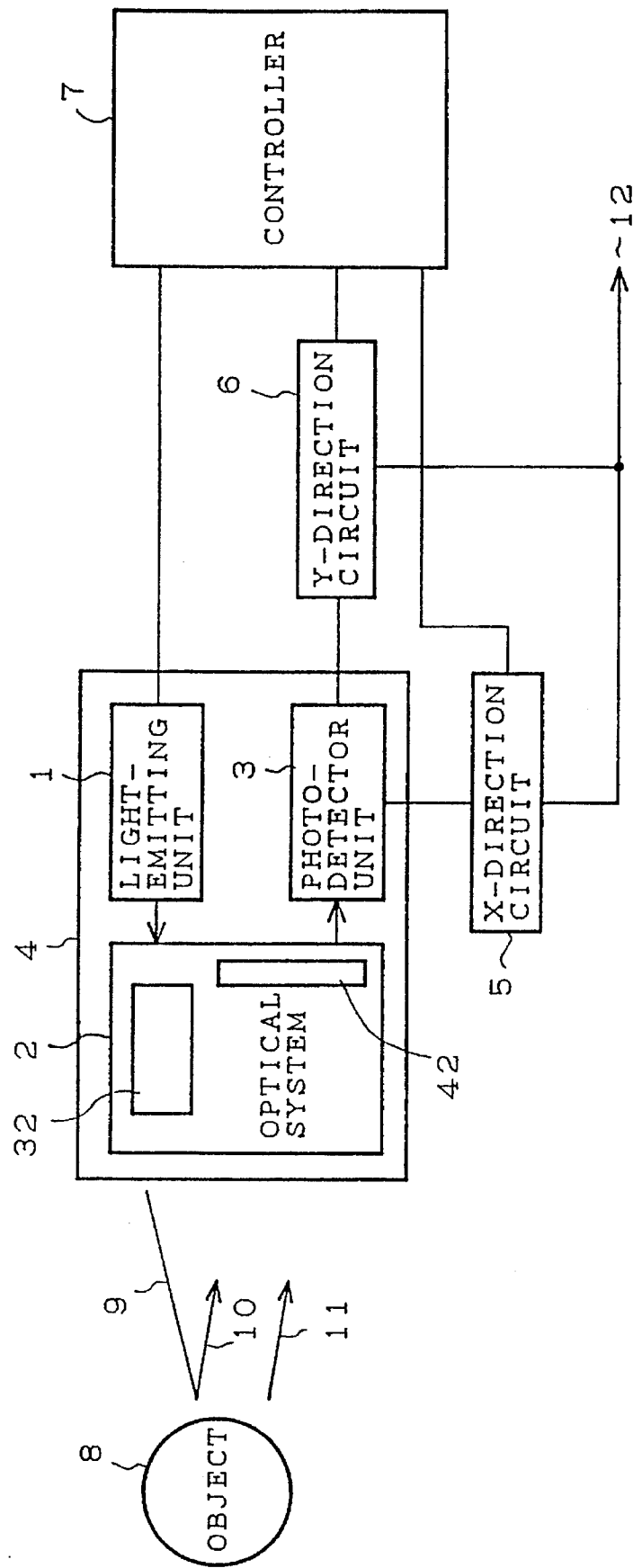
FIG. 74 is a block diagram of an object detector in a preferred embodiment according to the present invention.

FIG. 74 shows an object detector in a preferred embodiment according to the present invention, in which parts like or corresponding to those of the object detector of FIG. 72 are denoted by the same reference characters. This object detector is provided with a beam deflector 32 on a light path along which the light emitted by a light-emitting unit 1 travels. In this object detector, each of pulses of light is directed toward a specified region to receive the reflected light having a high intensity. The beam deflector 32 may be such as provided with a rotating mirror or a grating.

Figure 75:
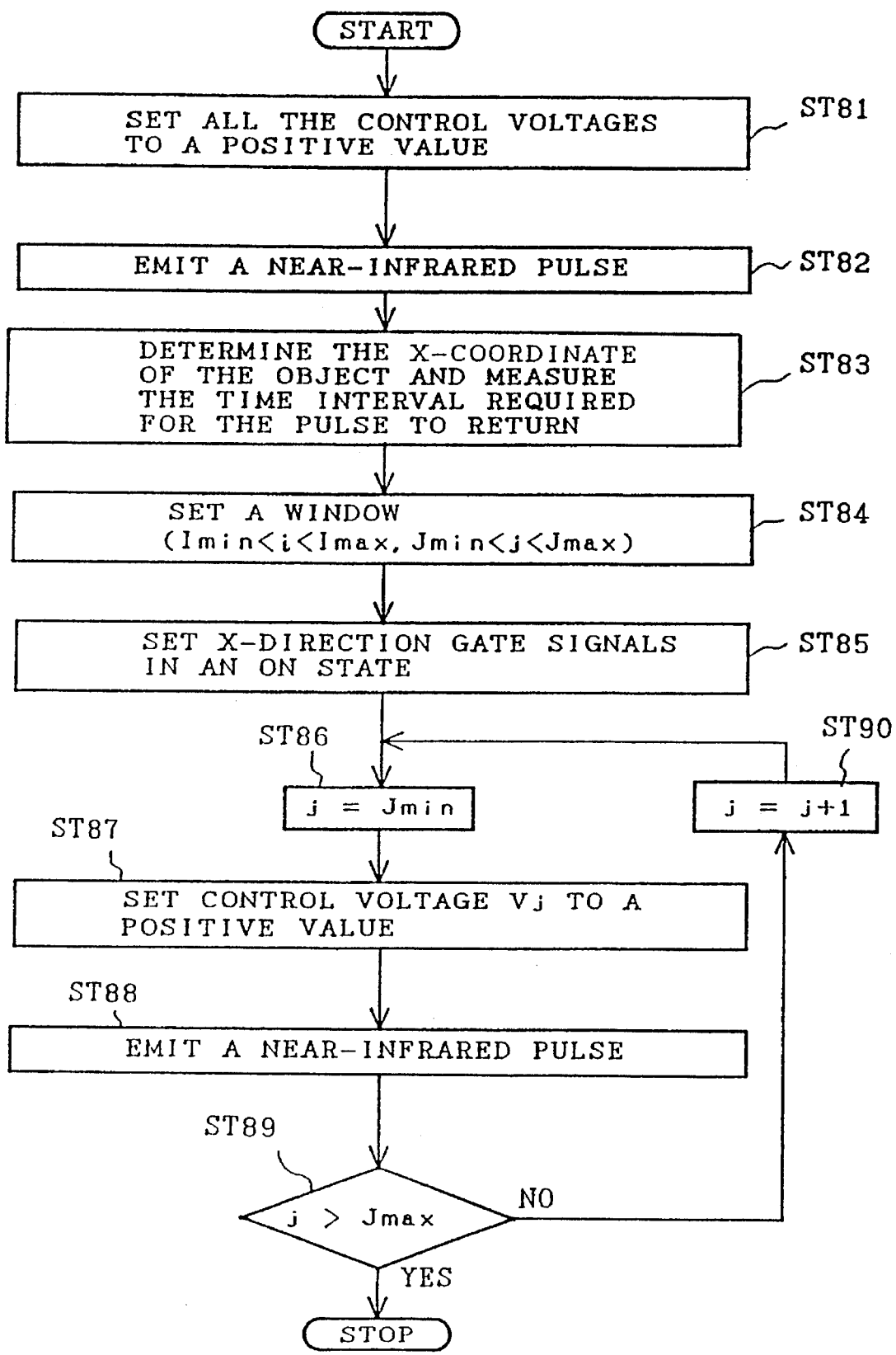
FIG. 75 is a flow chart of an object detecting procedure in a preferred embodiment according to the present invention.

FIG. 75 is a flow chart of an object detecting procedure to be carried out by the object detector in this embodiment. Referring to FIG. 75, all control voltages Vj to be applied to the photodetectors are set to +5 in step ST81. In this state, the photosensitivities of all the photodetectors are adjusted to "5" (all the x-direction gates are set in an ON state). Then in step ST82, the light-emitting unit 1 emits a near-infrared pulse, and then the beam deflector 32 of the optical system 2 directs the near-infrared pulse toward a desired object 8.

Then in step ST83, the optical system 2 receives the reflected light from the object, and transmits the reflected light after absorbing visible radiation by the visible radiation absorbing filter 42 to the photodetector unit 3. The x-coordinate of the object 8 can be roughly estimated through the detection of the x-direction terminals 15 through which photocurrents flow. The distance between the object 8 and the object detector can be determined by calculation on the basis of the measured time interval Dt between the emission of a pulse of near-infrared radiation and the reception of the reflected pulse of near-infrared radiation.

Then in step ST84, a window is set in an image formed by the photodetector unit 3 so as to contain an image of the object 8 ($I_{min}<i<I_{max}$, $J_{min}<j<J_{max}$) on the basis of the x-coordinate, the distance and the position of the object detector. Then in step ST85, x-direction gate signals for Imin to Imax are set in an ON state and the rest are kept in an OFF state.

Then in step ST86, the first line in the window, i.e., the j-th line, is selected as the $J_{min}$-th line. Then in step ST87, control voltages $V_j$ for the photodetectors on the first line, i.e., the j-th line, are set to +5 and control voltages for the rest are set to zero. In this state, the photodetectors on the j-th line are photosensitive. Then in step ST88, the light-emitting unit 1 emits near-infrared radiation, and then the photodetector unit 3 receives reflected near-infrared radiation to form an image on the j-th line in the window.

Then in step ST89, a query is made to see if the j-th line is the last line in the window. If the response in step ST89 is negative, j is incremented by one in step ST90, and then steps ST87 and ST88 are repeated to form an object on the j+1-th line in the window. Thus, the line number is incremented successively by one at a time to form images on all the lines in the window.

Thus, the distance to the object 8, the x-coordinate of the object 8 and a partial image of the object 8 can be obtained. The y-coordinate and the shape of the object 8 can be obtained by processing the partial image by a subsequent circuit.

Figure 76:
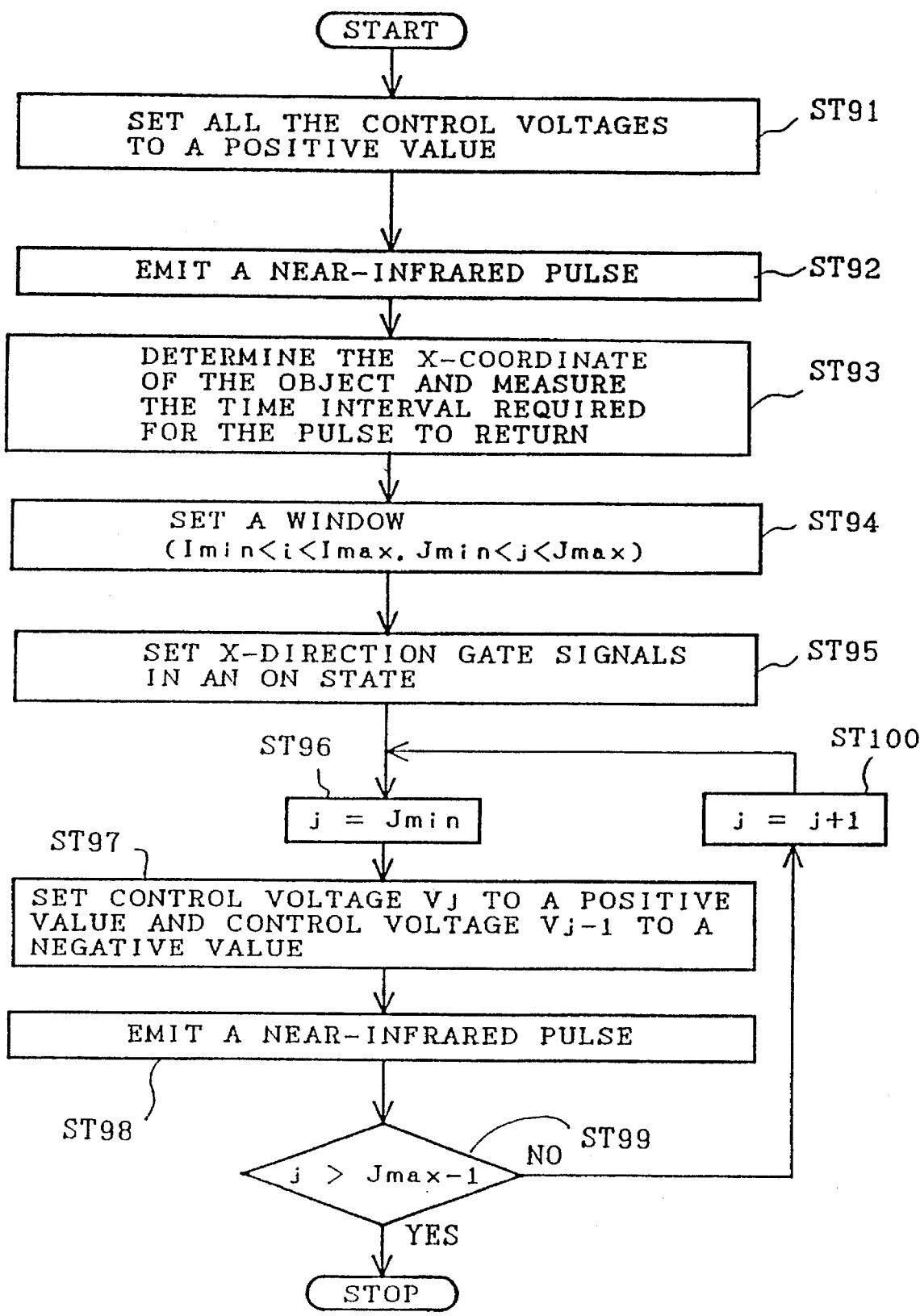
FIG. 76 is a flow chart of an object detecting procedure in a preferred embodiment according to the present invention.

FIG. 76 is a flow chart of another object detecting procedure in a preferred embodiment according to the present invention to be carried out by the object detector of FIG. 74. Referring to FIG. 76, control voltages Vj to be applied to the photodetectors are set to +5 in step ST91. In this state, the photosensitivities of all the photodetectors are adjusted to "5" (all the x-direction gates are set in an ON state). Then in step ST92, the light-emitting unit 1 emits a near-infrared pulse and the beam deflector 32 of the optical system 2 sends the near-infrared pulse toward the object 8.

Then in step ST93, the photodetector unit 3 receives the reflected light reflected from the object 8. The x-coordinate of the object 8 can be roughly estimated through the detection of the x-direction terminals 15 through which photocurrents flow. The distance between the object 8 and the object detector can be determined by calculation on the basis of the measured time interval Dt between the emission of a pulse and the reception of the reflected pulse.

Then in step ST94, a window is set in an image formed by the photodetector unit 3 so as to contain an image of the object 8 ($I_{min}<i<I_{max}$, $J_{min}<j<J_{max}$) on the basis of the x-coordinate, the distance and the position of the object detector.

Then in step ST95, x-direction gate signals 20 for $I_{min}$ to $I_{max}$ are set in an ON state and the rest are kept in an OFF state. Then, the first line in the window, i.e., the j-th line, is selected as the $J_{min}$-th line. Then in step ST97, control voltages $V_j$ are set to a positive value of +5, control voltages $V_{j+1}$ are set to a negative value of −5 and the rest are set to zero.

Then, the light-emitting unit 1 emits near-infrared radiation and the optical system 2 sends out the near-infrared radiation through the beam deflector 32. Then, the photodetector unit 3 receives the reflected light reflected from the object. An x-directiOn output signal represents the difference in the illuminance of the incident light on the plane of incidence between the j-th line and the j+1-th line. Output signals corresponding to the vertical outlines of a pattern are high and output signals corresponding to the rest part of the pattern are low.

Then in step ST99, a query is made to see if the j-th line is the $J_{max}$−1-th line. If the response in step ST99 is negative, j is incremented by one in step ST100, and then steps ST98 and ST99 are repeated while j is incremented successively by one at a time to obtain vertical outlines on lines successively.

Thus, the object detecting procedure in this embodiment determines the distance to the object, the x-coordinate of the object and the vertical outlines to form a partial image.

Figure 77:
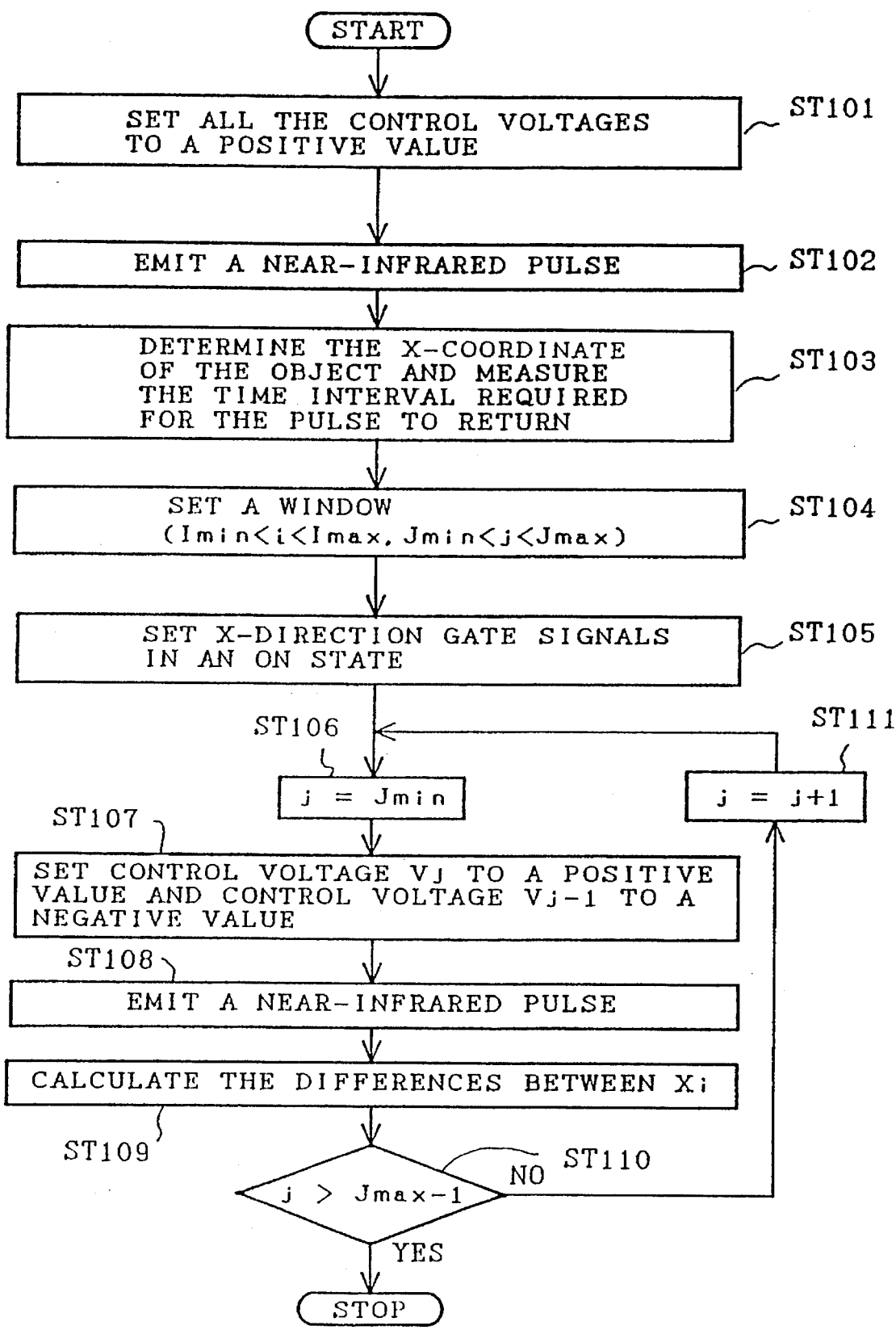
FIG. 77 is a flow chart of an object detecting procedure to be carried out by the object detector of FIG. 72.

FIG. 77 is a flow chart of an object detecting procedure to be carried out by an object detector provided with a circuit similar to the x-direction arithmetic circuit 28 of FIG. 53 in addition to the components of the object detector of FIG. 72. Referring to FIG. 77, control voltages $V_j$ to be applied to the photodetectors are set to a positive value of +5 in step ST101. In this state, the photosensitivities of the photodetectors are "5" (all the x-direction gate are set in an ON state). Then in step ST102, the light-emitting unit 1 emits a near-infrared pulse and the optical system 2 sends out the near-infrared pulse through the beam deflector 32 toward an object 8.

Then in step ST103, the optical system 2 receives the reflected light reflected from the object 8, and then the photodetector unit 3 receives the reflected light through a visible radiation absorbing filter 42 and forms an image. The x-coordinate of the object 8 can be roughly estimated through the detection of the x-direction terminals 15 through which photocurrents flow. The distance between the object 8 and the object detector can be determined by calculation on the basis of the measured time interval Dt between the emission of a pulse and the reception of the reflected pulse.

Then in step ST104, a window is set in the image formed by the photodetector unit 3 so as to contain an image of the object 8 ($I_{min}<i<I_{max}$, $J_{min}<j<J_{max}$) on the basis of the x-coordinate, the distance and the position of the object detector. Then in step ST105, x-direction gate signals 20 for $I_{min}$ to $I_{max}$ are set in an ON state and the rest are kept in an OFF state. Then in steps ST106, the j-th line in the window is selected as the $J_{min}$-th line.

Then in step ST107, control voltages $V_j$ are set to +5, control voltages $V_{j+1}$ are set to −5 and the rest are set to zero. Then in step ST108, the light-emitting unit 1 emits near-infrared radiation and the optical system 2 sends out the near-infrared radiation through the beam deflector 32 toward a desired object 8.

Then, the optical system 2 receives the reflected light reflected form the object 8 and the photodetector unit 3 receives the reflected light through the visible radiation absorbing filter 42. An x-direction output signal represents the difference in the illuminance of the incident light on the plane of incidence between the j-th line and the j+1-th line. Then in step ST109, the x-direction arithmetic circuit 28 calculates the differences between the adjacent signals.

Then in step ST110, a query is made to see if the j-th line is the $J_{max}$−1-th line. If the response in step ST110 is negative, j is incremented by one in step ST111. Then, steps ST107 and ST108 are repeated while j is incremented successively by one at a time to determine the diagonal outlines of the partial image including the image of the object for each line. Similarly, the horizontal outline of the partial image can be determined by setting only the control voltages $V_j$ to +5 and calculating the horizontal differences by the x-direction arithmetic circuit 28.

Figure 78:
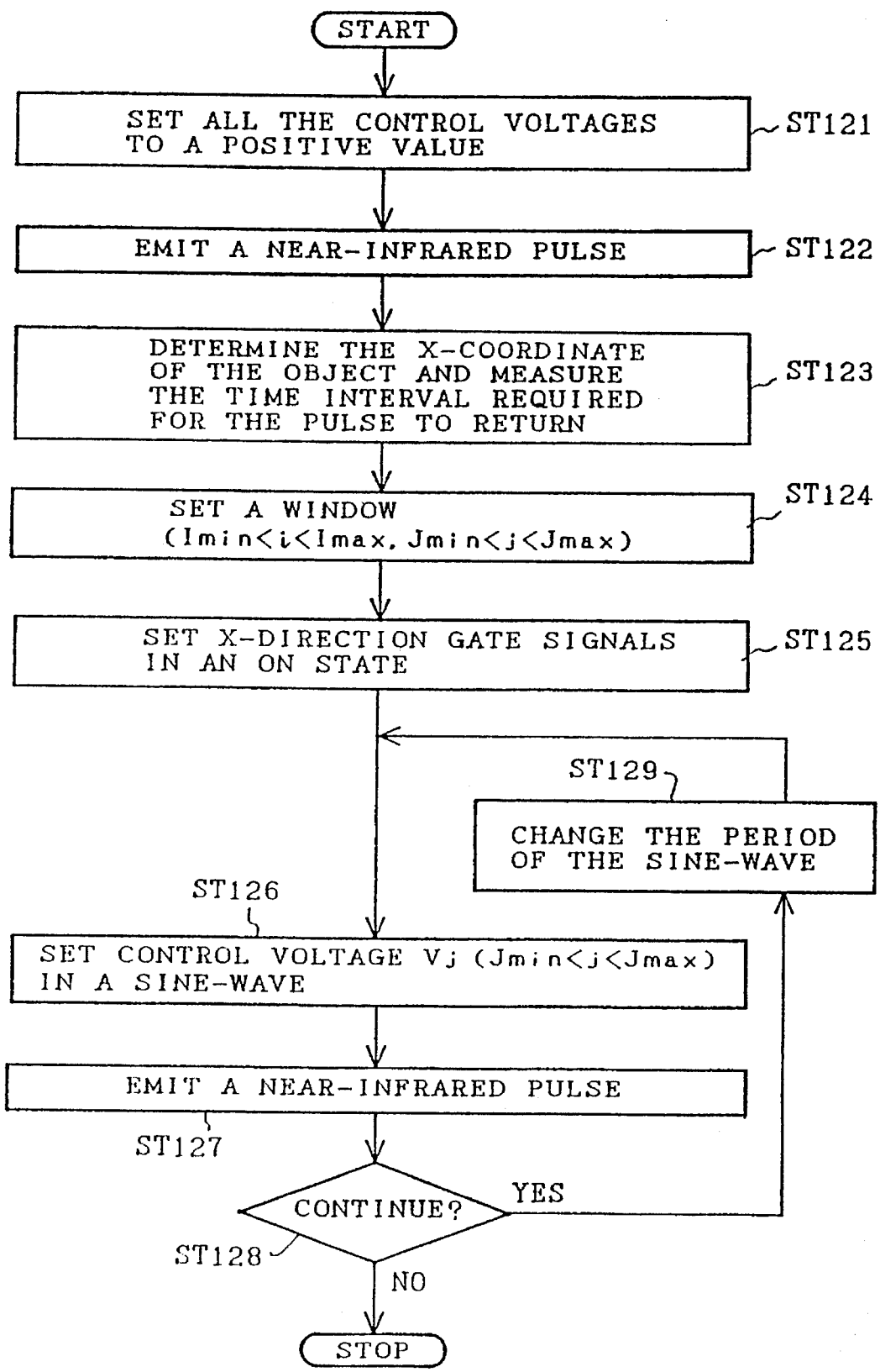
FIG. 78 is a flow chart of an object detecting procedure in a preferred embodiment according to the present invention.

FIG. 78 is a flow chart of an object detecting procedure in a preferred embodiment according to the present invention to be carried out by the object detector of FIG. 74. This object detecting procedure employs spatial Fourier transformation. Referring to FIG. 78, all control voltages $V_j$ to be applied to the photodetectors are set to +5 in step ST121. In this state, the photosensitivities of all the photodetectors are set to "5" (all the x-direction gates are set in an ON state).

Then in step ST122, the light-emitting unit 1 emits a near-infrared pulse and the optical system 2 sends out the near-infrared pulse through the beam deflector 32 toward a desired object 8. Then in step ST123, the photodetector unit 3 receives the reflected light reflected from the object 8. The x-coordinate of the object i can be roughly estimated through the detection of the x-direction terminals 15 through which photocurrents flow. The distance between the object 8 and the object detector can be determined by calculation on the basis of the measured time interval Dt between the emission of a pulse and the reception of the reflected pulse.

Then in step ST124, a window is set in an image formed by the photodetector unit 3 so as to contain an image of the object ($I_{min}<i<I_{max}$, $J_{min}<j<J_{max}$) on the basis of the x-coordinate, the distance and the position of the object detector. In step ST125, x-direction gate signals 20 for Imin to Imax are set in an ON state and the rest are set in an OFF state.

Then in step ST126, the control voltages $V_j$ ($J_{min}<j<J_{max}$) are set to a sine-wave voltage. In this state, the x-direction output represents the magnitude of a set spatial frequency component. Then in step ST127, the light-emitting unit 1 emits near-infrared radiation and the photodetector unit 3 receives the reflected light reflected from the object.

Then in step ST128, a query is made to see if the procedure is to be continued. If the response in step ST128 is affirmative, the period of the control voltages Vj is changed in step ST129, and then steps ST126 and ST127 are repeated while the frequency of the sine-wave voltage is changed to carry out the vertical Fourier transformation of the partial image for each line.

Other orthogonal transformation, such as Walsh transformation may be used instead of Fourier transformation for the same purpose.

Figure 79:
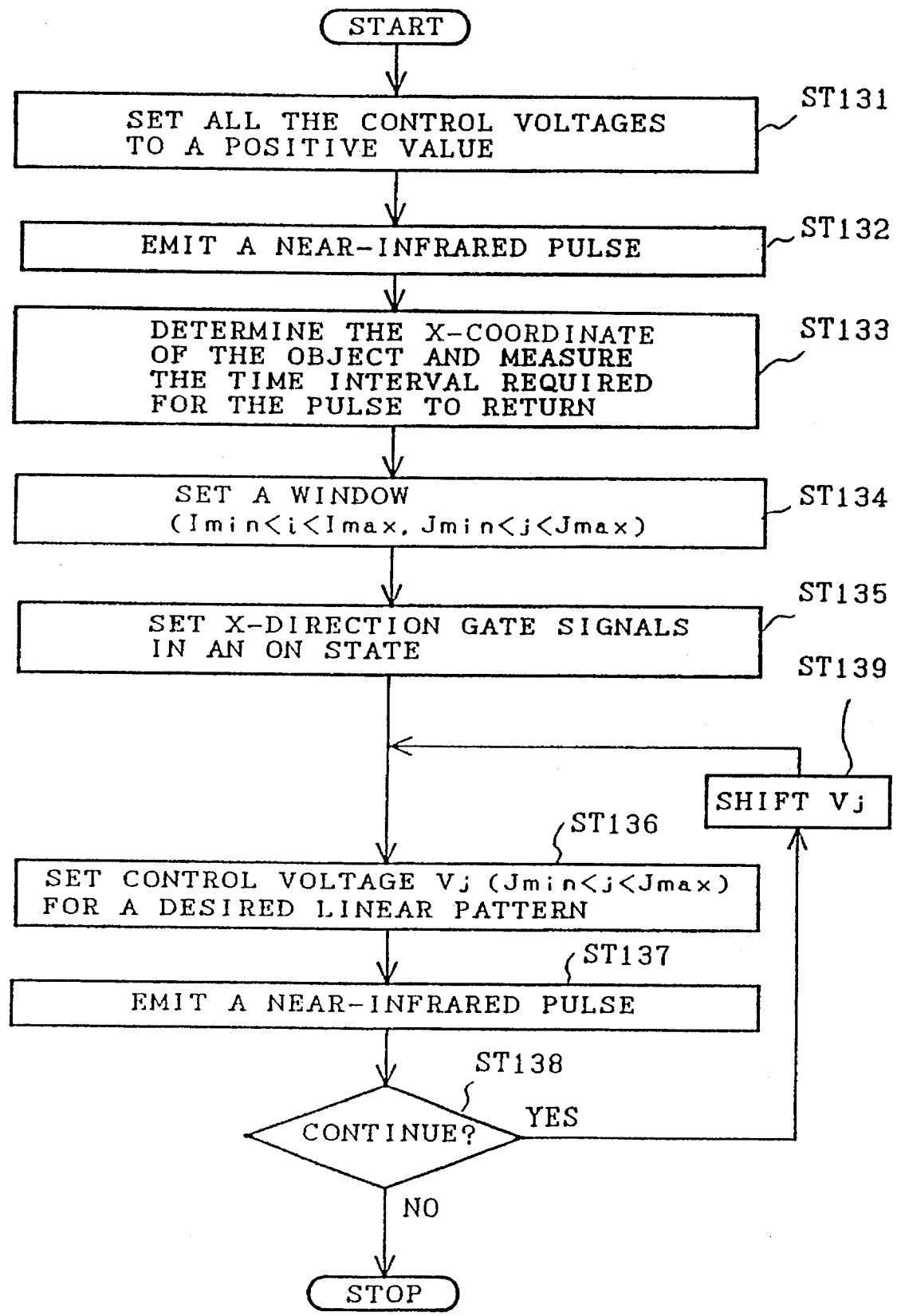
FIG. 79 is a flow chart of an object detecting procedure in a preferred embodiment according to the present invention.

FIG. 79 is a flow chart of an object detecting procedure capable of pattern matching to be carried out by the object detector of FIG. 74. Referring to FIG. 79, control voltages Vj to be applied to the photodetectors are set to +5 in step ST131. In this state, the photosensitivities of the photodetectors are set to "5" (all the x-direction gates are set in an ON state). Then in step ST132, the light-emitting unit 1 emits a near-infrared pulse and the optical system 2 sends out the near-infrared pulse through the beam deflector 32 toward a desired object 8. Then in step ST133, the photodetector unit 3 receives the reflected light reflected from the object 8. The x-coordinate of the object 8 can be roughly estimated through the detection of the x-direction terminals 15 through which photocurrents flow. The distance between the object and the object detector can be determined by calculation on the basis of the measured time interval Dt between the emission of a pulse of near-infrared radiation and the reception of the reflected pulse.

Then in step ST134, a window is set in an image formed by the photodetector unit 3 so as to contain an image of the object ($I_{min}<i<I_{max}$, $J_{min}<j<J_{max}$) on the basis of the x-coordinate, the distance and the position of the object detector. Then in step ST135, x-direction gate signals 20 for Imin to Imax are set in an ON state and the rest are kept in an OFF state.

Then in step ST136, control voltages $V_j$ ($J_{min}<j<J_{max}$) are set for a pattern to be found. Then, the light-emitting unit 1 emits near-infrared radiation and the optical system 2 sends out the near-infrared radiation, and the photodetector unit 3 receives the reflected light. In this state, the x-direction output signal is a correlation signal representing the correlation between the pattern and the image.

Then in step ST138, a query is made to see if the procedure is to be continued. If the response in step ST138 is affirmative, the control voltages Vj are shifted in step ST139, and then steps ST136 and ST137 are repeated while the components of the control voltage vectors are shifted to achieve pattern matching with the partial image for each line.

Figure 80:
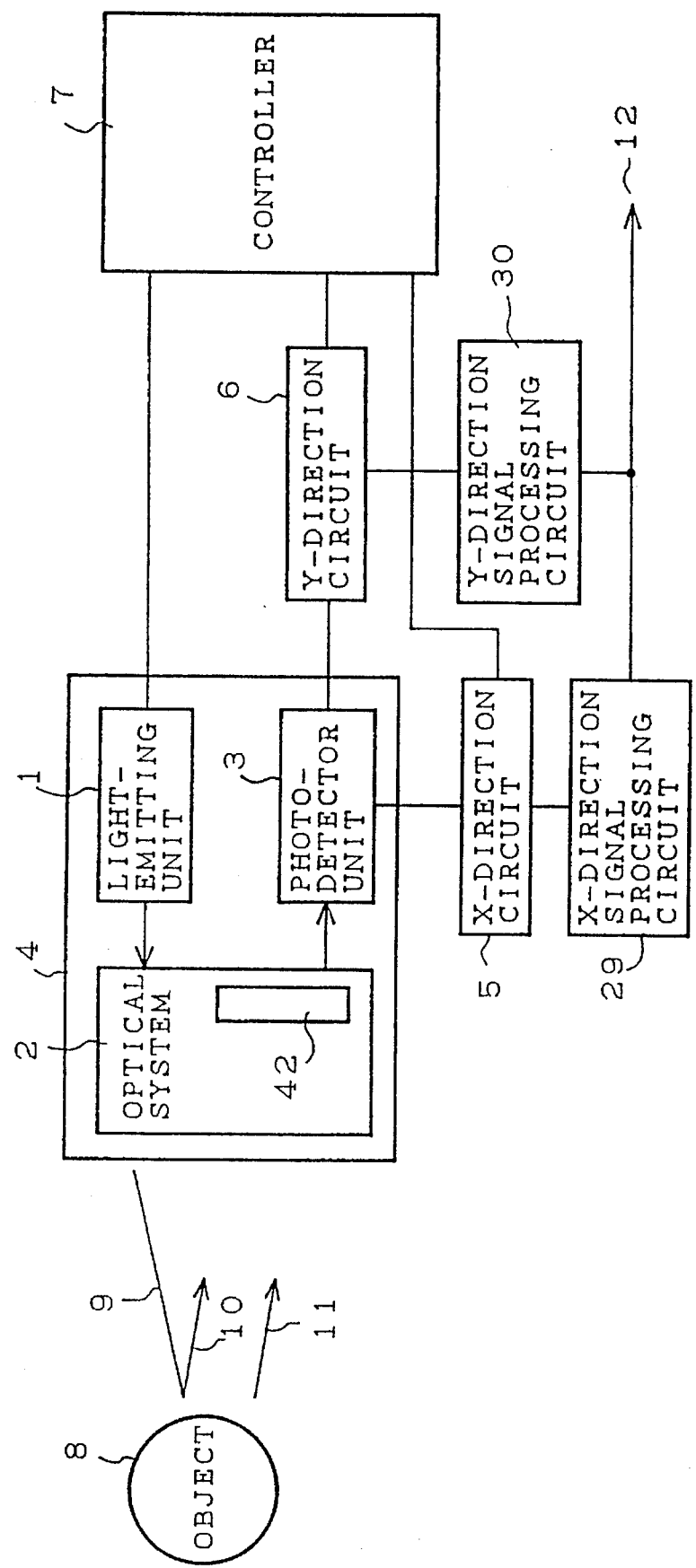
FIG. 80 is a block diagram of an object detector in a preferred embodiment according to the present invention.

FIG. 80 shows an object detector in a preferred embodiment according to the present invention, in which parts like or corresponding to those of the object detector of FIG. 74 are denoted by the same reference characters. In FIG. 80, indicated at 29 is an x-direction signal processing circuit which receives a plurality of signals from an x-direction circuit 5 and processes the signals in an analog signal processing mode, a digital signal processing mode or an analog-and-digital signal processing mode, and at 30 is a y-direction signal processing circuit which receives a plurality of signals from a y-direction circuit 6 and processes the signals in an analog signal processing mode, a digital signal processing mode or an analog-and-digital signal processing mode.

Figure 81:
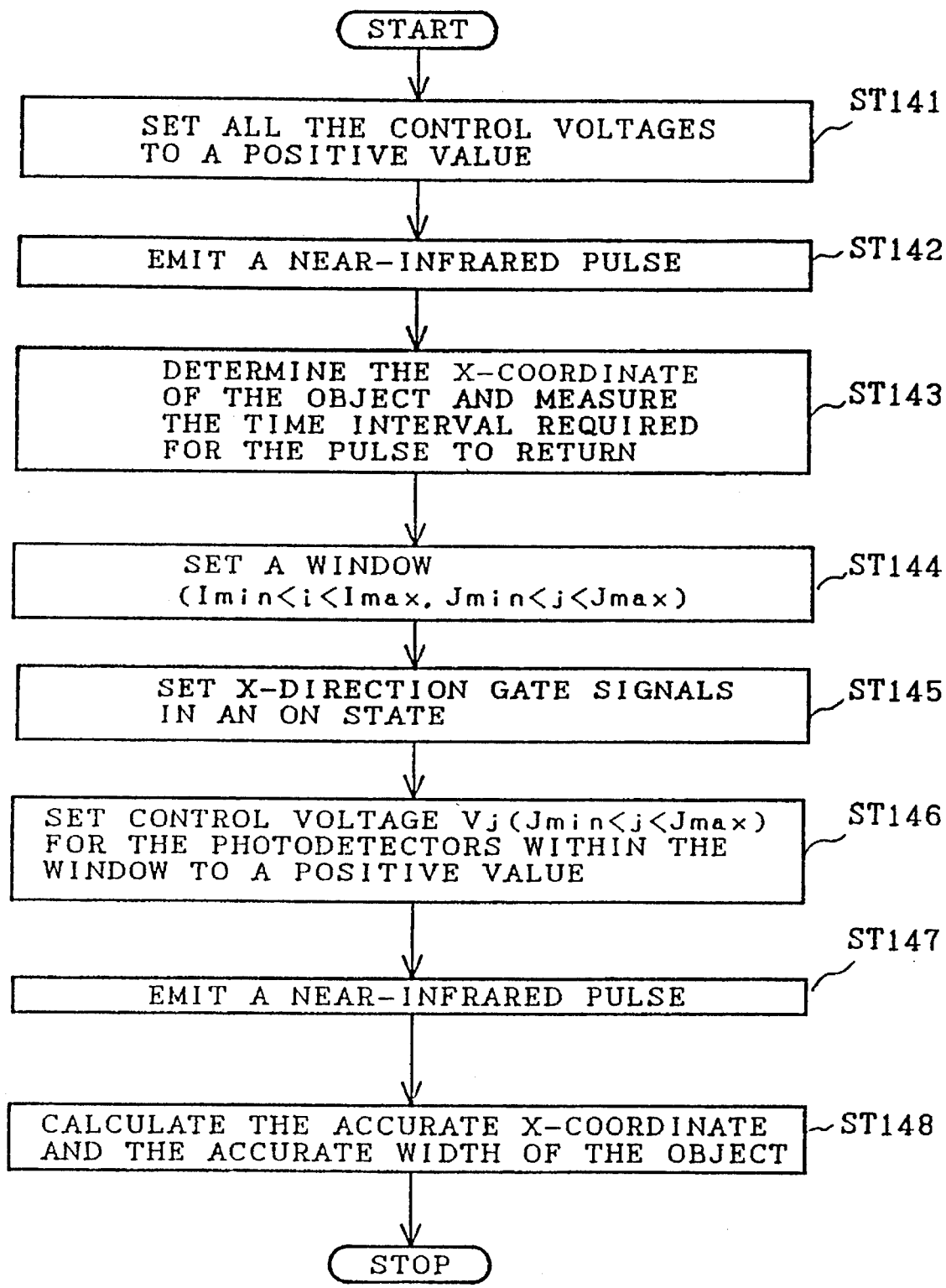
FIG. 81 is a flow chart of an object detecting procedure to be carried out by the object detector of FIG. 80.

The operation of the object detector will be described hereinafter with reference to FIG. 81 showing an object detecting procedure in a flow chart. In step ST141, control voltages Vj to be applied to the photodetectors are set to +5. In this state, the photosensitivities of all the photodetectors are set to "5" (all the x-direction gates are set in an ON state).

Then in step ST142, the light-emitting unit emits a near-infrared pulse. Then in step ST143, the photodetector unit 3 receives the reflected light reflected from an object. The x-coordinate of the object can be roughly estimated through the detection of the x-direction terminals 15 through which photocurrents flow. The distance between the object and the object detector can be determined by calculation on the basis of the measured time interval Dt between the emission of a pulse and the reception of the reflected pulse.

Then in step ST144, a window is set in an image formed by the photodetector unit 3 so as to contain an image of the object ($I_{min}<i<I_{max}$, $J_{min}<j<J_{max}$) on the basis of the x-coordinate, the distance and the position of the object detector. Then in step ST145, x-direction gate signals 20 for Imin to Imax are set in an ON state and the rest are kept in an OFF state.

Then in step ST146, control voltages $V_j$ ($J_{min}<j<J_{max}$) are set to +5, and then the light-emitting unit 1 emits near-infrared radiation. In this state, the x-direction output signal represents a vertical projection of an image contained in the window. If only few patterns other than a pattern of the object are contained in the window, the vertical projection corresponds to a vertical projection of the pattern of the object.

Then in step ST148, the x-direction signal processing circuit calculates the accurate x-coordinate and the accurate width of the object on the basis of an x-direction projection signal. Since the object detecting procedure does not need to drive the photodetector array repeatedly, the distance to the object, and the accurate x-coordinate and the accurate width of the object can be very quickly determined.

Figure 82:
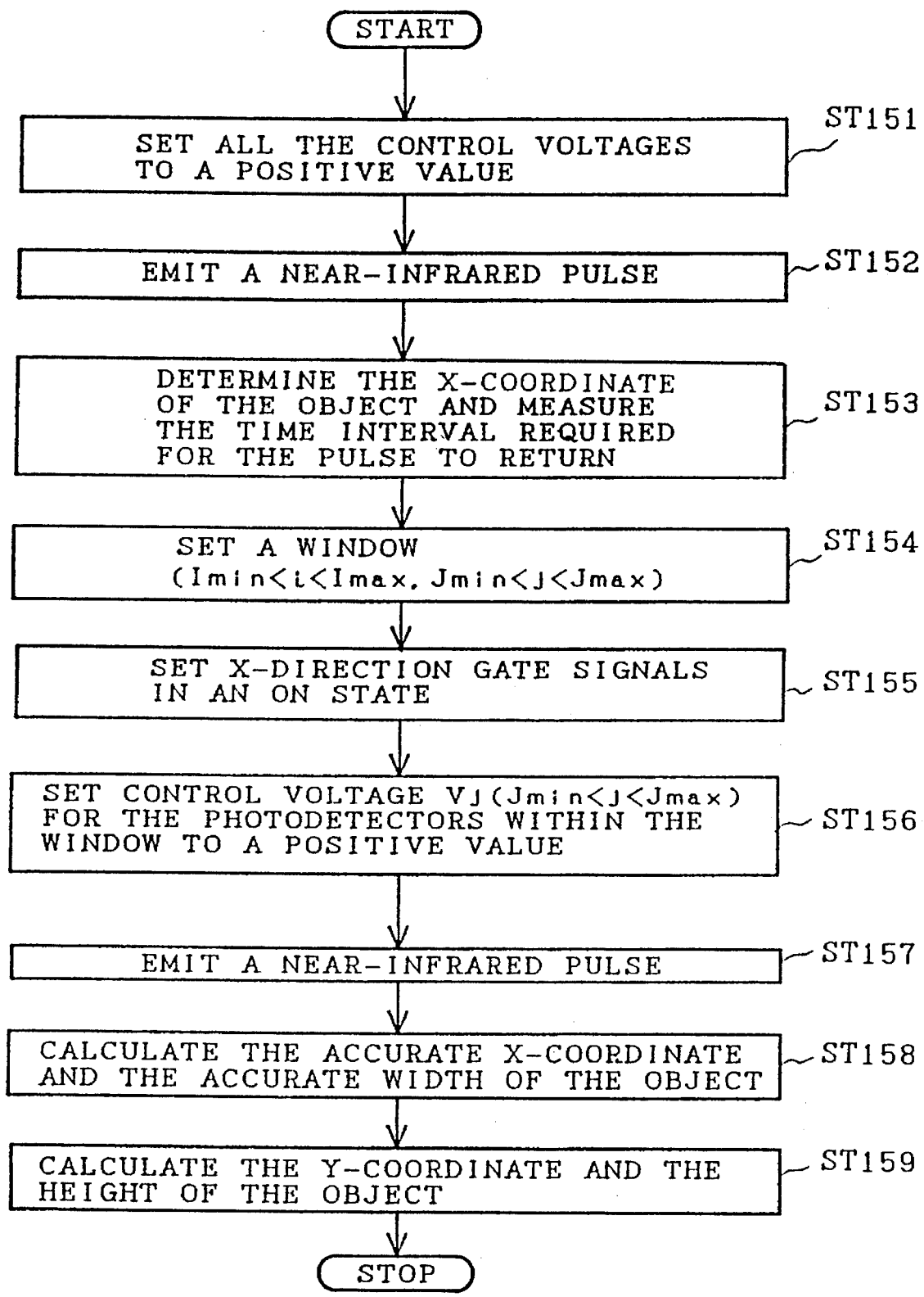
FIG. 82 is a flow chart of another object detecting procedure to be carried out by the object detector of FIG. 80.

The object detecting procedure shown in FIG. 81 uses only the x-direction projection. An object detecting procedure shown in FIG. 82 uses both the x-direction and the y-direction projection. Referring to FIG. 82, control voltages $V_j$ to be applied to all the photodetectors are set to +5 in step ST151. In this state, the photosensitivities of all the photodetectors are set to "5" (all the x-direction gates are set in an ON state).

Then, the light-emitting unit 1 emits a near-infrared pulse in step ST152 and the photodetector unit 3 receives the reflected light reflected from an object in step ST153. The x-coordinate of the object can be roughly estimated through the detection of the x-direction terminals 15 through which photocurrents flow. The distance between the object and the object detector can be determined by calculation on the basis of the measured time interval Dt between the emission of a pulse and the reception of the reflected pulse.

Then in step ST154, a window is set in an image formed by the photodetector unit 3 so as to contain an image of the object ($I_{min}<i<I_{max}$, $J_{min}<j<J_{max}$) on the basis of the x-coordinate, the distance and the position of the object detector. Then in step ST155, x-direction gate signals 20 for Imin to Imax are set in an ON state and the rest are kept in an OFF state.

Then in step ST156, control voltages $V_j$ ($J_{min}<j<J_{max}$) are set to +5, and then the light-emitting unit 1 emits near-infrared radiation in step ST157. In this state, the x-direction output signal represents a vertical projection of the image within the window. If only few patterns other than that of the object are contained in the window, the vertical projection corresponds to a vertical projection of the pattern of the object.

Then in step ST158, the x-direction signal processing circuit 29 calculates the accurate x-coordinate and the accurate width of the object on the basis of the x-direction projection signal. In step ST159, the y-direction signal processing circuit 30 calculates the y-coordinate and the height of the object on the basis of a y-direction projection signal.

Since the object detecting procedure does not need to drive the photodetector array repeatedly, the distance to the object, the accurate x-coordinate, the y-coordinate, the width and the height of the object can be very quickly determined.

It is possible to infer roughly, in a manner as explained previously with reference to FIG. 63, what the object is from the width and the height of the object.

Figure 83:
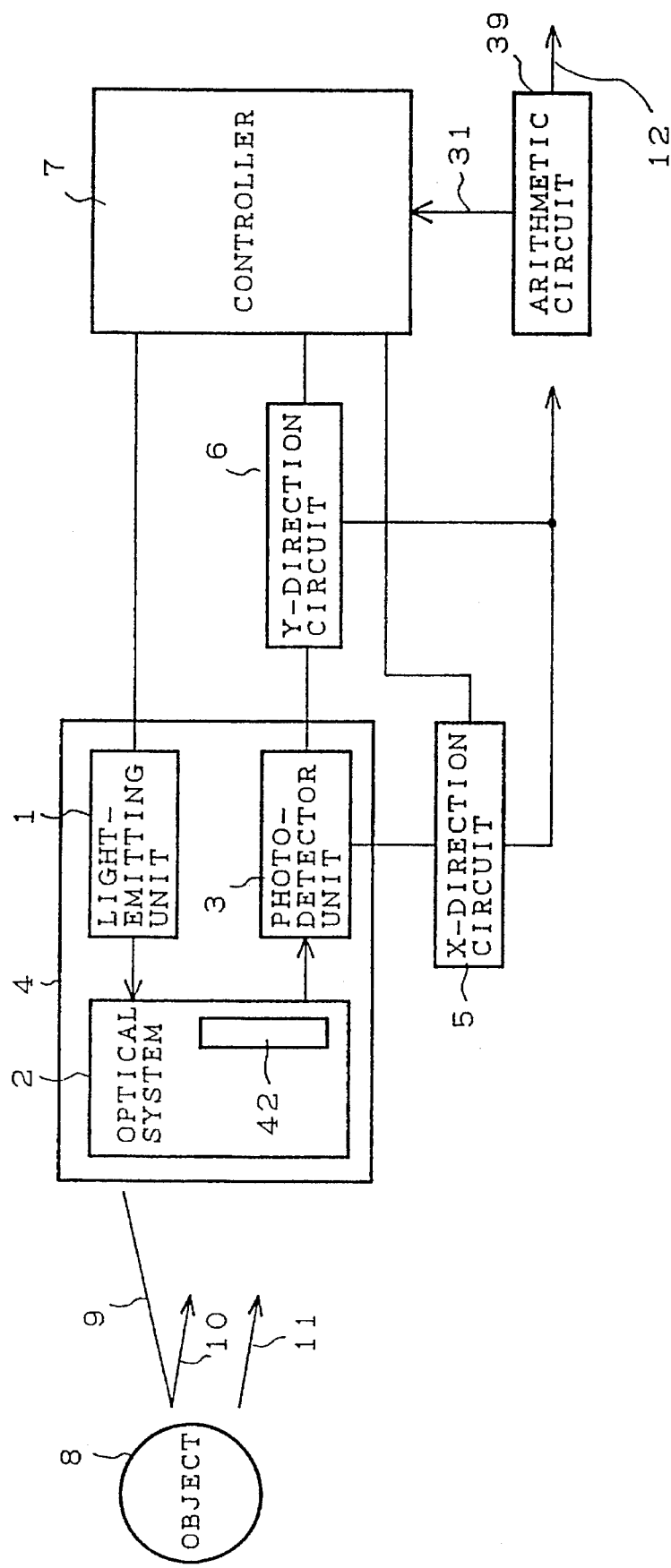
FIG. 83 is a block diagram of an object detector in a preferred embodiment according to the present invention.

FIG. 83 shows an object detector in a preferred embodiment according to the present invention. In FIG. 83, indicated at 39 is an arithmetic circuit and at 31 is a feedback signal. The arithmetic circuit 39 processes the output signals of an x-direction circuit and a y-direction circuit in an optional signal processing mode. The arithmetic circuit 39 may be an analog circuit, a chip microcomputer, a signal processor, a computer or such.

A three-dimensional image processing procedure which repeats a window setting operation to be carried out by the object detector of FIG. 83 will be described with reference to FIG. 84.

Figure 84:
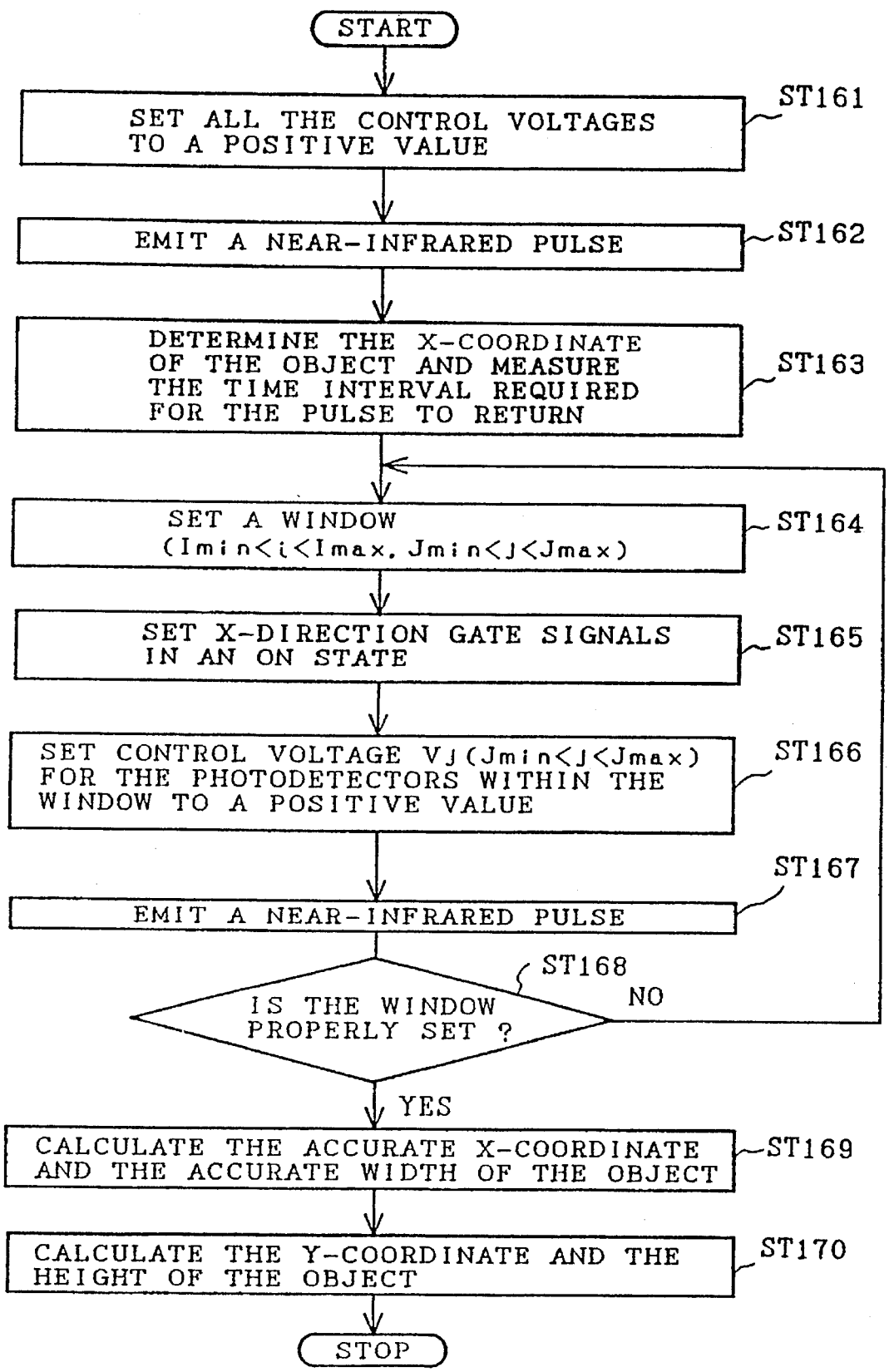
FIG. 84 is a flow chart of an object detecting procedure to be carried out by the object detector of FIG. 83.

Referring to FIG. 84, control voltage Vj to be applied to the photodetectors are set to +5 in step ST161. In this state, the photosensitivities of all the photodetectors are "5" (all the x-direction gates are set in an ON state).

Then in step ST162, the light-emitting unit 1 emits a near-infrared pulse and, in step ST163, the photodetector unit 3 receives the reflected light reflected from an object. The x-coordinate of the object can be roughly estimated through the detection of the x-direction terminals 15 through which photocurrents flow. The distance between the object and the object detector can be determined by calculation on the basis of the measured time interval Dt between the emission of a pulse and the reception of the reflected pulse.

Then in step ST164, a window is set ($I_{min}<i<I_{max}$, $J_{min}<j<J_{max}$) in an image formed by the photodetector unit 3 so as to contain an image of the object on the basis of the x-coordinate, the distance and the position of the object detector. Then in step ST165, x-direction gate signals 20 for Imin to Imax are set in an ON state and the rest are kept in an OFF state.

Then in step ST166, control voltages $V_j$ ($J_{min}<j<J_{max}$) are set to +5. Then in step ST167, the light-emitting unit 1 emits near-infrared radiation. In this state, the x-direction output signal represents a vertical projection of the image within the window. If only few pattern other than that of the object is contained in the window, the vertical projection corresponds to a vertical projection of the pattern of the object.

Then in step ST168, a control circuit 7 receives a feedback signal from the arithmetic circuit 39 and checks if the window is set correctly. If the window is not set correctly, the procedure returns to step ST164 to repeat steps ST164 through step ST167. If the window is set correctly, the procedure goes to step ST169.

In step ST169, a subsequent circuit calculates the accurate x-coordinate and the width of the object. Then in step ST170, the accurate y-coordinate and the width of the object are calculated. The feedback operation enhances the reliability of the object detecting procedure.

Although the object detector shown in FIG. 83 sets a window again, it is also possible to change the manner of processing the partial image without changing the window. A pattern matching procedure for such a purpose will be described with reference to a flow chart shown in FIG. 85.

Figure 85:
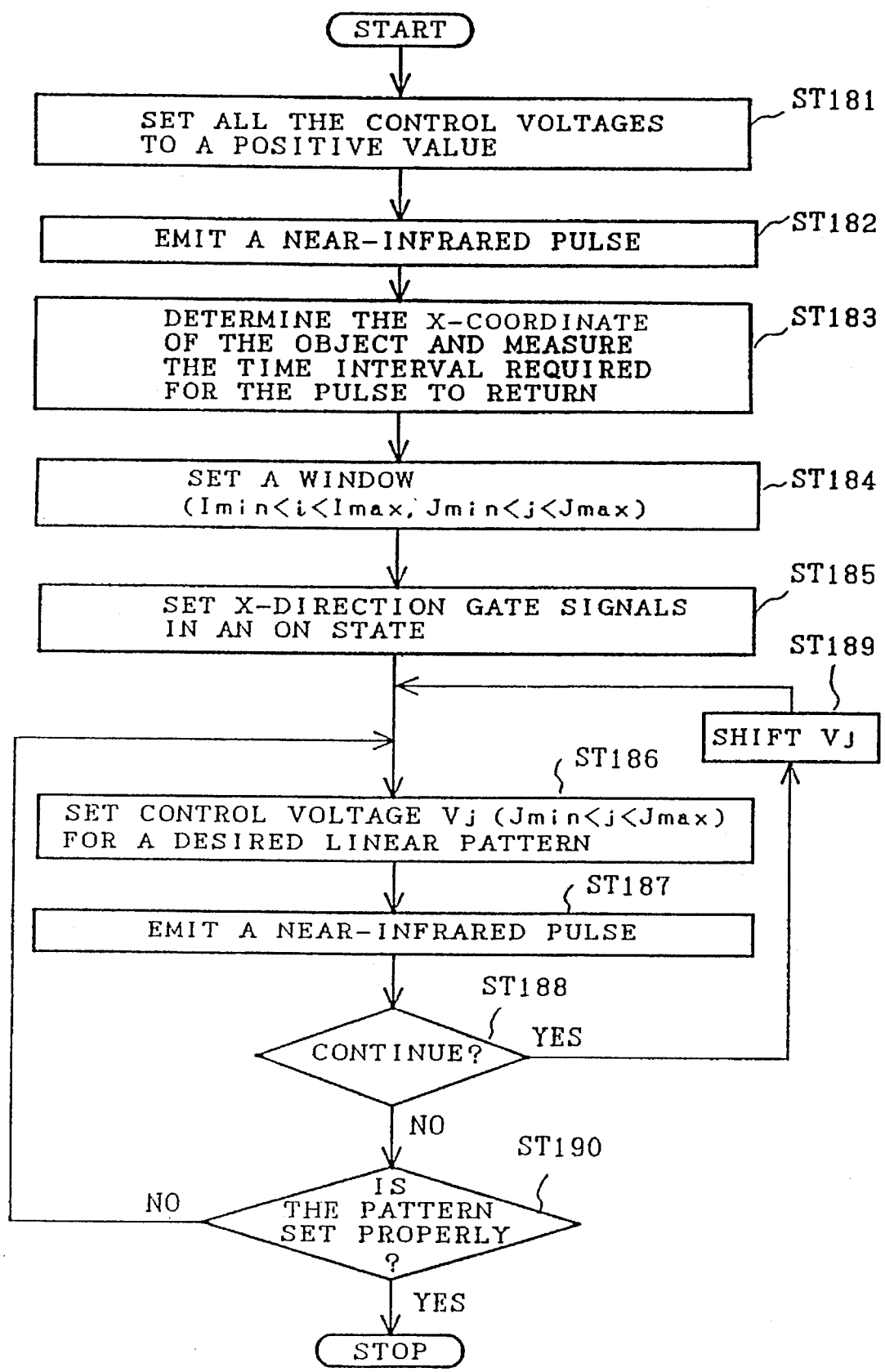
FIG. 85 is a flow chart of another object detecting procedure to be carried out by the object detector of FIG. 83.

Referring to FIG. 85, control voltages $V_j$ to be applied to the photodetectors are set to +5 in step ST181. In this state the photosensitivities of all the photodetectors are set to "5" (all the x-direction gates are set in an ON state).

Then in step ST182, the light-emitting unit 1 emits a near-infrared pulse and, in step ST183, the photodetector unit 3 receives the reflected light reflected from an object. The x-coordinate of the object can be roughly estimated through the detection of the x-direction terminals 15 through which photocurrents flow. The distance between the object and the object detector can be determined by calculation on the basis of the measured time interval Dt between the emission of a pulse and the reception of the reflected pulse.

Then in step ST184, a window is set in the image formed by the photodetector unit 3 so as to contain an image of the object ($I_{min}<i<I_{max}$, $J_{min}<j<J_{max}$) on the basis of the x-coordinate, the distance and the position of the object detector. Then in step ST185 the x-direction gate signals 20 for $I_{min}$ to $I_{max}$ are set in an ON state and the rest are kept in an OFF state.

Then in step ST186, control voltages $V_j$ ($J_{min}<j<J_{max}$) are set for a pattern to be found, and then the photodetector unit 3 receives the reflected light. In this state, the x-direction output signal is a correlation signal representing the correlation between the pattern and the image. Then in step ST188, a query is made to see if the procedure is to be continued and, if the response in step ST188 is affirmative, the components of the control voltage vectors are shifted in step ST189, and then steps ST186 and 187 are executed again. Thus, pattern matching with the partial image for each line is achieved.

Then in step ST190, a query is made to see if it is necessary to change the pattern and to execute steps ST186 and ST187 and, if the response in step ST190 is affirmative, the procedure returns to step ST186.

This object detecting procedure is able to search the partial image for different patterns; for example, the object detecting procedure searches the partial image for a square pattern first and, if any square pattern is found in the partial image, searches the partial image for a triangular pattern.

Figure 86:
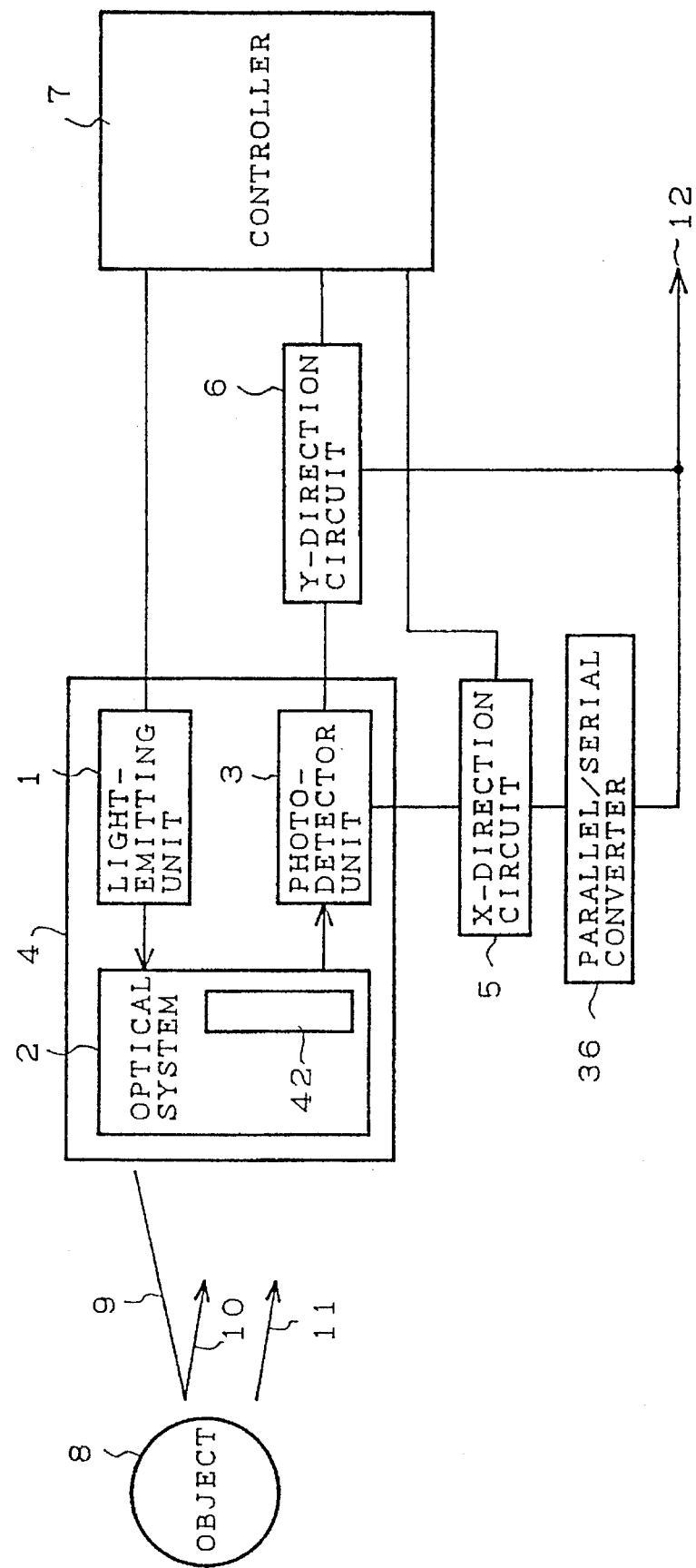
FIG. 86 is a block diagram of an object detector in a preferred embodiment according to the present invention.

FIG. 86 shows an object detector in a preferred embodiment according to the present invention. In FIG. 86, indicated at 36 is a parallel/serial converter (signal converting means) capable of converting the parallel output signals of the x-direction circuit into serial signals. The parallel/serial converter may be a circuit comprising capacitors for temporarily holding analog signals, and switches that are turned on sequentially to send out the analog signals sequentially or a circuit capable of converting analog input signals into digital signals and comprising a shift register.

An x-direction circuit included in the object detector of FIG. 86 may be replaced with the circuit shown in FIG. 68 having a plurality of x-direction terminals 15 connected to a single circuit. In FIG. 68, indicated at 37 are switches for parallel/serial conversion. This circuit need not be provided with any x-direction gate switch. The switches 37 are turned on sequentially to convert parallel signals into serial signals.

Figure 87:
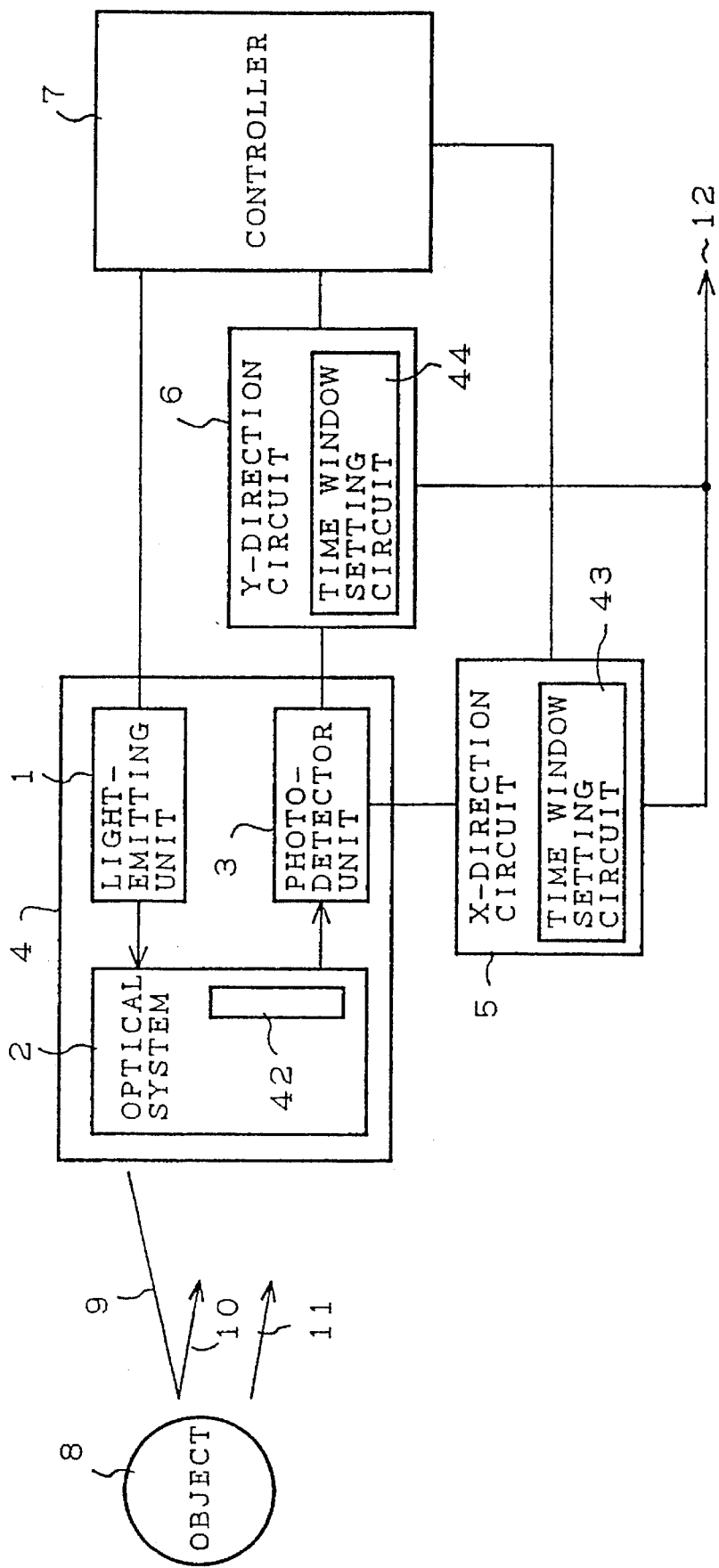
FIG. 87 is a block diagram of an object detector in a preferred embodiment according to the present invention.

FIG. 87 shows an object detector in a preferred embodiment according to the present invention, in which parts like or corresponding to those of the object detector of FIG. 86 are denoted by the same reference characters. In FIG. 87, indicated at 43 is a time window setting circuit (time window setting means) subsequent to the x-direction circuit 5, and at 44 is a time window setting circuit subsequent to the y-direction circuit 6. The time window setting circuit 43 detects input signals given thereto within a given time window.

Figure 89:
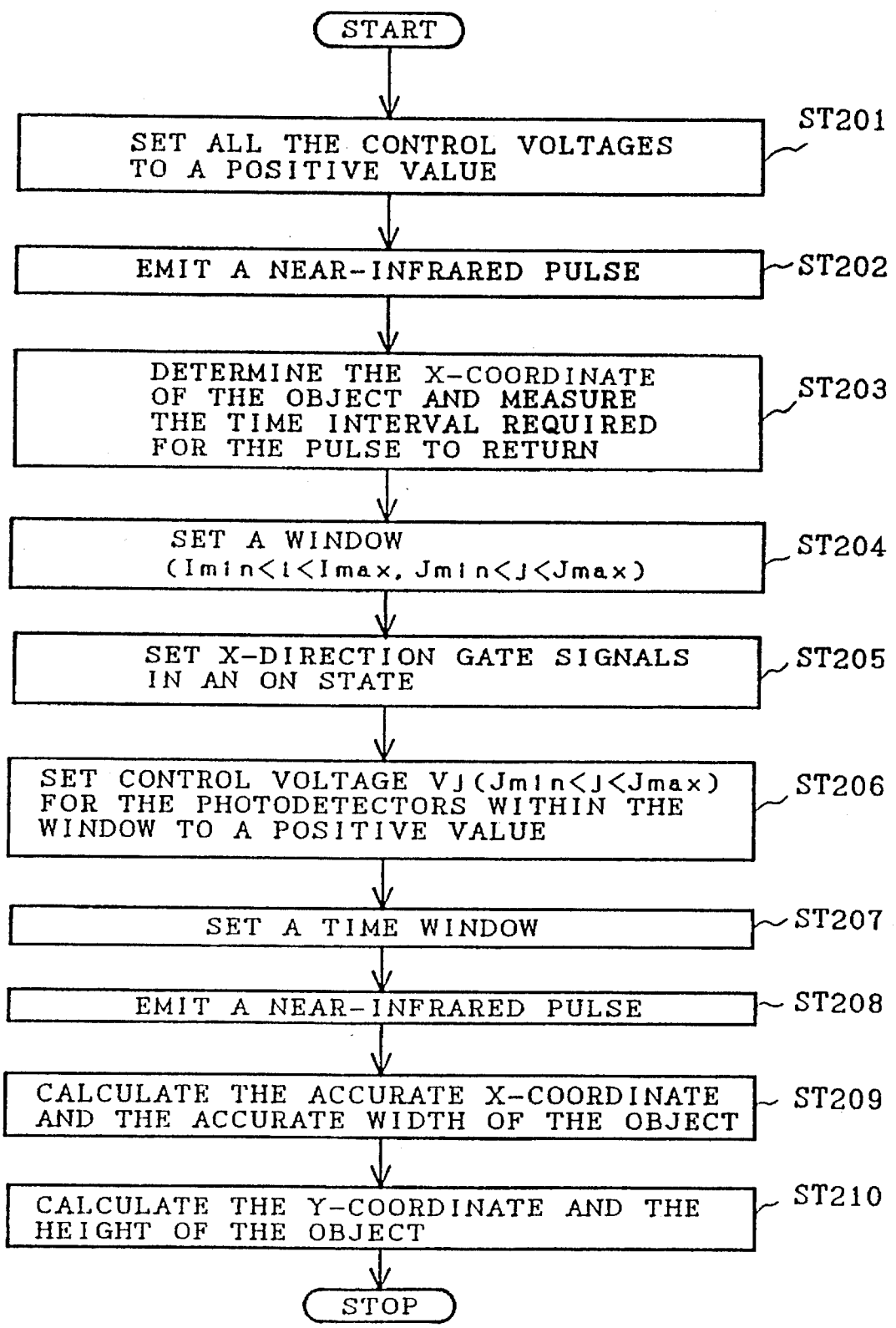
FIG. 89 is a flow chart of an object detecting procedure in a preferred embodiment according to the present invention.

FIG. 89 is a flow chart of an object detecting procedure to be carried out by the object detector of FIG. 87. Referring to FIG. 89, control voltages Vj to be applied to the photodetectors are set to +5 in step ST201. In this state, the photosensitivities of all the photodetectors are set to "5" (all the x-direction gates are set in an ON state). Then in step ST202, the light-emitting unit 1 emits a near-infrared pulse.

Figure 88A:
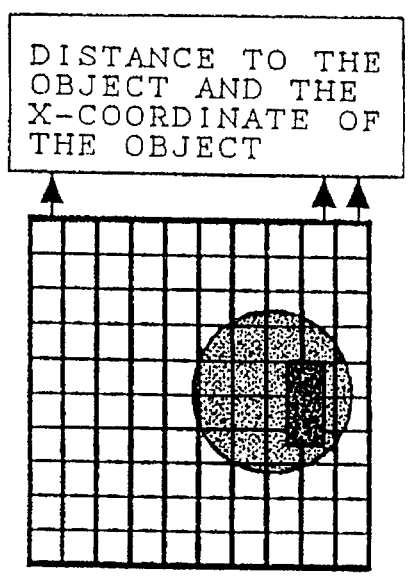
FIGS. 88(a) and 88(b) are diagrammatic views of assistance in explaining a procedure for projecting a window to be carried out by the object detector of FIG. 87.

Then in step ST203, the photodetector unit 3 receives the reflected light reflected from an object through the visible radiation absorbing filter 42 of the optical system 2 to detect the object. The x-coordinate of the object can be roughly estimated through the detection of the x-direction terminals 15 through which photocurrents flow. The distance between the object and the object detector can be determined by calculation on the basis of the measured time interval Dt between the emission of a pulse and the reception of the reflected pulse (FIG. 88(a)).

Then in step ST204, a window is set in an image formed by the photodetector unit 3 so as to contain an image of the object ($I_{min}<i<I_{max}$, $J_{min}<j<J_{max}$) on the basis of the x-coordinate, the distance and the position of the object detector. Then in step ST205, x-direction gate signals 20 for Imin to Imax are set in an ON state and the rest are set in an OFF state.

Figure 88B:
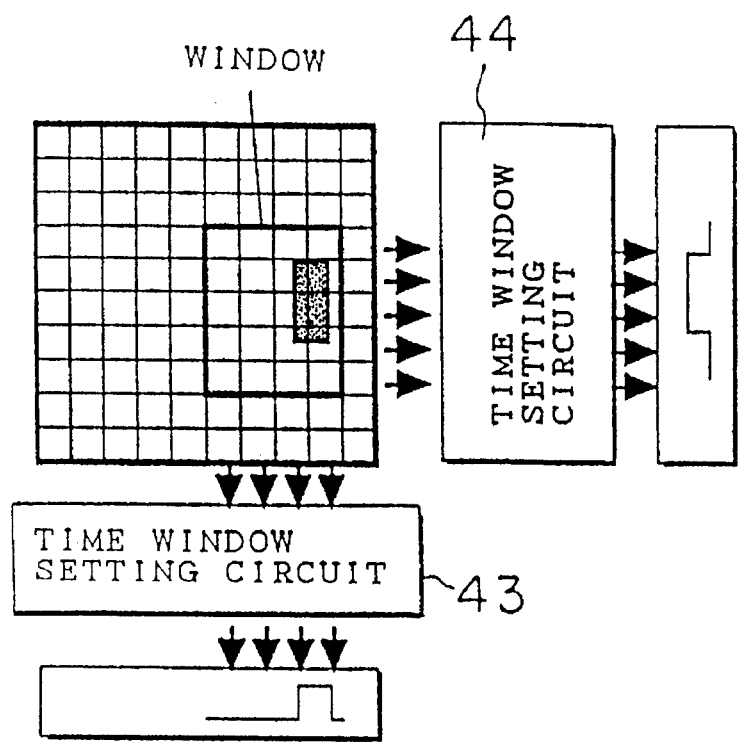

Then in step ST206, control voltages $V_j$ ($J_{min}<j<J_{max}$) for the photodetectors within the set window are set to +5. In step ST207 a time window corresponding to the distance between objects is set. Then in step ST208, the light-emitting unit 1 emits a near-infrared pulse, and then, the photodetector unit 3 detects the reflected light falling thereon within the time window. In this state, the x-direction output signal represents a vertical projection of the image within the window, and the y-direction output signal represents a horizontal projection of the image within the window. The projection signals do not include information about the background at a distance different from the distance between the object and the object detector from the object detector owing to the effect of the time window. (FIG. 88(b)).

Then in step ST209, the x-direction signal processing circuit calculate the accurate x-coordinate and the width of the object on the basis of the x-direction projection signal. In step ST210, the y-direction signal processing circuit calculates the y-coordinate and the height of the object on the basis of the y-direction projection signal.

Thus, the object detector in this embodiment set a time window to eliminate information about the background and processes only information about the object to enhance the accuracy of object detection.

Figure 90:
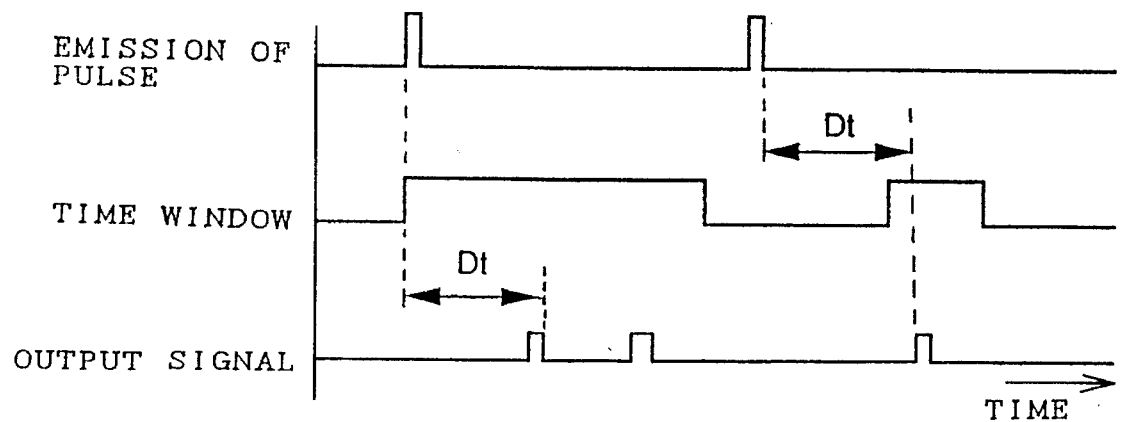
FIG. 90 is a timing diagram of a window setting procedure to be carried out by the object detector of FIG. 87.
Figure 91:
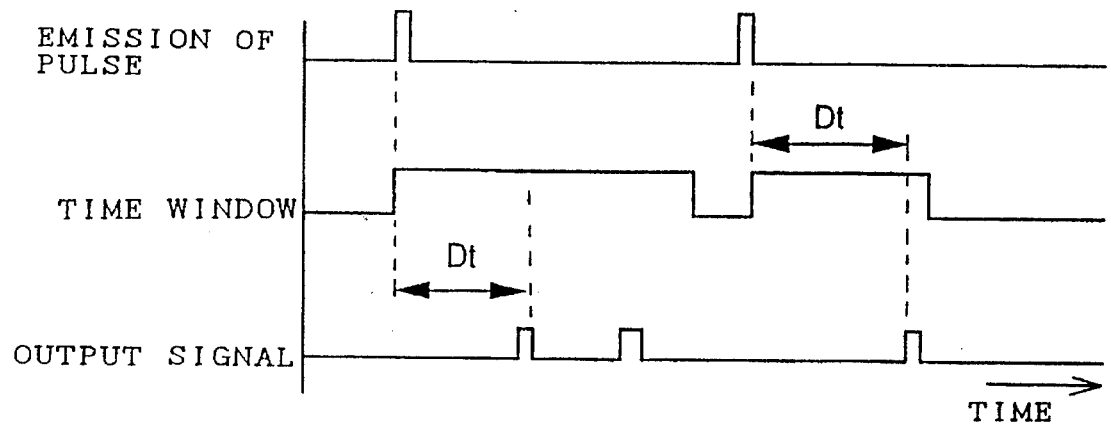
FIG. 91 is a timing diagram of a window setting procedure to be carried out by the object detector of FIG. 87.

Although the width of the time window in this embodiment is set in front of and behind time corresponding to the distance to the object as shown in FIG. 90, the time window may be set for a time corresponding to the distance after the end of the second cycle of emission of a pulse as shown in FIG. 91.

Figure 92:
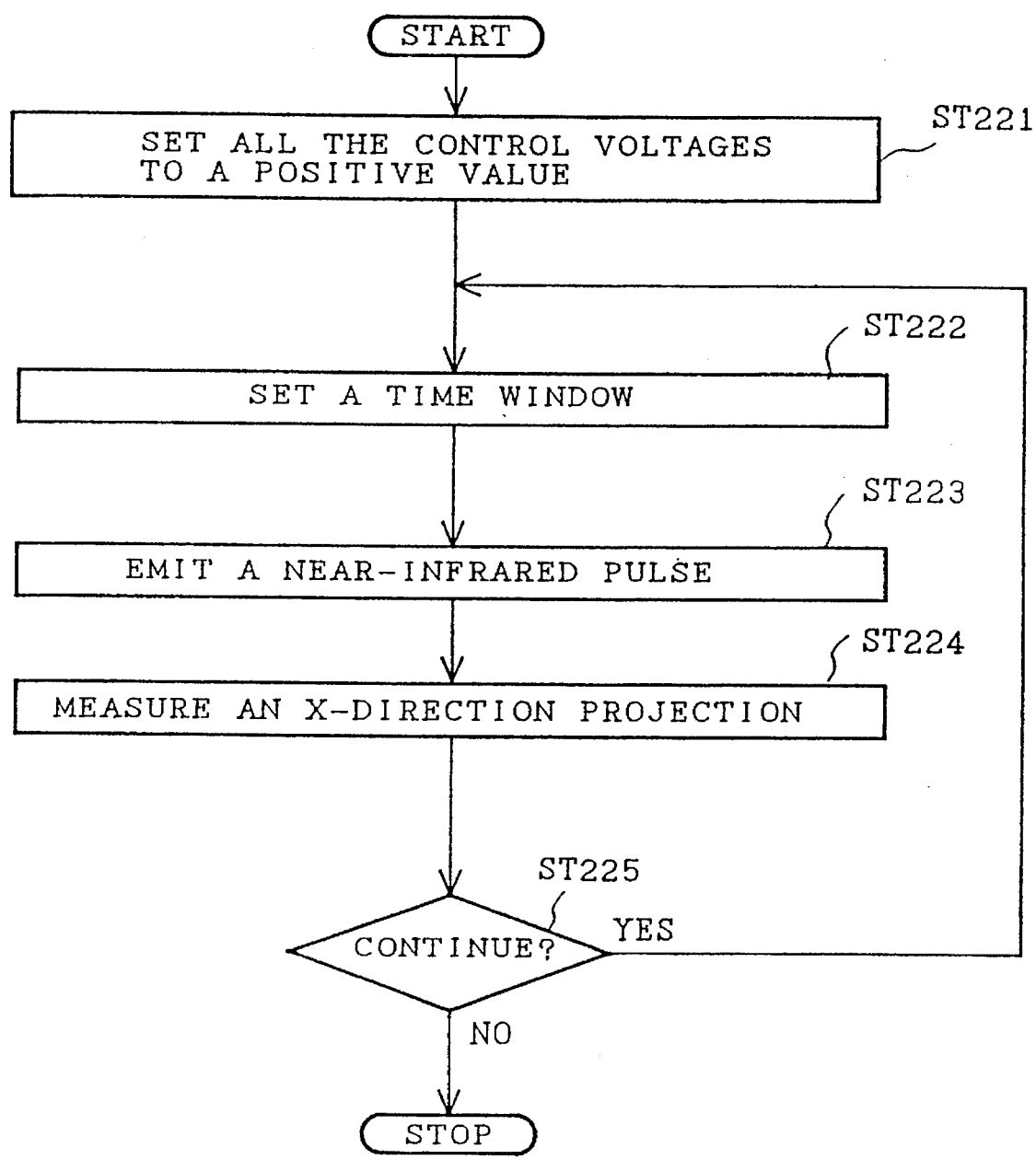
FIG. 92 is a flow chart of an object detecting procedure in a preferred embodiment according to the present invention.

FIG. 92 is a flow chart of an object detecting procedure in a preferred embodiment according to the present invention. Referring to FIG. 92, control voltages $V_j$ to be applied to the photodetectors are set to +5 in step ST221. In this state, the photosensitivities of all the photodetectors are set to "5" (all the x-direction gates are set in an ON state). Then in step ST222, a time window corresponding to a desired distance is set.

Then in step ST223, the light-emitting unit 1 emits a pulse of near-infrared radiation, and the photodetector unit 3 receives the reflected light within the time window in step ST224. In this state, the x-direction output signal represents a vertical projection of an image of an object at the desired distance from the object detector.

Then in step ST225, a query is made to see if the procedure is to be continued and, if the response in step ST225 is affirmative, the procedure returns to step ST222 to change the desired distance, and then steps ST223 and ST224 are executed again. Thus, data of projections of images of objects at different distances from the object detector can be obtained.

Figure 93:
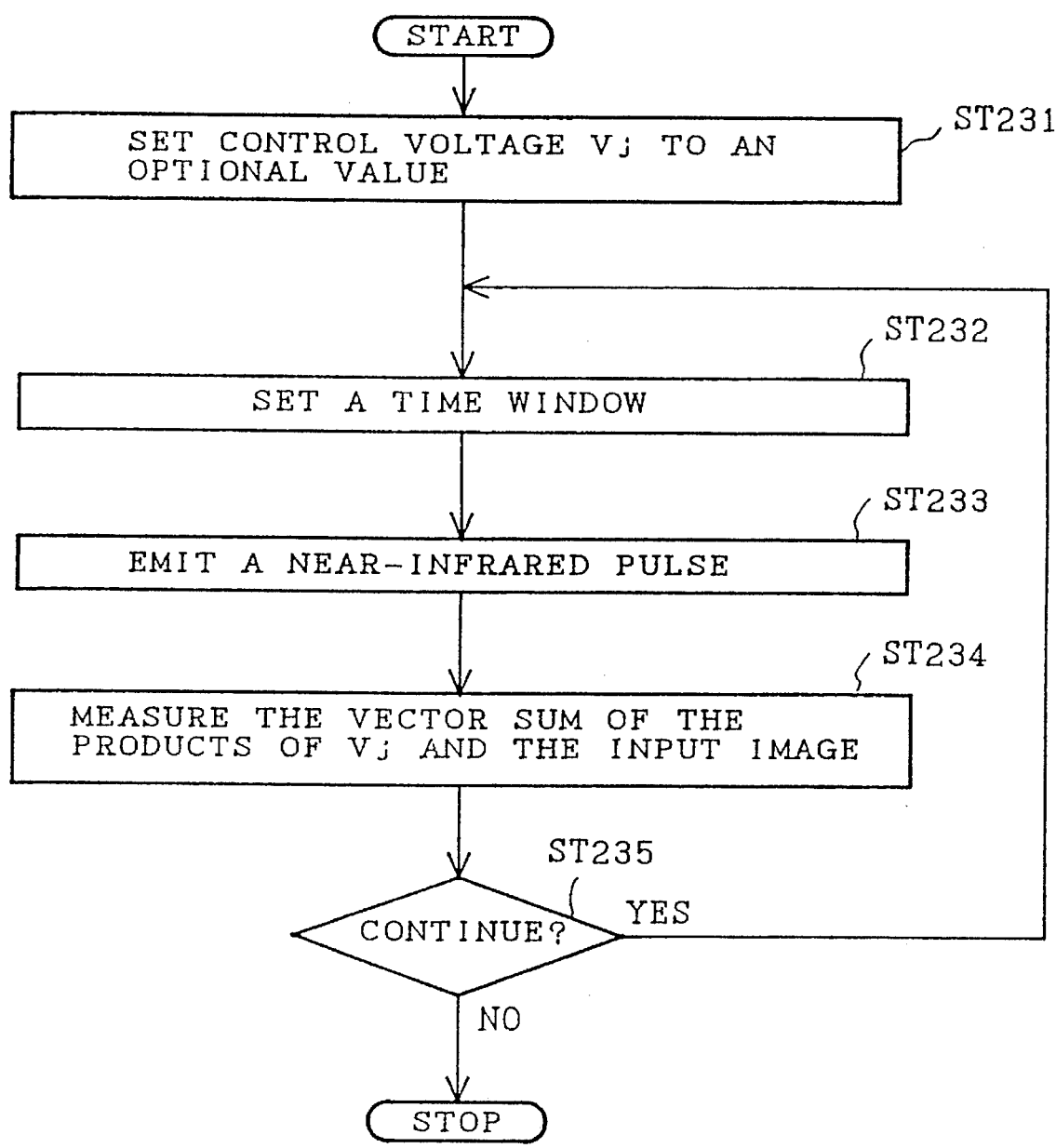
FIG. 93 is a flow chart of an object detecting procedure in a preferred embodiment according to the present invention.

FIG. 93 is a flow chart of an object detecting procedure which sets control voltages Vj to be applied to the photodetectors to optional values instead of +5 to which the object detecting procedure of FIG. 92 sets control voltages $V_j$.

Referring to FIG. 93, control voltages $V_j$ are set to optional values in step ST231, and then a time window corresponding to a desired distance is set in step ST232.

Then in step ST233, the light-emitting unit 1 emits a pulse of near-infrared radiation and, in step ST234, the photodetector unit 3 receives the reflected light within the time window. In this state, the x-direction output signal represents the vector sum of products of an image of an object at the desired distance from the object detector and vectors determined by the control voltages.

Then in step ST235, a query is made to see if the procedure is to be continued and, if the response in step ST235 is affirmative, the procedure returns to step ST232 to change the distance, and then steps ST233 and ST234 are executed again. Thus, sums of products for different distances are calculated.

Figure 94:
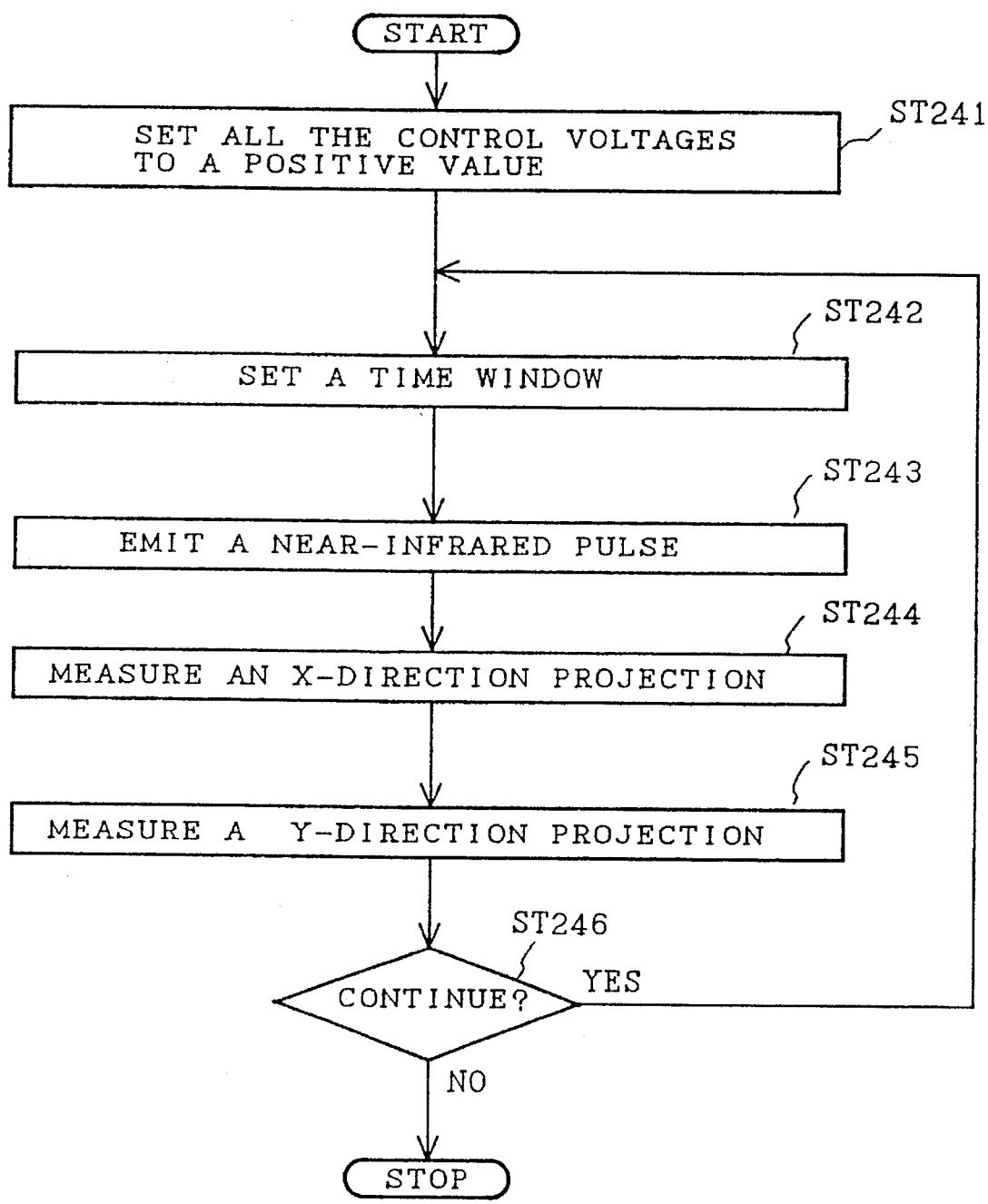
FIG. 94 is a flow chart of an object detecting procedure in a preferred embodiment according to the present invention.

Whereas the object detecting procedures of FIGS. 89 and 92 use only the x-direction projection, an object detecting procedure shown in FIG. 94 uses both the x-direction and the y-direction projections. Referring to FIG. 94, all control voltages $V_j$ are set to +5 in step ST241. In this state, the photosensitivities of all the photodetectors are set to "5" (all the x-direction gates are set in an ON state).

Then in step ST242, a window corresponding to a desired distance is set, and then the light-emitting unit 1 emits a pulse of near-infrared radiation in step ST243. Then in step ST244, the photodetector unit 3 receives the reflected light within the time window. In this state, the x-direction output signal represents a vertical projection of an image within the window; an x-direction projection is determined by calculation on the basis of the x-direction output signal. Similarly, the y-direction output signal represents a horizontal projection; a y-direction projection is determined by calculation on the basis of the y-direction output signal in step ST245.

Then in step ST246, a query is made to see if the procedure is to be continued and, if the response in step ST246 is affirmative, the procedure returns to step ST242 to change the distance, and then steps ST243, ST244 and ST245 are executed again. Thus, both x-direction projections and y-direction projections are determined for different distances.

Figure 95:
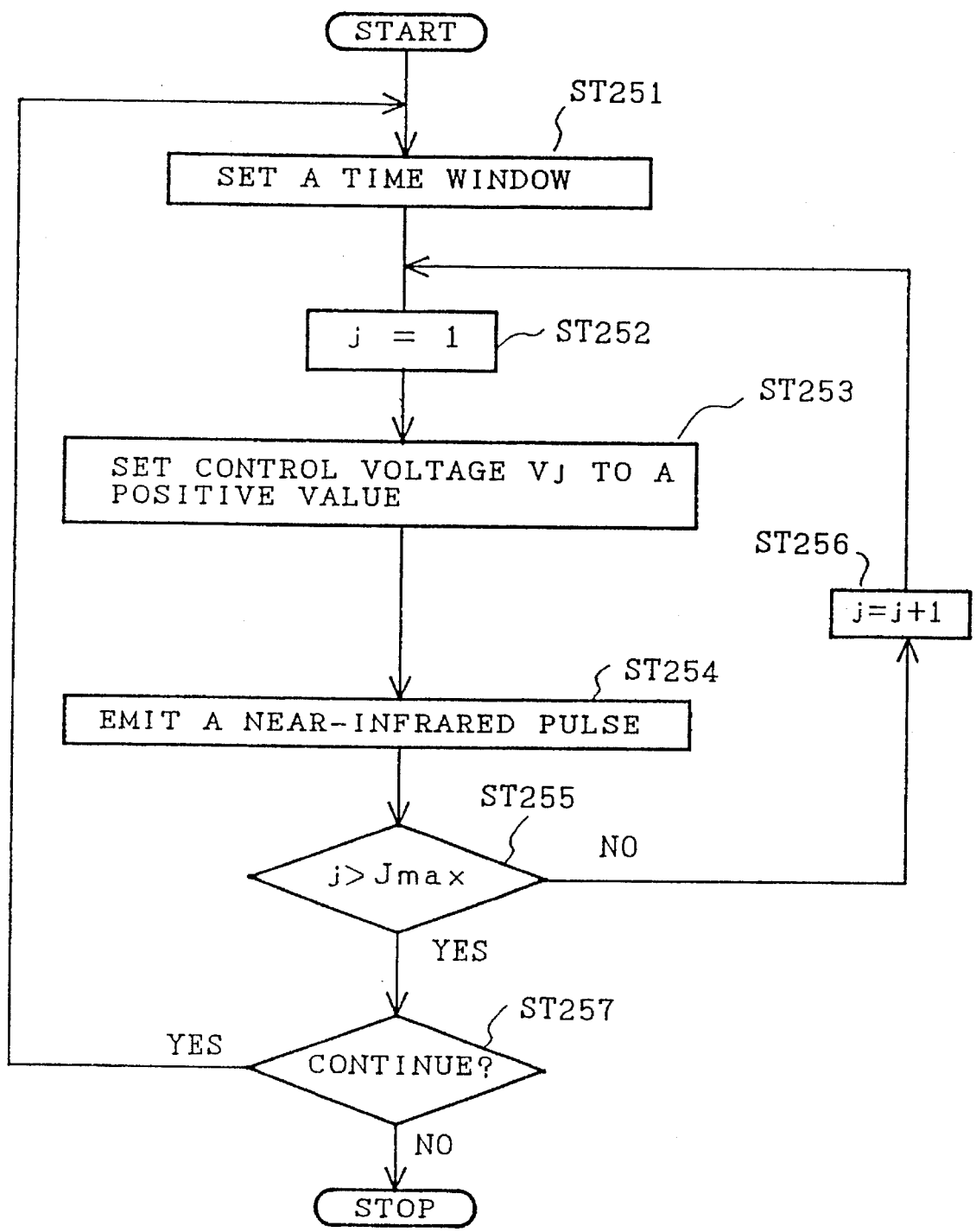
FIG. 95 is a flow chart of an object detecting procedure in a preferred embodiment according to the present invention.

FIG. 95 is a flow chart of an object detecting procedure in a preferred embodiment according to the present invention. Referring to FIG. 95, a time window corresponding to a desired distance is set in step ST251, and the first line is selected (j=1) in step ST252.

Then in step ST253 control voltages $V_j$ are set to +5. In this state, the photosensitivities of photodetectors on the j-th line are set to "5" (all the x-direction gates are set in an ON state). Then in step ST254, the light-emitting unit 1 emits a pulse of near-infrared radiation, and then the photodetector unit receives the reflected light within the time window. In this state, the x-direction output signal represents a part of an image of an object at the desired distance from the object detector formed by the photodetectors on the j-th line.

In step ST255, a query is made to see if the j-th line is the last line and, if the response in step ST255 is negative, j is incremented by one in step ST256, and then steps ST253 and ST254 are executed again. Thus, a loop of steps ST252 through ST256 is repeated for all the lines.

Then in step ST257, a query is made to see if the procedure is to be continued and, if the response in step ST257 is affirmative, the procedure returns to step ST251 to set another time window corresponding to another desired distance is set, and then the foregoing steps are repeated. Thus, image information about objects at different distances from the object detector can be obtained.

Figure 96:
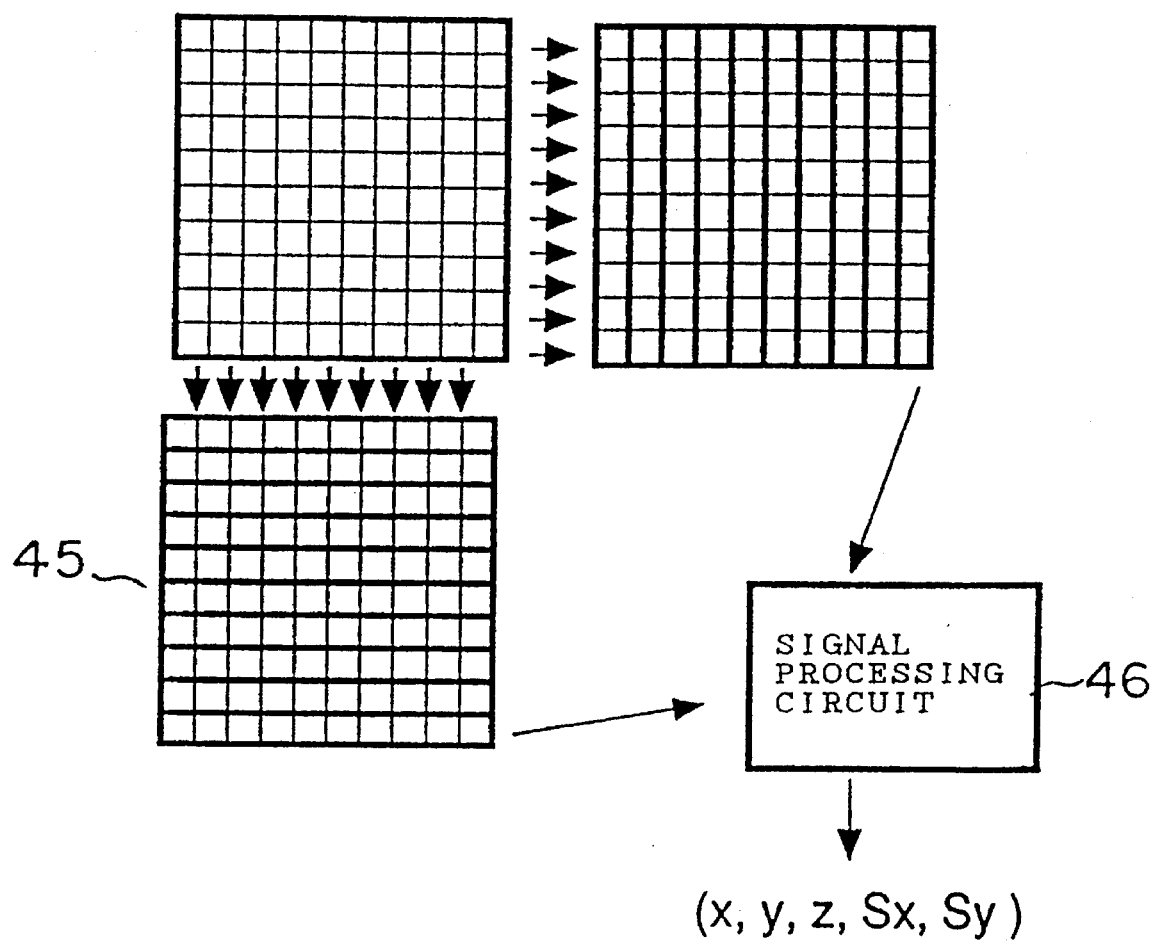
FIG. 96 is a diagrammatic view of assistance in explaining an essential circuit of an object detector in a preferred embodiment according to the present invention.

FIG. 96 shows a photodetector unit included in an object detector in a preferred embodiment according to the present invention. In this photodetector unit, high-speed memories 45 (storage means) are connected respectively to the x-direction output end and the y-direction output end of a photodetector array. In this object detector, control voltages for all the photodetectors are set to +5, and a light-emitting unit emits near-infrared pulses.

Projections of images of objects respectively at different distances from the object detector can be obtained in a single pulse emitting cycle by storing the variation with time of the photocurrent generated by the photodetector array exposed to the reflected light in the high-speed memories 45. The data stored in the high-speed memories 45 are processed by a data processing circuit 46 to determine the distances to the objects, and the positions and the sizes of the objects.

Figure 97:
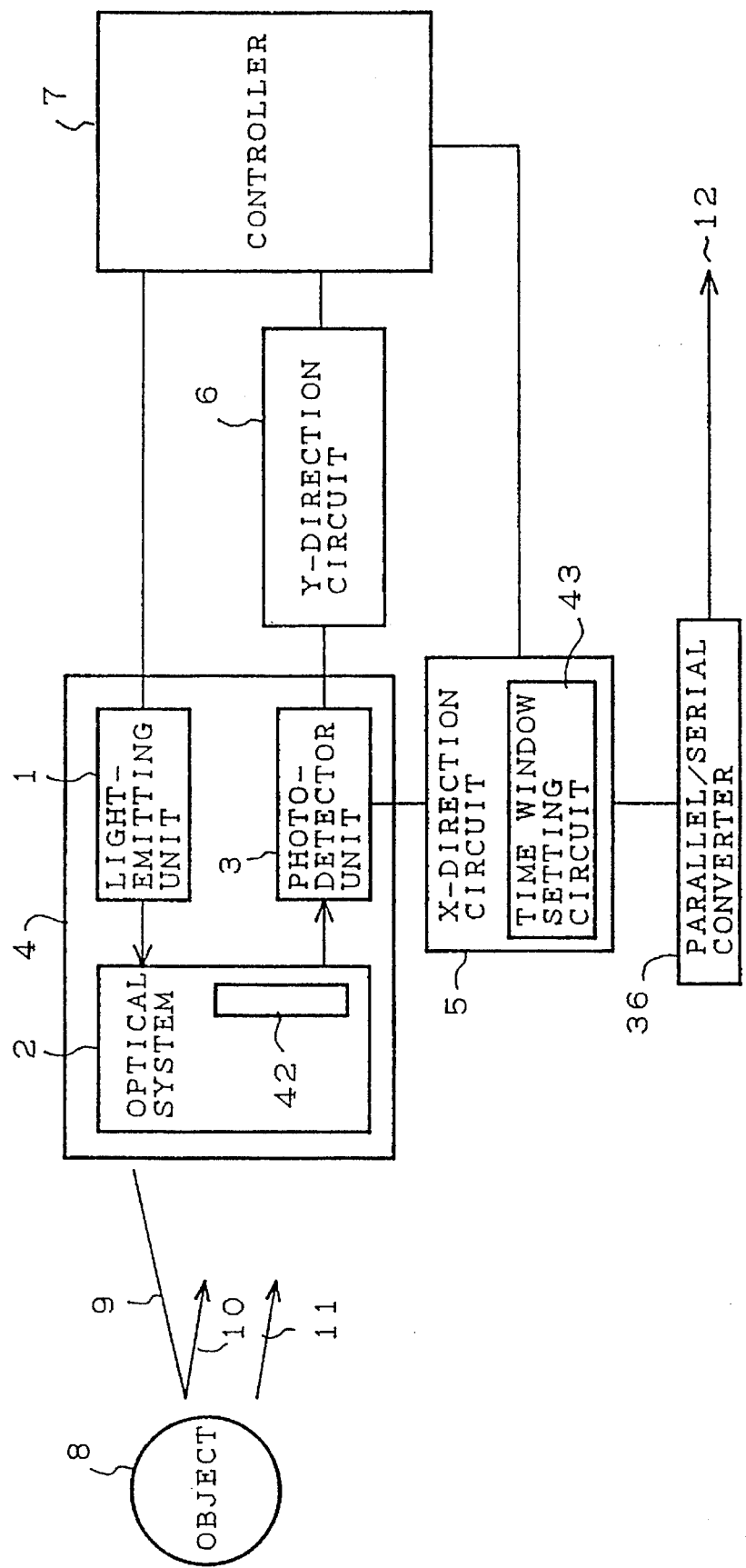
FIG. 97 is a block diagram of an object detector in a preferred embodiment according to the present invention.

FIG. 97 shows an object detector in a preferred embodiment according to the present invention. In FIG. 97, indicated at 36 is a parallel/serial converter which converts parallel output signals of an x-direction circuit into serial signals. The parallel/serial converter may be a circuit comprising capacitors for temporarily holding analog signals, and switches which are turned on sequentially to send out the analog signals sequentially or a circuit an A/D converter which converts analog signals into digital signals, and a digital shift register.

Figure 98:
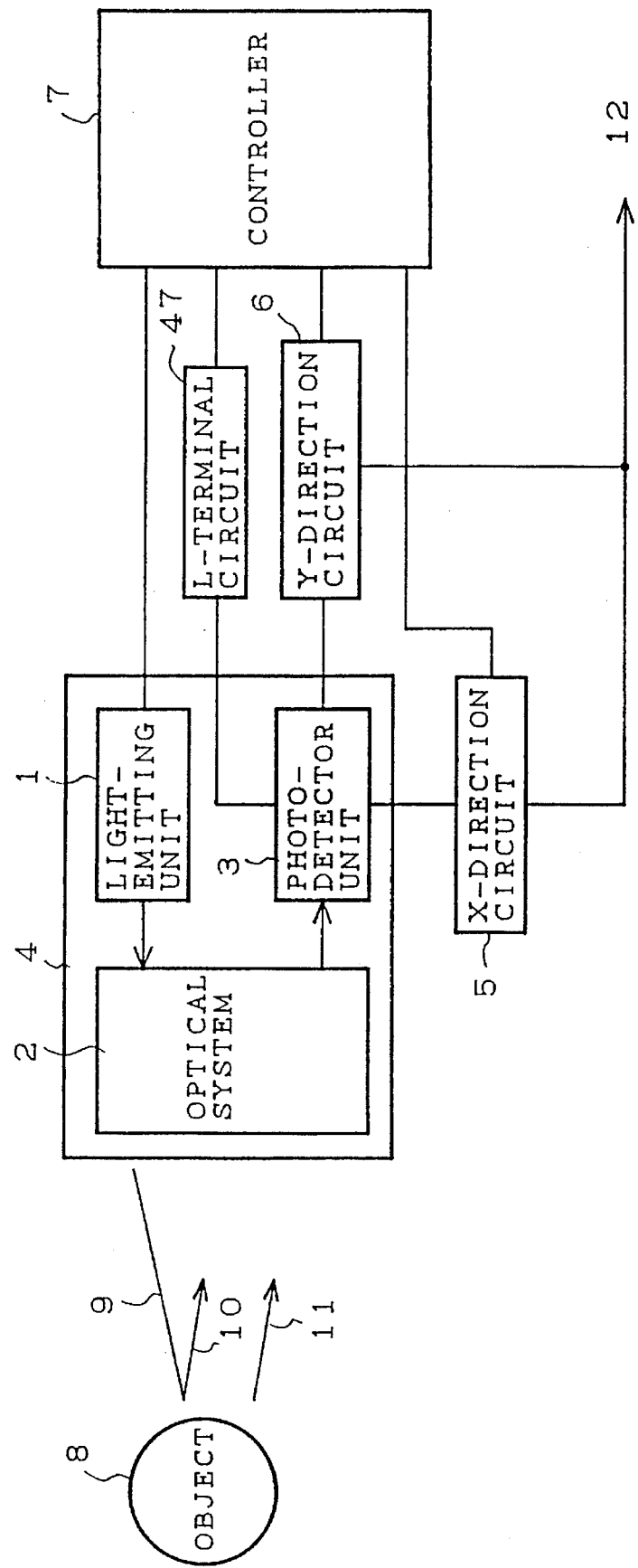
FIG. 98 is a block diagram of an object detector in a preferred embodiment according to the present invention.
Figure 99A:
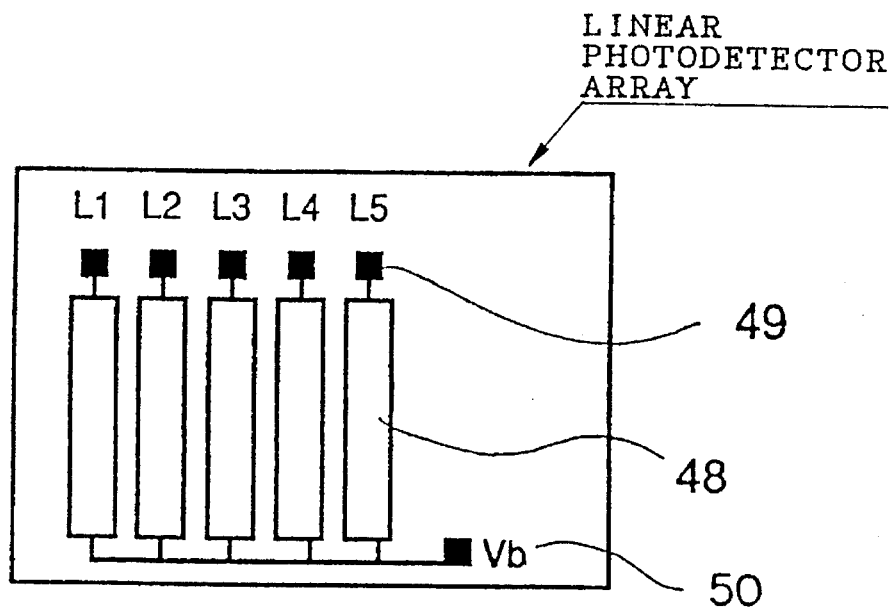
FIG. 99 is a plan view of a photodetector unit included in the object detector of FIG. 98.
Figure 99B:
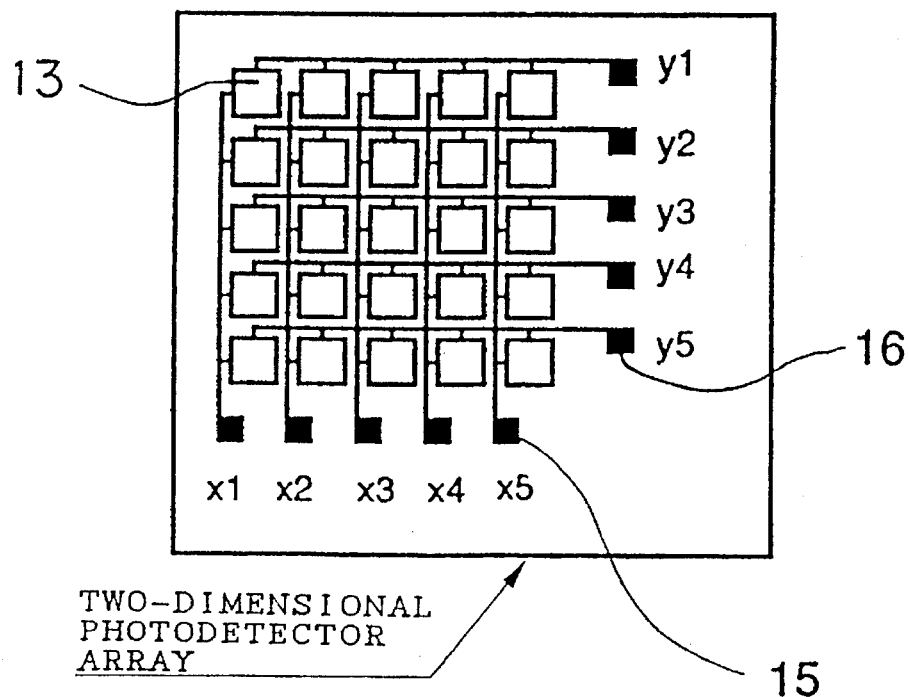
Figure 100:
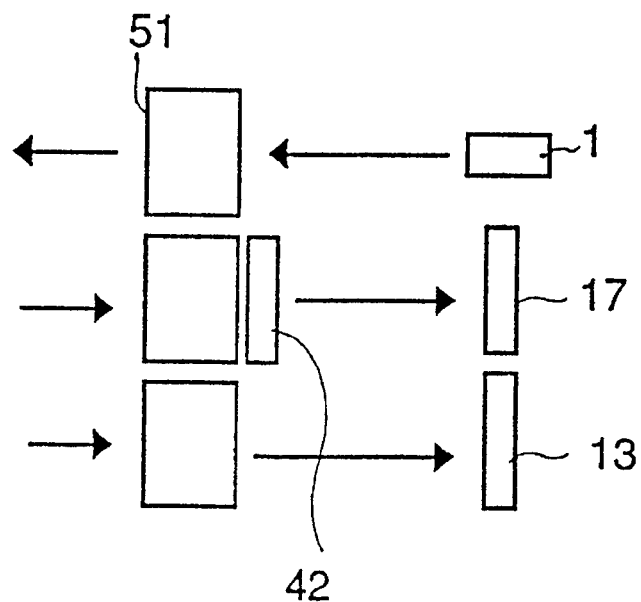
FIG. 100 is a diagrammatic view of an optical system included in the object detector of FIG. 98.

FIG. 98 shows an object detector in a preferred embodiment according to the present invention. This object detector has a photodetector unit 3 provided with a linear photodetector array. The output signal of the linear photodetector array is processed by an L-terminal circuit 47. Referring to FIG. 99 showing the photodetector 3 of the object detector of FIG. 98, there are shown photodetectors 48, L-terminals 49 and a bias terminal 50. A common bias voltage is applied to the photodetectors 48 of the linear photodetector array. The output photocurrent of each photodetector 48 flows through the L-terminal 49. The L-terminal circuit 47 converts the output photocurrents into voltage signals. FIG. 100 shows the positional relation between a light-emitting unit 1, the photodetector unit 3 and an optical system 2. Near-infrared radiation emitted by the light-emitting unit 1 is sent out through a lens 51 into a predetermined range. A visible radiation absorbing filter 42 absorbs visible radiation included in the reflected light so that only the reflected near-infrared radiation will fall on the linear photodetector array.

Figure 101:
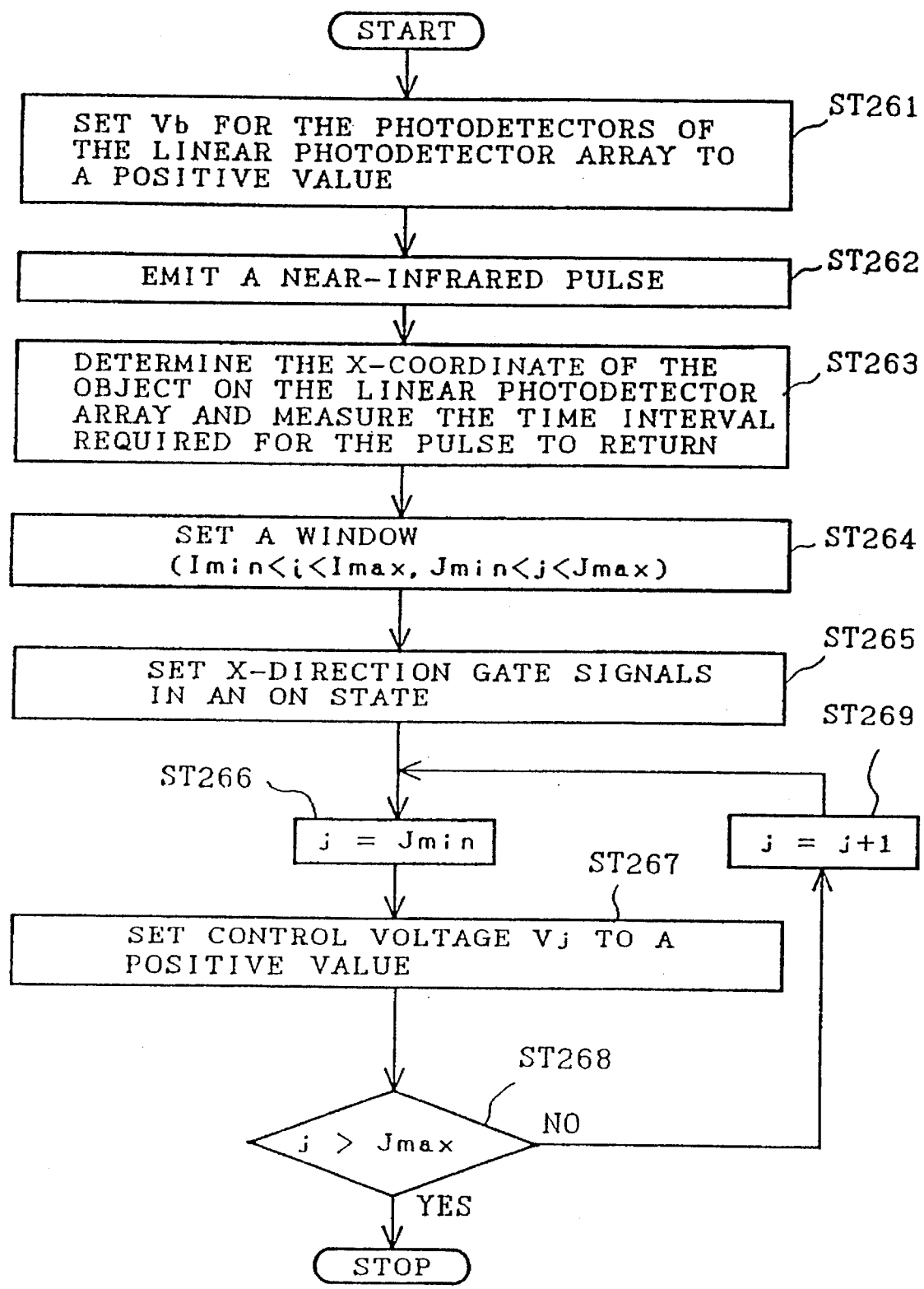
FIG. 101 is a flow chart of an object detecting procedure in a preferred embodiment according to the present invention.

FIG. 101 is a flow chart of an object detecting procedure in a preferred embodiment according to the present invention. Referring to FIG. 101, the bias voltage is applied to the photodetectors of the linear photodetector array in step ST261, and then the light-emitting unit emits a near-infrared pulse in step ST262. Then in step ST263, the linear photodetector array receives the reflected light reflected from an object 8. The x-coordinate of the object 8 can be roughly estimated through the detection of the L-terminals through which photocurrents flow. The distance between the object 8 and the object detector can be determined by calculation on the basis of the measured time interval Dt between the emission of the near-infrared pulse and the reception of the reflected light.

Then in step ST264, a window is set in an image formed by the two-dimensional photodetector array of the photodetector unit 3 so as to contain an image of the object 8 ($I_{min}<i<I_{max}$, $J_{min}<j<J_{max}$) on the basis of the x-coordinate, the distance and the position of the object detector. Then in step ST265, the x-direction gate signals of an x-direction circuit for the two-dimensional photodetector array for $I_{min}$ to $I_{max}$ are set in an ON state and the rest are set in an OFF state. Then in step ST266, the j-th line, i.e., $J_{min}$-th line, of the window is selected.

Then in step ST267, control voltages $V_j$ to be applied to the photodetectors of the two-dimensional photodetector array are set to +5 and the rest are set to zero. In this state, only the photodetectors on the j-th line are photosensitive. Therefore, part of the image within the window on the j-th line can be formed through the measurement of the x-direction dc outputs 23 of the x-direction circuit 5 representing the reflected visible radiation reflected from the object 8 on the two-dimensional photodetector array, namely, image data. Then in step ST268, a query is made to see if $j=J_{max}$, namely, if the j-th line is the last line in the set window and, if the response in step ST268 is negative, the line number is incremented by one, namely, j=j+1, in step ST269, and then step ST267 is executed again. Thus, image data including that of the object for each line can be obtained.

Figure 102:
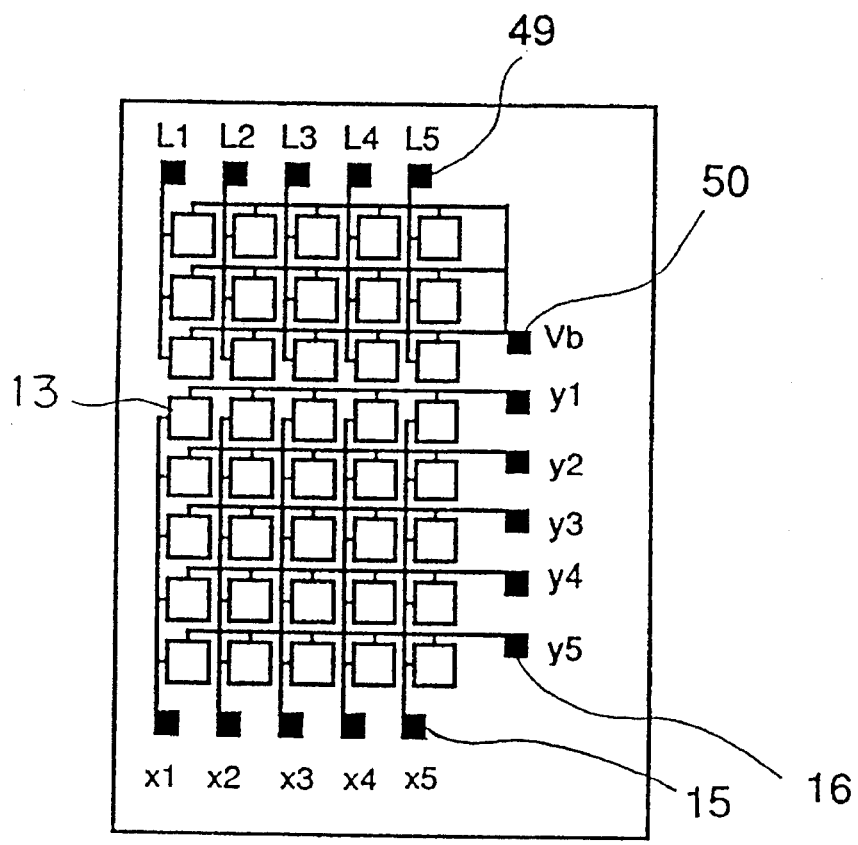
FIG. 102 is a schematic plan view of another photodetector unit applicable to the object detector of FIG. 98.

Although the photodetector unit 3 in this embodiment comprises the two-dimensional photodetector array of variable-sensitivity photodetectors, and the linear array of photodetectors, the photodetector unit 3 may comprise only a two-dimensional photodetector array and one line of photodetectors of the two-dimensional photodetector array may be used as a linear photodetector array as shown in FIG. 102.

Figure 103:
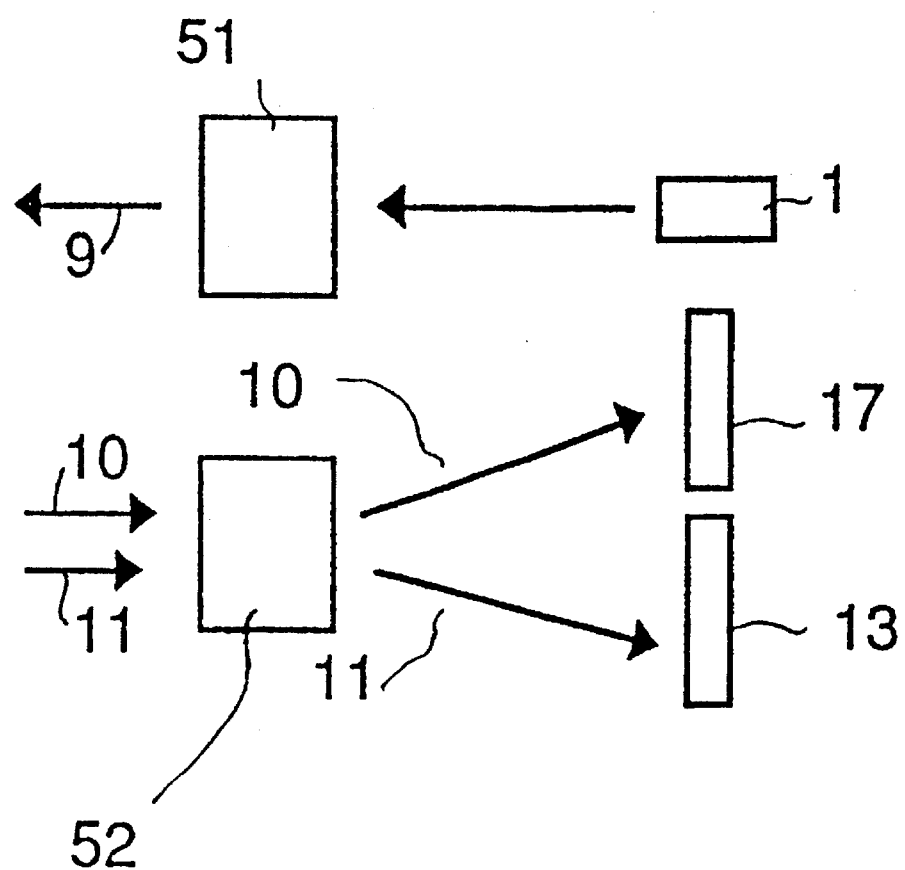
FIG. 103 is a diagrammatic view of another optical system applicable to the object detector of FIG. 98.

The optical system 2 of the object detector may be provided, instead of the visible radiation absorbing filter 42 that transmits only near-infrared radiation to the linear photodetector array, with a wavelength separating device 52 that directs electromagnetic waves having different wavelengths in different directions as shown in FIG. 103.

The x-direction circuit 5 of FIG. 98, similarly to the x-direction circuit of FIG. 50, may be provided with an A/D converter to convert the analog current signals provided by the photodetectors into corresponding digital signals.

Figure 104:
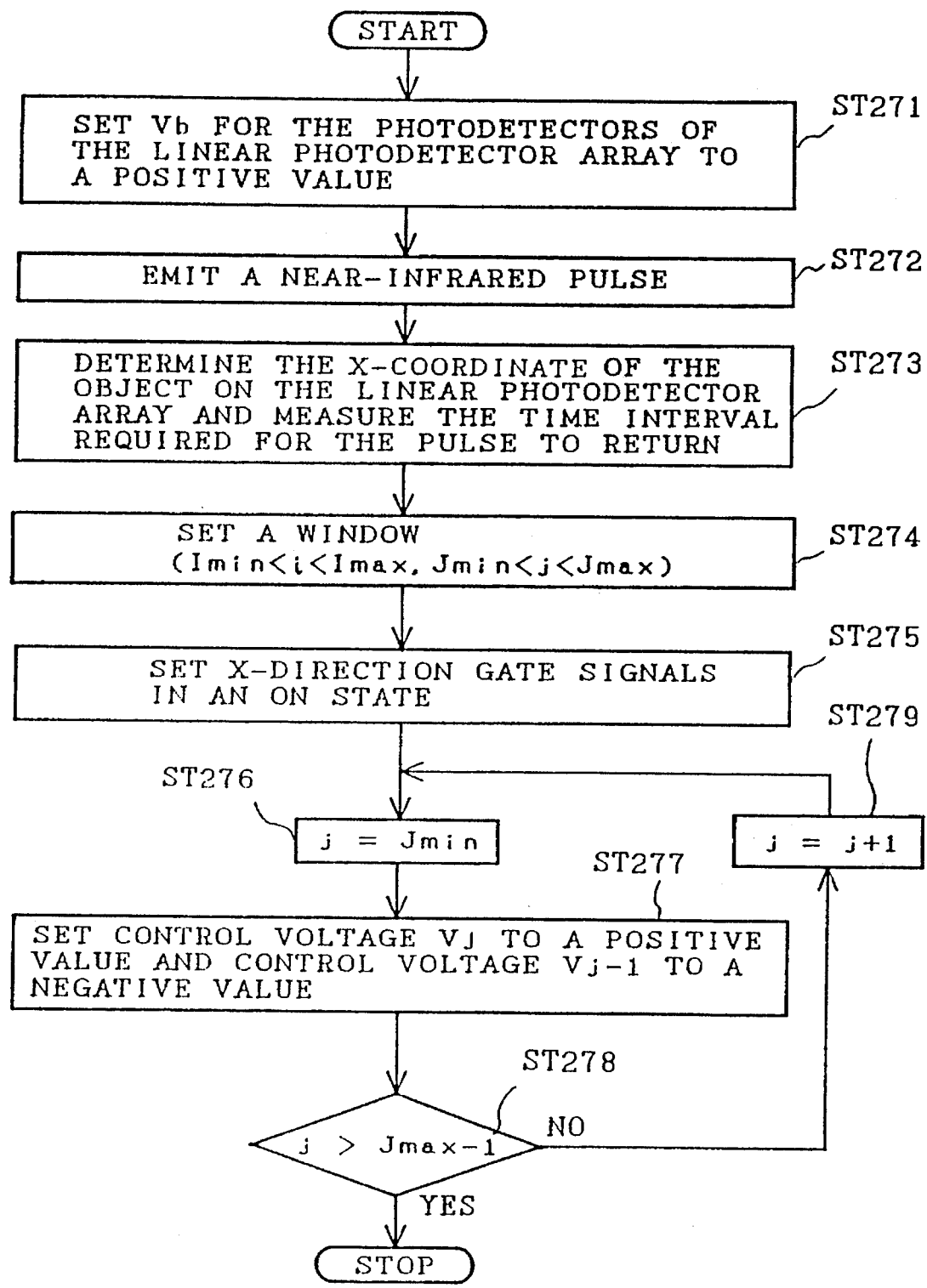
FIG. 104 is a flow chart of another object detecting procedure to be carried out by the object detector of FIG. 98.

FIG. 104 is a flow chart of another object detecting procedure in a preferred embodiment according to the present invention to be carried out by the object detector previously described with reference to FIGS. 98 and 99.

Referring to FIG. 104, a bias voltage is applied to the photodetectors of the linear photodetector array of the photodetector unit 3 in step ST271, and then the light-emitting unit 1 emits a near-infrared pulse in step ST272. Then in step ST273, the linear photodetector array receives the reflected light f=reflected from an object. The x-coordinate of the object can be roughly estimated through the detection of the L-terminals 49 through which photocurrents flow. The distance between the object and the object detector can be determined by calculation on the basis of the measured time interval Dt between the emission of the near-infrared pulse and the reception of the reflected pulse. Then in step ST274, a window is set in an image formed by the two-dimensional photodetector array so as to contain an image of the object ($I_{min}<i<I_{max}$, $J_{min}<j<J_{max}$) on the basis of the x-coordinate, the distance and the position of the object detector. Then in step ST275, the x-direction gate signals of the x-direction circuit 5 for $I_{min}$ to $I_{max}$ are set in an ON state and the rest are kept in an OFF state.

Then in step ST276, the j-th line corresponding to the $J_{min}$-th line of the window is selected. In step ST277, control voltages $V_j$ to be applied to the photodetectors on the j-th line of the two-dimensional photodetector array are set to +5, control voltages $V_j$ to be applied to the photodetectors on the j+1-th line are set to −5 and the rest are set to zero. In this state, the x-direction output signal represents the difference in the illuminance of the incident visible radiation on the plane of incidence between the j-th line and the j+1-th line.

Then in step ST278, a query is made to see if j is greater than $j_{max}$−1 and, if the response in step ST278 is negative, j is incremented by one in step ST279. Then, step ST277 is executed again. Thus, steps ST276 through ST279 are repeated to obtain a vertical outline of a partial image including that of the object can be obtained for each line.

Figure 105:
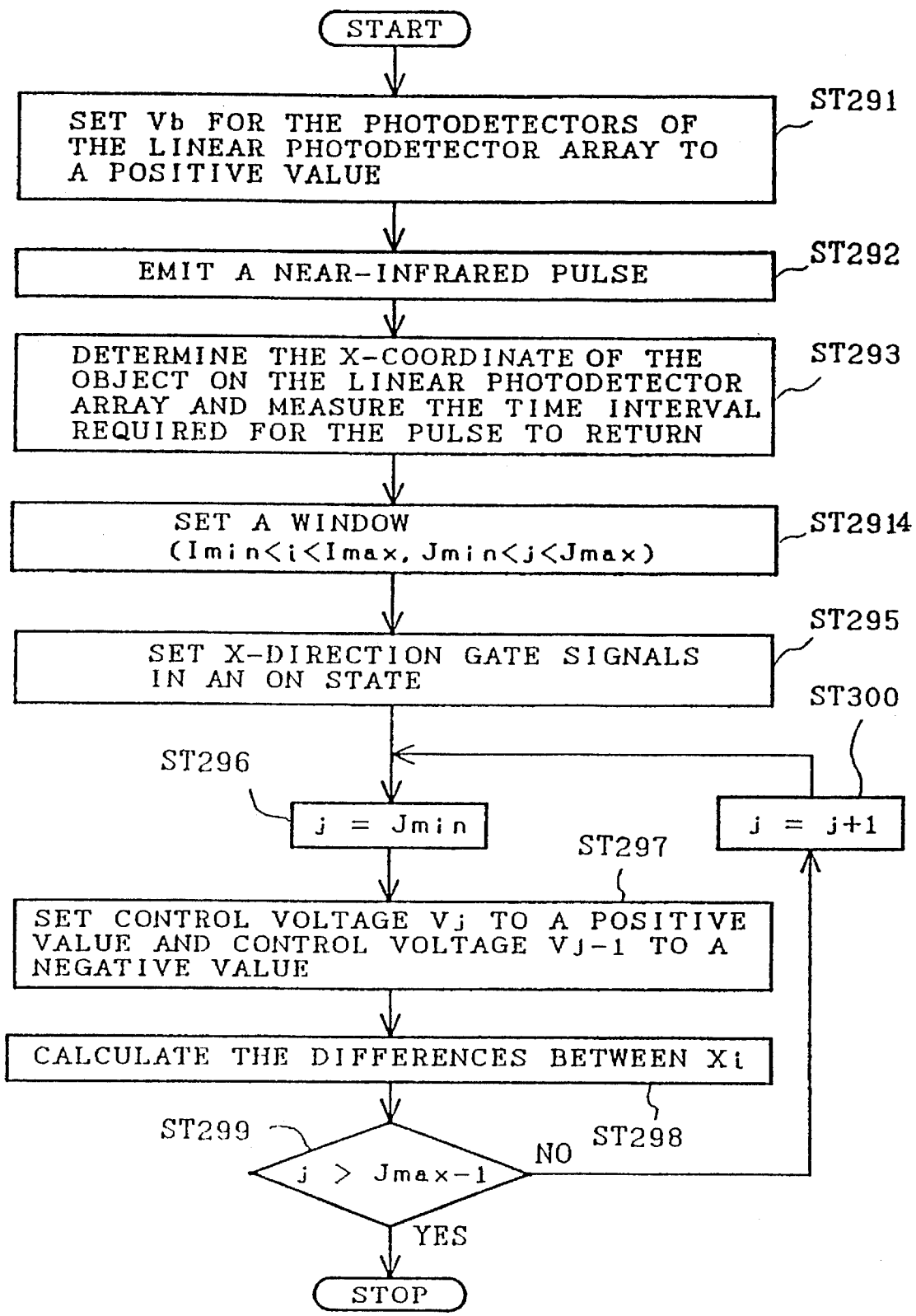
FIG. 105 is a flow chart of a third object detecting procedure to be carried out by the object detector of FIG. 98.

Another object detector provided with an x-direction arithmetic circuit 28 connected to the x-direction circuit 5 in addition to the components of the object detector of FIG. 98 will be described hereinafter. The x-direction arithmetic circuit 28 performs arithmetical operation, such as additions and subtractions, on the plurality of output signals of the x-direction circuit 5. FIG. 105 is a flow chart of an object detecting procedure to be carried out by this object detector.

Referring to FIG. 105, a bias voltage is applied to the photodetectors of the linear photodetector array in step ST291, the light-emitting unit 1 emits a near-infrared pulse in step ST292, and then the linear photodetector array receives the reflected light reflected from an object in step ST293. The x-coordinate of the object can be roughly estimated through the detection of the L-direction terminals 49 through which photocurrents flow. The distance between the object and the object detector can be determined by calculation on the basis of the measured time interval Dt between the emission of the near infrared pulse and the reception of the reflected pulse.

Then in step ST294, a window is set in an image formed by the two-dimensional photodetector array so as to contain an image of the object ($I_{min} < i < I_{max}$, $J_{min} < j < J_{max}$) on the basis of the x-coordinate, the distance and the position of the object detector. Then in step ST295, the x-direction gate signals of the x-direction circuit 5 for $I_{min}$ to $I_{max}$ are set in an ON state and the rest are kept in an OFF state. Then in step ST296, the j-th line corresponding to the $J_{min}$-th line in the set window is selected (j=$J_{min}$).

Then in step ST297, control voltages $V_j$ to be applied to the photodetectors on the j-th line of the two dimensional photodetector array are set to +5, control voltages $V_{j+1}$ to be applied to the photodetectors on the j+1-th line of the two-dimensional photodetector array are set to −5, and the rest are set to zero. Then, the x-direction output signal represents the difference in the illuminance of incident light on the plane of incidence between the j-th line and the j+1-th line when the two-dimensional photodetector array receives the reflected visible radiation.

Then in step ST298, the x-direction arithmetic circuit calculates the differences between the adjacent x-direction output signals. Then in step ST299, a query is made to see if j=$J_{max}$ and, if the response in step ST299 is negative, j is incremented by one in step ST300, and then steps ST297 and ST298 are executed again. Thus, the steps ST297 and ST298 are repeated to determine the vertical outline of a partial image including the image of the object for each line.

Similarly, only the control voltages $V_j$ are set to +5 and the x-direction arithmetic circuit calculates the differences between the adjacent signals with respect to the horizontal direction to determine the horizontal lines of a partial image.

While the operation of the object detector shown in FIGS. 97 to 103 for determining the outlines has been described, the object detector is able to perform various image processing operations by using various combinations of the control voltages. An object detecting procedure employing spatial Fourier transformation will be described hereinafter with reference to FIG. 106.

Figure 106:
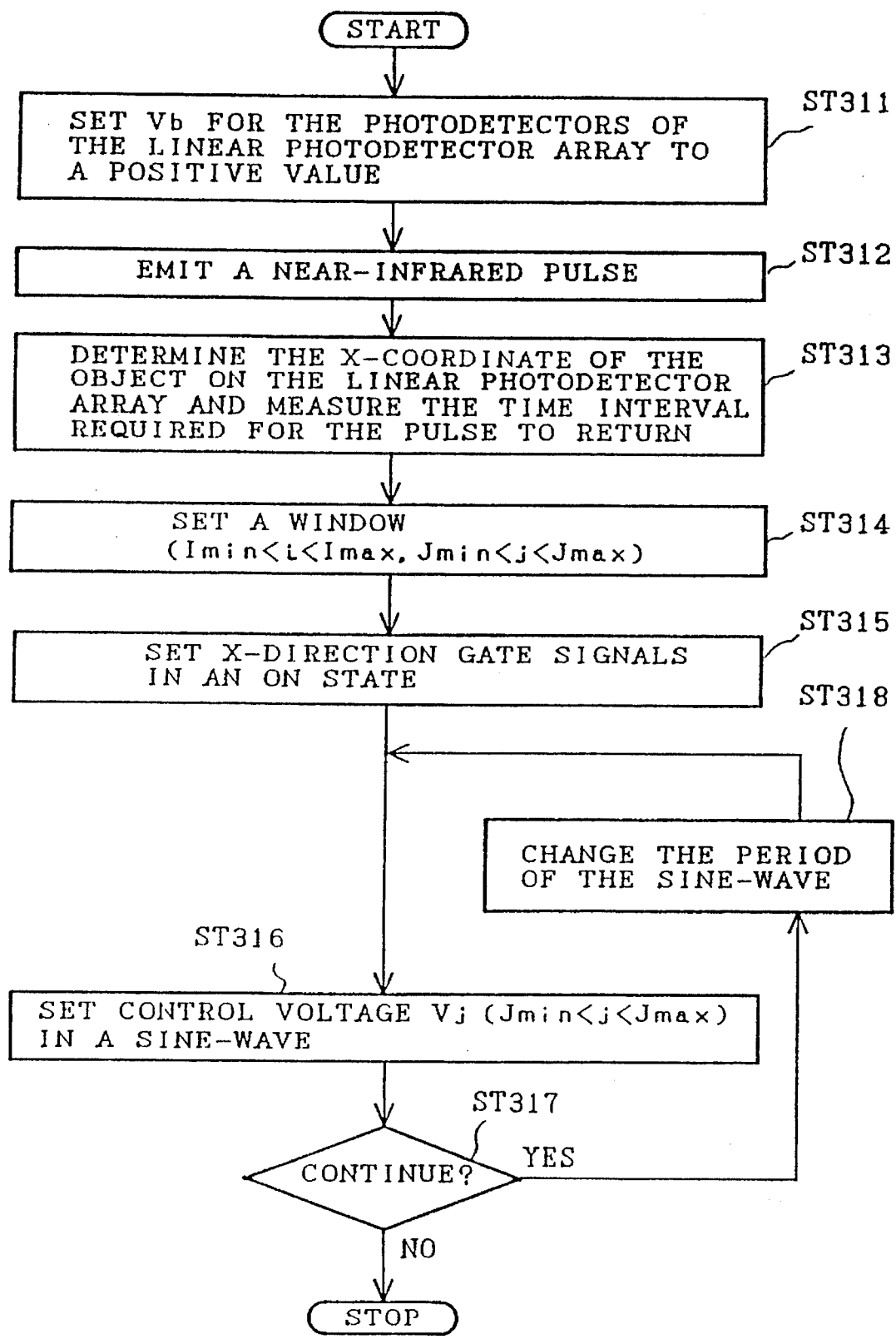
FIG. 106 is a flow chart of a fourth object detecting procedure to be carried out by the object detector of FIG. 98.

Referring to FIG. 106, a bias voltage is applied to the photodetectors of the linear photodetector array in step ST311, and the light-emitting unit 1 emits a near-infrared pulse in step ST312.

Then in step ST313 the linear photodetector array of the light-receiving unit 3 receives the reflected light reflected from an object. The x-coordinate of the object can be roughly estimated through the detection of the L-terminals 49 through which photocurrents flow. The distance between the object and the object detector can be determined by calculation on the basis of the measured time interval Dt between the emission of a pulse and the reception of the reflected pulse.

Then in step ST314, a window is formed in an image formed by the two-dimensional photodetector array so as to contain an image of the object ($I_{min} < i < I_{max}$, $J_{min} < j < J_{max}$) on the basis of the x-coordinate, the distance and the position of the object detector. Then in step ST315, the x-direction gate signals of the x-direction circuit 5 for $I_{min}$ to $I_{max}$ are set in an ON state and the rest are kept in an OFF state.

Then in step ST316, a sine-wave control voltages $V_j$ ($J_{min} < j < J_{max}$) is applied to the photodetectors of the two-dimensional photodetector array. In this state, the x-direction output signal represents the magnitude of a set spatial frequency component. Then in step ST317, a query is made to see if the procedure is to be continued and, if the response in step ST317 is affirmative, the frequency of the sine-wave control voltage is changed in step ST318. Thus, the vertical Fourier transformation of a partial image is executed for each line.

The object detecting procedure may employ an orthogonal transformation other than Fourier transformation, such as Walsh transformation.

Figure 107:
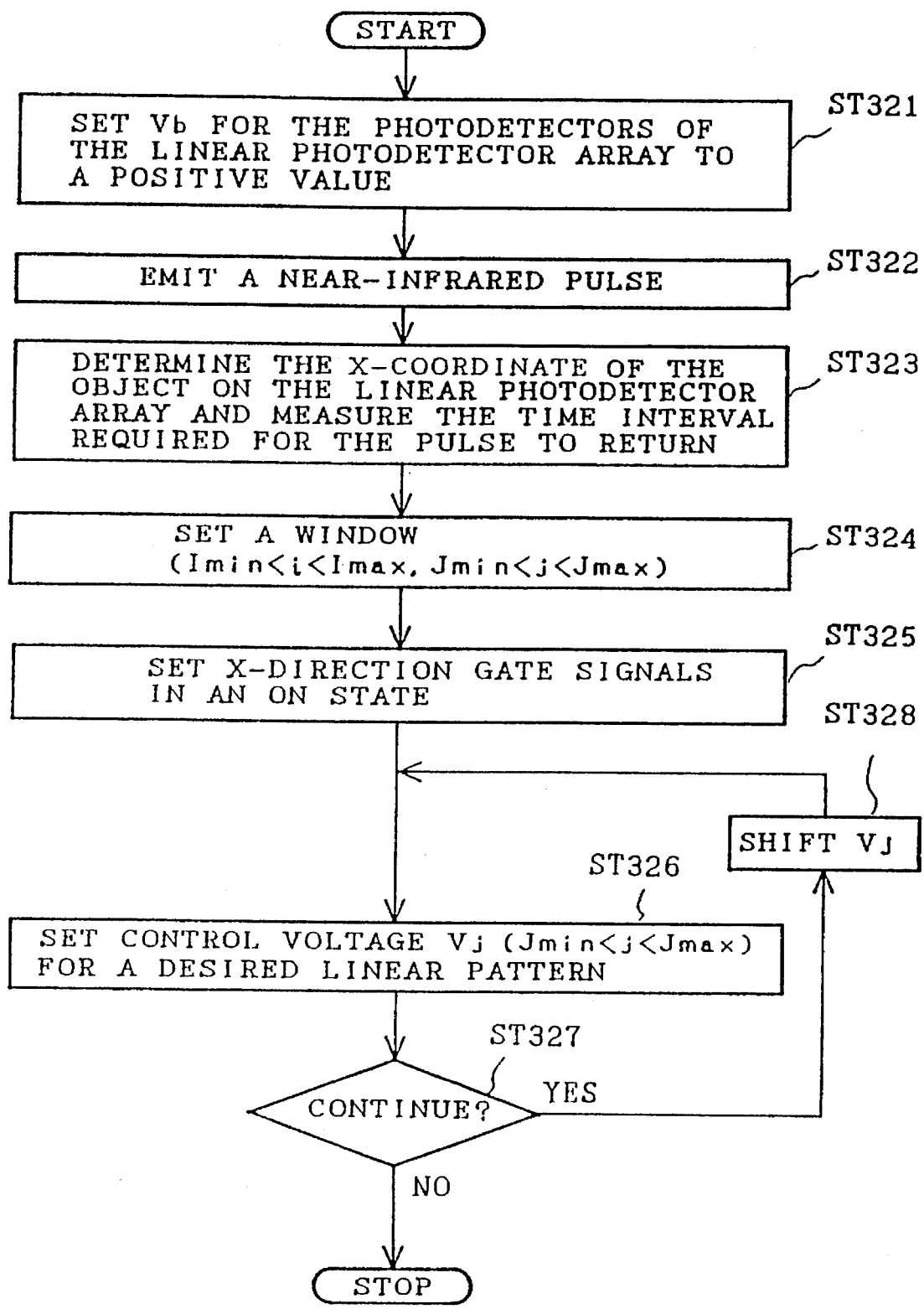
FIG. 107 is a flow chart of a fifth object detecting procedure to be carried out by the object detector of FIG. 98.

FIG. 107 shows another object detecting procedure in a preferred embodiment according to the present invention to be carried out by the object detector of FIG. 98. This object detecting procedure performs pattern matching to find out a specified pattern in a set window. Referring to FIG. 107, a bias voltage is applied to the photodetectors of the linear photodetector array in step ST321, and then the light-emitting unit 1 emits a near-infrared pulse in step ST322.

Then, the linear photodetector array of the photodetector unit 3 receives the reflected light reflected from an object in step ST323. The x-direction coordinate of the object can be roughly estimated through the detection of the L-terminals 49 through which photocurrents flow. The distance between the object and the object detector can be determined by calculation on the basis of the measured time interval Dt between the emission of a pulse and the reception of the reflected pulse.

Then in step ST324 a window is set in an image formed by the two-dimensional photodetector array so as to contain an image of the object ($I_{min} < i < I_{max}$, $J_{min} < j < J_{max}$) on the basis of the x-coordinate, the distance and the position of the object detector. Then in step ST325, the x-direction gate signals of the x-direction circuit 5 for $I_{min}$ to $I_{max}$ are set in an ON state and the rest are kept in an OFF state.

Then in step ST326, control voltages $V_j$ ($J_{min} < j < J_{max}$) are applied to the photodetectors of the two-dimensional photodetector array corresponding to a desired pattern, and then the photodetector unit 3 receives the reflected visible radiation reflected from the object. In this state, the x-direction output signal is a correlation signal representing the correlation between the set pattern and the image. Then in step ST327, a query is made to see if the procedure is to be continued and, if the response in step ST327 is affirmative, the element of the control voltage vector is shifted in step ST328 and step ST326 is executed again. Thus, step ST326 is repeated to achieve pattern matching with a partial image for each line.

Figure 108:
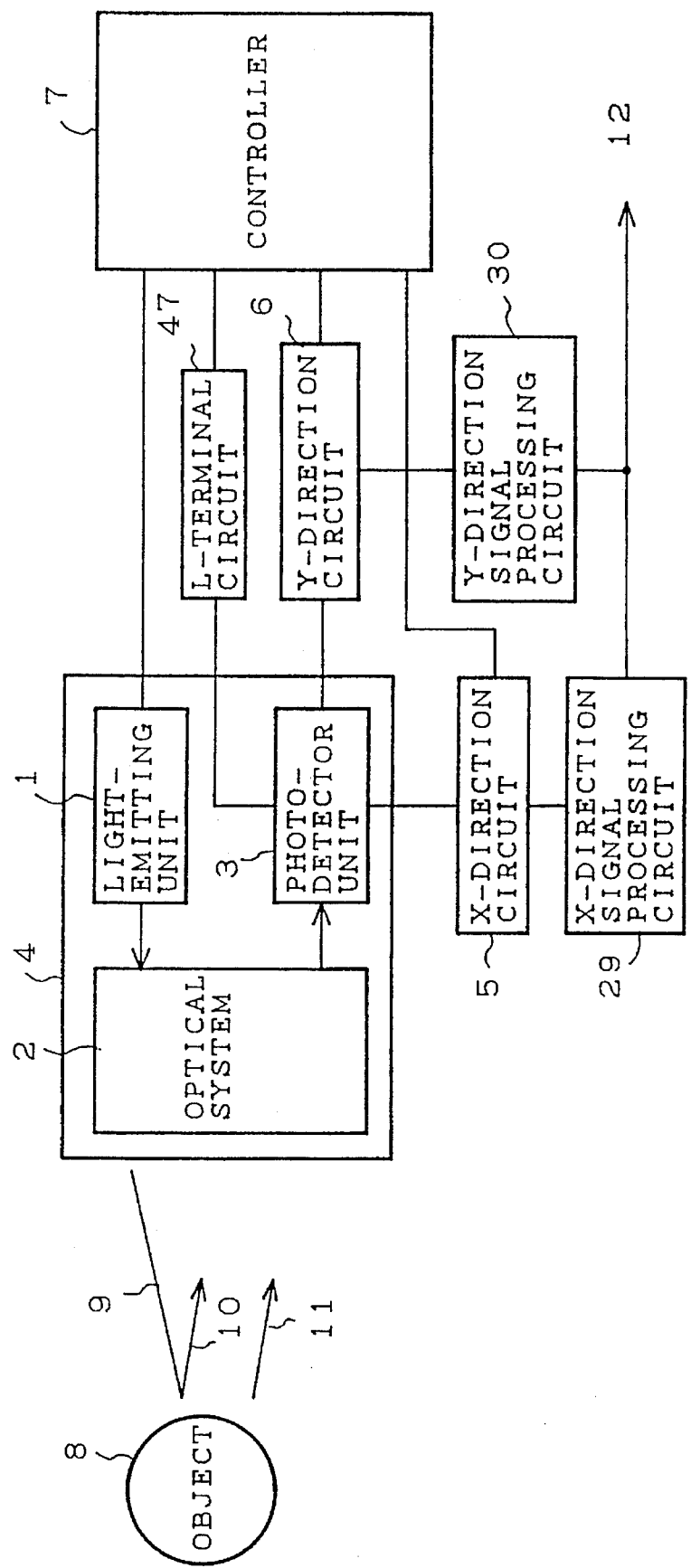
FIG. 108 is a block diagram of an object detector in a preferred embodiment according to the present invention.

FIG. 108 shows an object detector in a preferred embodiment according to the present invention. This object detector is provided, in addition to the components of the object detector of FIG. 98, an x-direction signal processing circuit 29 that receives the plurality of output signals of the x-direction circuit 5 and processes the signals in an analog processing mode, a digital processing mode or an analog-and-digital processing mode, and a y-direction signal processing circuit 30 that receives the plurality of output signals of the y-direction circuit 6 and processes the signals in an analog processing mode, a digital processing mode or an analog-and-digital processing mode.

Figure 109:
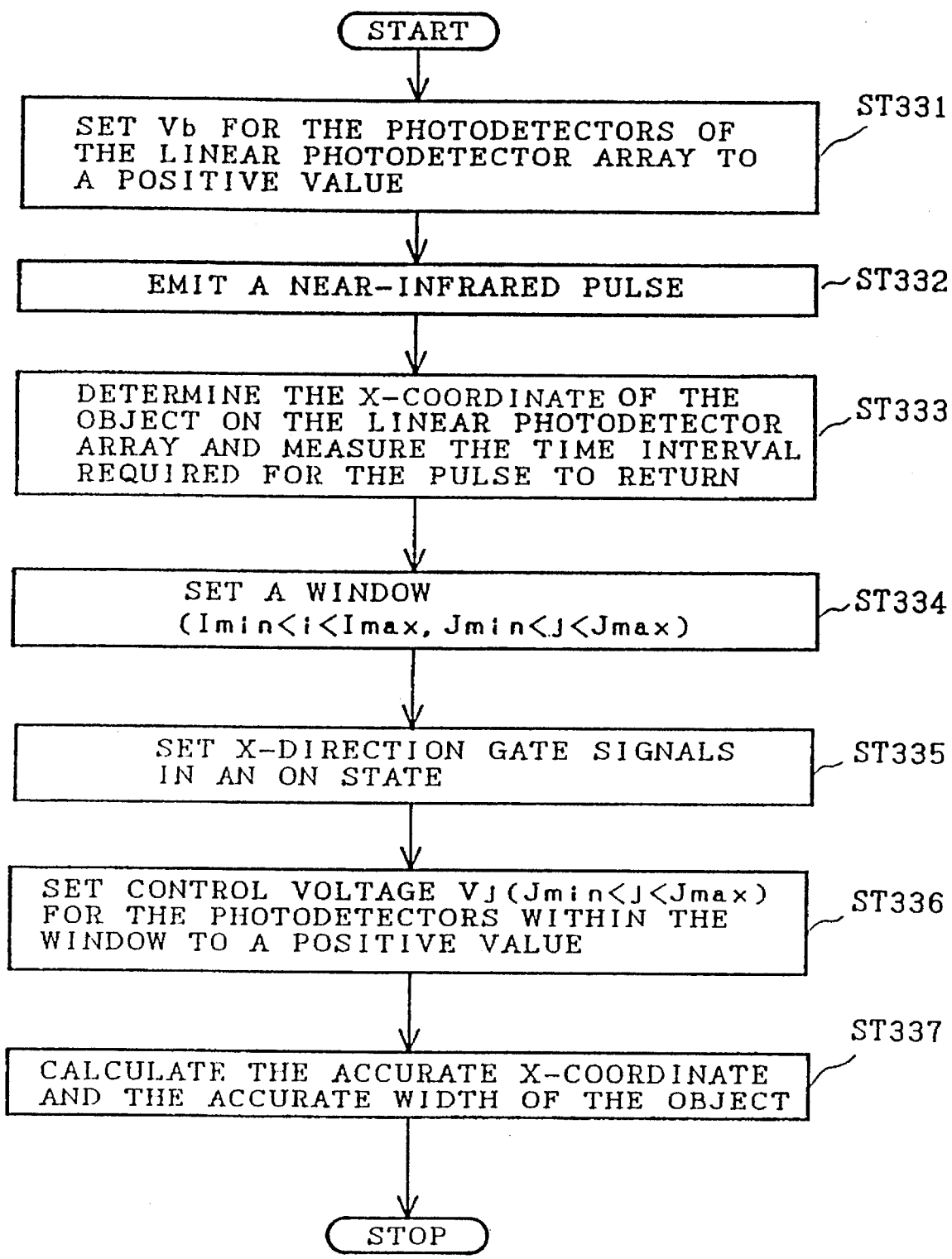
FIG. 109 is a flow chart of an object detecting procedure in a preferred embodiment according to the present invention.

FIG. 109 is a flow chart of an object detecting procedure to be carried out by the object detector of FIG. 108.

Referring to FIG. 109, a bias voltage is applied to the photodetectors of the linear photodetector array in step ST331, the light-emitting unit 1 emits a near-infrared pulse in step ST332, and then the linear photodetector array of the photodetector unit 3 receives the reflected light reflected from an object in step ST333. The x-coordinate of the object can be roughly estimated through the detection of the L-terminals 49 through which photocurrents flow. The distance between the object and the object detector can be determined by calculation on the basis of the measured time interval Dt between the emission of a pulse and the reception of the reflected pulse.

Then in step ST334, a window is set in an image formed by the two-dimensional photodetector array so as to contain an image of the object ($I_{min}<i<I_{max}$, $J_{min}<j<J_{max}$) on the basis of the x-coordinate, the distance and the position of the object detector. Then in step ST335, the x-direction gate signals of the x-direction circuit 5 for Imin to Imax are set in an ON state and the rest are kept in an OFF state.

Then in step ST336, control voltages $V_j$ ($J_{min}<j<J_{max}$) to be applied to the photodetectors of the two-dimensional photodetector array are set to +5, and then the two-dimensional photodetector array receives the reflected visible radiation reflected from the object. In this state, the x-direction output signal represents a vertical projection of the image within the window. If only few patterns other than that of the object are contained in the window, the x-direction output signal represents a projection of the image of the object.

Then in step ST337, the x-direction signal processing circuit 29 calculates the accurate x-coordinate and the width of the object on the basis of the x-direction projection signal.

Figure 110:
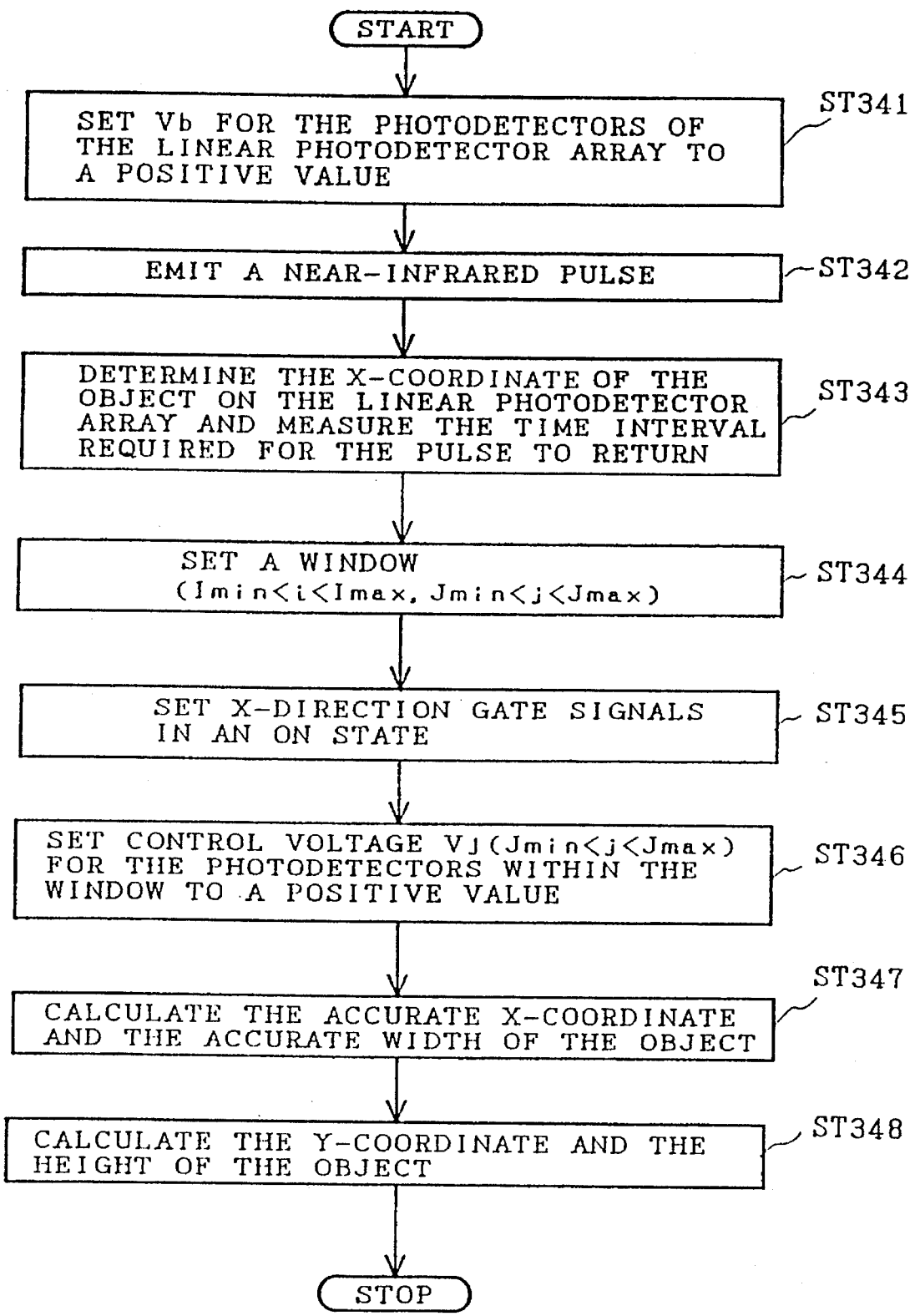
FIG. 110 is a flow chart of an object detecting procedure to be carried out by the object detector of FIG. 108.

While the object detecting procedure carried out by the object detector of FIG. 108 for determining the x-direction projection has been described, the object detector is able to carry out an object detecting procedure shown in FIG. 110 for determining both the x-direction and the y-direction projection.

Referring to FIG. 110, a bias voltage is applied to the photodetectors of the linear photodetector array in step ST341, the light-emitting unit 1 emits a near-infrared pulse, and then the linear photodetector array receives the reflected light reflected from an object. The x-coordinate of the object can be roughly estimated through the detection of the L-terminals 49 through which photocurrents flow. The distance between the object and the object detector can be determined by calculation on the basis of the measured time interval Dt between the emission of a pulse and the reception of the reflected pulse.

Then in step ST342 a window is set in an image formed by the two-dimensional photodetector array so as to contain an image of the object ($I_{min}<i<I_{max}$, $J_{min}<j<J_{max}$) on the basis of the x-coordinate, the distance and the position of the object detector. Then in step ST343, the x-direction gate signals of the x-direction circuit 5 for Imin to Imax are set in an ON state and the rest are kept in an OFF state.

Then in step ST346, control voltages $V_j$ ($J_{min}<j<J_{max}$) to be applied to the photodetectors of the two-dimensional photodetector array are set to +5. In this state, the x-direction output signal represents a vertical projection of the image within the window, and the y-direction output signal represents a horizontal projection of the image within the window. If only few patterns other than that of the object are contained in the window, the x-direction output signal and the y-direction output signal represent a projection of the image of the object.

Then the x-direction signal processing circuit 29 calculates the accurate x-coordinate and the width of the object on the basis of the x-direction projection signal in step ST347 and the y-direction signal processing circuit 30 calculates the y-coordinate and the height of the object on the basis of the y-direction projection signal. It is possible to infer roughly what the object is from the width and the height of the object. For example, objects can be classified by width W and height H into through groups respectively having the three shapes as shown in FIG. 63.

Figure 111:
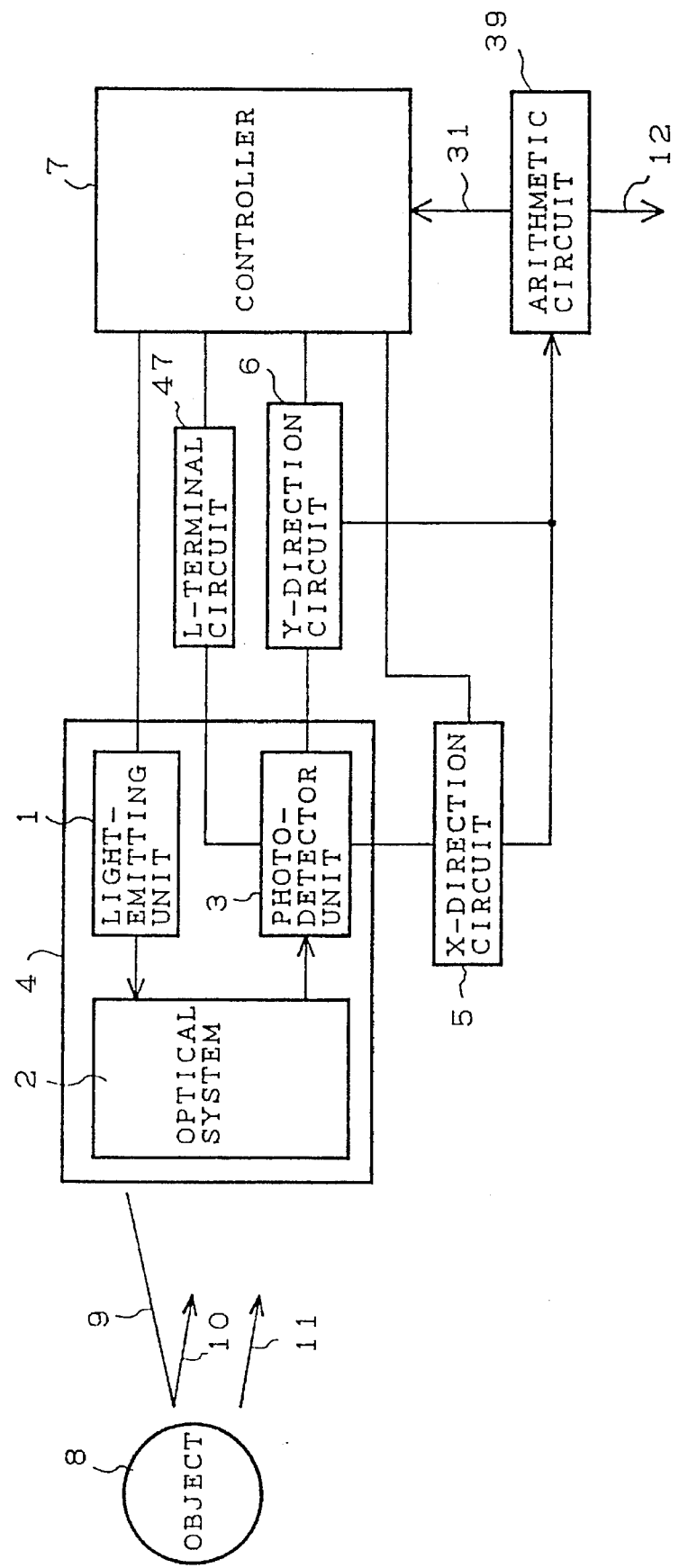
FIG. 111 is a block diagram of an object detector in a preferred embodiment according to the present invention.

FIG. 111 shows an object detector in a preferred embodiment according to the present invention. This object detector is provided with a photodetector unit 3 having a linear photodetector array comprising photodetectors having a fixed photoelectric conversion efficiency and a two-dimensional photodetector array comprising variable-sensitivity photodetectors, an x-direction circuit 5, a y-direction circuit 6, and an arithmetic circuit 39 which processes the output signals of the x-direction circuit 5 and the y-direction circuit 6 for predetermined arithmetical operations. The arithmetic circuit 39 serves as a set information feedback means that gives a feedback signal for setting a window to a control circuit 7. The arithmetic circuit 39 may be an analog circuit, a chip microcomputer, a processor or a computer.

Figure 112:
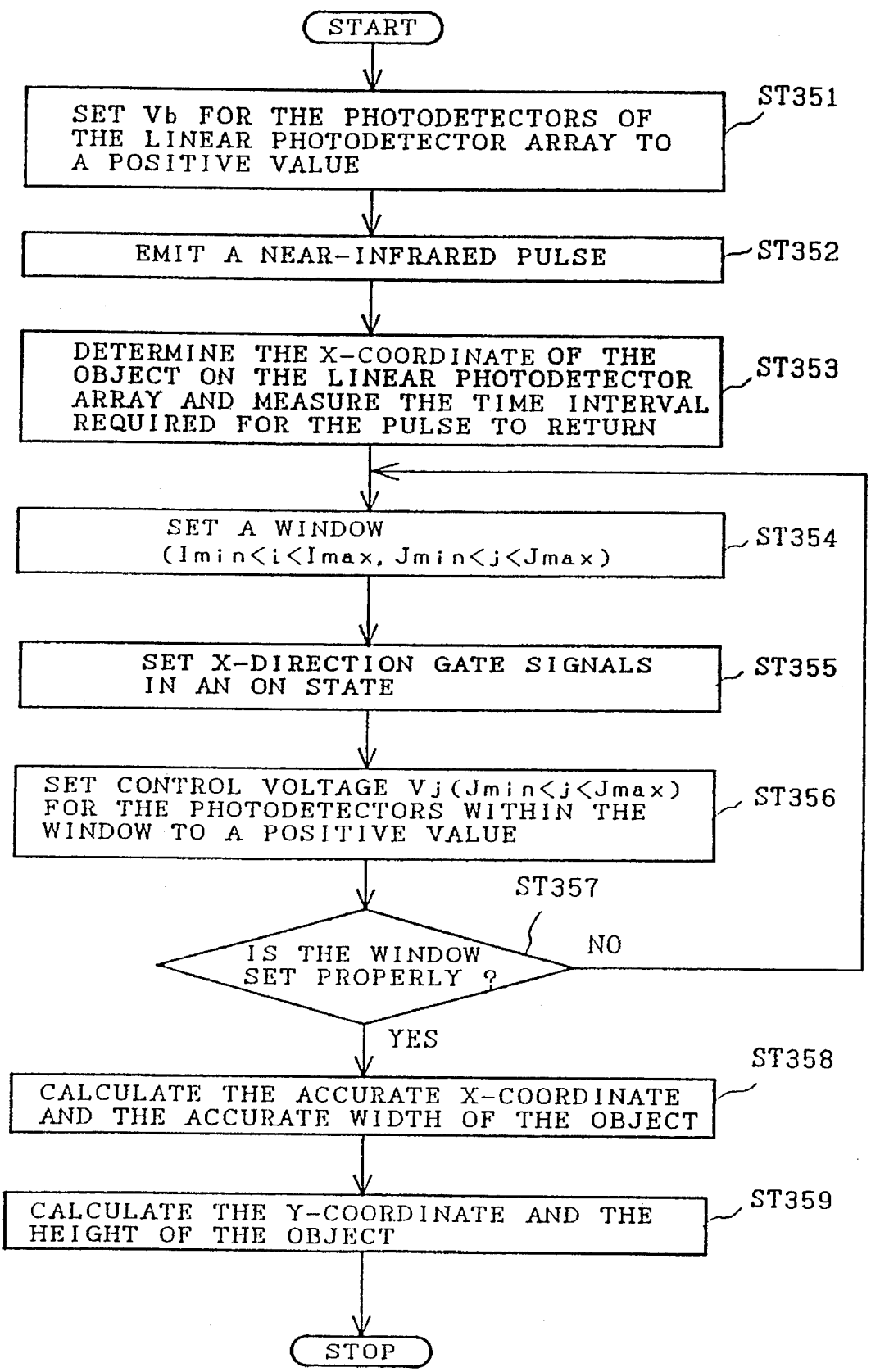
FIG. 112 is a flow chart of an object detecting procedure in a preferred embodiment according to the present invention.

FIG. 112 is a flow chart of an object detecting procedure to be carried out by the object detector of FIG. 111. Referring to FIG. 112, a bias voltage is applied to the photodetectors of the linear photodetector array in step ST351, the light-emitting unit 1 emits a near-infrared pulse in step ST352, and then the linear photodetector array receives the reflected near-infrared pulse reflected from an object in step ST353. The x-coordinate of the object can be roughly estimated through the detection of the L-terminals 49 of the L-terminal circuit 47 through which photocurrents flow. The distance between the object and the object detector can be determined by calculation on the basis of the measured time interval Dt between the emission of the pulse by the light-emitting unit and the reception of the reflected pulse by the linear photodetector array.

Then in step ST354, a window is set in an image formed by the two-dimensional photodetector array so as to contain an image of the object ($I_{min}<i<I_{max}$, $J_{min}<j<J_{max}$) on the basis of the x-coordinate, the distance and the position of the object detector. Then in step ST355, the x-direction gate signals of the x-direction circuit 5 for $I_{min}$ to $I_{max}$ are set in an ON state and the rest are kept in an OFF state.

Then in step ST356, control voltages $V_j$ ($J_{min}<j<J_{max}$) to be applied to the photodetectors of the two-dimensional photodetector array are set to +5, and then the two-dimensional photodetector array receives the reflected visible radiation reflected from the object. In this state, the x-direction output signal represents a vertical projection of the image within the window. Then in step ST357, the arithmetic circuit 39 receives the x-direction output signal and gives a feedback signal 31 to the control circuit 7, and then a query is made to see if the window is set properly. If the response in step ST357 is negative, a window is set again in step ST354.

After a window has been properly set, the accurate x-coordinate and the width of the object are calculated in step ST358. Similarly, the accurate y-coordinate and the height of the object are calculated in step ST359.

The feedback operation of the object detector enhances the reliability of object detection.

Figure 113:
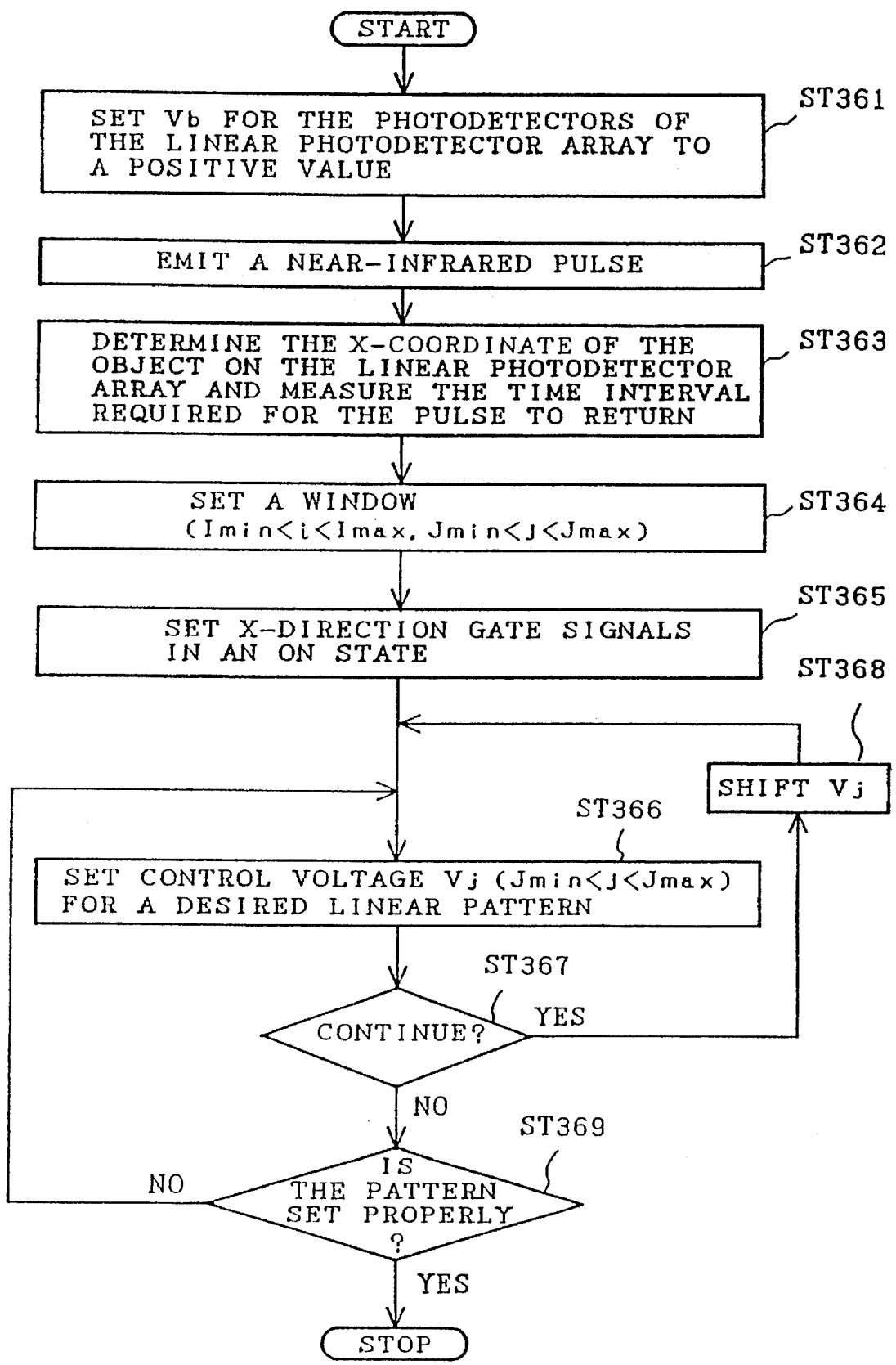
FIG. 113 is a flow chart of an object detecting procedure to be carried out by the object detector of FIG. 111.

FIG. 113 is another object detecting procedure in a preferred embodiment according to the present invention to be carried out by the object detector of FIG. 111. While the object detecting procedure of FIG. 112 changes the window on the basis of the feedback signal 31, this object detecting procedure does not change the window and changes the manner of processing a partial image for pattern matching.

Referring to FIG. 113, a bias voltage is applied to the photodetectors of the linear photodetector array in step ST361, the light-emitting unit 1 emits a near-infrared pulse in step ST362, and then the linear photodetector array receives the reflected light reflected from an object in step ST363. In this state, the x-coordinate of the object can be roughly estimated through the detection of the L-terminals 49 of the L-terminal circuit 47 through which photocurrents flow. The distance between the object and the object detector can be determined by calculation on the basis of the measured time interval Dt between the emission of a pulse by the light-emitting unit 1 and the reception of the reflected pulse by the linear photodetector array.

Then in step ST364, a window is set in an image formed by the two-dimensional photodetector array so as to contain an image of the object ($I_{min} < i < I_{max}$, $J_{min} < j < J_{max}$) on the basis of the x-coordinate, the distance and the position of the object detector. Then in step ST365, the x-direction gate signals of the x-direction circuit 5 for $I_{min}$ to $I_{max}$ are set in an ON state and the rest are kept in an OFF state.

Then in step ST366, control voltages $V_j$ ($J_{min} < j < J_{max}$) are applied to the photodetectors of the two-dimensional photodetector array in a desired pattern, and then the two-dimensional photodetector array receives the reflected visible radiation reflected from the object. In this state, the x-direction output signal is a correlation signal representing the correlation between the desired pattern and the image. Then in step ST367 a query is made to see if the procedure is to be continued and, if the response in step ST367 is affirmative, the element of the control voltage vector is shifted in step ST368, and then step ST366 is executed again. Thus, step ST366 is repeated for pattern matching with a partial image for each line. Then, in step ST369, a query is made to see if the pattern is set properly and, if the response in step ST369 is negative, step ST366 is executed again. Then, steps ST367 and ST368 are repeated for appropriate pattern matching.

Figure 114:
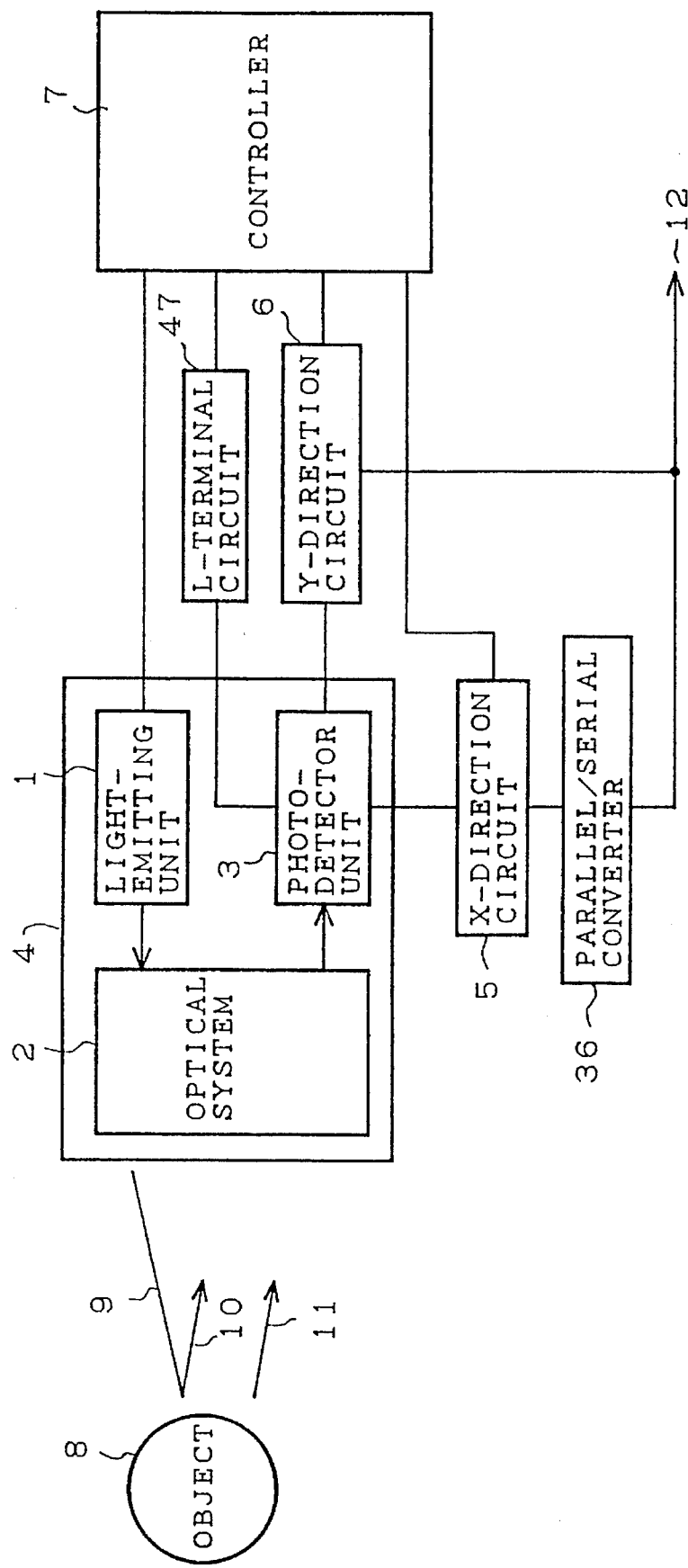
FIG. 114 is a block diagram of an object detector in a preferred embodiment according to the present invention.

FIG. 114 shows an object detector in a preferred embodiment according to the present invention provided with a parallel/serial converter (signal converting means) 36 in addition to the components of the object detector of FIG. 111. The parallel/serial converter 36 converts the parallel output signals of the x-direction circuit 5 into serial signals and may be a circuit comprising capacitors for temporarily holding analog signals and switches which are turned on sequentially to send out the analog signals sequentially or a circuit comprising an A/D converter for converting analog signals into digital signals and a digital shift register.

The object detector may be provided with the circuit of FIG. 68 as the x-direction circuit 5. The parallel/serial switches 37 are turned on sequentially to convert the parallel output signals of the two-dimensional photodetector array into serial signals. This object detector needs only a single x-direction circuit 5 for a plurality of input signals and hence can be formed in a compact configuration.

Figure 115A:
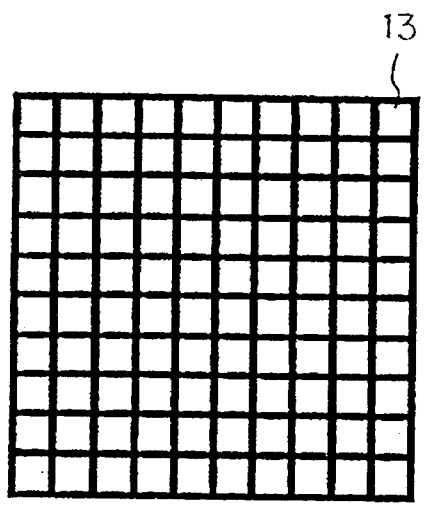
FIGS. 115(a) and 115(b) are diagrammatic views of assistance in explaining an object detecting procedure in a preferred embodiment according to the present invention.
Figure 115B:
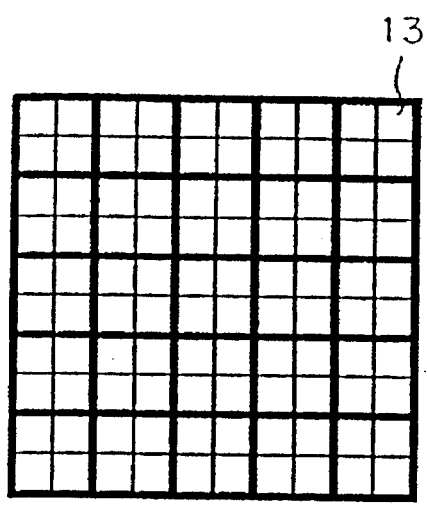

FIGS. 115(a) and 115(b) are schematic views of a two-dimensional photodetector array of assistance in explaining an object detecting procedure to be carried out by any one of the foregoing object detectors embodying the present invention. This object detecting procedure employs a two-dimensional access method by which image data is read from the two-dimensional photodetector array. The two-dimensional access method reads pixel signals provided by the photodetectors on lines and rows in a desired combination of the two-dimensional photodetector array. The two-dimensional access method reads pixel signals from, for example, all the photodetectors as shown in FIG. 115(a) or reads pixel signals from groups each of four photodetectors as shown in FIG. 115(b). Access to the groups of photodetectors reduces the number of access cycles, which reduces the signal processing time.

Figure 116:
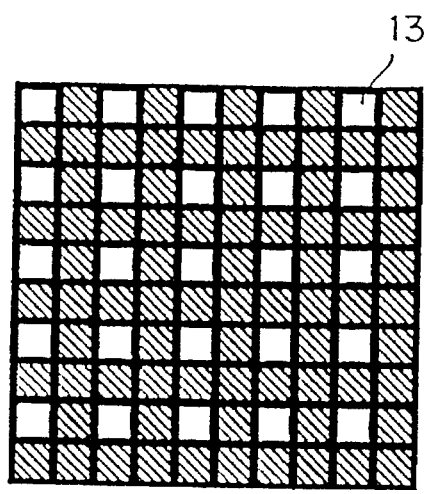
FIG. 116 is a diagrammatic view of assistance in explaining an object detecting procedure in a preferred embodiment according to the present invention.
Figure 117:
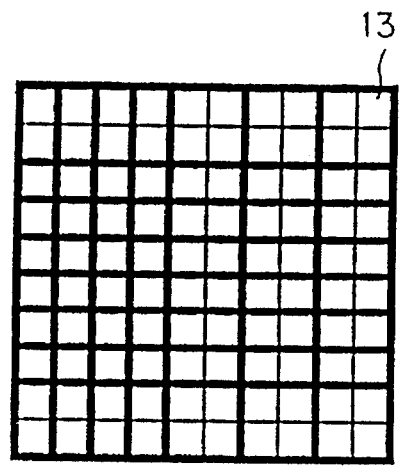
FIG. 117 is a diagrammatic view of assistance in explaining an object detecting procedure in a preferred embodiment according to the present invention.

It is also possible to read pixel signals from every other photodetectors on every other line as shown in FIG. 116 or to group different numbers of the photodetectors for different regions as shown in FIG. 117 for more efficient reading.

The foregoing object detectors embodying the present invention may be provided with the two-dimensional photodetector array in which photodetectors having different shapes or different sizes arranged as shown in FIG. 23 so that the photodetectors are arranged in a high density in regions requiring accurate processing and the same are arranged in a low density in regions not requiring accurate processing to achieve effective object detection in a short time. It is also effective to arrange photodetectors having the same shape in an irregular distribution as shown in FIG. 24.

Figure 118:
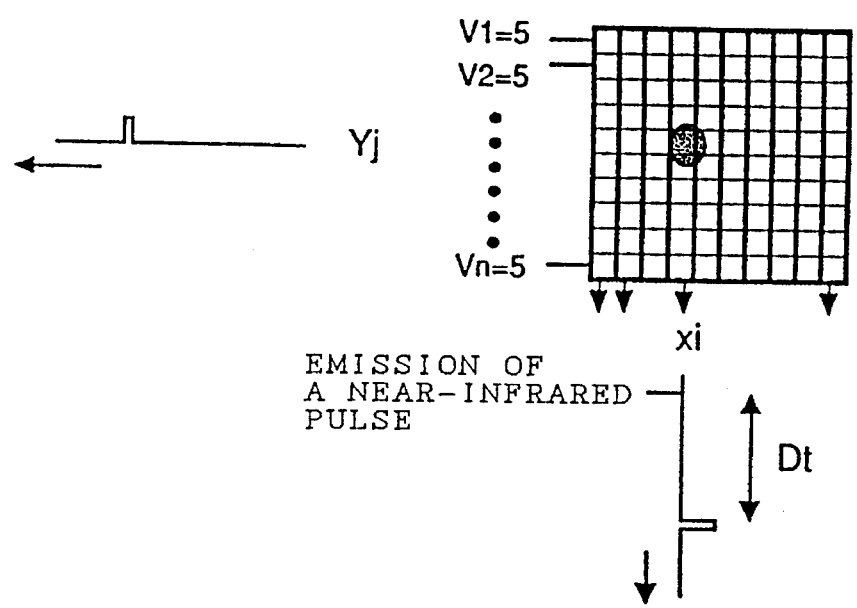
FIG. 118 is a diagrammatic view of assistance in explaining a window setting procedure to be carried out by the object detector of FIG. 114.

FIG. 118 is a view of assistance in explaining a window setting method. This window setting method sets all control voltages to be applied to photodetectors to +5, A light-emitting unit 1 emits a near-infrared pulse toward an object, and then a two-dimensional photodetector array receives the reflected light reflected from the object to determine the approximate position of the object through the observation of photocurrents that flow through x-direction terminals and y-direction terminals. A window for the subsequent processing can be set on the basis of the information.

Figure 119:
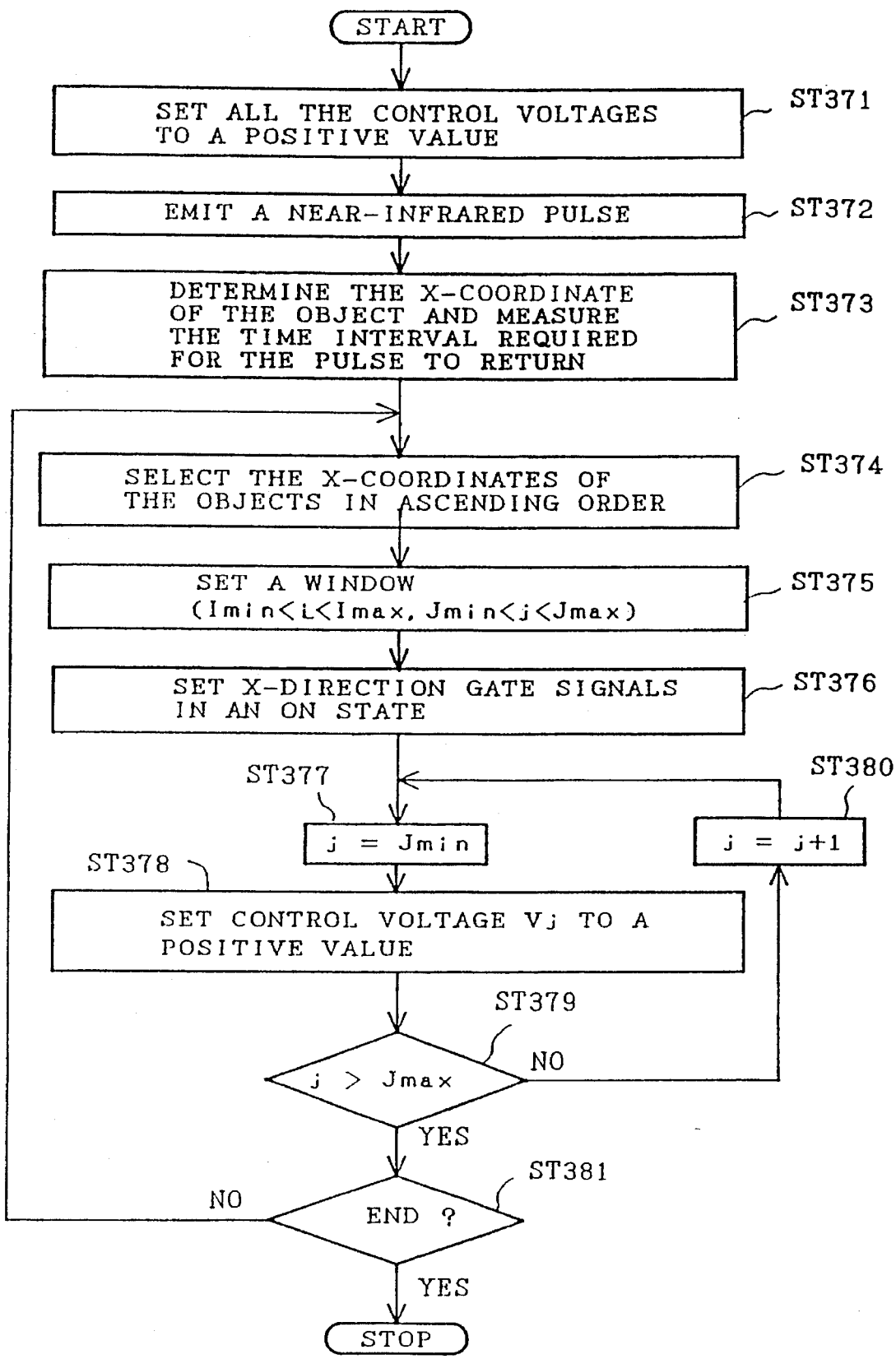
FIG. 119 is a flow chart of an object detecting procedure in a preferred embodiment according to the present invention.

FIG. 119 is a flow chart of an object detecting procedure in a preferred embodiment according to the present invention to be applied to detecting a plurality of objects. while this object detecting procedure can be carried out any one of the foregoing object detectors and the methods, the object detecting procedure will be described as applied to the object detector of FIG. 39.

Referring to FIG. 119, control voltages Vj to be applied to the photodetectors are set to +5 in step ST371. In this state, the photosensitivities of all the photodetectors are set to "5" (all the x-direction gates are set in an ON state). Then in step ST372 the light-emitting unit 1 emits a near-infrared pulse.

In step ST373, the photodetector unit 3 receives the reflected pulses reflected from objects. The x-coordinates of the objects can be roughly estimated through the detection of the x-direction terminals through which photocurrents flow. The distances between the objects and the object detector can be determined by calculation on the basis of the measured time interval Dt between the emission of a pulse and the reception of the reflected pulses.

Then in step ST374, objects are selected in ascending order of x-coordinates. Then in step ST375 a window is set in an image formed by the photodetector unit 3 so as to contain images of the objects ($I_{min} < i < I_{max}$, $J_{min} < j < J_{max}$) on the basis of the x-coordinates, the distances and the position of the object detector. Then in step ST376, the x-direction gate signals for Imin to Imax are set in an ON state and the rest are kept in an OFF state.

Then, the j-th line corresponding to $J_{min}$ is selected in step ST377. In step ST378 control voltages $V_j$ to be applied to the photodetectors on the j-th line are set to +5 and the rest are set to zero. In this state, only the photodetectors on the j-th line are photosensitive. An image on the j-th line within the window can be obtained through the observation of the x-direction dc output signals of the x-direction circuit 5 generated by the photodetectors that received the reflected visible radiation reflected from the objects (FIGS. 115(a) and 115(b)).

Then in step ST379, a query is made to see if $j=J_{max}$ and, if the response in step ST379 is negative, j is incremented by one in step ST380, and then step ST378 is executed again. Thus, step ST378 is repeated to obtain the image data of a selected object for each line.

Then in step ST381, a query is made to see if the procedure is to be terminated and, if the response in step ST381 is negative, the procedure returns to step ST374 to select the next object, the subsequent steps are executed, j is incremented by one at a time and step ST380 is repeated to obtain image data of the next object. The foregoing steps are executed for all the objects sequentially selected in ascending order of the x-coordinates to obtain image data of all the objects.

Figure 120:
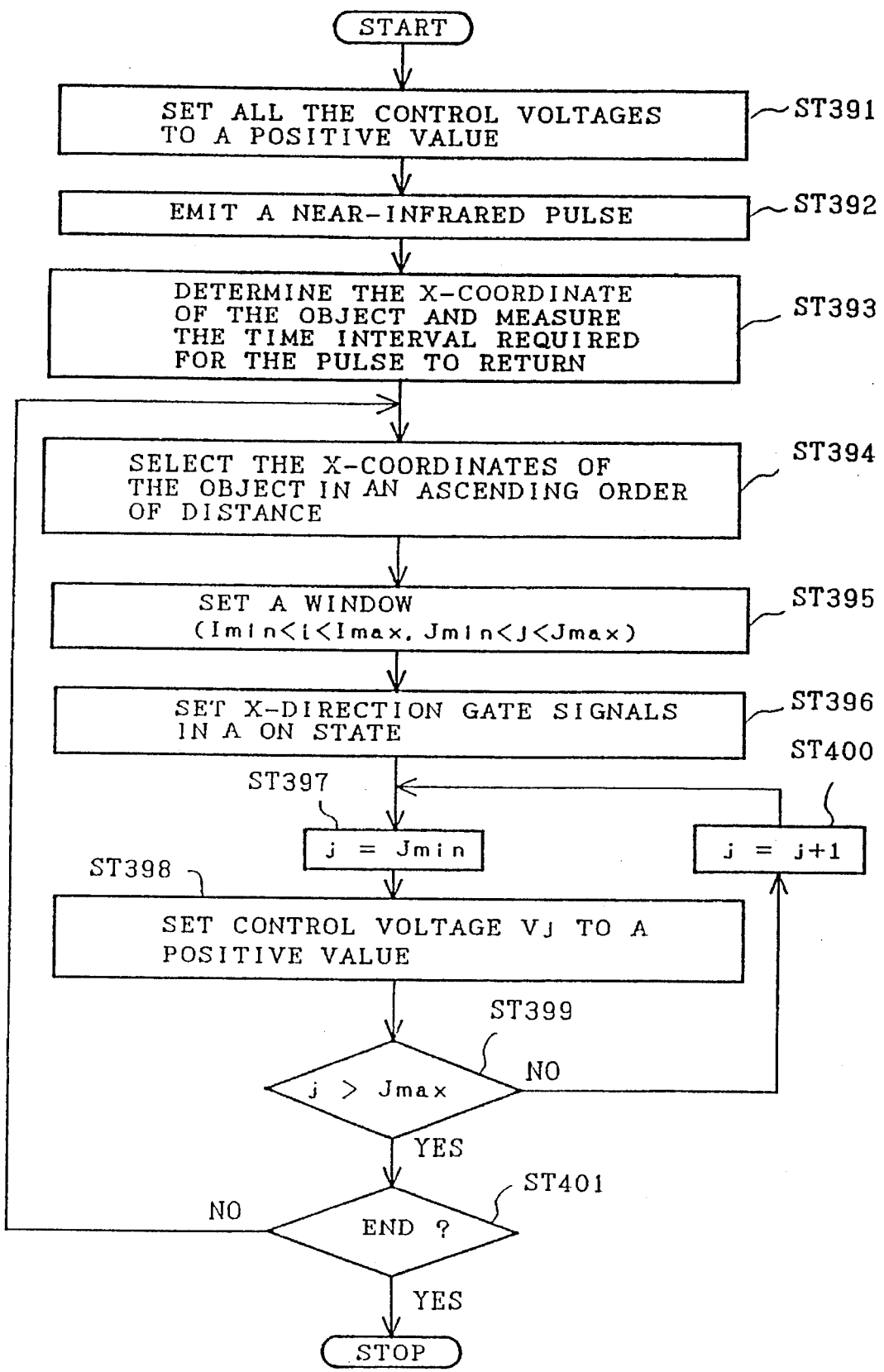

Thus, the respective distances of the plurality of objects from the object detector, and the respective positions and the image data of the plurality of objects are obtained. FIG. 120 is a flow chart of an object detecting procedure in a preferred embodiment according to the present invention, which, similarly to the object detecting procedure of FIG. 119, is applied to detecting a plurality of objects. While this object detecting procedure can be carried out by any one of the foregoing object detectors and the method, it is supposed herein that the object detecting procedure is carried out by the object detector of FIG. 114.

Referring to FIG. 120, control voltages Vj to be applied to the photodetectors are set to +5 in step ST391. In this state the photosensitivities of all the photodetectors are set to "5" (all the x-direction gates are set in an ON state), and then the light emitting unit 1 emits a near-infrared pulse in step ST392.

Then, the photodetector unit receives the reflected light reflected from an object. The x-coordinate of the object can be roughly estimated through the detection of the x-direction terminals through which photoelectric currents flow. The distance between the object and the object detector can be determined by calculation on the basis of the measured time interval Dt between the emission of a pulse and the reception of the reflected pulse.

In step ST394, the nearest object is selected. The objects are selected sequentially one at a time in ascending order of the distances from the object detector. In step ST395, a window is formed in an image formed by the photodetector unit so as to contain an image of the object ($I_{min} < i < I_{max}$, $J_{min} < j < J_{max}$) on the basis of the x-coordinate, the distance and the position of the object detector. Then in step ST396 x-direction gate signals for Imin to Imax are set in an ON state and the rest are kept in an OFF state.

The j-th line corresponding to the $J_{min}$-th line is selected in step ST397, and then control voltages $V_j$ to be applied to the photodetectors on the j-th line are set to +5 and the rest are set to zero in step ST398. In this state, only the photodetectors on the j-th line are photosensitive. an image on the j-th line within a window is formed through the detection of the x-direction dc output signals of the x-direction circuit corresponding to the reflected visible radiation from the object, i.e., image data of the object.

Then in step ST399, a query is made to see if $j=J_{max}$ and, if the response in step ST399 is negative, j is incremented by one in step ST400, and then step ST398 is executed. Thus, j is incremented successively by one at a time and step ST398 is repeated to obtain image data of the selected object on each line.

Then in step ST401, a query is made to see if the procedure is to be terminated and, if the response in step ST401 is negative, the procedure returns to step ST394 and step ST394 and the following steps are executed for the next object. Thus, steps ST395 through ST 400 are repeated for all the objects at distances shorter than a predetermined distance from the object detector to obtain image data. Thus, the distances from the object detector, the positions and the image data of the objects are obtained are determined in ascending order of distances. Naturally, the objects may be selected by an optional criterion.

Figure 121:
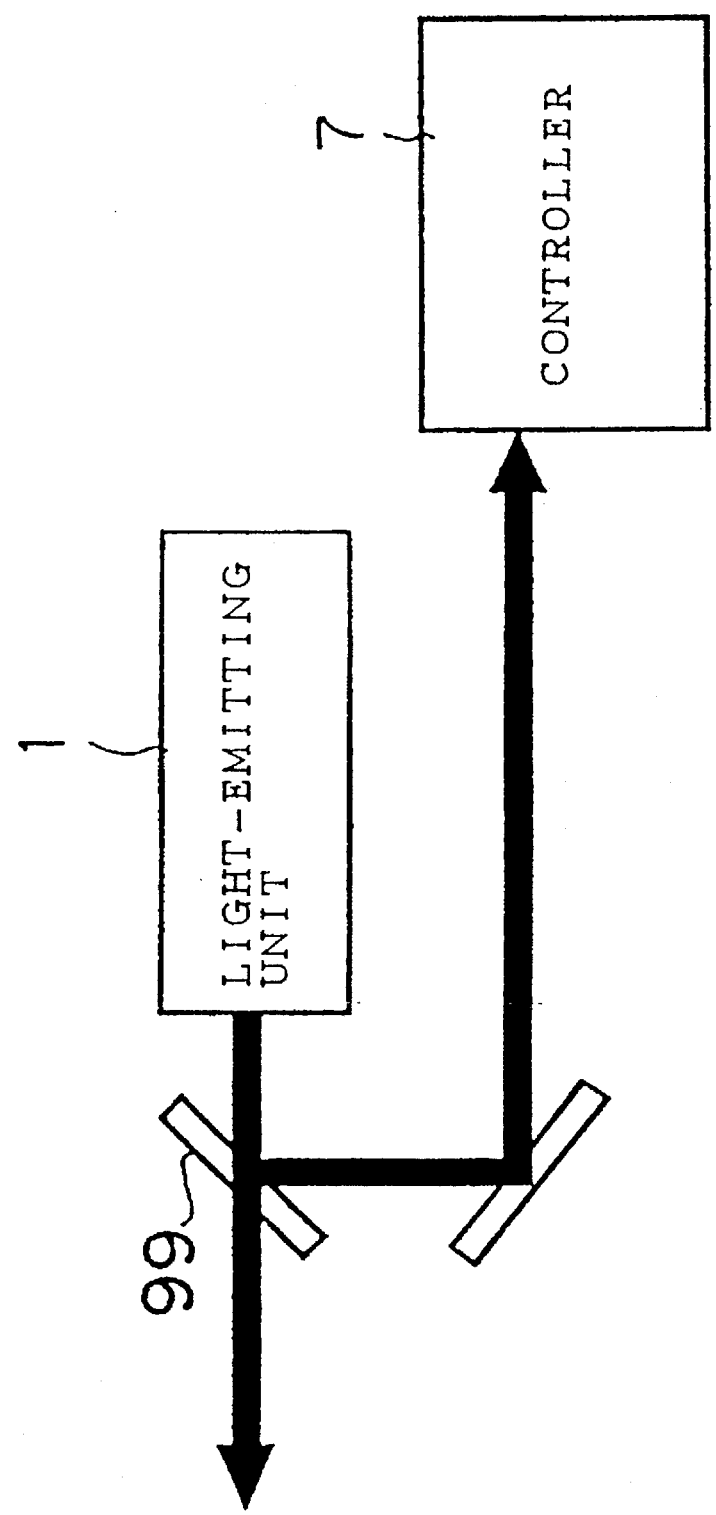

FIG. 121 shows an essential part of an object detector in a preferred embodiment according to the present invention. In this object detector, part of a near-infrared pulse emitted by a light-emitting unit 1 is reflected by a beam splitter 99 toward a control circuit 7. The time interval between the emission of a pulse and the reception of the reflected pulse reflected from an object must be measured to determine the distance between the object and the object detector. Since this object detector is able to measure accurately time when a pulse is emitted, the distance between the object and the object detector can be accurately determined. Part of the near-infrared pulse may be transmitted to the control unit 7 through air, optical fibers or or an optical waveguide. When a laser is employed as the light-emitting unit 1, light beams can be emitted respectively through the opposite ends of the resonator, and hence one of the light beam may be guided to the control circuit 7 and the other may be sent toward an object.

Figure 122:
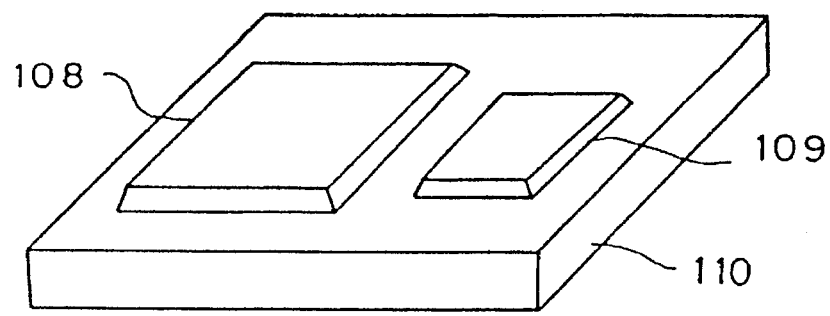

FIG. 122 shows an essential part, i.e., an optical information acquisition unit, of an object detector in a preferred embodiment according to the present invention. In FIG. 122, indicated at 108 is a two-dimensional photodetector array formed by arranging a plurality of variable-sensitivity photodetectors in a two-dimensional arrangement, at 109 is a light-emitting device, and at 110 is a substrate. The light-emitting device 109 emits light in a direction perpendicular to the major surface of the substrate 110. As shown in FIG. 122, both the light-emitting device 109 of a light-emitting unit 1 and the two-dimensional photodetector array 108 of a photodetector unit 3 are mounted on the substrate 110.

In operation, the light-emitting device 109 emits a light beam in a direction perpendicular to the major surface of the substrate 110. Part of the light beam is reflected by an object and the reflected light beam, i.e., optical information, falls on the two-dimensional photodetector array 108. The two-dimensional photodetector array 108 converts the optical information represented by the reflected light beam into electrical information according to a photosensitivity specified by an external control signal, and a signal processing unit processes the input signal, i.e., the output electrical information of the two-dimensional photodetector array 108. Thus, the light-emitting device 109 mounted on the substrate 110 serves as a light source that emits light for acquiring external optical information.

Figure 123:
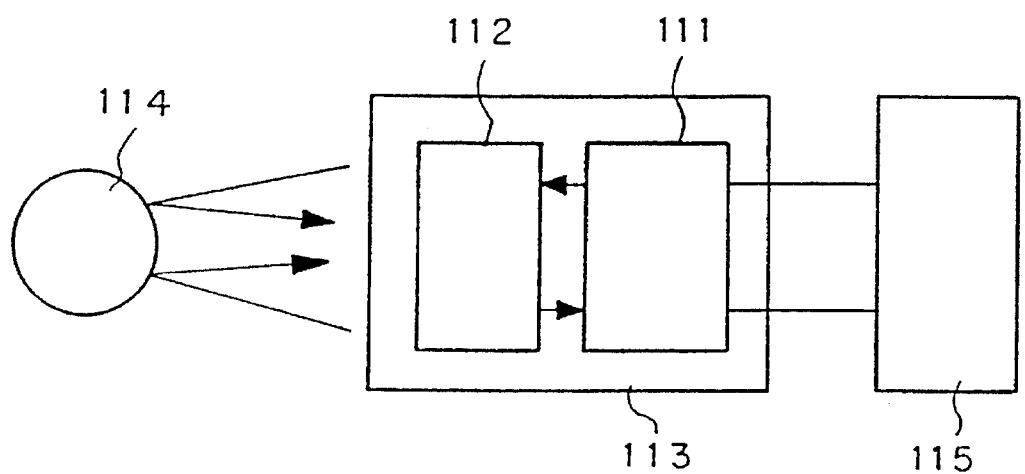

FIG. 123 shows an image detector provided with the optical information acquisition unit of FIG. 122. In FIG. 123, indicated at 111 is an optical information acquisition unit integrally comprising a light-emitting device 109 and a two-dimensional photodetector array 108, and forming an object detecting head 113 together with an optical system 112 and a signal processing circuit 115.

In operation, light emitted by the light-emitting device 109 is directed toward an object 114 by the optical system 112, and part of the reflected light reflected from the object 114 travels through the optical system 112 and falls on the two-dimensional photodetector array 108. Then, the two-dimensional photodetector array 108 having variable photosensitivity detects the data of the object in a three-dimensional space in the reflected light at a high detection speed.

While the light emitting device 109 in this embodiment emits light in a direction perpendicular to the major surface of the substrate 110 of the optical information acquisition unit 111, the light-emitting device 109 of the light-emitting unit 1 may be provided with a vertical resonator for vertical light emission. When provided with a vertical resonator, the light-emitting device 109 forms a resonator configuration perpendicular to the major surface of the substrate 110 to emit light perpendicularly to the major surface of the substrate 110.

The light-emitting device 109 of the light-emitting unit 1 may be provided with a horizontal resonator and a 45 reflecting mirror. In this light-emitting unit 1, emitted in parallel to the major surface of the substrate 110 by the light-emitting device 109 is deflected so as to travel perpendicularly to the major surface of the substrate 110. Naturally, the horizontal resonator and the 45 reflecting mirror are mounted together with a two-dimensional photodetector array on the substrate 110.

Similarly, the light-emitting unit 1 may be provided with a light-emitting device provided with a horizontal resonator and a diffraction grating. In this light emitting unit 1, light emitted in parallel to the major surface of the substrate 110 is deflected with the diffraction grating formed of a semiconductor or a dielectric so as to travel perpendicularly to the major surface of the substrate 110.

When fabricating the two-dimensional photodetector array 108 and the light emitting device 109 on the same surface of the substrate 110, the two-dimensional photodetector array 108 and the light emitting device 109 are formed of the same semiconductor by continuous processes in an integrated circuit; that is, both the two-dimensional photodetector array 108 and the light-emitting device 109 are formed simultaneously on the substrate 110 by a crystal growth process. For example, photodetectors of GaAs, and a monocrystal film of AlGaAs for a light-emitting device are formed continuously on a GaAs substrate. Since both the variable-sensitivity two-dimensional photodetector array 108 and the light-emitting device 109 are formed on the same surface of the substrate 110, the wavelength of the light that is emitted by the light-emitting device 109 and the wavelength to which the variable-sensitivity photodetector array 108 is sensitive may be determined without taking into consideration the light absorbing characteristic of the substrate 110.

Figure 124:
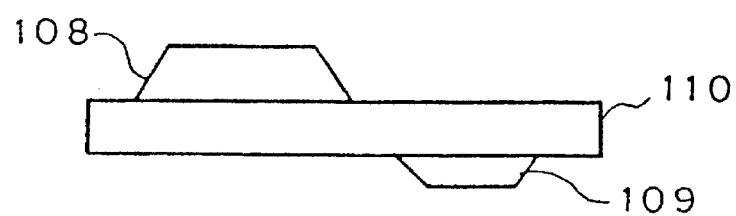

While both the two-dimensional photodetector array 108 and the light-emitting device 109 of the optical information acquisition head in this embodiment are formed on the same major surface of the substrate 110, in a modification, the two-dimensional photodetector array 108 and the light-emitting device 109 may be formed respectively on the opposite major surfaces of the substrate 110 as shown in FIG. 124. In the modification shown in FIG. 124, the light-emitting device 109 needs to emit light having a wavelength that will not be absorbed by the substrate 110, and the two-dimensional photodetector array 108 needs to be sensitive to light having a wavelength that will not be absorbed by the substrate 110, and the optical information acquisition head may be disposed with either the two-dimensional photodetector array 108 or the light-emitting device 109 facing an object. The fabrication of the two-dimensional photodetector array 108 and the light-emitting device 109 respectively on the opposite major surfaces of the substrate 110 requires simple processes.

The two-dimensional photodetector array 108, the light-emitting device 109 and the substrate 110 of the optical information acquisition head may be formed of different materials, respectively. For example, the substrate 110 may be a silicon substrate, and the two-dimensional photodetector array 108 and the light-emitting device 109 may be formed of AlGaAs materials. Naturally, the variable-sensitivity two-dimensional photodetector array 108 and the light-emitting device 109 may be formed of any other suitable materials.

Figure 125:
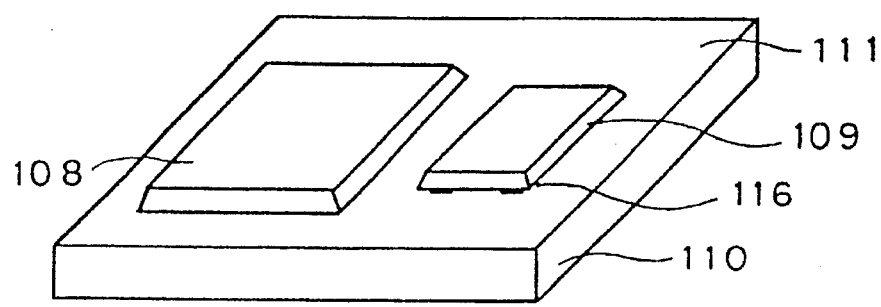

FIG. 125 shows an optical information acquisition head, in which a substrate on which a light-emitting device 109 is fabricated is attached adhesively to a substrate 110 on which two-dimensional photodetector array 108 is fabricated. The light-emitting device 109 may be formed of a material different from that of the two-dimensional photodetector array 108; for example, the two-dimensional photodetector array is formed on a silicon substrate, and the light-emitting device 109 is formed of an AlGaAs material.

Figure 126:
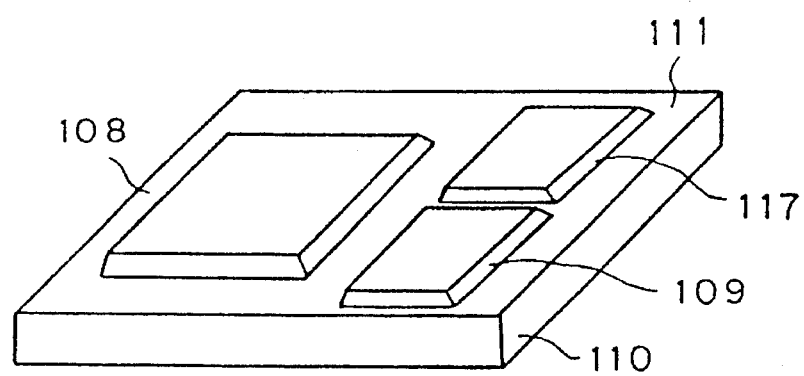

While the optical information acquisition head shown in FIG. 122 is provided with only the two-dimensional photodetector array 108 and the light-emitting device 109, a driving circuit 117 may be formed also on the surface 111 of the substrate 110 as shown in FIG. 126, because the optical information acquisition head 113 is used in combination with an external signal processing circuit 115 comprising a current amplifier for amplifying the output photocurrents of the photodetectors of the two-dimensional photodetector array 108, and a driving circuit for driving the light-emitting device 109 as shown in FIG. 123. This configuration of the optical information acquisition head 113 enables forming the object detector in a compact configuration.

While the driving circuit 115 for driving the light-emitting device 109 of the object detector shown in FIG. 123 is driven by a dc power source for continuous operation, the output of the driving circuit 115 may be subjected to pulse modulation to modulate the amplitude of the light emitted by the light-emitting device 109.

Figure 127:
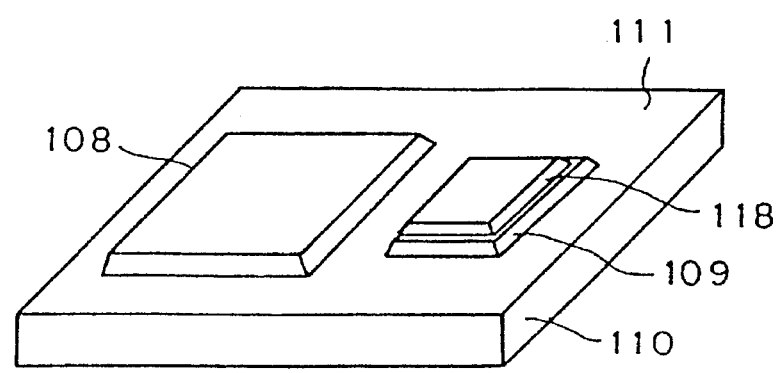

An optical information acquisition head shown in FIG. 127 has a dc-driven light-emitting device 109, a spatial modulating device 118 is mounted on the light-emitting device 109. The light transmittance of the spatial modulating device 118 is varied by an external device to vary the intensity of the light emitted by the light-emitting device 109. The spatial modulating device 118 may be formed of the same material as that of the light-emitting device 109 directly on the light-emitting device 109 or may be formed of a material different from that of the light-emitting device 109 and attached to the light-emitting device 109. For example, the light transmittance of a spatial modulating device formed of a semiconductor varies quickly according to a control voltage applied thereto.

Figure 128:
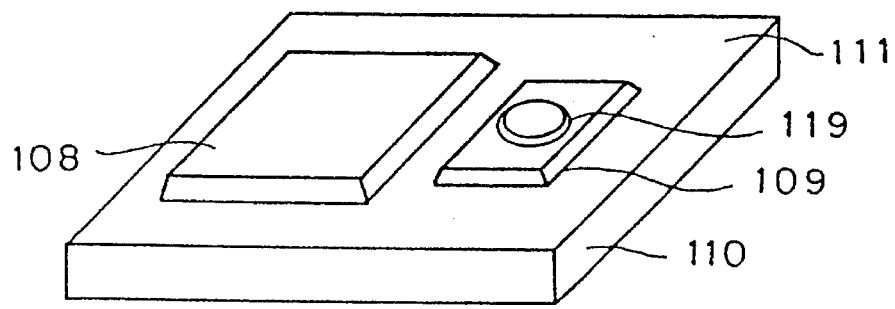

In the foregoing optical information acquisition head, the two-dimensional photodetector array 108 and the light emitting device 109 are formed on the surface 111 of the substrate 110, and the light emitted by the light-emitting device 109 must be collimated in a beam by the optical system 112 formed separately from the two-dimensional photodetector array 108 as shown in FIG. 123, Therefore, a diffraction type or a refraction type lens 119 may be formed directly on or may be attached to the light-emitting device 109 as shown in FIG. 128.

Figure 129:
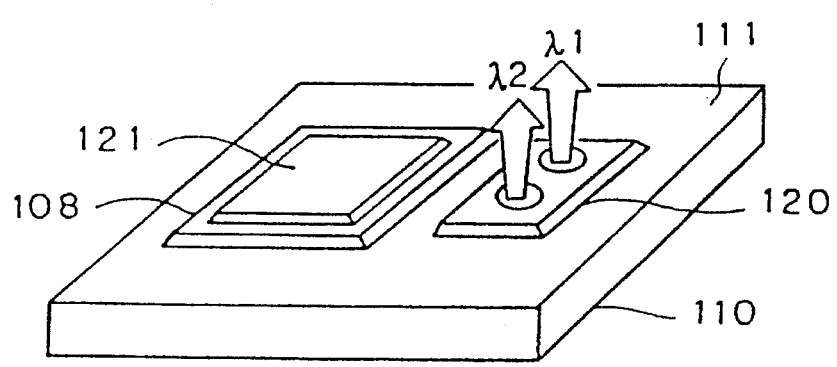

In a modification shown in FIG. 129, a light-emitting device 120 capable of wavelength-multiplexing or of emitting light beams having different wavelengths, and a two-dimensional photodetector array 108 integrally provided with a wavelength-selective filter 121 are formed on a substrate 110 to increase the quantity of image information or distance information by wavelength multiplexing.

Figure 130:
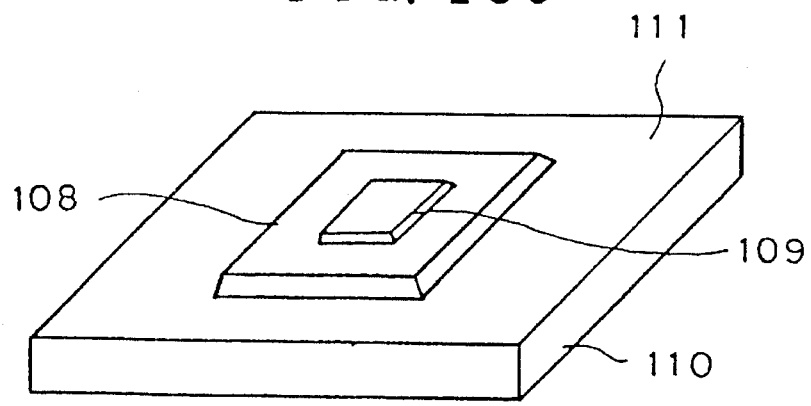

In another modification shown in FIG. 130, a light-emitting device 109 may be formed in a two-dimensional photodetector array 108.

While the two-dimensional photodetector array 108 and the light-emitting device 109 of the optical information acquisition head shown in FIG. 123 need individual optical systems 112, respectively, the optical information acquisition head may be provided with a single optical system for both the two-dimensional photodetector array 108 and the light-emitting device 109.

The optical information acquisition head 113, i.e., an essential part of the object detector in this embodiment, comprises, in an integral unit, the light emitting unit 1, the optical system 2 and the photodetector unit 3. This optical information acquisition head 113 is applicable to any one of the embodiments described previously with reference to FIGS. 39 through 119, and may employ any one of the photodetector arrays and any one of the light emitting devices described previously with reference to FIGS. 4 through 39. Naturally, the forgoing components may be used in any suitable combinations and changes and variations may be made therein without departing from the scope of the present invention as stated in the appended claims.

FIG. 131 shows an object detector in a preferred embodiment according to the present invention. In FIG. 13, there are shown a light-emitting unit 1, a lens 2, a photodetector unit 3, an x-direction circuit 5, a y-direction circuit 6, an object 8, an optical scanner 122 and a light beam 123. This object detector is capable of measuring the three-dimensional shape of the object 8. As shown in FIG. 133, the y-direction circuit 6 has y-direction terminals 16 to which control voltages are applied to adjust the respective photosensitivities of photodetectors connected respectively to the y-terminals 16. FIG. 134 shows one of the channels of the x-direction circuit. The channel receives the x-direction output currents of the corresponding photodetectors, converts the input currents into digital signals and operates the digital signals and the contents of a shift register 125 for division.

The operation of the object detector in a two-dimensional space will be described with reference to FIG. 132 showing a section in an x-plane. The optical scanner 122 collimates the light emitted by the light-emitting unit 1 in a light beam 123 and deflects the light beam 123 for scanning. Scattered light reflected and scattered by the object 8 falls on the photodetector unit 3. When a scanning angle A of the light beam 123 and a scattered light receiving position Y corresponding to an angle B at a certain moment are known, the position of the surface of the object 8 on which the light beam 123 falls in the y-z plane at the same moment can be determined. Thus, the positions of the surface of the object 8 at a plurality of moments are determined to determine the three-dimensional shape of the object 8. A function A(t) indicating the scanning angle A as a function of time can be optionally determined. A method of determining a function Y(t) indicating the scattered light receiving position Y as a function of time will be described. First, as shown in FIG. 135(a), the photosensitivities of all the photodetectors are set to a, the contents of all the shift registers (FIG. 134) are set to "1", and then a light beam is projected for scanning.

Supposing that light power of the reflected light reflected from the object at time t is expressed by I(t), the intensity of the x-direction current at time t is $a \cdot (t)$. The x-direction circuit converts the intensity of the x-direction current into a digital signal at regular time intervals, divides the digital signal by the left-end contents of the shift register 125, and then gives the quotient to the right end of the shift register 125 to store $a \cdot (t)$ in the shift register 125.

Then, the photosensitivities of the photodetectors are set to values corresponding to the y-coordinates of the photodetectors as shown in FIG. 135(b), respectively, and then a light beam is projected for scanning. At time t, the reflected light falls on the photodetectors at a y-coordinate Y(t) having a photosensitivity $a \cdot (t)$ and, therefore, the intensity of the x-direction current is $a \cdot (t) \cdot (t)$. The x-direction circuit (FIG. 134) performs dividing operation at regular time intervals and, consequently, the contents of the shift register 125 is Y(t). From this signal, the shape of the object 8 in an x-plane is estimated. The photodetectors arranged on the x-direction performs these operations simultaneously to determine the three-dimensional shape of the object 8.

While this embodiment projects the light beam twice on the object for two scanning cycles, the first scanning cycle and the second scanning cycle may be performed in reverse order when the x-direction circuit 5 is changed. Such a manner of scanning enables the omission of a step for returning the light beam to its starting position. Naturally, the photodetectors and the two-dimensional photodetector arrays previously described with reference to FIGS. 4 through 38 are applicable to this embodiment.

As is apparent from the foregoing description, a photodetector in accordance with the present invention comprises a light-absorptive semiconductor substrate, two depletion layers symmetrically formed in the surface of the semiconductor substrate, a first electrode, to which control voltage variable in a positive range through a negative range is applied, electrically connected to the semiconductor substrate, and a second electrode, through which output signal is provided, electrically connected to the semiconductor substrate. Therefore, charges induced by the incident light can be caused to drift into one of the symmetrical depletion layers and delivered through the second electrode by applying a control voltage to the first electrode to expand one of the depletion layers relative to the other so that the charges drift into one of the depletion layers. Accordingly, the photosensitivity of the photodetector can be adjusted by changing the control voltage in a positive range through a negative range. The photodetector is able to convert the intensity of the incident light into a photocurrent in a desired photosensitivity.

In a preferred embodiment, the first electrode and the second electrode are formed on the surface of the semiconductor substrate in a symmetrical arrangement so as to form metal-semiconductor junctions. Therefore, the photosensitivity can be varied in a positive range through a negative range by using the depletion layers formed near the surface of the semiconductor substrate, and light falls on the surface of the semiconductor substrate to enable the photodetector function in a high photosensitivity.

In a preferred embodiment, the first electrode and the second electrode connected to the surface of the semiconductor substrate are semitransparent to enable part of the incident light to fall effectively on the depletion layers formed near the surface of the semiconductor substrate, which further enhances the photosensitivity.

In a preferred embodiment, the first electrode and the second electrode connected to the surface of the semiconductor substrate are transparent to enable part of the incident light to fall effectively on the depletion layers formed near the surface of the semiconductor substrate, which further enhances the photosensitivity.

In a preferred embodiment, the first electrode and the second electrode are embedded in the semiconductor substrate in a symmetrical arrangement so as to form metal-semiconductor junctions to enable the variation of the photosensitivity in a positive range through a negative range by using the depletion layers. Since the photodetector is able to use more light-induced charge, the photodetector has an enhanced photosensitivity.

In a preferred embodiment, the first electrode and the second electrode are embedded in the semiconductor substrate and are semitransparent electrodes to enable incident light to illuminate effectively the depletion layers formed in the surface of the semiconductor substrate, opposite the surface on which the incident light falls. Therefore, the photodetector has a high photosensitivity.

In a preferred embodiment, the first electrode and the second electrode are transparent and formed within the semiconductor substrate to enable the incident light to illuminate effectively the depletion layers formed in the surface of the semiconductor substrate, opposite the surface on which the incident light falls.

In a preferred embodiment, the first electrode and the second electrode are formed on the side surfaces of a mesa of the semiconductor substrate having a mesa configuration so as to form metal-semiconductor junctions. Therefore, the photosensitivity can be varied in a positive range through a negative range by using the deep depletion layers, and the photodetector has a high photosensitivity.

In a preferred embodiment, the semiconductor substrate comprises a first semiconductor layer, and two second semiconductor layers of a polarity opposite that of the first semiconductor layer and attached respectively to the opposite surfaces of the first semiconductor layer, and the first electrode and the second electrode are connected respectively to the second semiconductor layers. Therefore, the depletion layers formed in the pn junctions of the first semiconductor layer and the second semiconductor layers are changed by applying a control voltage variable in a positive range through a negative range to the first electrode connected to one of the second semiconductor layers and an output is obtained at the second electrode. Thus, the photosensitivity can be varied in a positive range through a negative range.

In a preferred embodiment, the first electrode and the second electrode are connected in ohmic contact to second semiconductor layers protruding from a first semiconductor layer, a control voltage variable in a positive range through a negative range is applied to the first electrode connected to one of the second semiconductor layers to change the area of depletion layers formed between the first semiconductor layer and the second semiconductor layers, and a photocurrent flows through the second electrode connected to the surface of the other second semiconductor layer.

In a preferred embodiment, second semiconductor layers having a wide band gap are formed in a first semiconductor layer formed of a material different from that of the second semiconductor layers. Therefore, light can effectively fall on the depletion layers through the second semiconductor layers to enhance the photosensitivity.

In a preferred embodiment, second semiconductor layers are formed in the surface of a first semiconductor layer so that their surfaces are exposed. Therefore, depletion layers formed around the second semiconductor layers, namely, near the surface of the first semiconductor layer, can be effectively changed by applying a control voltage to the first electrode, and light is able to fall effectively in the surface of the semiconductor layer. Thus, the photodetector has an enhanced photosensitivity.

In a preferred embodiment, second semiconductor layers are formed close to each other in a first semiconductor layer. Therefore, charge induced by the incident light fallen on depletion layers formed between the first semiconductor layer and the second semiconductor layers can be amplified by transistor effect, and a photocurrent can be drawn through the second electrode. Thus, the photodetector has an enhanced photosensitivity.

In a preferred embodiment, the surface of the semiconductor substrate is coated with an antireflection film. Therefore, reflection of the incident light can be prevented and the incident is able to fall effectively on the depletion layers. Thus, the photodetector has an enhanced photosensitivity.

In a preferred embodiment, the semiconductor substrate is provided internally with a dispersive Bragg reflecting mirror to reflect the incident light penetrated through the depletion layers into the semiconductor substrate effectively toward the depletion layers. Thus, the photodetector has an enhanced photosensitivity.

In a preferred embodiment, a control voltage that will cause electron avalanche within the semiconductor substrate is applied to the first electrode when the photodetector is illuminated with light. Therefore, light is able to fall effectively on the depletion layers and the photodetector has an enhanced photosensitivity.

In a preferred embodiment, a control voltage that will cause electron avalanche within the semiconductor substrate when the photodetector is illuminated with light is applied to the first electrode. Therefore, charge induced by the light fallen on the depletion layers is amplified by electron avalanche and hence a high output appears on the second electrode.

In a preferred embodiment, the semiconductor substrate is an insulating substrate that enables the formation of a photodetector having photosensitivity variable in a positive range through a negative range.

In a preferred embodiment, the photodetector is formed on a semiconductor substrate having a band gap wider than that of the semiconductor substrate on which the cell is formed to prevent light absorption by the semiconductor substrate.

In a preferred embodiment, the variable-sensitivity photodetector is cooled by a cooling means so that the photodetector is able to operate stably.

In a preferred embodiment, the cooling means is a heatsink capable of absorbing heat from the semiconductor substrate of the photodetector and dissipating the absorbed heat.

In a preferred embodiment, the photodetectors having photosensitivity variable in a positive range through a negative range are isolated electrically from each other by an insulating means, so that the photodetectors are able to operate stably.

In a preferred embodiment, the photodetector array comprises photodetectors having photosensitivity variable in a positive range through a negative range and arranged in an array at predetermined intervals on an insulating substrate so as to be isolated electrically from each other, so that the photodetectors are able to operate stably.

In a preferred embodiment, photodetectors having photosensitivity variable in a positive range through a negative range are arranged in an array on a semiconductor substrate having a polarity different from that of the substrate of the photodetectors and not absorptive to light, and the photodetectors are isolated electrically from each other by potential barriers formed in the pn junctions, so that the photodetectors are able to operate stably.

In a preferred embodiment, photodetectors having photosensitivity variable in a positive range through a negative range and differing from each other in size or shape are arranged in an array, so that the photodetectors can be efficiently accessed to form a desired image.

In a preferred embodiment, photodetectors having photosensitivity variable in a positive range through a negative range are arranged at irregular intervals so that the photodetectors are arranged in a relatively high density in a specified region, so that the photodetectors can be efficiently accessed to form a desired image.

In a preferred embodiment, a gradient index lens is put on each of the photodetectors of a photodetector array to concentrate the incident light effectively on the corresponding photodetector.

In a preferred embodiment, a gradient index lens is put on each of the photodetectors of a photodetector array to concentrate the incident light effectively on the corresponding photodetector.

In a preferred embodiment, a linear gradient index lens is disposed so as to concentrate the incident light effectively on the photodetectors on each. line or row of photodetectors of a photodetector array. The linear gradient index lenses can be easily and correctly positioned relative to the photodetector array.

In a preferred embodiment, a diffraction lens is disposed so as to concentrate the incident light effectively on each of the photodetectors having photosensitivity variable in a positive range through a negative range, so that the incident line can be surely guided to the light-receiving surface of each photodetector.

In a preferred embodiment, a linear diffraction lens is disposed so as to concentrate the incident light on the photodetectors on each line or row of photodetectors of a photodetector array. The linear lenses can be easily and correctly positioned relative to the photodetector array.

In a preferred embodiment, the incident light is transmitted through an optical system having a surface coated with an antireflection film to the photodetectors having photosensitivity variable in a positive range through a negative range, so that the reflection of the incident light on the surface of each photodetector can be prevented and hence the photodetectors have an enhanced photosensitivity.

In a preferred embodiment, light having a predetermined wavelength filtered through a wavelength-selective filter having selective transmittance with respect to wavelength falls on the photodetectors having photosensitivity variable in a positive range through a negative range, so that only the incident light having a desired wavelength falls on the photodetector array.

In a preferred embodiment, a light modulator having light transmittance with respect to wavelength, which can be adjustable by an external selection signal, transmits light having a predetermined wavelength to the photodetectors having photosensitivity variable in a positive range through a negative range, so that only the incident light having a desired wavelength falls on the photodetector array.

In a preferred embodiment, optical switching devices having light transmittance that can be determined according to the intensity of light that falls thereon make light having a predetermined wavelength fall on the photodetectors having photosensitivity variable in a positive range through a negative range.

In a preferred embodiment, a control voltage applying means applies a control voltage variable in a positive range through a negative range through a parallel circuit of diodes respectively having opposite forward directions to the photodetectors, so that the flow of leakage current into the photodetectors can be surely prevented when the control voltage is zero.

In a preferred embodiment, a photodetector array comprises photodetectors each having a first electrode and a second electrode connected to a semiconductor substrate so as to form metal-semiconductor junctions, which enables the variation of the photosensitivity in a positive range through a negative range by using depletion layers.

In a preferred embodiment, a photodetector array comprises photodetectors each having a first electrode and a second electrode connected to a semiconductor substrate so as to form metal-semiconductor junctions, which enables the photosensitivity in a positive range through a negative range by using the depletion layers.

In a preferred embodiment, a photodetector array comprises photodetectors each having a first electrode and a second electrode attached to the surface of a semiconductor substrate at symmetrical positions so as to form metal-semiconductor junctions, so that the photosensitivity can be varied in a positive range through a negative range by using depletion layers formed near the surface of the semiconductor substrate.

In a preferred embodiment, a photodetector array comprises photodetectors each having a transparent first electrode and a transparent second electrode capable of effectively transmitting light therethrough to depletion layers formed near the surface of a semiconductor substrate.

In a preferred embodiment, a photodetector array comprises photodetectors each having a first electrode and a second electrode embedded in a semiconductor substrate in a symmetrical arrangement so as to form metal-semiconductor junctions, so that the photosensitivity can be varied in a positive range through a negative range by using depletion layers.

In a preferred embodiment, a photodetector array comprises photodetectors each having a semitransparent first electrode and a semitransparent second electrode formed in a semiconductor substrate, so that light can be effectively transmitted to depletion layers formed in one surface of the semiconductor substrate opposite the other surface of the same on which the incident light falls.

In a preferred embodiment, a photodetector array comprises photodetectors having a transparent first electrode and a transparent second electrode formed in a semiconductor substrate, so that light can be effectively transmitted to depletion layers formed on one surface of the semiconductor substrate opposite the other surface of the same on which the incident light falls.

In a preferred embodiment a photodetector array comprises photodetectors formed on a semiconductor substrate having a mesa construction and each having a first electrode and a second electrode formed on the side surfaces of a mesa so as to form metal-semiconductor junctions, so that the photosensitivity can be varied in a positive range through a negative range by using deep depletion layers.

In a preferred embodiment, one of the depletion layers formed in pn junctions formed by stacking a first semiconductor layer and second semiconductor layers is varied by applying control voltage variable in a positive range through a negative range to a first electrode connected to one of the second semiconductor layers, so that photosensitivity can be varied in a positive range through a negative range, and an output appears on a second electrode connected to the other second semiconductor layer.

In a preferred embodiment, a photodetector array comprises photodetectors each comprising a first semiconductor layer, second semiconductor layers protruding from the surface of the first semiconductor layer, a first electrode attached to one of the second semiconductor layers, and a second electrode connected to the other second semiconductor layer. Control voltage variable in a positive range through a negative range is applied to the first electrode to vary the areas of depletion layers formed between the first semiconductor layer and the second semiconductor layers, and a photocurrent is provided through the second electrode.

In a preferred embodiment, a photodetector array comprises photodetectors each having a first semiconductor layer and second semiconductor layers having a band gap wider than that of the first semiconductor layer. Light falls effectively from the side of the second semiconductor layers on depletion layers formed between the first semiconductor layer and the second semiconductor layers.

In a preferred embodiment, a photodetector array comprises photodetectors each having depletion layers formed around second semiconductor layers formed in a first semiconductor layer so as to be partly exposed, namely, near the surface of the first semiconductor layer, the depletion layers are varied effectively by applying a control voltage to a first electrode, and a photocurrent flows through a second electrode.

In a preferred embodiment, a photodetector array comprises photoconductors, in which charge induced by light fallen on depletion layers is amplified by transistor effect between second semiconductor layers formed close to each other and a first semiconductor layer, and an output appears on a second electrode.

In a preferred embodiment, a photodetector array comprises photodetectors each having a dispersive Bragg reflecting mirror formed in a semiconductor substrate to reflect effectively the light penetrated through depletion layers into the semiconductor substrate toward the depletion layers.

In a preferred embodiment, a photodetector array comprises photodetectors each having a first electrode and a second electrode on one of the surfaces of a semiconductor substrate, and each photodetector receives the incident light on the other surface to use the surface of the semiconductor substrate effectively.

In a preferred embodiment, a photodetector array comprises photodetectors, in which a control voltage that will cause electron avalanche within the semiconductor substrate is applied to the first electrode when the incident light falls on on the photodetector array to amplify light-induced charge by electron avalanche, and an output appears on the second electrode.

In a preferred embodiment, a photodetector unit has a two-dimensional photodetector array comprising photodetectors arranged in a two-dimensional array. Therefore, an image of external objects can be formed and an image of a desired object can be effectively extracted.

In a preferred embodiment, a set information feedback means receives the output of a signal detecting means which detects the output of a two-dimensional photodetector array having photosensitivity variable in a positive range through a negative range, and feeds back a set information to a control means. Therefore, the control means is able to decide effectively whether or not a setting operation for the two-dimensional photodetector array has been accurately achieved, and setting and detecting operations can be carried out again.

In a preferred embodiment, an optical system is provided with a selective light transmitting means that selectively transmits near-infrared radiation. Therefore, a pulse of light is emitted by a light-emitting unit, and a photodetector unit receives only near-infrared radiation included in incoming light.

In a preferred embodiment, each of the photodetectors of a photodetector unit receives selectively either visible radiation or near-infrared radiation. Therefore, each photodetector provides an output suitable for processing.

In a preferred embodiment, the parallel output signals of a signal detecting means connected in parallel to lines or rows of the photodetectors of the two-dimensional photodetector array of a photodetector unit are converted into serial signals by a signal converting means. Therefore, the signals can be effectively processed by the subsequent circuit.

In a preferred embodiment, the parallel output signals of a signal detecting means connected in parallel to liens or rows of the photodetectors of the two-dimensional photodetector array of a photodetector unit are converted into serial signals by the selective switching operation of switching means. Therefore, the serial signals can be effectively processed by the subsequent circuit.

In a preferred embodiment, the output signal of the two-dimensional photodetector array of a photodetector unit is integrated by an integrating means included in a signal detecting means, so that noise included in the output signal can be removed.

In a preferred embodiment, visible radiation included in a pulse of light emitted by a light-emitting unit and reflected light including visible radiation and reflected from an object is absorbed by a visible radiation absorbing means and only near-infrared radiation falls on the photodetector unit. Therefore, the distance to a desired object and the projection of an image of the object can be accurately determined.

In a preferred embodiment, an object detector having a visible radiation absorbing means is provided with a set information feedback means which receives the output signal of a signal detecting means that detects the output signal of a two-dimensional photodetector array having photosensitivity variable in a positive range through a negative range, and feeds back set information to a control means. Therefore, the control means is able to determine effectively whether or not a setting operation for the two-dimensional photodetector array has been accurately achieved, and setting and detecting operation can be carried out again.

In a preferred embodiment, a signal converting means converts parallel output signals representing near-infrared radiation fallen on the photodetectors of the two-dimensional photodetector array of a photodetector unit and provided by a signal detecting means connected in parallel to lines or rows of the photodetectors into serial signals. The serial signals can be effectively processed by the subsequent circuit.

In a preferred embodiment, a switching means converts the parallel output signals of a signal detecting means connected in parallel to lines or rows of the photodetectors of a photodetector unit, representing near-infrared radiation fallen on the photodetectors into serial signals by selective switching operation. The serial signals can be effectively processed by the subsequent circuit.

In a preferred embodiment, a control signal supply means specifies lines or rows of photodetectors of the two-dimensional photodetector array having photosensitivity variable in a positive range through a negative range of a photodetector unit to set a time window. Therefore, a projection of an image of a desired object can be accurately determined.

In a preferred embodiment, an object detector having a control signal supply means for setting a time window is provided with a set information feedback means is provided with a set information feedback means that receives the output signal of a signal detecting means that receives the output signal of a two-dimensional photodetector array having photosensitivity variable in a positive range through a negative range and feeds back set information to a control means. Therefore, the control means is able to determine effectively whether or not a setting operation for setting the two-dimensional photodetector array has been accurately achieved, and setting and detection operations can be carried out again.

In a preferred embodiment, a signal converting means converts the parallel output signals of a signal detecting means connected in parallel to lines or rows of the two-dimensional photodetector array of a photodetector unit, representing only near-infrared radiation fallen in a time window into serial signals. Therefore, the subsequent circuit is able to process the serial signals effectively.

In an object detector in a preferred embodiment having a two-dimensional photodetector array having photosensitivity variable in a positive range through a negative range, a visible radiation absorbing means extracts only near-infrared radiation from reflected light including a pulse of light emitted by a light-emitting unit and reflected from an object, and visible radiation, and a linear photodetector array formed by linearly arranging photodetectors having a fixed conversion efficiency receives the extracted near-infrared radiation. Therefore, the distance to the object and the approximate position of the object can be determined for the effective detection of the desired object by the two-dimensional photodetector array.

In an object detector in a preferred embodiment having a linear photodetector array, and a two-dimensional photodetector array having photosensitivity variable in a positive range through a negative range, a signal detecting means detects the output signals of the two-dimensional photodetector array, a set information feedback means receives the output signals of the signal detecting means and feeds back set information to a control means. Therefore, the control means is able to determine accurately whether or not setting operation for the two-dimensional photodetector array has been accurately achieved, and setting and detecting operations can be carried out again.

In a preferred embodiment, a signal converting means converts the parallel output signals of a signal detecting means connected in parallel to lines or rows of the two-dimensional photodetector array of a photodetector unit into serial signals. Therefore the subsequent circuit is able to process the signals effectively.

In a preferred embodiment, a switching means converts the parallel output signals of a signal detecting means connected in parallel to lines or rows of the two-dimensional photodetector array of a photodetector unit into serial signals by selective switching operation. Therefore, the subsequent circuit is able to process the signals effectively.

In a preferred embodiment, a control means gives a timing signal to other circuits in synchronism with the light emitting operation of a light-emitting unit. therefore, the distance to the object can be accurately determined and an accurate image of the object can be formed.

In a preferred embodiment, the two-dimensional photodetector array of a photodetector unit, and the light-emitting device of a light-emitting unit are mounted on a single substrate to form an optical information acquisition head for emitting a pulse of light toward an object and receiving the reflected pulse from the object in a compact configuration.

In a preferred embodiment, the two-dimensional photodetector array of a photodetector unit, and the light-emitting device and the vertical resonator of a light-emitting unit are mounted on a single substrate to form an optical information acquisition head for emitting a pulse of light toward an object and receiving the reflected pulse from the object in a compact configuration and to enable the optical information acquisition head to operate efficiently.

In a preferred embodiment, the two-dimensional photodetector array of a photodetector unit, the light-emitting device and the horizontal resonator of a light-emitting unit, and a 45 reflecting mirror are mounted on a single substrate to form an optical information acquisition head for emitting a pulse of light toward an object and receiving the reflected pulse from the object in a compact configuration.

In a preferred embodiment, the two-dimensional photodetector array of a photodetector unit, the light-emitting device and the horizontal resonator of a light-emitting unit, and a diffraction grating are mounted on a single substrate to form an optical information acquisition head for emitting a pulse of light toward an object and receiving the reflected pulse from the object in a compact configuration.

In a preferred embodiment, the two-dimensional photodetector array of a photodetector unit, the light-emitting device of a light-emitting unit are formed by continuous processes on a single substrate in an integrated circuit to form an optical information acquisition head for emitting a pulse of light toward an object and receiving the reflected pulse from the object in a compact configuration.

In a preferred embodiment, the two-dimensional photodetector array of a photodetector unit, and the light-emitting device of a light-emitting unit are formed respectively on the opposite surfaces of a single substrate to form an optical information acquisition head for emitting a pulse of light toward an object and receiving the reflected pulse from the object in a compact configuration.

In a preferred embodiment, the two-dimensional photodetector array of a photodetector unit, and the light-emitting device of a light-emitting unit are formed respectively on separate substrate, and then the substrates are put together to form an optical information acquisition head for emitting a pulse of light toward an object and receiving the reflected pulse from the object in a compact configuration.

In a preferred embodiment, the two-dimensional photodetector array of a photodetector unit, the light-emitting device and the driving integrated circuit of a light-emitting unit are formed on a single substrate to form an optical information acquisition head for emitting a pulse of light toward an object and receiving the reflected pulse from the object in a compact configuration.

In a preferred embodiment, the two-dimensional photodetector array of a photodetector unit, and the light-emitting device and the amplitude modulating driving source of a light-emitting unit are formed on a single substrate to form an optical information acquisition head for emitting a pulse of amplitude-modulated light toward an object and receiving the reflected pulse from the object in a compact configuration and to enable the optical information acquisition head to operate efficiently.

In a preferred embodiment, the two-dimensional photodetector array of a photodetector unit, the light-emitting device of a light-emitting unit, and diffraction or gradient index lenses are formed on a single substrate to form an optical information acquisition head for emitting a pulse of light toward an object and receiving the reflected pulse from the object in a compact configuration.

In a preferred embodiment, the two-dimensional photodetector array of a photodetector unit, a wavelength-selective filter, and the light-emitting device of a light-emitting unit are formed on a single substrate to form an optical information acquisition head for emitting a pulse of light toward an object and receiving the reflected pulse from the object in a compact configuration.

In a preferred embodiment, the light-emitting device of a light-emitting unit is formed on the two-dimensional photodetector array of a photodetector unit to form an optical information acquisition head for emitting a pulse of light toward an object and receiving the reflected pulse from the object in a compact configuration, In a preferred embodiment, a light-emitting unit emits a light beam having a predetermined wavelength, an optical scanning unit projects the light beam on an object for scanning, a two-dimensional photodetector array comprising photodetectors having photosensitivity which can be varied in a positive range through a negative range according to a control signal receives the reflected light through lenses, and the output signal of each line or each row of the photodetectors is detected. Therefore, a desired object can be surely and accurately detected.

In a preferred embodiment, a two-dimensional photodetector array comprises photodetectors each having photosensitivity variable in a positive range through a negative range.

In a preferred embodiment, a photodetector unit has a two-dimensional photodetector array comprising photodetectors each having a first electrode and a second electrode connected to a semiconductor substrate so as to form metal-semiconductor junctions, and the photosensitivity of the photodetector is varied in a positive range through a negative range by using depletion layers formed in the metal-semiconductor junctions.

In a preferred embodiment, a photodetector unit has a two-dimensional photodetector array comprising photodetectors each formed by combining a first semiconductor layer and second semiconductor layers so as to form pn junctions, depletion layers formed in the pn junctions are varied by applying control voltage variable in a positive range through a negative range to a first electrode connected to one of the depletion layers to vary the photosensitivity in a positive range and a negative range, and an output is drawn through a second electrode connected to the other depletion layer.

In a preferred embodiment, a photodetector unit having a two-dimensional photodetector array comprising photodetectors each having photosensitivity variable in a positive range through a negative range is provided with a cooling means for absorbing heat generated by the photodetectors during operation and dissipating the absorbed heat to enable the photodetectors to operate stably.

In a preferred embodiment, the two-dimensional photodetector array of a photodetector unit is formed by arranging photodetectors having photosensitivity variable in a positive range through a negative range and differing from each other in size or shape. Therefore, the photodetectors can be efficiently accessed to form a desired image.

In a preferred embodiment, the two-dimensional photodetector array of a photodetector unit is formed by arranging photodetectors having photosensitivity variable in a positive range through a negative range in an irregular arrangement so that the photodetectors are arranged in a relatively high density in a specified region. Therefore, the photodetectors can be efficiently accessed to form a desired image.

In a preferred embodiment, the photosensitivities of the photodetectors of a photodetector unit are set to a specified value, the photodetector unit having a set photosensitivity receives the reflected light reflected from an object to provide image data of the object. Therefore, the photosensitivities of the photodetectors of the photodetector unit are set properly for the detection of a desired object to form an accurate image of the object.

In a preferred embodiment, the photosensitivities of the photodetectors of a photodetector unit are set, a spatial window is set in the photodetector unit having a set photosensitivity so as to contain an image of a desired object, the photodetector unit having a set photosensitivity receives the reflected light reflected from the object to provide image data of the object within the spatial window. Therefore, a more accurate image of the object can be formed by accurately setting the spatial window.

In a preferred embodiment, a light-emitting unit emits a near-infrared pulse, a photodetector unit receives the reflected near-infrared pulse reflected from an object, the coordinates of the object, and the time interval between the emission of the near-infrared pulse and the reception of the reflected near-infrared pulse are determined on the basis of the output signals of the photodetector unit. Therefore, the distance to the desired object can be accurately determined.

In a preferred embodiment, a light-emitting unit emits a near-infrared pulse, a photodetector unit receives the reflected near-infrared pulse reflected from an object, the coordinates of the object, and the time interval between the emission of the near-infrared pulse and the reception of the reflected near-infrared pulse are determined on the basis of the output signals of the photodetector unit, a window is set in an image formed in the photodetector unit on the basis of the coordinates of the object so as to contain an image of the object, and optical image information within the window is obtained by the photodetector unit. Therefore, the distance to the desired object and an image of the object can be accurately determined.

In a preferred embodiment, a light-emitting unit emits a near-infrared pulse, a photodetector unit receives the reflected near-infrared pulse reflected from an object, the coordinates of the object, and the time interval between the emission of the near-infrared pulse and the reception of the reflected near-infrared pulse are determined on the basis of the output signals of the photodetector unit, a window is set in an image formed in the photodetector unit on the basis of the coordinates of the object so as to contain an image of the object, optical image information within the window is obtained by the photodetector unit, and the optical image information is processed by a predetermined image processing method. Therefore, the distance to a desired object and an image of the object can be accurately determined, and the processed image can be effectively used.

In a preferred embodiment, a light-emitting unit emits a near-infrared pulse, a photodetector unit receives the reflected near-infrared pulse reflected from an object, the coordinates of the object and the time interval between the emission of the near-infrared pulse and the reception of the reflected near-infrared pulse are determined on the basis of the output signals of the photodetector unit, a window is set in the photodetector unit on the basis of the coordinates of the object so as to contain an image of the object, optical image information within the window is obtained from the photodetector unit, and a projection of the image of a desired object is determined on the basis of the optical image information. Therefore, the distance to a desired object and an image of the object can be accurately determined, and the object can be identified from the projection.

In an object detecting procedure in a preferred embodiment, the object detecting procedure returns to an earlier step from a step in which a photodetector unit receives the reflected light and provides output signals, according to the output signals of the photodetector unit. Therefore, an accurate image of an object can be formed by setting another window.

In a preferred embodiment, a light-emitting unit emits a near-infrared pulse, a spatial window is set in an image formed in a photodetector unit so as to contain an image of an object, and optical image information representing part of the reflected near-infrared pulse reflected from the object and falling in the window is obtained. Therefore, an image of a desired object can be more accurately determined.

In a preferred embodiment, a light-emitting unit emits a near-infrared pulse, a photodetector receives the reflected near-infrared pulse reflected from an object, the coordinates of the object and the time interval between the emission of the near-infrared pulse and the reception of the reflected near-infrared pulse are determined on the basis of the output signals of the photodetector unit, a spatial window is set in an image formed in the photodetector unit on the basis of the coordinates of the object so as to contain an image of the object, and optical image information representing part of the reflected near-infrared pulse falling within the window is determined from the output signals of the photodetector unit. Therefore, the distance to a desired object and an image of the object can be more accurately determined.

In a preferred embodiment, a light-emitting unit emits a near-infrared pulse, a photodetector unit receives the reflected near-infrared pulse reflected from an object, the coordinates of the object and the time interval between the emission of the near-infrared pulse and the reception of the reflected near-infrared pulse are determined on the basis of the output signals of the photodetector unit, a spatial window is set in an image formed in the photodetector unit on the basis of the coordinates of the object so as to contain an image of the object, optical image information representing part of the reflected near-infrared pulse falling within the window is determined form the output signals of the photodetector unit, and the optical image information is processed by a predetermined image processing method. Therefore, the distance to a desired object and an image of the object can be more accurately determined, and the processed image can be effectively used.

In a preferred embodiment, a light-emitting unit emits a near-infrared pulse, a photodetector unit receives the reflected near-infrared pulse reflected from an object, the coordinates of the object and the time interval between the emission of the near-infrared pulse and the reception of the reflected near-infrared pulse are determined on the basis of the output signals of the photodetector unit, a spatial window is set in an image formed in the photodetector unit on the basis of the coordinates of the object so as to contain an image of the object, optical image information representing part of the reflected near-infrared pulse falling within the window is determined from the output signals of the photodetector unit, and a projection of an image of a desired object is formed on the basis of the optical image information. Therefore, the distance to a desired object and an image of the object can be accurately determined and the object can be identified from the projection.

In an object detecting procedure in a preferred embodiment, the object detecting procedure returns to an earlier step from a step in which a photodetector unit receives reflected light and provides output signals, according to the output signals of the photodetector unit. Therefore, accurate image information can be obtained by setting a window again.

In a preferred embodiment, a photodetector unit determine the coordinates of an object with respect to two directions to determined the position of the object and the distance to the object. Therefore, the coordinates of the object and the distance to the object can be more accurately determined.

In a preferred embodiment, a light-emitting unit emits a near-infrared pulse, the linear photodetector array of a photodetector unit receives the reflected near-infrared pulse reflected from an object, the coordinates of the object and the time interval between the emission of the near-infrared pulse and the reception of the reflected near-infrared pulse are determined on the basis of the output signals of the linear photodetector array, a spatial window is set in an image formed in the two-dimensional photodetector array of the photodetector unit on the basis of the coordinates of the object so as to contain an image of the object, the two-dimensional photodetector array receives the reflected light reflected from the object, and optical image information representing part of the reflected light falling within the window is determined on the basis of the output signals of the two-dimensional photodetector array. Therefore, the two-dimensional photodetector array is able to determine the image accurately.

In a preferred embodiment, a light-emitting unit emits a near-infrared pulse, the linear photodetector array of a photodetector unit receives the reflected near-infrared pulse reflected from an object, the coordinates of the object and the time interval between the emission of the near-infrared pulse and the reception of the reflected near-infrared pulse are determined on the basis of the output signals of the linear photodetector array, a spatial window is set in an image formed in the two-dimensional photodetector array of the photodetector unit on the basis of the coordinates of the object so as to contain an image of the object, the two-dimensional photodetector array receives the reflected light reflected from the object, optical image information representing part of the reflected light falling within the window is determined on the basis of the output signals of the two-dimensional photodetector array, and the optical image information is processed by a predetermined image processing method. Therefore, the optical image information can be effectively used.

In a preferred embodiment, a light-emitting unit emits a near-infrared pulse, a linear photodetector array of a photodetector receives the reflected near-infrared pulse reflected from an object, the coordinates of the object and the time interval between the emission of the near-infrared pulse and the reception of the reflected near-infrared pulse are determined on the basis of the output signals of the linear photodetector array, a spatial window is set in an image formed in the two-dimensional photodetector array of the photodetector unit on the basis of the coordinates of the object so as to contain an image of the object, the two-dimensional photodetector array receives the reflected light reflected from the object, optical image information representing part of the reflected light falling within the window is determined on the basis of the output signals of the two-dimensional photodetector array, and a projection of the image of a desired object is determined on the basis of the optical image information. Therefore, the two-dimensional photodetector array is able to form an image of the object more accurately and the object can be identified from the projection.

In n object detecting procedure in a preferred embodiment returns to an earlier step from a step in which a photodetector unit receives the reflected light and provides output signals, according to the output signals of the photodetector unit. Therefore, a window can be set again to determine accurate image information.

In a preferred embodiment, the combination of lines or rows of the two-dimensional photodetector array through which image information is read from the two-dimensional photodetector array may be selectively determined. Therefore, it is possible to make access to the two-dimensional photodetector array in an optimum manner according to the desired object.

In a preferred embodiment, since windows are set sequentially for a plurality of objects detected through the detection of the reflected pulses in ascending or descending order of x-coordinates, a necessary image can be quickly formed in connection with the position of a desired object.

In a preferred embodiment, windows are set sequentially for a plurality of objects detected through the detection of the reflected pulses in order meeting a predetermined criterion. Therefore, a necessary image can be quickly formed in connection with, for example, the size of an object.

While the invention has been described in its preferred embodiments illutrated in the accompanying drawings, such description is illutrative and not restrictive. It is therefore to be understood many changes and variations may be made in the invention without departing from the scope and spirit thereof.

What is claimed is:

1. An object detector that receives a light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a photodetector array comprising a plurality of photodetectors each having photosensitivity variable in a positive range through a negative range, and arranged in a two-dimensional arrangement;

a control signal supply means for supplying a control signal for controlling the photosensitivity of each photodetector of the photodetector unit;

a signal detecting means for detecting the output signals of the photodetectors on each line or row of the photodetectors of the photodetector unit; and a control means for controlling the adjustment of the time when the light-emitting unit emits light, and controlling one of the time when the control signal supply means supplies a control signal to the photodetectors, and the time when the signal detecting means detects the output signals of the photodetectors on each line or row.

2. An object detector according to claim 1 further comprising a set information feedback means that receives an output signal of the signal detecting means and gives set information to the control means.

3. An object detector according to claim 1 or 2 further comprising an optical system that sends out a pulse of light emitted by the light-emitting unit and transmits incident light to the photodetector unit, provided with a selective transmission means which selectively transmits visible radiation and near-infrared radiation.

4. An object detector according to claim 1 or 2, wherein each photodetector of the photodetector unit is provided with a means for selectively detecting visible radiation and near-infrared radiation.

5. An object detector according to claim 1 or 2, wherein the signal detecting means is connected in parallel to lines or rows of the plurality of photodetectors of the two-dimensional photodetector array of the photodetector unit and is provided with a signal converting means for converting parallel output signals of the signal detecting means into serial signals.

6. An object detector according to claim 1 or 2, wherein the signal detecting means is connected in parallel to lines or rows of the plurality of photodetectors of the two-dimensional photodetector array of the photodetector unit and is provided with a switching means for sending parallel output signals of the signal detecting means to a subsequent means by selective switching.

7. An object detector according to claim 3, wherein the signal detecting means is connected in parallel to lines or rows of the photodetectors of the two-dimensional photodetector array of the photodetector unit and is provided with a switching means for sending parallel output signals of the signal detecting means to a subsequent means by selective switching.

8. An object detector according to claim 4, wherein the signal detecting means is connected in parallel to lines or rows of the photodetectors of the two-dimensional photodetector array of the photodetector unit and is provided with a switching means for sending parallel output signals of the signal detecting means to subsequent means by selective switching.

9. An object detector according to claim 1 or 2, wherein the signal detecting means is provided with an integrating means for integrating the output signals of the photodetector unit.

10. An object detector according to claim 3, wherein the signal detecting means is provided with an integrating means for integrating the output signals of the photodetector unit.

11. An object detector according to claim 4, wherein the signal detecting means is provided with an integrating means for integrating the output signals of the photodetector unit.

12. An object detector that receives a light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a photodetector array comprising a plurality of photodetectors each having photosensitivity variable in a positive range through a negative range, and arranged in a two-dimensional arrangement;

an optical system provided with a visible radiation absorbing means for absorbing visible radiation included in the light reflected from the object;

a control signal supply means for supplying a control signal for controlling the photosensitivity of each photodetector of the photodetector unit;

a signal detecting means for detecting the output signals of the photodetectors on each line or row of the photodetector unit; and a control means for controlling the adjustment of the time when the light-emitting unit emits light, the time when the control signal supply means supplies a control signal to the photodetectors, and the time when the signal detecting means detects the output signals of the photodetectors on each line or row of the photodetector unit.

13. An object detector according to claim 12 further comprising a set information feedback means that receives an output signal of the signal detecting means and gives set information to the control means.

14. An object detector according to claim 12 or 13, wherein the signal detecting means is connected in parallel to lines or rows of the photodetectors of the two-dimensional photodetector array of the photodetector unit and is provided with a signal converting means for converting the parallel output signals of the signal detecting means into serial signals.

15. An object detector that receives light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a photodetector array comprising a plurality of photodetectors each having photosensitivity variable in a positive range through a negative range, and arranged in a two-dimensional arrangement;

an optical system provided with a visible radiation absorbing means for absorbing visible radiation included in the light reflected from the object;

a control signal supplying means for supplying a control signal for controlling the photosensitivity of each photodetector of the photodetector unit, provided with a time window setting means for specifying lines or rows of the photodetectors to set a time window;

a signal detecting means for detecting the output signals of the photodetectors on each line or row of the photodetectors of the photodetector unit, capable of selectively detecting output signals of the photodetectors on each line or row within the time window; and a control means for controlling the adjustment of the time when the light-emitting unit emits light, the time when the control signal supply means supplies a control signal to the photodetectors, and the time when the signal detecting means detects the output signals of the photodetectors on each line or row.

16. An object detector that receives light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a photodetector array comprising a plurality of photodetectors each having photosensitivity variable in a positive range through a negative range, and arranged in a two-dimensional arrangement;

an optical system provided with a visible radiation absorbing means for absorbing visible radiation included in the reflected light reflected from the object;

a control signal supply means for supplying a control signal for controlling the photosensitivity of the photodetectors of the photodetector unit;

a signal detecting means for detecting output signals of the photodetectors on each line or row of the photodetector unit;

a signal storage means for storing output signals of the signal detecting means for parallel access; and a control means for controlling the adjustment of the time when the light-emitting unit emits light, the time when the control signal supply means supplies a control signal to the photodetectors and, the time when the signal detecting means detects the output signals of the photodetectors on each line or row of the photodetector unit.

17. An object detector according to claim 15 or 16, wherein the signal detecting means is connected in parallel to lines or rows of the photodetectors of the two-dimensional photodetector array of the photodetector unit and is provided with a signal converting means for converting parallel output signals of the signal detecting means into serial signals.

18. An object detector that receives light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a two-dimensional photodetector array comprising a plurality of photodetectors that generates output signals, each photodetector having photosensitivity variable in a positive range through a negative range and arranged in a two-dimensional arrangement and a linear photodetector array comprising a plurality of photodetectors each having a fixed conversion efficiency;

an optical system provided with a visible radiation absorbing or visible radiation separating means for separating light radiation having wavelengths other than those of visible radiation from the light reflected from the object so that light radiation having wavelengths other than those of visible radiation falls on the photodetector unit;

a control signal supply means for supplying a control signal for controlling the photosensitivity of each photodetector of the two-dimensional photodetector array of the photodetector unit;

a first signal detecting means for detecting the output signals of the photodetectors on each line or row of the two-dimensional photodetector array;

a second signal detecting means for detecting the output signals of the photodetectors of the linear photodetector array; and a control means for controlling the adjustment of the time when the light-emitting unit emits a pulse of light, the time when the control signal supply means supplies a control signal to each photodetector, the time when the first signal detecting means detects the output signals of the photodetectors on each line or row of the two-dimensional photodetector array, and the time when the second signal detecting means detects the output signals of the photodetectors of the linear photodetector array.

19. An object detector that receives the light reflected from an object to determine a position and an image of the object, said object detector comprising:

a light-emitting unit that emits a pulse of light having a predetermined wavelength, wherein at least a portion of the pulse of light is reflected from the object;

a photodetector unit for receiving the reflected light from the object and generating output signals, the reflected light including at least the portion of the pulse of light reflected from the object, wherein the photodetector unit includes a two-dimensional photodetector array comprising a plurality of photodetectors that generates output signals, each photodetector having photosensitivity variable in a positive range through a negative range and arranged in a two-dimensional arrangement and a linear photodetector array comprising a plurality of photodetectors each having a fixed conversion efficiency;

an optical system provided with a visible radiation absorbing or visible radiation separating means for separating light radiation having wavelengths other than those of visible radiation from the light reflected from the object so that light radiation having wavelengths other than those of visible radiation falls on the photodetector unit;

a control signal supply means for supplying a control signal for controlling the photosensitivity of each photodetector of the two-dimensional photodetector array of the photodetector unit;

a first signal detecting means for detecting the output signals of the photodetectors on each line or row of the two-dimensional photodetector array of the photodetector unit;

a second signal detecting means for detecting the output signals of the photodetectors of the linear photodetector array of the photodetector unit;

a control means for controlling the adjustment of the time when the light-emitting unit emits a pulse of light, the time when the control signal supply means supplies a control signal to each photodetector, the time when the first signal detecting means detects the output signals of the photodetectors on each line or row of the two-dimensional photodetector array, and the time when the second signal detecting means detects the output signals of the photodetectors of the linear photodetector array.

20. An object detector according to claim 18 or 19, wherein the first signal detecting means is connected in parallel to lines or rows of the photodetectors of the two-dimensional photodetector array and is provided with a signal converting means for converting parallel output signals of the first signal detecting means into serial signals.

21. An object detector according to claim 18 or 19, wherein the first signal detecting means is connected in parallel to lines or rows of the photodetectors of the two-dimensional photodetector array and is provided with a switching means for sending parallel output signals of the first signal detecting means to the subsequent means by selective switching.

22. An object detector according to claim 1, wherein the control means applies a timing signal to other circuits in synchronism with the light-emitting operation of the light-emitting unit.

23. An object detector according to claim 1, wherein the two-dimensional photodetector array of the photodetector unit and the light-emitting device of the light-emitting unit are formed on a single substrate.

24. An object detector according to claim 23, wherein the light-emitting device of the light-emitting unit is provided with an optical resonator, the two-dimensional photodetector array of the photodetector unit is formed on a substrate on which the light-emitting device and the optical resonator are formed in an integrated circuit, and the optical resonator radiates light in a direction perpendicular to a major surface of the substrate.

25. An object detector according to claim 23, wherein the light-emitting device of the light-emitting unit is provided with an optical resonator and a 45 degree reflecting mirror, the two-dimensional photodetector array of the photodetector unit is formed on a substrate on which the optical resonator and the 45 degree reflecting mirror are formed in an integrated circuit, the optical resonator radiate light in a direction parallel to a major surface of the substrate, and the 45 degree reflecting mirror deflects the light radiated by the optical resonator in a direction perpendicular to the major surface of the substrate.

26. An object detector according to claim 23, wherein the light-emitting device of the light-emitting unit is provided with an optical resonator for radiating light in a direction horizontal to the major surface of the substrate of the light-emitting device, and a diffraction grating, and the two-dimensional photodetector array is formed on another substrate on which the optical resonator and the diffraction grating are formed.

27. An object detector according to claim 23, wherein the two-dimensional photodetector array of the photodetector unit and the light-emitting device of the light-emitting unit are formed in an integrated circuit on a single substrate by continuous processes.

28. An object detector according to claim 23, wherein the two-dimensional array of the photodetector unit and the light-emitting device of the light-emitting unit are formed respectively on opposing major surfaces of a single substrate.

29. An object detector according to claim 23, wherein the two-dimensional photodetector array of the photodetector unit and the light-emitting device of the light-emitting unit formed respectively of different materials are formed in an integrated circuit on a single substrate.

30. An object detector according to claim 23, wherein the two-dimensional photodetector array of the photodetector unit is formed on a first substrate, the light-emitting device of the light-emitting unit is formed on a second substrate, and the first substrate and the second substrate are put together in a single substrate.

31. An object detector according to claim 23, wherein a driving integrated circuit for driving the two-dimensional photodetector array of the photodetector unit and the light-emitting device of the light-emitting unit is formed on a substrate on which the two-dimensional photodetector array and the light-emitting device are formed.

32. An object detector according to claim 23, wherein the light-emitting unit is provided with a driving power supply for the amplitude modulation of the light-emitting device, and the two-dimensional photodetector array is formed on a substrate on which the light-emitting device provided with the driving power supply are formed in an integrated circuit.

33. An object detector according to claim 23, wherein the light-emitting unit is provided with a spatial modulator for the amplitude modulation of the light-emitting device, and the two-dimensional photodetector array is formed on a substrate on which the light-emitting device and the spatial modulator are formed in an integrated circuit.

34. An object detector according to claim 23, wherein the light-emitting unit is provided with one of a diffraction lens and a gradient index lens through which a pulse of light emitted by the light-emitting device travels, and the two-dimensional photodetector array is formed on a substrate on which the light-emitting device, and the one of the diffraction lens and the gradient index lens are formed.

35. An object detector according to claim 23, wherein a wavelength-selective filter is formed on the surface of the two-dimensional photodetector array, the light-emitting unit is provided with a plurality of light-emitting devices that emit light having different wavelengths, respectively, and the light-emitting devices and the two-dimensional photodetector array are formed on a single substrate.

36. An object detector according to claim 23, wherein the light-emitting device of the light-emitting unit is formed in an integrated circuit on the two-dimensional photodetector array.

37. An object detector comprising:
a photodetector unit having a two-dimensional photodetector array comprising a plurality of photodetectors each having photosensitivity variable in a positive range through a negative range and arranged in a two-dimensional arrangement, and lenses formed on the two-dimensional photodetector array;
a control voltage circuit that applies a control voltage to the photodetectors on each line of the two-dimensional photodetector array of the photodetector unit;
a signal detecting circuit that detects the output signals of the photodetectors on each line of the two-dimensional photodetector array of the photodetector unit;
a light-emitting unit that emits light having a predetermined wavelength toward an object; and
an optical scanning unit that collimates the light emitted by the light-emitting unit in a light beam and scans a scanning range with the light beam.

38. An object detector according to claim 37, wherein each of the plurality of photodetectors of the two-dimensional photodetector array comprises a semiconductor substrate, depletion layers formed in the semiconductor substrate in a symmetrical arrangement, a first electrode electrically connected to the semiconductor substrate and to a power source that applies control voltage variable in a positive range through a negative range to the first electrode, and a second electrode symmetric with respect to the first electrode and electrically connected to the semiconductor substrate to deliver a photocurrent induced in the depletion layers.

39. An object detecting procedure that uses an object detector having a photodetector unit having a two-dimensional photodetector array comprising a plurality of photodetectors each having photosensitivity variable in a positive range through a negative range and arranged in a two-dimensional arrangement, said object detecting procedure comprising steps of:
setting each photodetector of the photodetector unit for a photosensitivity;
receiving the light reflected from an object by the photodetector unit comprising the photodetectors each having a set photosensitivity; and
producing image information about the object on the basis of output signals of the photodetector unit.

40. An object detecting procedure that uses an object detector having a photodetector unit having a two-dimensional photodetector array comprising a plurality of photodetectors each having photosensitivity variable in a positive range through a negative range and arranged in a two-dimensional arrangement, said object detecting procedure comprising steps of:

setting each photodetector of the photodetector unit for a photosensitivity;
setting a spatial window on the photodetector unit comprising the photodetectors respectively having set photosensitivities so as to contain an image of a desired object;
receiving the light reflected from the object by the photodetector unit comprising the photodetectors respectively having the set photosensitivities; and
detecting output signals of the photodetectors of the photodetector unit within the set spatial window to obtain image information about the object.

41. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:
emitting a near-infrared pulse by the light-emitting unit;
receiving the reflected near-infrared pulse reflected from the object by the photodetector unit; and
determining the coordinates of the object and the time interval between the emission of the near-infrared pulse and the reception of the reflected near-infrared pulse on basis of the output signals of the photodetector unit.

42. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting means comprising steps of:
emitting a near-infrared pulse by the light-emitting unit;
receiving the reflected near-infrared pulse reflected from an object by the photodetector unit;
determining the coordinates of the object and the time interval between the emission of the near-infrared pulse and the reception of the reflected near-infrared pulse on the basis of output signals of the photodetector unit;
setting a spatial window on the photodetector unit so as to contain the image of the object; and
obtaining optical image information from the output signals of the photodetectors of the photodetector unit within the spatial window.

43. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:
emitting a near-infrared pulse by the light-emitting unit;
receiving the reflected near-infrared pulse reflected from an object by the photodetector unit;
determining the coordinates of the object and the time interval between the emission of the near-infrared pulse and the reception of the reflected near-infrared pulse on the basis of output signals of the photodetector unit;

setting a spatial window on the photodetector unit, on the basis of coordinates of the object so as to contain an image of the object;

obtaining optical image information from the output signals of the photodetectors of the photodetector unit within the spatial window; and processing the optical image information.

44. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:

emitting a near-infrared pulse by the light-emitting unit;

receiving the reflected near-infrared pulse reflected from an object by the photodetector unit;

determining coordinates of the object and the time interval between the emission of the near-infrared pulse and the reception of the reflected near-infrared pulse on the basis of output signals of the photodetector unit;

setting a spatial window on the photodetector unit, on the basis of the coordinates of the object so as to contain an image of the object;

obtaining optical image information from the output signals of the photodetectors of the photodetector unit within the spatial window; and determining a projection of the image of the object on the basis of the optical image information.

45. An object detecting procedure according to claim 42 further comprising a step in which the object detecting procedure returns to an earlier step depending on the information provided by the photodetector unit upon the reception of the reflected near-infrared pulse.

46. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:

emitting a near-infrared pulse by the light-emitting unit;

receiving the reflected near-infrared pulse reflected from the object by the photodetector unit;

forming a spatial window on the photodetector unit so as to contain an image of the object; and obtaining optical image information from output signals of the photodetectors of the photodetector unit within the spatial window.

47. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:

emitting a near-infrared pulse by the light-emitting unit;

receiving the reflected near-infrared pulse reflected from the object by the photodetector unit;

determining coordinates of the object and a time interval between the emission of the near-infrared pulse and the reception of the reflected near-infrared pulse on the basis of output signals of the photodetector unit;

setting a spatial window on the photodetector unit on the basis of the coordinates of the object so as to contain the image of the object;

obtaining optical image information from the output signals of the photodetectors of the photodetector unit within the spatial window; and processing the optical image information.

48. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, said object detecting procedure comprising steps of:

emitting a near-infrared pulse by the light-emitting unit;

receiving the reflected near-infrared pulse reflected from the object by the photodetector unit;

determining coordinates of the object and a time interval between the emission of the near-infrared pulse and the reception of the reflected near-infrared pulse on the basis of output signals of the photodetector unit;

setting a time window on the photodetector unit on the basis of the coordinates of the object so as to contain an image of the object;

obtaining optical image information from the output signals of the photodetectors of the photodetector unit within the spatial window; and determining a projection of the image of the object on the basis of the optical image information.

49. An object detecting procedure according to claim 45 further comprising a step in which the object detecting procedure returns to an earlier step depending on the output signals of the photodetector unit.

50. An object detecting procedure according to claim 42, wherein the coordinates with respect to two directions are determined in the step of determining the coordinates of the object and the time interval between the emission of the near-infrared pulse and the reception of the reflected near-infrared pulse.

51. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, and a linear photodetector array comprising a plurality of photodetectors each having a fixed conversion efficiency, said object detecting procedure comprising steps of:

emitting a near-infrared pulse by the light-emitting unit;

receiving a reflected near-infrared pulse by the linear photodetector array of the photodetector unit;

determining coordinates of the object and the time interval between the emission of the near-infrared pulse and the reception of the reflected near-infrared pulse on the basis of the output signals of the linear photodetector array;

setting a time window on the two-dimensional photodetector array of the photodetector unit on the basis of the coordinates of the object so as to contain the image of the object;

receiving the light reflected from the object by the two-dimensional photodetector array of the photodetector unit; and obtaining optical image information from output signals of the photodetectors of the two-dimensional photodetector array within the time window.

52. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, and a linear photodetector array comprising a plurality of photodetectors each having a fixed conversion efficiency, said object detecting procedure comprising steps of:

emitting a near-infrared pulse by the light-emitting unit;

receiving the reflected near-infrared pulse reflected from an object by the linear photodetector array;

determining coordinates of the object and a time interval between the emission of the near-infrared pulse and the reception of the near-infrared pulse on the basis of output signals of the linear photodetector array;

setting a time window on the two-dimensional photodetector array of the photodetector unit on the basis of the coordinates of the object so as to contain the image of the object;

receiving the light reflected from the object by the two-dimensional photodetector array;

obtaining optical image information from the output signals of the photodetectors of the two-dimensional photodetector array within the time window; and processing the optical image information by a predetermined method.

53. An object detecting procedure for determining the distance to an object and forming an image of the object by using an object detector having a light-emitting unit that emits a near-infrared pulse, and a photodetector unit having a two-dimensional photodetector array comprising a plurality of photodetectors each having photosensitivity variable in a positive range through a negative range and arranged in a two-dimensional arrangement, and a linear photodetector array comprising a plurality of photodetectors each having a fixed conversion efficiency, said object detecting procedure comprising steps of:

emitting a near-infrared pulse by the light-emitting unit;

receiving the reflected near-infrared pulse reflected from the object by the linear photodetector array of the photodetector unit;

determining the coordinates of the object and a time interval between the emission of the near-infrared pulse and the reception of the reflected near-infrared pulse on the basis of output signals of the linear photodetector array;

setting a time window on the two-dimensional photodetector array of the photodetector unit on the basis of the coordinates of the object so as to contain the image of the object;

receiving the light reflected from the object by the two-dimensional photodetector array;

obtaining optical image information from the output signals of the photodetectors of the two-dimensional photodetector array within the time window; and forming a projection of the image of the object on the basis of the optical image information.

54. An object detecting procedure according to claim 52 further comprising a step in which the object detecting procedure returns to an earlier step depending on the output signals of the photodetector unit.

55. An object detecting procedure according to claim 50, wherein the combination of lines or rows of the photodetectors to which access is made to obtain the optical image information from the output signals of the two-dimensional photodetector array is changeable.

56. An object detecting procedure according to claim 50, wherein windows are set sequentially for a plurality of object detected through the detection of the near-infrared pulse in ascending or descending order of the coordinates of the object with respect to one direction of the two-dimensional photodetector array.

57. An object detecting procedure according to claim 50, wherein windows are set sequentially for a plurality of objects detected through the detection of the reflected near-infrared pulse in predetermined order.

\* \* \* \* \*